(12) United States Patent
Yamamoto et al.

(10) Patent No.: US 8,295,079 B2
(45) Date of Patent: Oct. 23, 2012

(54) NONVOLATILE SRAM/LATCH CIRCUIT USING CURRENT-INDUCED MAGNETIZATION REVERSAL MTJ

(75) Inventors: Shuichiro Yamamoto, Kanagawa (JP); Satoshi Sugahara, Kanagawa (JP)

(73) Assignee: Tokyo Institute of Technology, Tokyo (JP)

( * ) Notice: Subject to any disclaimer, the term of this patent is extended or adjusted under 35 U.S.C. 154(b) by 284 days.

(21) Appl. No.: 12/674,860

(22) PCT Filed: Jul. 31, 2008

(86) PCT No.: PCT/JP2008/063787
§ 371 (c)(1),
(2), (4) Date: Feb. 23, 2010

(87) PCT Pub. No.: WO2009/028298
PCT Pub. Date: Mar. 5, 2009

(65) Prior Publication Data
US 2011/0273925 A1    Nov. 10, 2011

(30) Foreign Application Priority Data

Aug. 31, 2007   (JP) ................................. 2007-225697
Sep. 3, 2007    (JP) ................................. 2007-227261

(51) Int. Cl.
*G11C 11/00* (2006.01)
(52) U.S. Cl. ........ 365/154; 365/145; 365/158; 365/157; 365/170
(58) Field of Classification Search .................. 365/154, 365/145, 158, 157, 170
See application file for complete search history.

(56) References Cited

U.S. PATENT DOCUMENTS

| | | | |
|---|---|---|---|
| 2004/0052106 A1 | 3/2004 | Ohtani | |
| 2008/0080231 A1 | 4/2008 | Abe et al. | |
| 2008/0225590 A1* | 9/2008 | Lamorey | 365/185.05 |

FOREIGN PATENT DOCUMENTS

| | | |
|---|---|---|
| JP | A-2004-103174 | 4/2004 |
| JP | A-2006-19008 | 1/2006 |
| JP | A-2008-85770 | 4/2008 |
| WO | WO 2004/079827 A1 | 9/2004 |

OTHER PUBLICATIONS

Abe et al.; "Novel Nonvolatile Logic Circuits with Three- Dimensionally Stacked Nanoscale Memory Device:" *Technical Proceedings of the 2005 NSTI Nanotechnology Conference and Trade Show*; May 12, 2005; pp. 203-206; vol. 3.

Sugahara; "Spin Transistors for Integrated Spin-electronics;" Journal of the Institute of Electronics; 2005; pp. 541-550; vol. 88; No. 7 (with abstract).

Aug. 26, 2008 International Search Report issued in corresponding International Application No. PCT/JP2008/063787.

Dec. 1, 2009 translation of substantive portion of International Preliminary Report on Patentability issued in corresponding International Application No. PCT/JP2008/063787.

* cited by examiner

*Primary Examiner* — Thong Q Le
(74) *Attorney, Agent, or Firm* — Oliff & Berridge, PLC

(57) ABSTRACT

The present invention is a memory circuit that includes a bistable circuit that stores data; and a ferromagnetic tunnel junction device that nonvolatilely stores the data stored in the bistable circuit according to a magnetization direction of a ferromagnetic electrode free layer, the data nonvolatilely stored in the ferromagnetic tunnel junction device being able to be restored in the bistable circuit. According to the present invention, writing data to and reading data from the bistable circuit can be performed at high speed. In addition, even though a power source is shut down, it is possible to restore data nonvolatilely stored in the ferromagnetic tunnel junction devices to the bistable circuit.

38 Claims, 81 Drawing Sheets

MTJ1:Rap
MTJ2:Rp

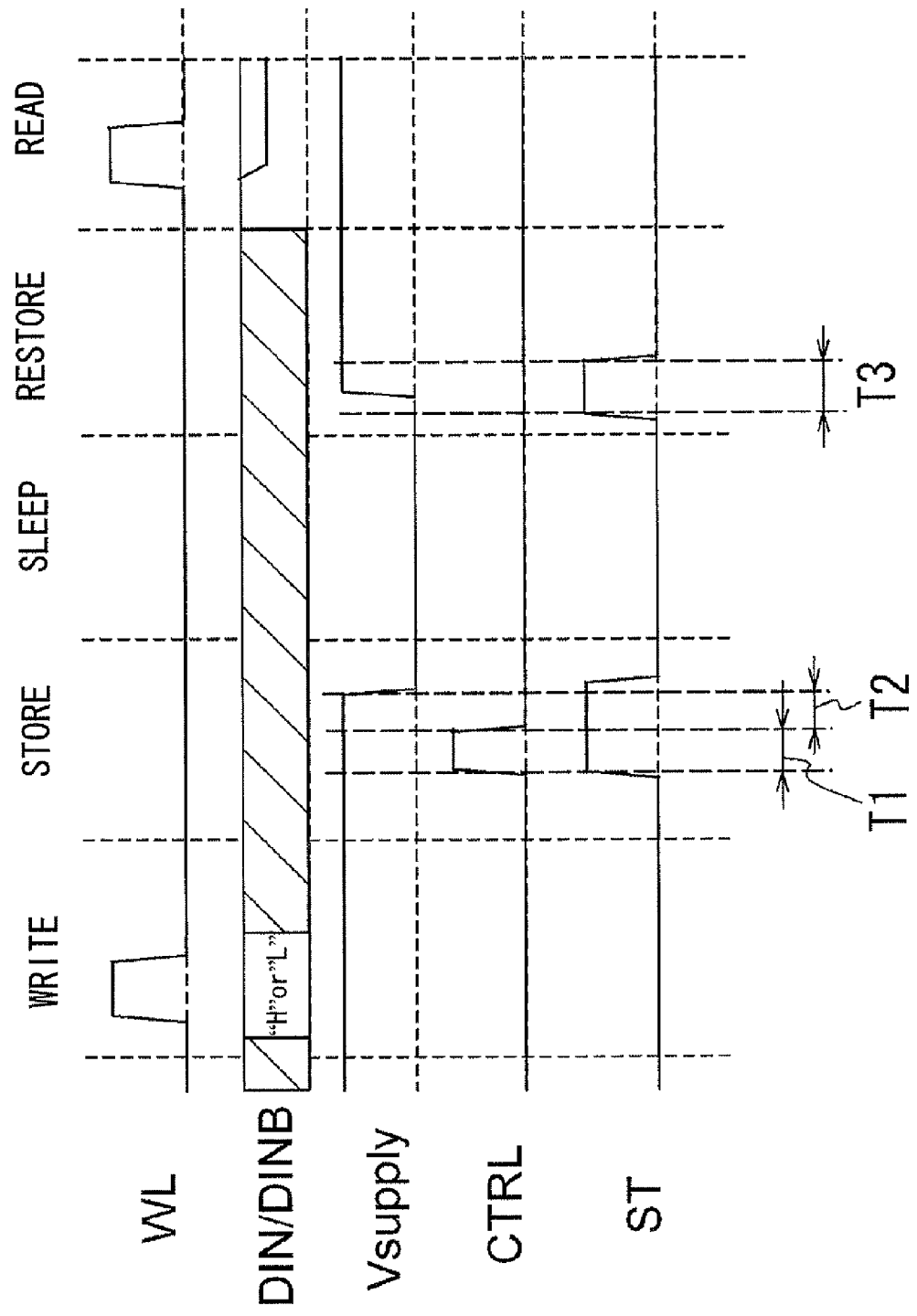

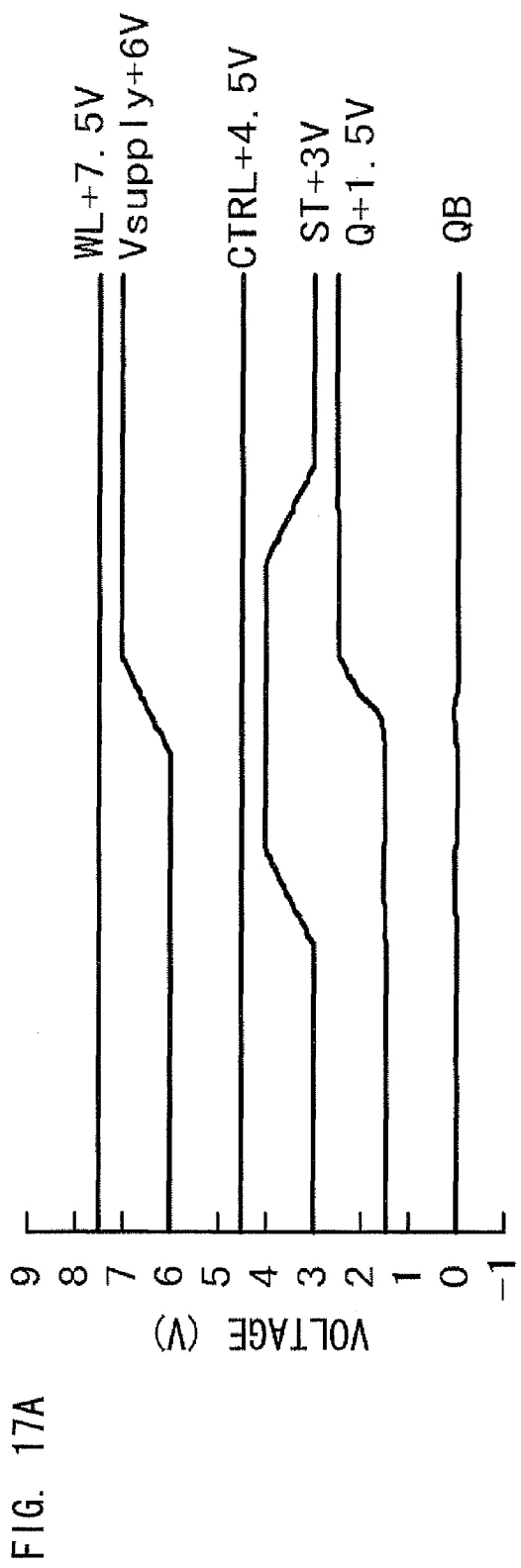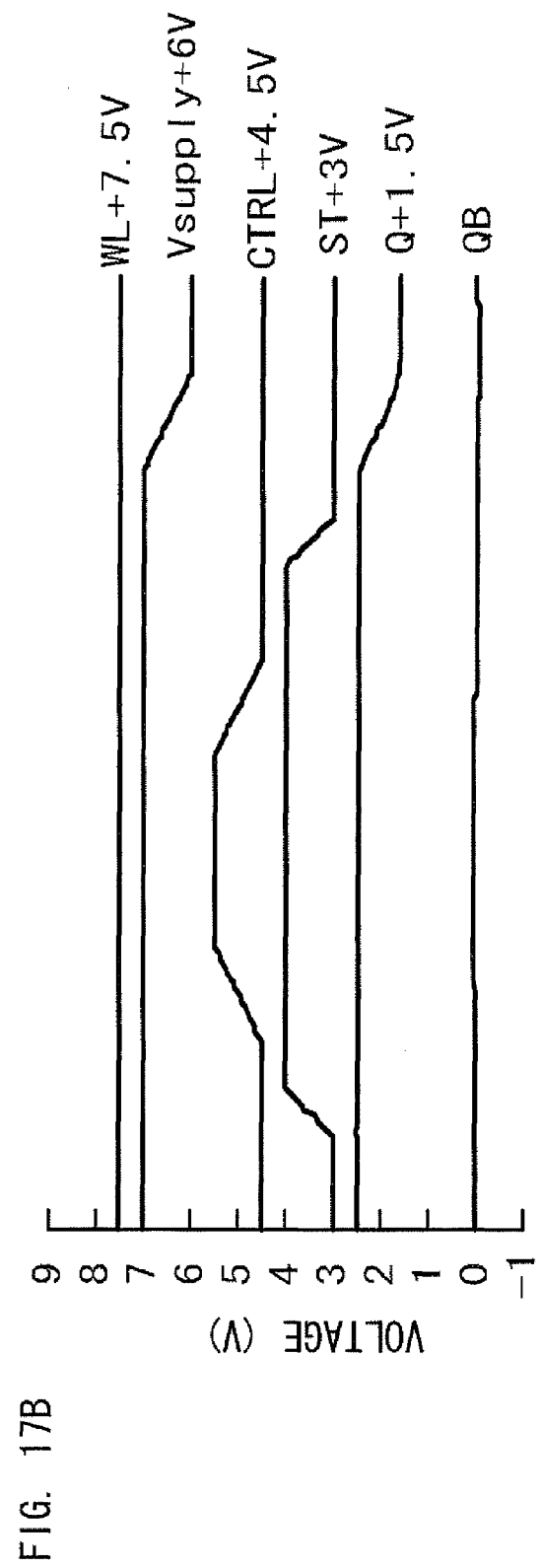

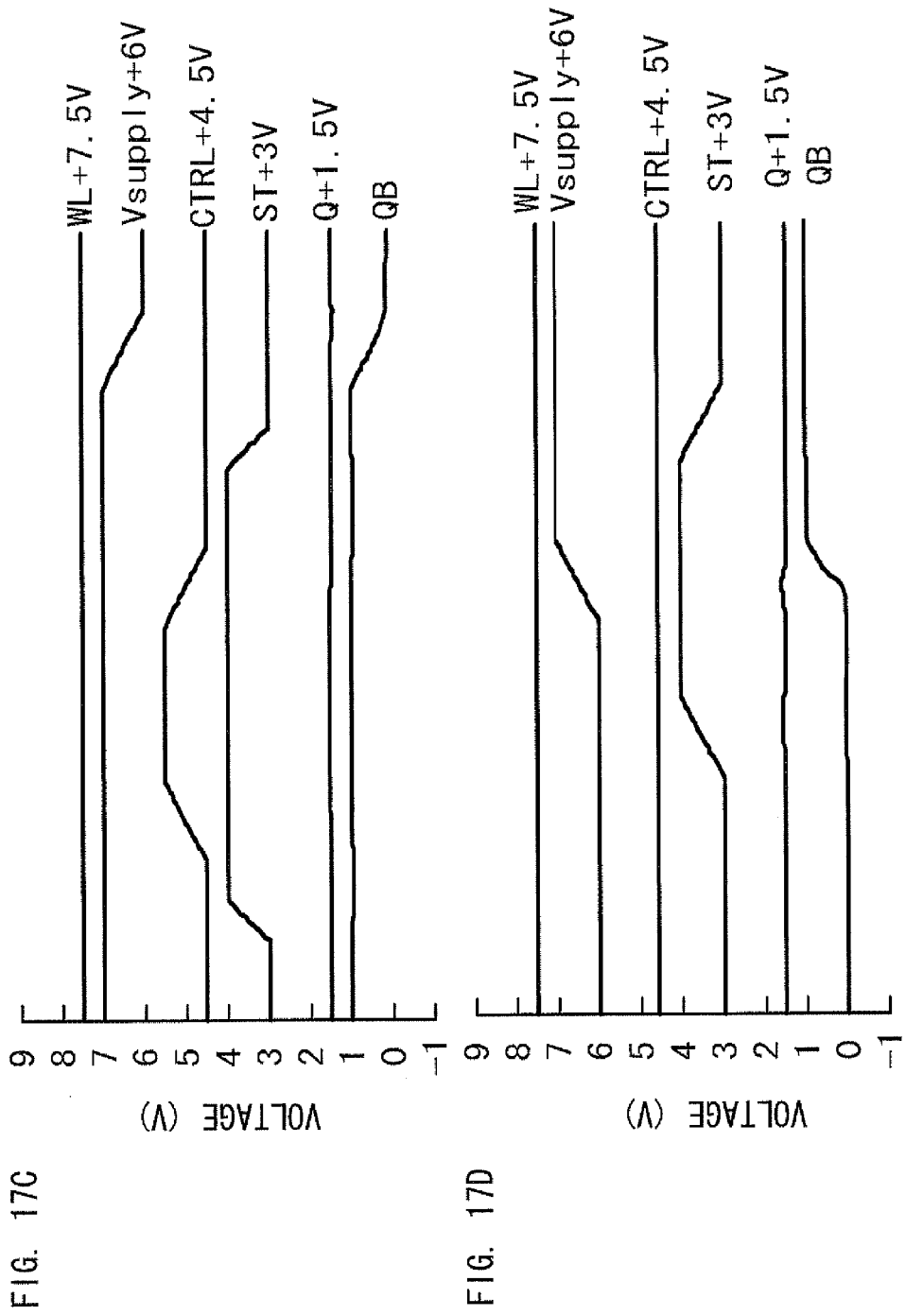

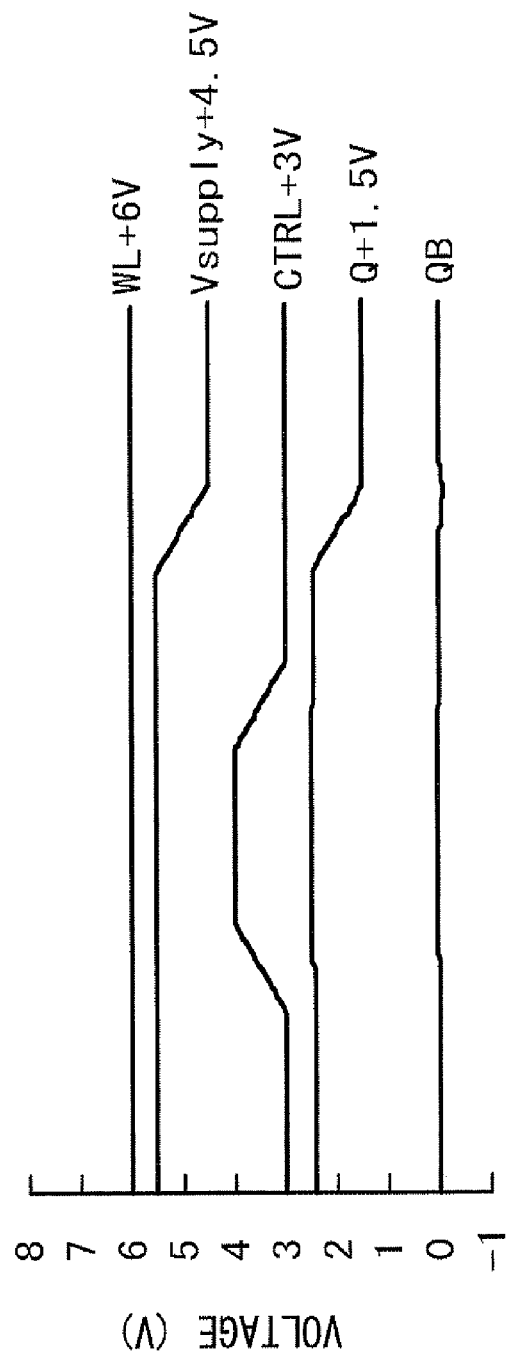
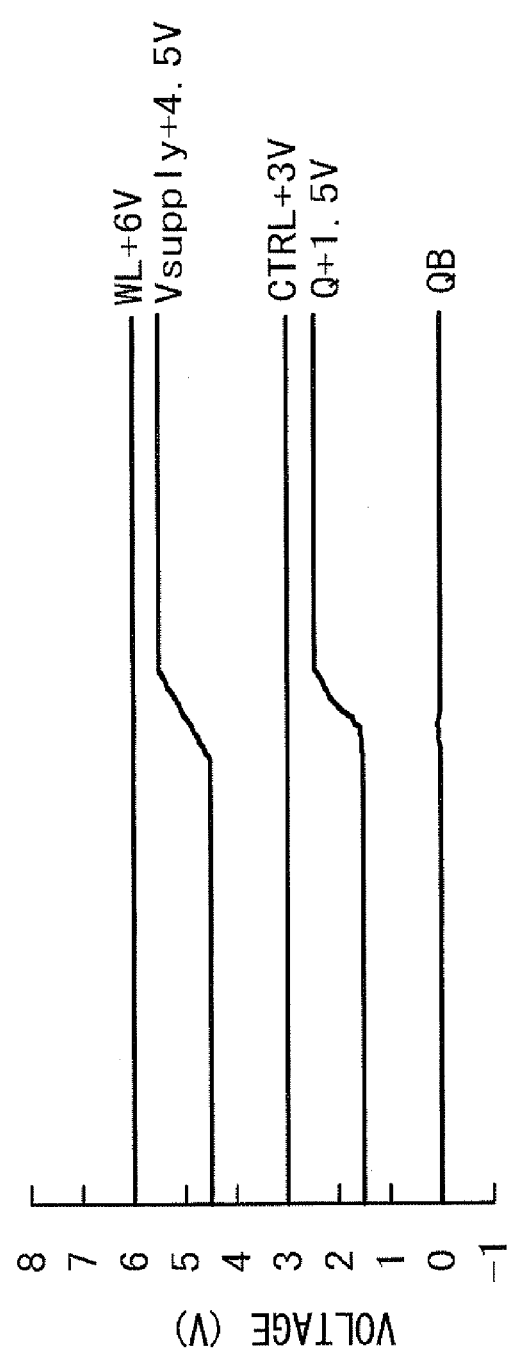
FIG. 19A
FIG. 19B

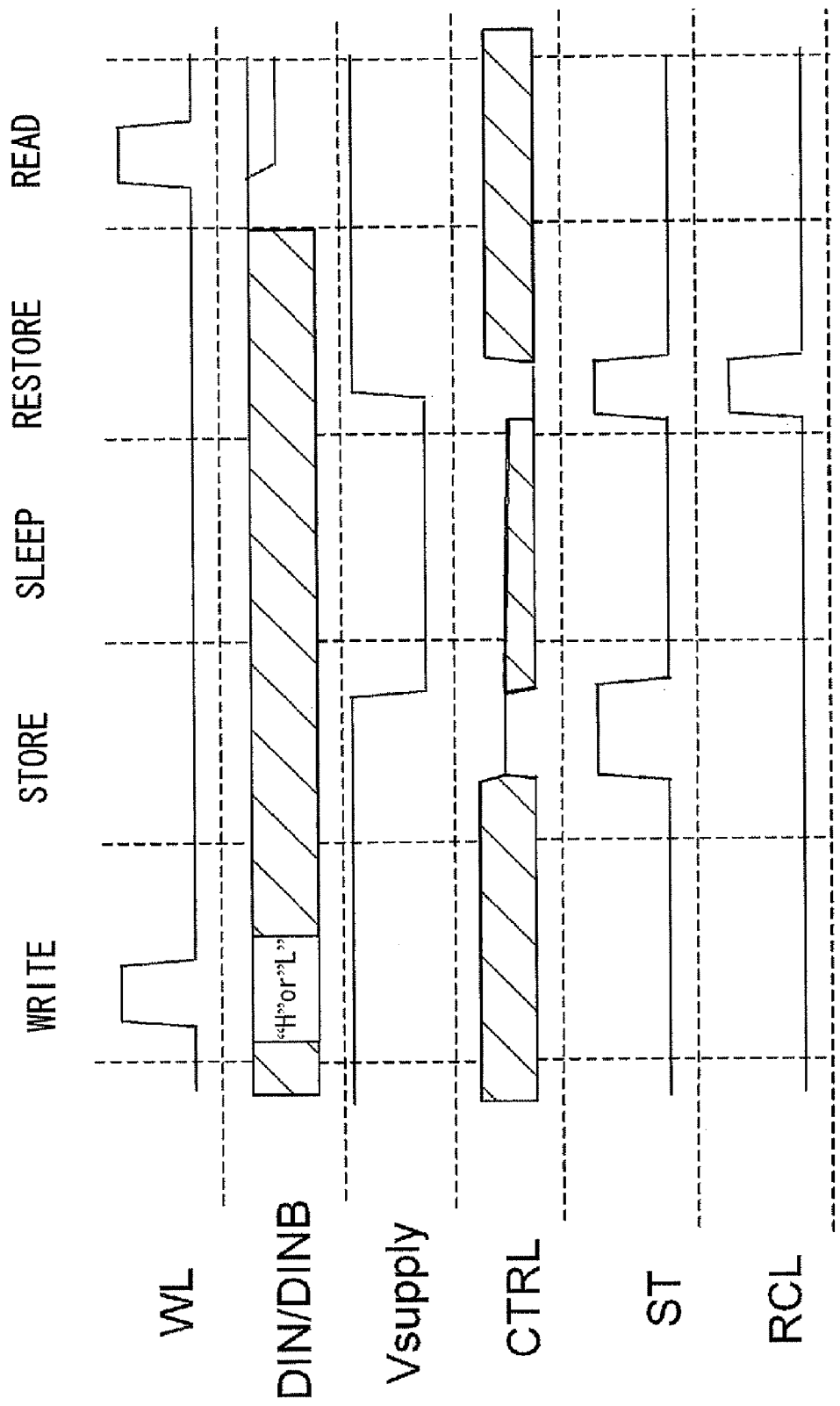

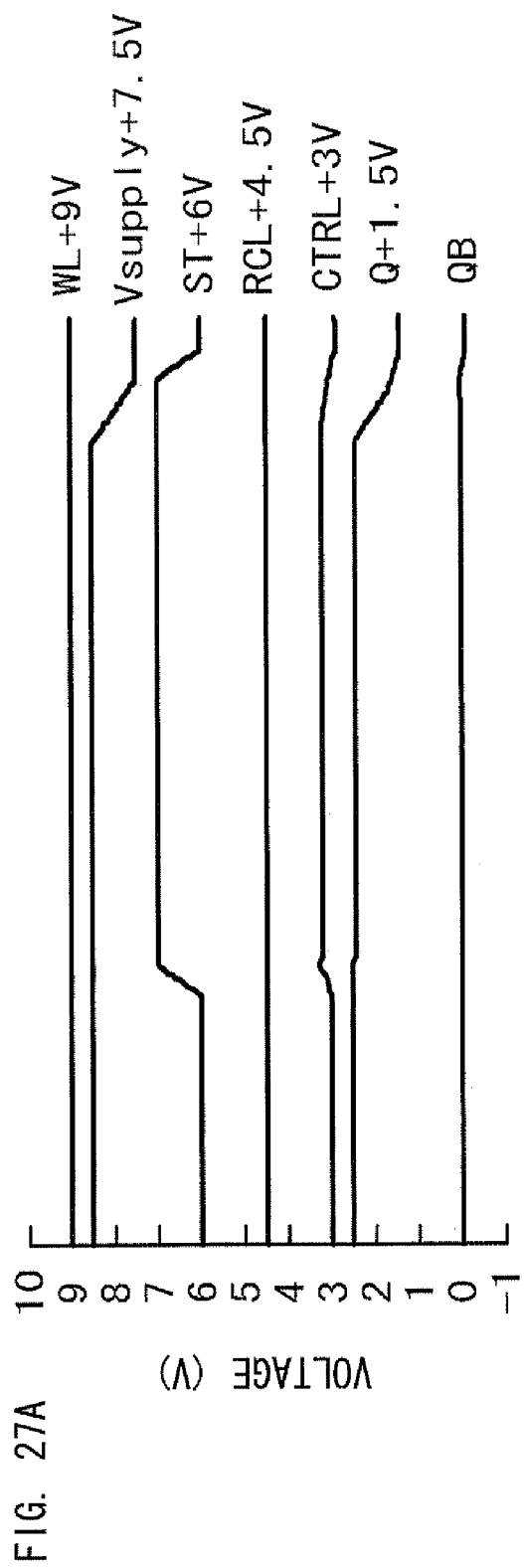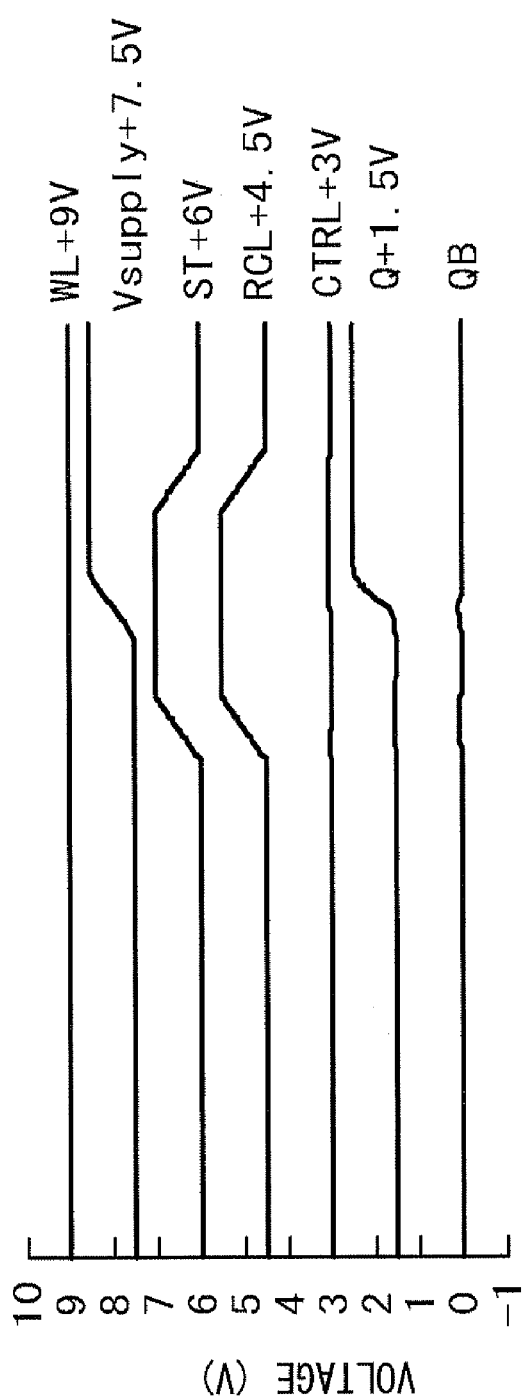

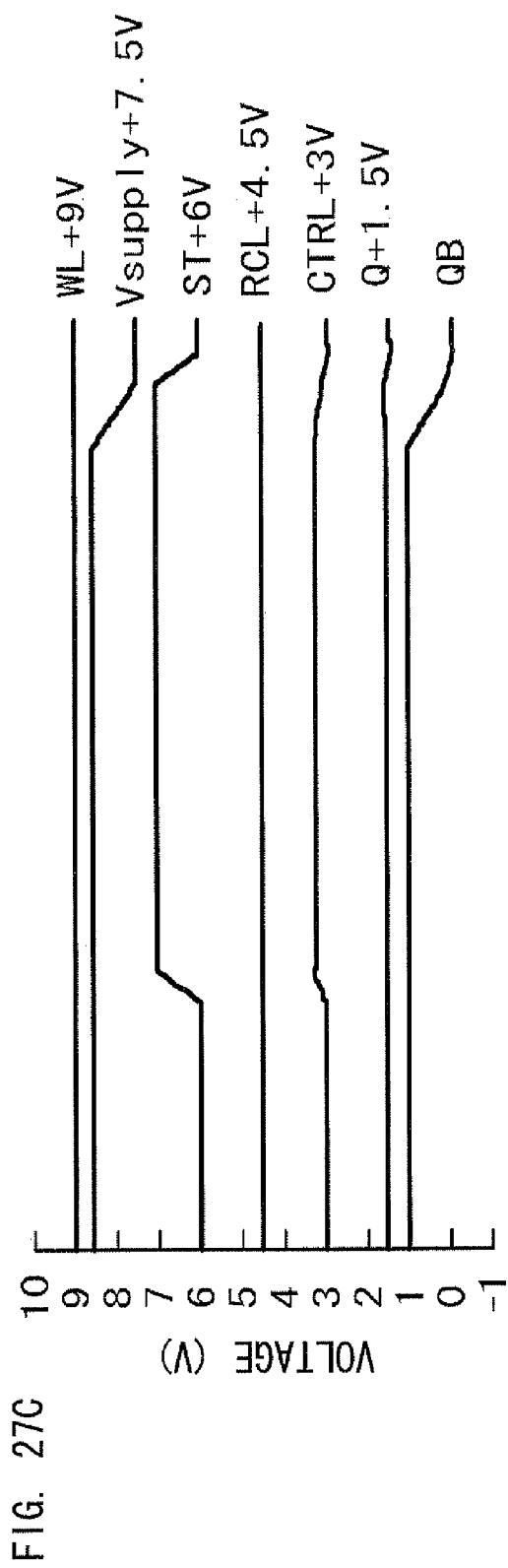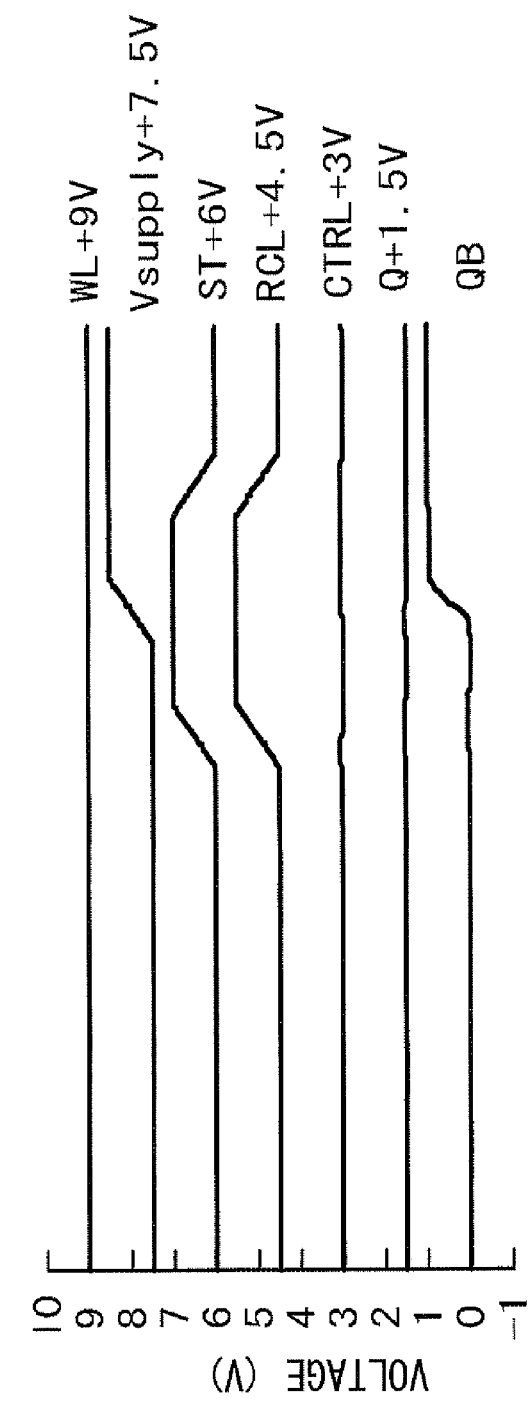
FIG. 27C
FIG. 27D

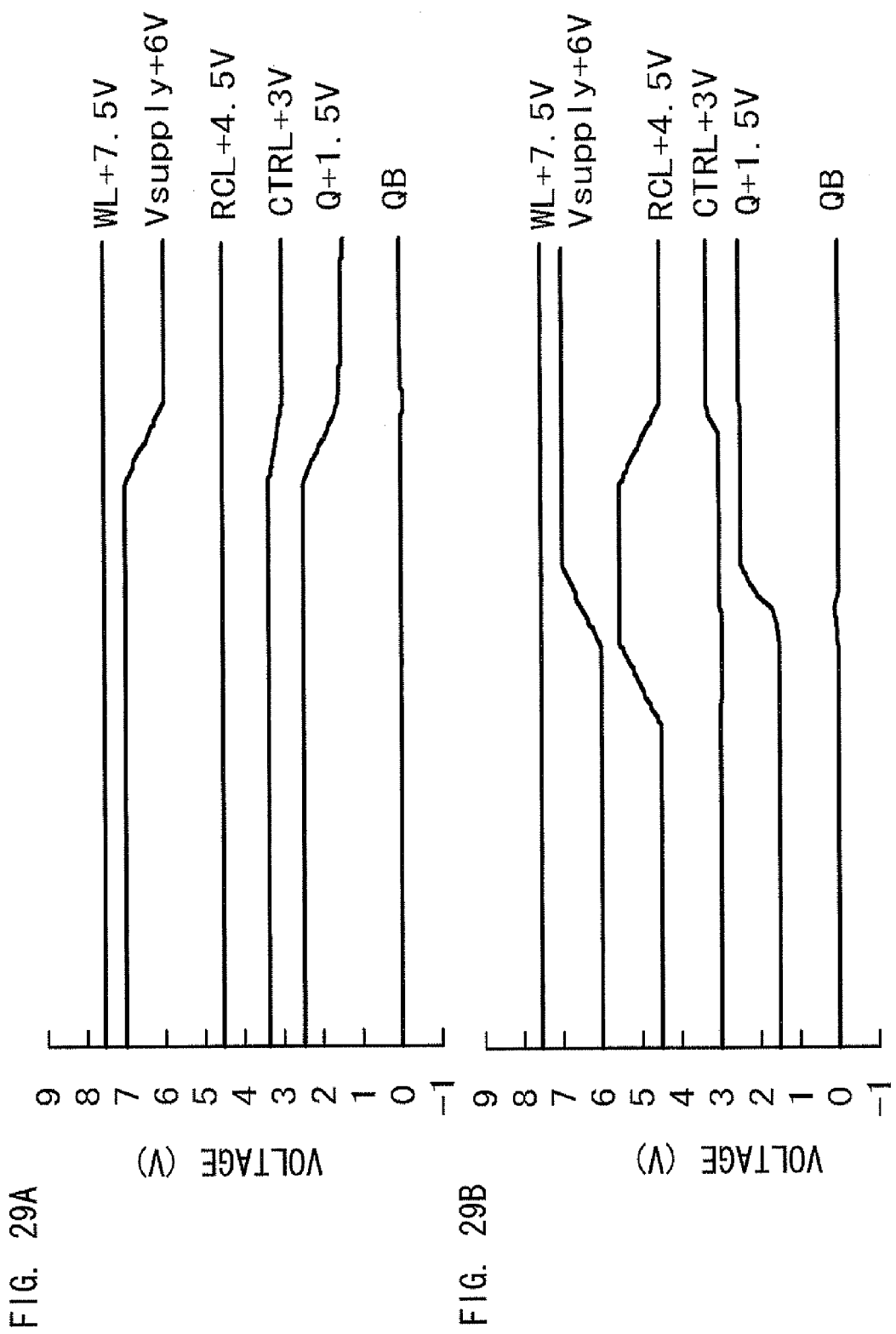

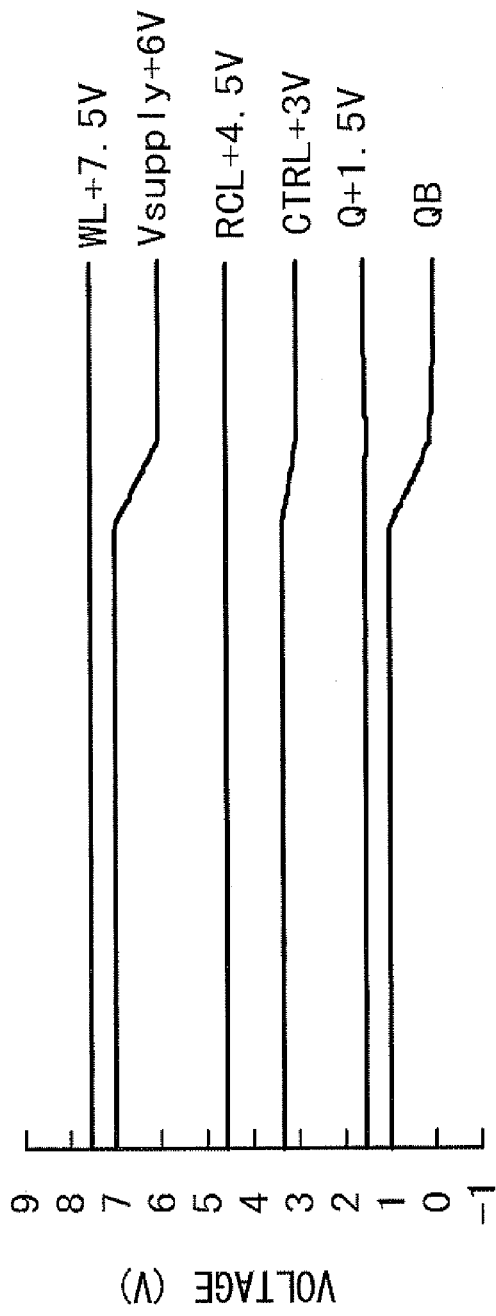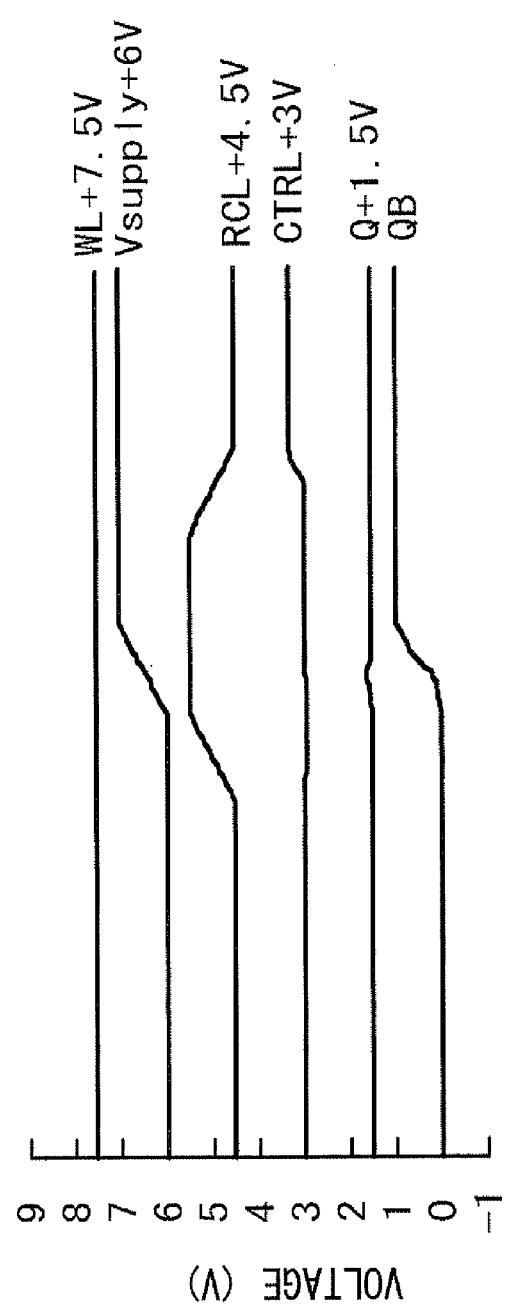

MTJ1 : Rap
MTJ2 : Rp

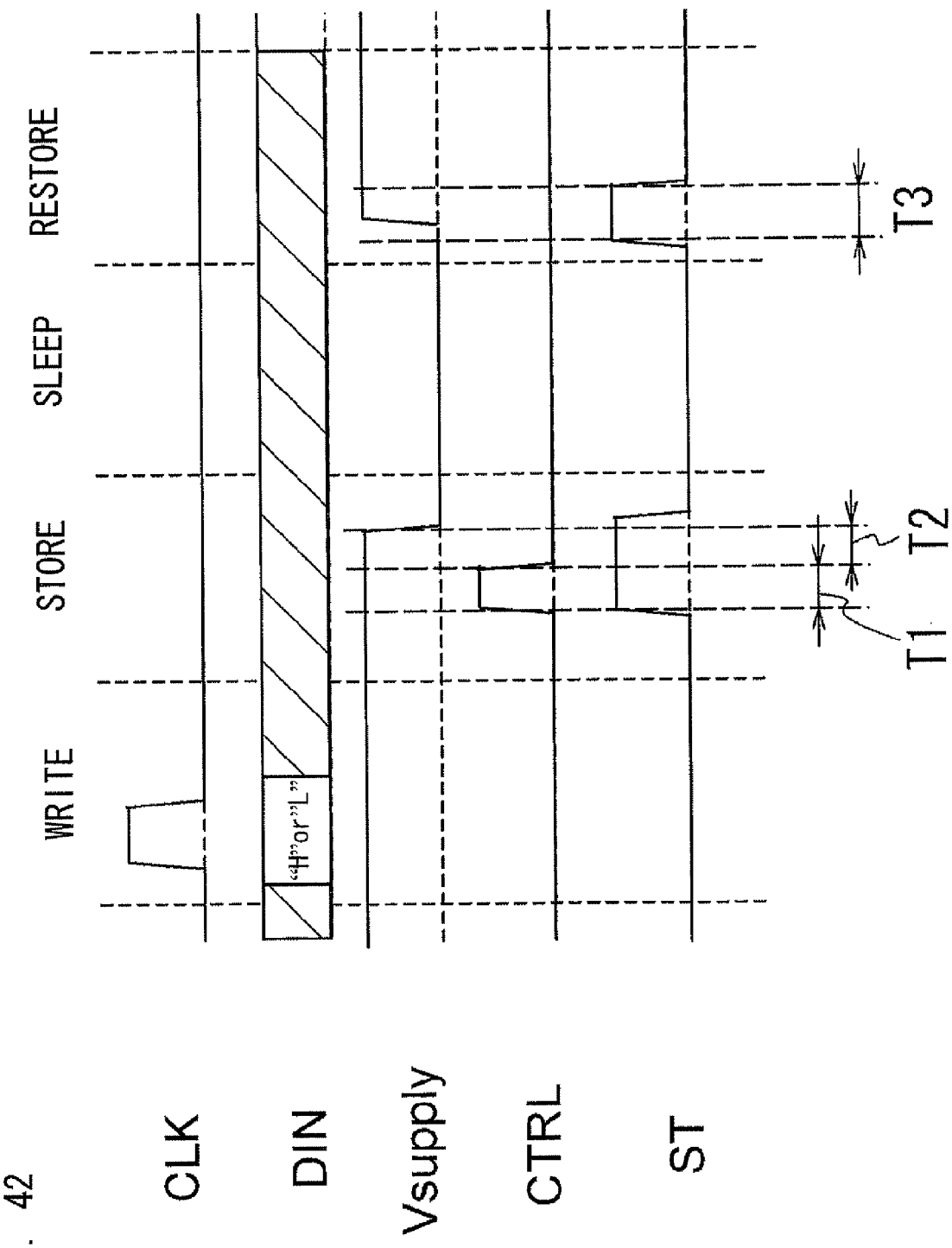

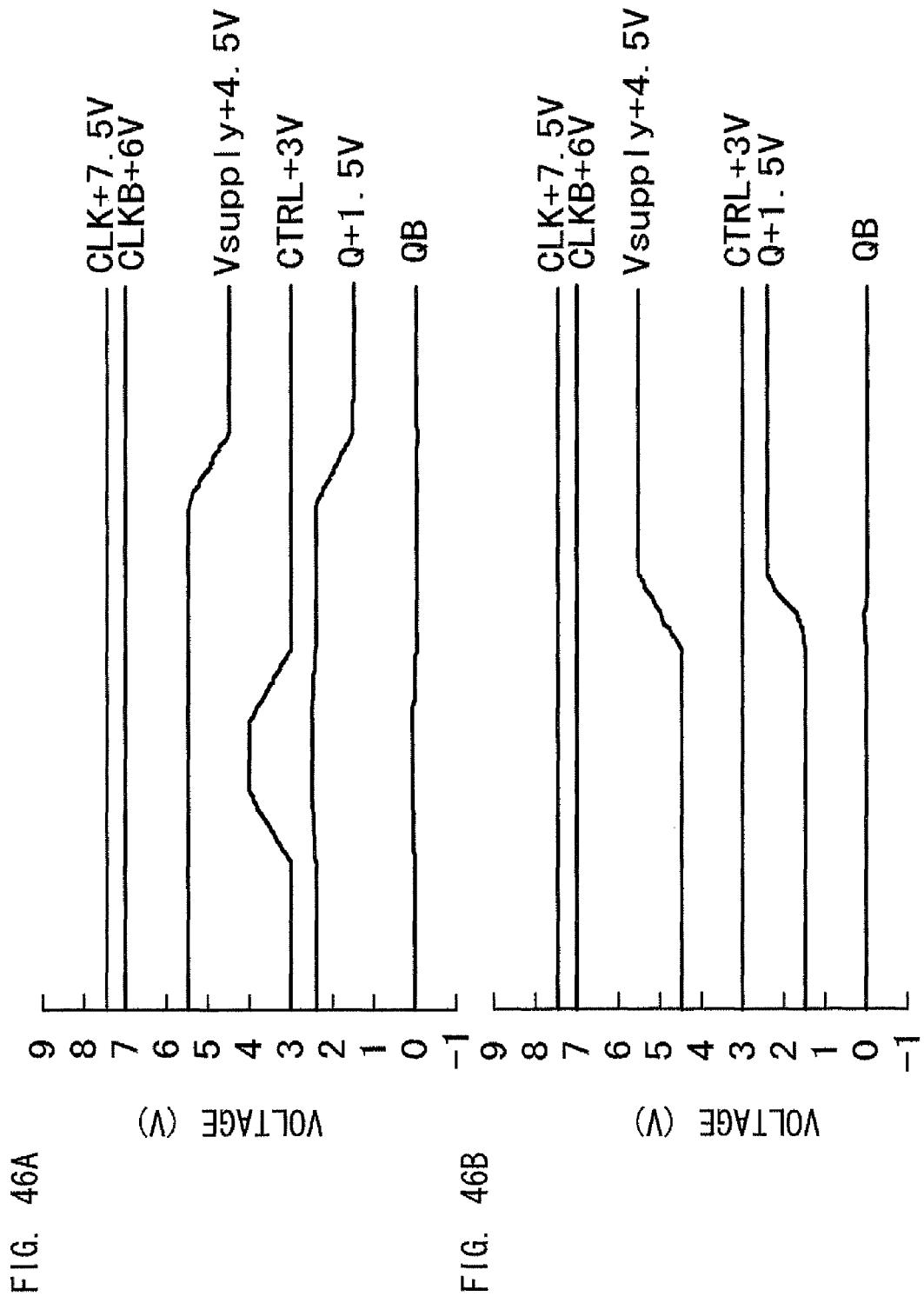

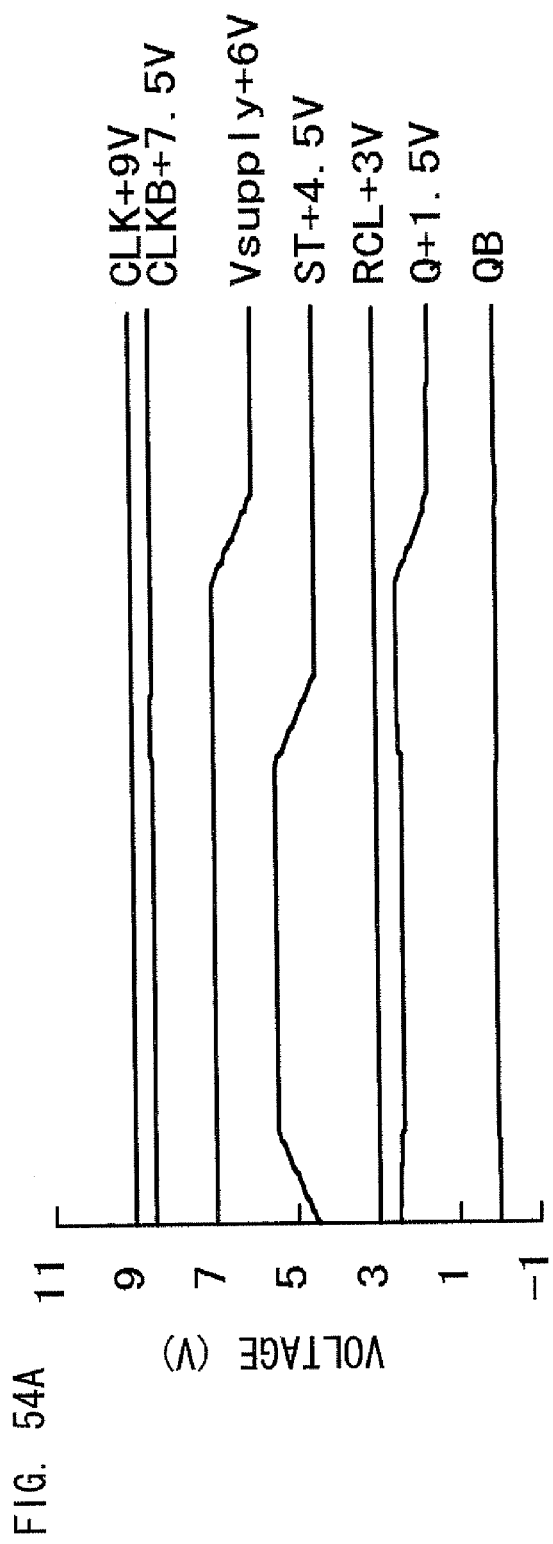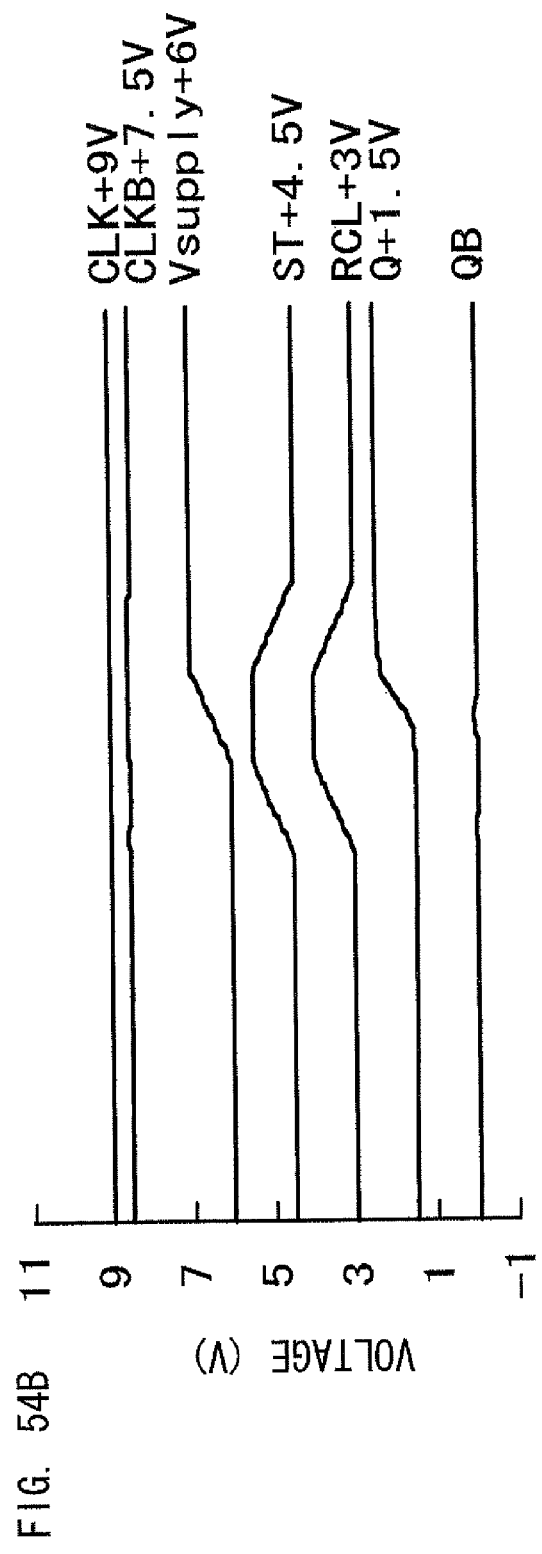

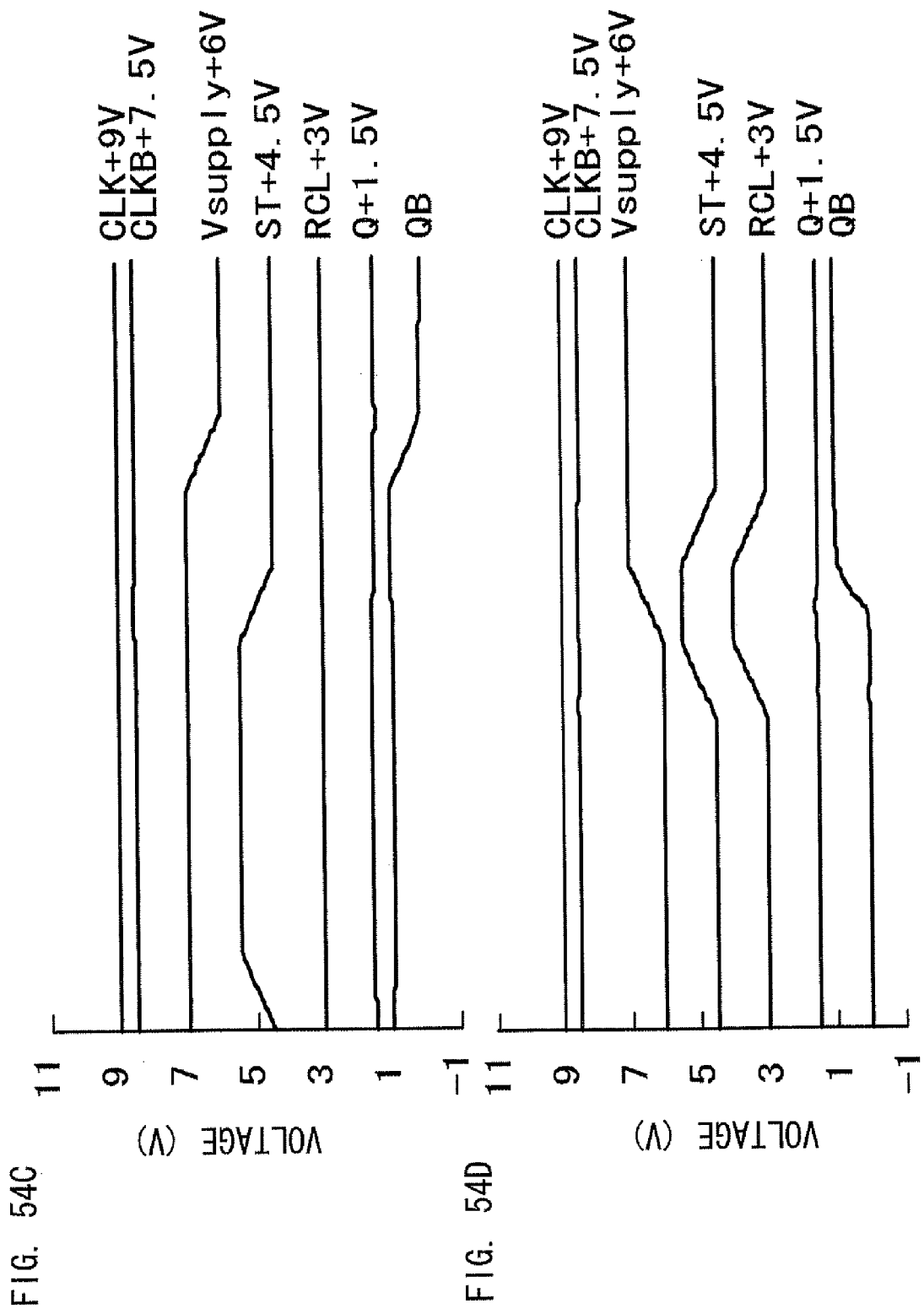

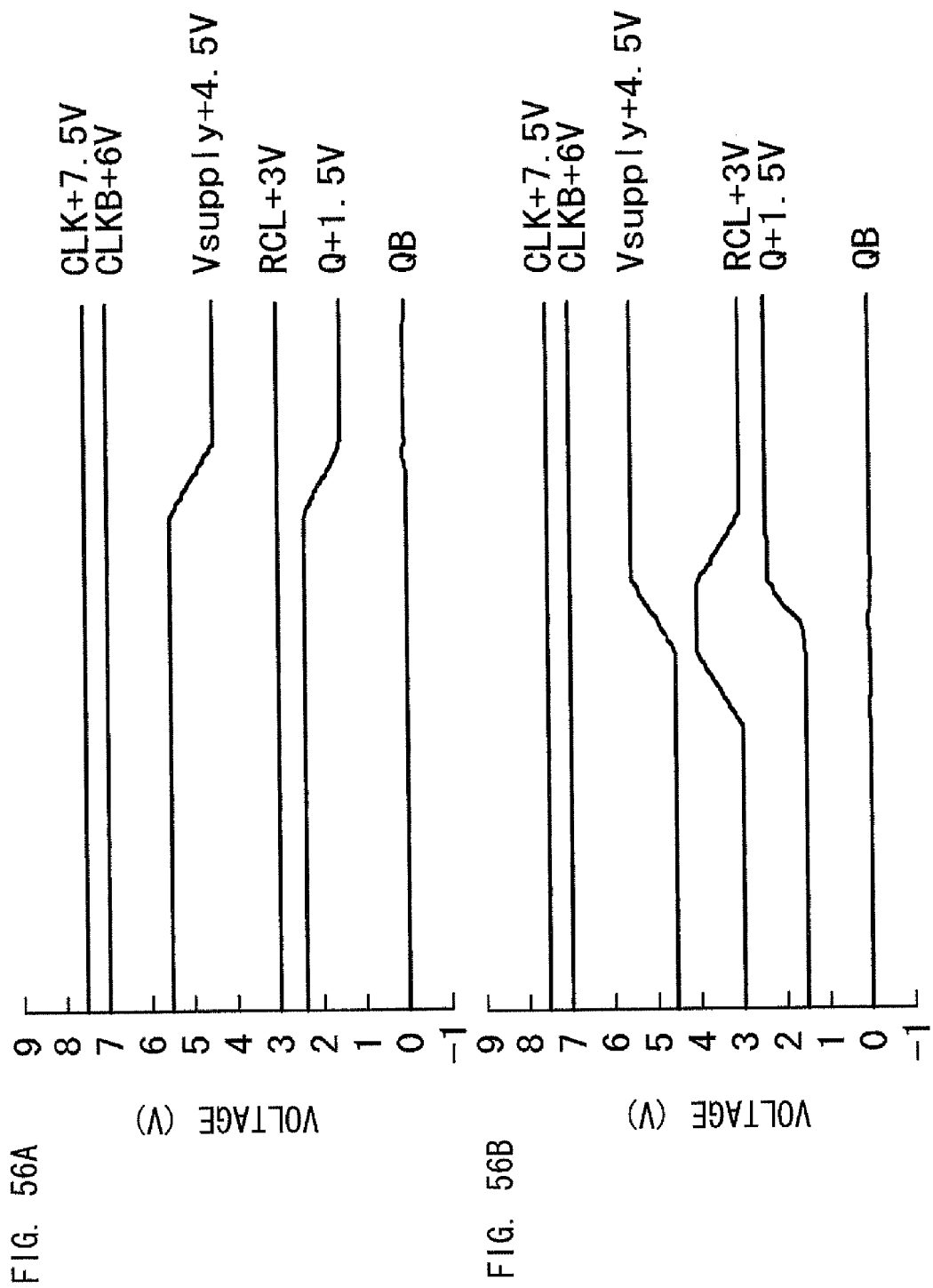

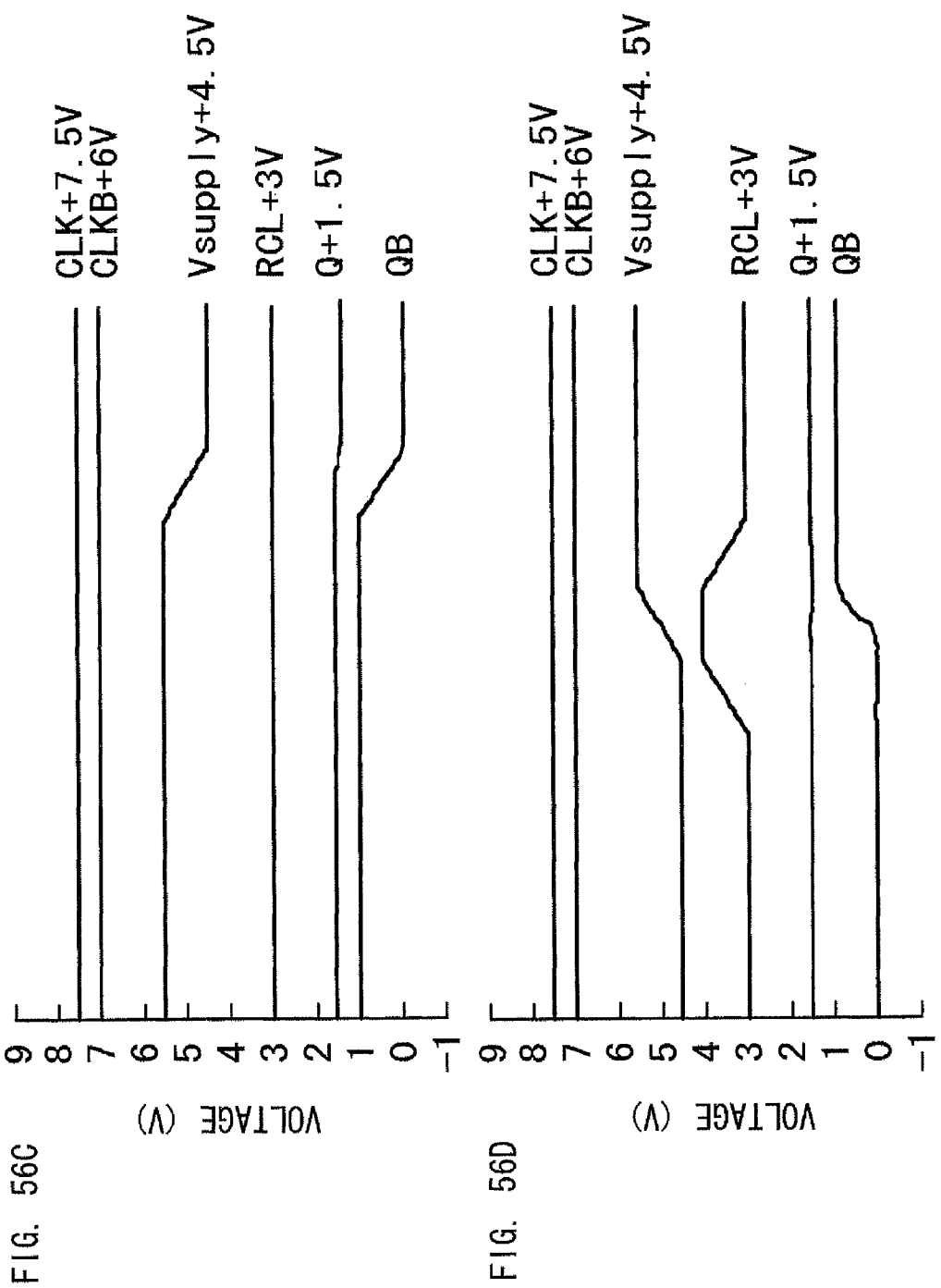

NONVOLATILE SRAM/LATCH CIRCUIT USING CURRENT-INDUCED MAGNETIZATION REVERSAL MTJ

TECHNICAL FIELD

The present invention relates to a memory circuit, a latch circuit, and a flip-flop circuit, especially relates to a memory circuit, a latch circuit, and a flip-flop circuit including a bistable circuit and a ferromagnetic tunnel junction device.

BACKGROUND ART

An SRAM (Static Random Access Memory) has been well known as a volatile memory circuit used for an electronic apparatus. FIG. 1 is a circuit diagram illustrating a memory cell of an SRAM using MOS (Metal Oxide Semiconductor) Field Effect Transistor (FET). The memory cell has a bistable circuit 30, two input/output transistors m5 and m6. A CMOS inverter 10 (a first inverter circuit) and a CMOS inverter 20 (a second inverter circuit) are coupled in a ring shape in the bistable circuit 30. The inverter 10 includes a p-type MOSFET m1 and an n-type MOSFET m2. In the FET m1 and the FET m2, sources are coupled to a power source Vsupply and a ground respectively, gates are commonly-coupled to a node Q, and drains are commonly coupled to a node QB. The inverter 20 includes a p-type MOSFET m3 and an n-type MOSFET m4. In the FET m3 and the FET m4, sources are coupled to a power source Vsupply and a ground respectively, gates are commonly-coupled to the node QB, and drains are commonly-coupled to the node Q. As described above, the inverter 10 is coupled to the inverter 20 in a ring shape. The node Q is coupled to a data input/output line DIN via an n-type FET m5, and the node QB is coupled to a data input/output line DINB via an n-type FET m6. Gates of FETs m5 and m6 are coupled to a word line WL.

According to above composition, it is possible to write and hold data in the bistable circuit 30, and read data from the bistable circuit 30. However, an SRAM consumes power while holding data. In addition, when the power source is shut down, data stored in the bistable circuit 30 is lost. Since the bistable circuit 30 has a symmetrical structure, and symmetrically-operates, once nodes Q and QB have the same potential after the power source is shut down, it is impossible to restore data even though the power source is restored. This is because potentials of nodes Q and QB remain at the same potential and data is determined by external noise and the like at certain timing regardless of the data stored before the power source is shut down when the power source is restored.

A volatile latch circuit used for an electronic apparatus is well known. FIG. 2 is a circuit diagram illustrating a D latch circuit using a MOS (Metal Oxide Semiconductor) Field Effect Transistor (FET) as an example of a latch circuit. The D latch circuit includes the bistable circuit 30, and pass gates 80 and 90. The CMOS inverter 10 (the first inverter circuit) and the CMOS inverter 20 (the second inverter circuit) are coupled to the bistable circuit 30 via the pass gate 90 in a ring shape. The inverter 10 includes the p-type MOSFET m1 and the n-type MOSFET m2. In the FET m1 and FET m2, sources are coupled to the power source Vsupply and ground respectively, gates are commonly-coupled to the node Q, and drains are commonly-coupled to the node QB. The inverter 20 includes the p-type MOSFET m3 and the n-type MOSFET m4. In the FET m3 and the FET m4, sources are coupled to the power source Vsupply and a ground respectively, gates are commonly-coupled to the node QB, and drains are commonly-coupled to the node Q via the pass gate 90. As described above, the inverter 10 is coupled to the inverter 20 in a ring shape.

The pass gate 80 (a first input switch) is coupled between the input line DIN and the node Q. The pass gate 80 includes the p-type MOSFET m5 and the n-type MOSFET m6. The source and drain of the FET m5 are coupled to the source and drain of the FET m6 respectively. An inverted clock signal CLKB is input to the gate of the FET m5, and a clock signal CLK is input to the gate of the FET m6. When the clock signal CLK at a high level is input, both FETs m5 and m6 become conductive, and the pass gate 80 becomes conductive. The pass gate 90 (a second input switch) is coupled between the node Q and the inverter 20. The pass gate 90 includes a p-type MOSFET m7 and an n-type MOSFET m8. The clock signal CLK is input to the gate of the FET m7, and the inverted clock signal CLKB is input to the gate of the FET m8. When the clock signal CLK at a low level is input, both FETs m7 and m8 become conductive, and the pass gate 90 becomes conductive. Other connections and behavior are same as the pass gate 80.

According to above composition, when the clock signal CLK is at a high level, the pass gate 80 becomes conductive, and the pass gate 90 becomes non-conductive. This makes data of the input line DIN written in the bistable circuit 30. When the clock signal CLK is at a low level, the pass gate 80 becomes non-conductive, and the pass gate 90 becomes conductive. This makes the bistable circuit 30 hold data. The data stored in the bistable circuit 30 can be output from the node Q or QB. A volatile D latch circuit consumes power while holding data. In addition, if the power source is shut down, the data stored in the bistable circuit 30 is lost. The bistable circuit 30 does not function as a bistable circuit when the pass gate 90 is non-conductive, but on the other hand, as the pass gate 80 is conductive, the data of the input line DIN is written in the node Q and the logic-inverted data of the node Q is written in the node QB. Therefore, the data of nodes Q and QB are determined regardless of the data stored before the power source is shut down. Since the bistable circuit 30 has a symmetrical structure where inputs and outputs of the inverter 10 and the inverter 20 are coupled each other and symmetrically-operates in a condition that the pass gate 90 is conductive, once nodes Q and QB have the same potential after the power source is shut down, it is impossible to restore the data even though the power source is restored. This is because potentials of nodes Q and QB remain at the same potential and data is determined by external noise and the like at certain timing regardless of the data stored before the power source is shut down when the power source is restored.

A flash memory, an MRAM (Magnetic Random Access Memory), an FeRAM (Ferroelectric Random Access Memory), a PRAM (Phase-change Random Access Memory) and the like are known as a nonvolatile memory circuit where data is not lost even though a power source is shut down. Since data is not lost in these memory circuits even though a power source is shut down, the data can be read out when the power source is restored after that.

Patent Reference 1 discloses an MRAM where ferromagnetic tunnel junction devices are coupled to each of complementary nodes of a latch circuit.

[Patent Reference 1] Japanese Patent Application Publication No. 2006-19008

DISCLOSURE OF THE INVENTION

Problems to be Solved by the Invention

An SRAM can write and read data at high speed. On the other hand, a speed of writing and reading data of a flash memory, an MRAM, an FeRAM, a PRAM and the like is slow. As described above, an SRAM operates at high speed, but data is lost when a power source is shut down. On the other hand, a conventional nonvolatile memory holds data even though a power source is shut down, but has difficulties in a high-speed operation.

An SRAM consumes power because of a leak current during the data-holding-condition (standby condition) which is a condition that a data access is not in progress. If a nonvolatile SRAM can be fabricated, it is possible to achieve both the reduction of power consumption during the standby condition and high speed data-read/write operations.

In addition, as illustrated in FIG. 2, a latch circuit using a CMOS can write data at high speed, and output data by driving an output line at any time. On the other hand, a nonvolatile memory such as a flash memory, an MRAM, an FeRAM, a PRAM writes and reads data at low speed. Furthermore, an operation to extract data from a memory element to an external output line (a readout operation) is necessary. As described above, the latch circuit using CMOS has advantages of being able to operate at high speed and being able to drive the output line while a power source is supplied, but data is lost when the power source is shut down. On the other hand, a conventional nonvolatile memory holds data even though a power source is shut down, but has difficulties in a high-speed operation. Furthermore, an operation to extract data from a memory element to an external output line (a readout operation) is necessary.

The latch circuit consumes power because of a leak current during a data-holding-condition (standby condition) which is a condition that the pass gate 80 which is a data input gate is non-conductive. If a nonvolatile latch circuit can be fabricated, it is possible to achieve all advantages, that are a reduction of power consumption during the standby condition, a high speed data-write/read operation, and a capability of outputting data by driving the output line whenever a power source is supplied.

The present invention is made in views of above problems, and the aim of the present invention is to provide a memory circuit, a latch circuit, and a flip-flop circuit that can operate at high speed, and can read out data stored before a power source is shut down when the power source is restored after the power source is shut down.

Means for Solving the Problems

The present invention is a memory circuit that includes a bistable circuit that stores data; and a ferromagnetic tunnel junction device that nonvolatilely stores the data stored in the bistable circuit according to a magnetization direction of a ferromagnetic electrode free layer, the data nonvolatilely stored in the ferromagnetic tunnel junction device being able to be restored to the bistable circuit. According to the present invention, data writing to and data reading from the bistable circuit can be performed at high speed. In addition, even though a power source is shut down, data nonvolatilely stored in the ferromagnetic tunnel junction device can be restored to the bistable circuit. Even though a power source is recovered after a power source is shut down, it is possible to data stored before the power source is shut down can be read out. Therefore, power consumption of the memory circuit can be reduced by shutting down a power source in a standby condition.

In the above composition, the ferromagnetic tunnel junction device may change the magnetization direction of the ferromagnetic electrode free layer by a current-induced magnetization reversal method.

In the above composition, a first inverter circuit and a second inverter circuit may be coupled in a ring shape in the bistable circuit, and the ferromagnetic tunnel junction device may be coupled to a node to which the first inverter circuit and the second inverter circuit are coupled.

In the above composition, the ferromagnetic tunnel junction device may be coupled between the node and a control line, and become a high resistance as a current flows between the node and the control line, and become a low resistance as a current flows to a counter direction of the current. According to this composition, data can be stored in the ferromagnetic tunnel junction device.

In the above composition, the control line may apply a high level voltage to the ferromagnetic tunnel junction device and further apply a low level voltage when storing the data from the bistable circuit to the ferromagnetic tunnel junction device. According to this composition, data can be stored in the ferromagnetic tunnel junction device.

In the above composition, the control line may apply a low level or high level voltage to the ferromagnetic tunnel junction device when restoring the data from the ferromagnetic tunnel junction device to the bistable circuit. According to this composition, the data can be restored to the bistable circuit.

In the above composition, the memory circuit may include a switch that is coupled between the node and the ferromagnetic tunnel junction device, and that becomes conductive when storing the data from the bistable circuit to the ferromagnetic tunnel junction device or when restoring the data from the ferromagnetic tunnel junction device to the bistable circuit. According to this composition, power consumption can be reduced with the switch.

In the above composition, the switch may include a MOSFET. According to this composition, the switch can be composed easily.

In the above composition, the node may include a first node and a second node that are complementary nodes to one another, and the ferromagnetic tunnel junction device may include a first ferromagnetic tunnel junction device which is coupled between the first node and the control line, and a second ferromagnetic tunnel junction device which is coupled between the second node and the control line.

In the above composition, the memory circuit may include a first switch that is provided between the first node and the first ferromagnetic tunnel junction device, and that becomes conductive when storing the data from the bistable circuit to the first ferromagnetic tunnel junction device or when restoring the data from the first tunneling junction device to the bistable circuit; and a second switch that is provided between the second node and the second ferromagnetic tunnel junction device, and that becomes conductive when storing the data from the second ferromagnetic tunnel junction device to the bistable circuit or when restoring the data from the second ferromagnetic tunnel junction device to the bistable circuit. According to this composition, power consumption can be reduced with the first switch and the second switch.

In the above composition, the first switch and the second switch may include a MOSFET respectively. According to this composition, the first switch and the second switch can be composed easily.

In the above composition, the memory circuit may include a third switch that is coupled between the control line and an electric power line which is at a low level or at a high level, the third switch becoming non-conductive when storing the data from the bistable circuit to the first ferromagnetic tunnel junction device and the second ferromagnetic tunnel junction device, and becoming conductive when restoring the data from the first ferromagnetic tunnel junction device and the second ferromagnetic tunnel junction device to the bistable circuit. According to this composition, high-speed operations become possible.

In the above composition, the memory circuit may include an input/output switch for inputting and outputting data to the node.

In the above composition, the input/output switch may input and output data to the node according a level of a word line.

In the above composition, the input/output switch may include a first input/output switch for inputting and outputting data to the first node, and a second input/output switch for inputting and outputting data to the second node.

In the above composition, the first inverter circuit and the second inverter circuit may be inverter circuits.

In the above composition, the ferromagnetic tunnel junction device may include a ferromagnetic electrode free layer, a ferromagnetic electrode pinned layer, and a tunnel insulation film that is provided between the ferromagnetic electrode free layer and the ferromagnetic electrode pinned layer.

The present invention is a latch circuit that includes a bistable circuit that includes a first logic circuit having one or more inputs and one or more outputs and a second logic circuit having one or more inputs and one or more outputs, and stores data; a first node to which one of outputs of the first logic circuit and one of inputs of the second logic circuit are coupled; a second node to which one of outputs of the second logic circuit and one of inputs of the first logic circuit are coupled; and a ferromagnetic tunnel junction device that is coupled to at least one of the first node and the second node, and nonvolatilely stores data stored in the bistable circuit according to a magnetization direction of a ferromagnetic electrode free layer, complementary data to be stored being output from the first logic circuit and the second logic circuit to the first node and the second node respectively when storing the data from the bistable circuit to the ferromagnetic tunnel junction device, a signal that has the first logic circuit output a logic inversion of the second node to the first node being output to inputs except an input which is coupled to the second node of the first logic circuit, and a signal that has the second logic circuit output a logic inversion of the first node to the second node being output to inputs except an input which is coupled to the first node of the second logic circuit when restoring the data from the ferromagnetic tunnel junction device to the bistable circuit. According to the present invention, data writing to and data outputting to the bistable circuit can be performed at high speed, and the output line can be always driven while a power source is supplied. In addition, even though a power source is shut down, data nonvolatilely stored in the ferromagnetic tunnel junction device can be restored to the bistable circuit. Thus, even though a power source is recovered after the power source is shut down, data before the power source is shut down can be output. Therefore, in a standby condition, by shutting down a power source, power consumption of the latch circuit can be reduced.

The present invention is a latch circuit that includes a bistable circuit that stores data, and where a first inverter circuit and a second inverter circuit are coupled in a ring shape; a first node and a second node to which the first inverter circuit and the second inverter circuit are coupled, and that are a complementary node to one another; a first input switch for writing the data to the bistable circuit from an input line; a second input switch that behaves in a complementary style to the first input switch, and holds data of the bistable circuit; and a ferromagnetic tunnel junction device that nonvolatilely stores data stored in the bistable circuit according to a magnetization direction of a ferromagnetic electrode free layer, data nonvolatilely stored in the ferromagnetic tunnel junction device being able to restored to the bistable circuit. According to the present invention, data writing to and data outputting to the bistable circuit can be performed at high speed. In addition, even though a power source is shut down, data nonvolatilely stored in the ferromagnetic tunnel junction device can be restored to the bistable circuit. Thus, even though a power source is recovered after the power source is shut down, data before the power source is shut down can be output. Therefore, in a standby condition, by shutting down a power source, power consumption of the latch circuit can be reduced.

In the above composition, the ferromagnetic tunnel junction device may change the magnetization direction of the ferromagnetic electrode free layer by a current-induced magnetization reversal method.

In the above composition, the ferromagnetic tunnel junction device may be coupled to at least one node of the first node and the second node.

In the above composition, the ferromagnetic tunnel junction device may be coupled between the at least one node and a control line, become a high resistance as a current flows between the at least one node and the control line, and become a low resistance as a current flows to a counter direction of the current. According to this composition, data can be stored to the ferromagnetic tunnel junction device.

In the above composition, the control line may apply a high level voltage to the ferromagnetic tunnel junction device, and further apply a low level voltage when storing the data from the bistable circuit to the ferromagnetic tunnel junction device. According to this composition, data can be stored to the ferromagnetic tunnel junction device.

In the above composition, the control line may apply a low level or high level voltage to the ferromagnetic tunnel junction device when restoring the data from the ferromagnetic tunnel junction device to the bistable circuit. According to this composition, data can be restored to the bistable circuit.

In the above composition, the latch circuit may include a switch that is coupled between the at least one node and the ferromagnetic tunnel junction device, and becomes conductive when storing the data from the bistable circuit to the ferromagnetic tunnel junction device or when restoring the data from the ferromagnetic tunnel junction device to the bistable circuit. According to this composition, power consumption can be reduced with the switch.

In the above composition, the switch may include a MOSFET. According to this composition, the switch is easily composed.

In the above composition, the ferromagnetic tunnel junction device may include a first ferromagnetic tunnel junction device that is coupled between the first node and the control line, and a second ferromagnetic tunnel junction device that is coupled between the second node and the control line. According to this composition, more stable operations are achieved with the first ferromagnetic tunnel junction device and the second ferromagnetic tunnel junction device.

In the above composition, the latch circuit may include a first switch that is provided between the first node and the first ferromagnetic tunnel junction device, and becomes conductive when storing the data from the bistable circuit to the first ferromagnetic tunnel junction device or when restoring the data from the first ferromagnetic tunnel junction device to the bistable circuit; and a second switch that is provided between the second node and the second ferromagnetic tunnel junction device, and becomes conductive when storing the data to the second ferromagnetic tunnel junction device or when restoring the data to the bistable circuit. According to this composition, power consumption is reduced by the first switch and the second switch.

In the above composition, the first switch and the second switch may include a MOSFET respectively. According to this composition, the first switch and the second switch are easily composed.

In the above composition, the latch circuit may include a third switch that is coupled between the control line and an electric power line which is at a low level or at a high level, the third switch becoming non-conductive when storing the data from the bistable circuit to the first ferromagnetic tunnel junction device and the second ferromagnetic tunnel junction device, and becoming conductive when restoring the data from the first ferromagnetic tunnel junction device and the second ferromagnetic tunnel junction device to the bistable circuit. According to this composition, high-speed operations can be achieved.

In the above composition, the ferromagnetic tunnel junction device may include a ferromagnetic electrode free layer, a ferromagnetic electrode pinned layer, and a tunnel insulation film provided between the ferromagnetic electrode free layer and the ferromagnetic electrode pinned layer.

Effects of the Invention

According to the present invention, it is possible to write data in and read out data from the bistable circuit at high speed. In addition, even though a power source is shut down, it is possible to restore data nonvolatilely stored in a ferromagnetic tunnel junction device to the bistable circuit. Therefore, it becomes possible to read out data stored before a power source is shut down even though the power source is restored after the power source is shut down.

BRIEF DESCRIPTION OF THE DRAWINGS

FIG. 15 is a timing diagram of a second embodiment;
FIG. 17A through FIG. 17D are diagrams illustrating simulation results of the second embodiment;
FIG. 19A through FIG. 19D are diagrams (No. 1) illustrating simulation results of the third embodiment;
FIG. 26 is a timing diagram of the eighth embodiment;
FIG. 27A through FIG. 27D are diagrams illustrating simulation results of the eighth embodiment;
FIG. 29A through FIG. 29D are diagrams illustrating simulation results of the ninth embodiment;
FIG. 42 is a timing diagram of the thirteenth embodiment;
FIG. 46A through FIG. 46D are diagrams (No. 1) illustrating simulation results of the fourteenth embodiment.

FIG. 54A through FIG. 54D are diagrams illustrating simulation results of the nineteenth embodiment;

FIG. 56A through FIG. 56D are diagrams illustrating simulation results of the twentieth embodiment;

BEST MODES FOR CARRYING OUT THE INVENTION

A description will now be given, with reference to drawings, of embodiments of the present invention.

First Embodiment

Figure 1:
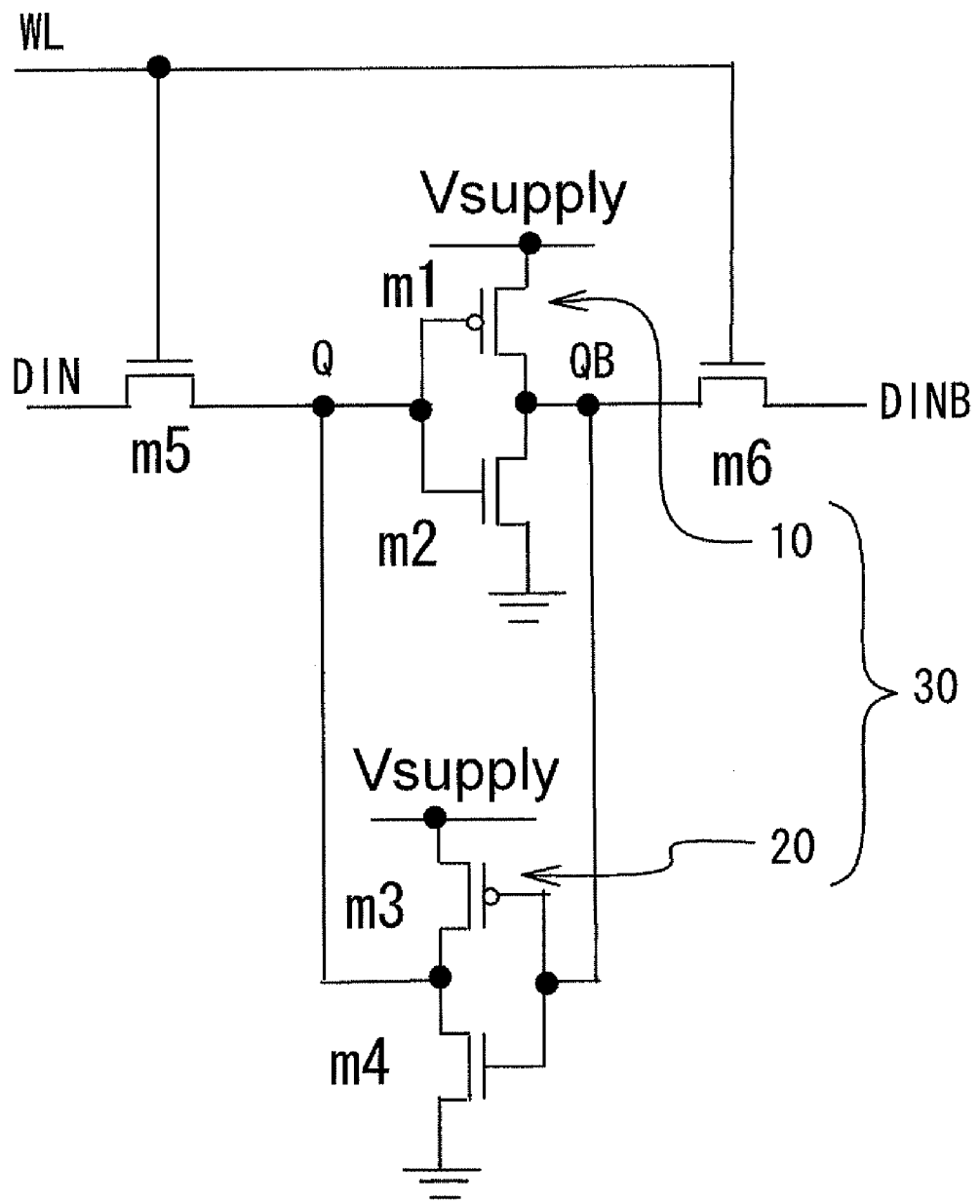
FIG. 1 is a circuit diagram of a memory circuit used for an SRAM.
Figure 3:
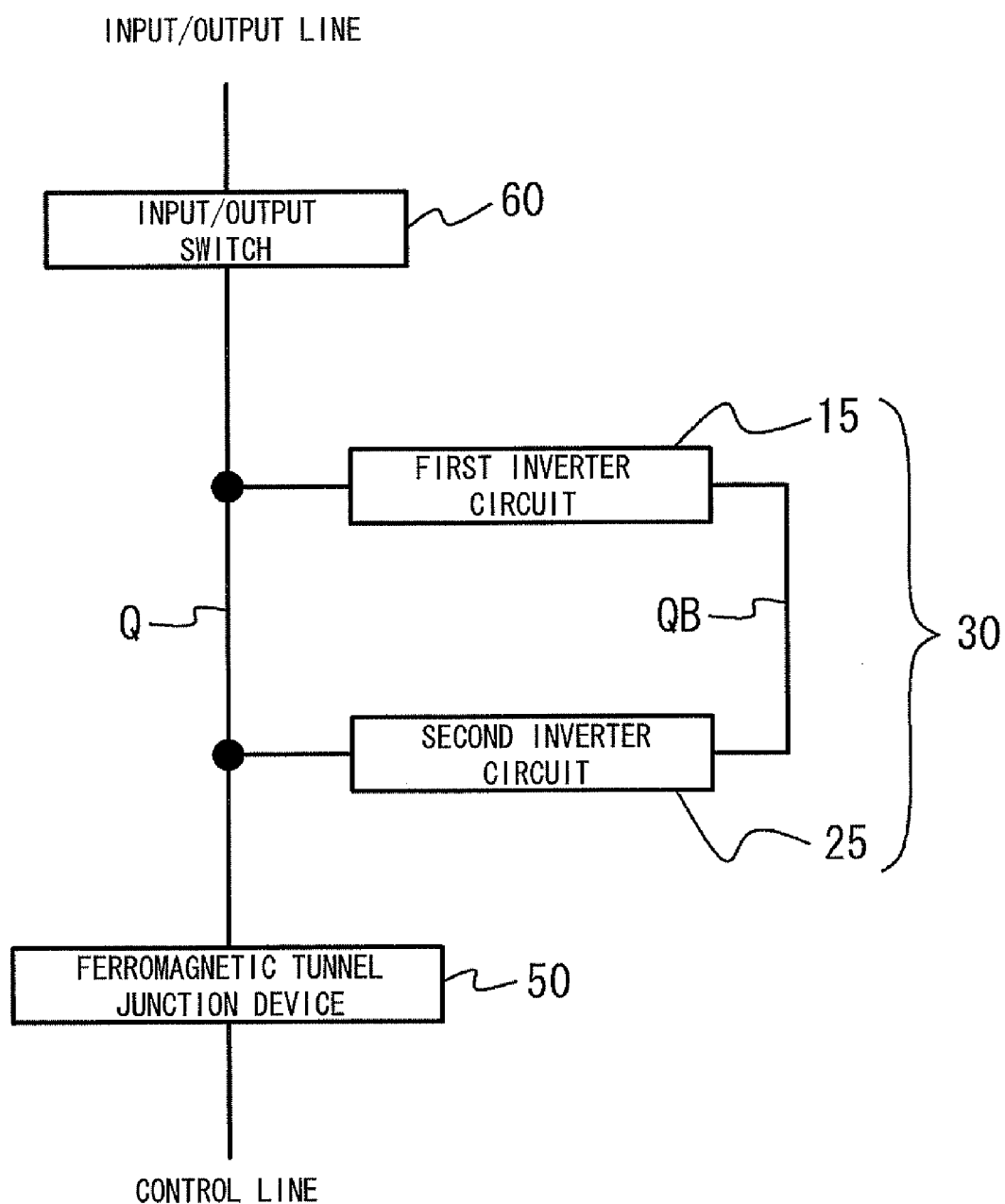
FIG. 3 is a block diagram of a memory circuit in accordance with a first embodiment.

FIG. 3 is a block diagram of a memory circuit in accordance with the first embodiment to explain a principle of the present invention. The memory circuit in accordance with the first embodiment includes a first inverter circuit 15, a second inverter circuit 25, a ferromagnetic tunnel junction (MTJ) device 50, and an input/output switch 60. The first inverter circuit 15 and the second inverter circuit 25 are coupled in a ring shape, and compose a bistable circuit 30. The first inverter circuit 15 and the second inverter circuit 25 are inverters 10 and 20 in FIG. 1 for example. Nodes to which the first inverter circuit 15 and the second inverter circuit 25 are coupled are nodes Q, and QB respectively. The node Q and the node QB are a complementary node to one another, and the state of the bistable circuit 30 becomes stable when the node Q and the node QB are at a high level and at a low level respectively, or when the node Q and the node QB are at a low level and at a high level respectively. When the state of the bistable circuit 30 becomes stable, the bistable circuit 30 can store data. The ferromagnetic tunnel junction device 50 nonvolatilely stores data stored in the bistable circuit 30 according to a magnetization direction of a ferromagnetic electrode free layer. Data which is nonvolatilely stored in the ferromagnetic tunnel junction device 50 can be restored to the bistable circuit 30. the input/output switch 60 connects or disconnects the input/output line and the node Q. Data of the input/output line can be stored in the bistable circuit 30 with the connection by the input/output switch 60. In addition, data of the bistable circuit 30 can be read out to the input/output line.

According to the first embodiment, data can be written in or read out from the bistable circuit 30 at about the same high speed as a circuit which does not include the ferromagnetic tunnel junction device 50. The ferromagnetic tunnel junction device 50 nonvolatilely stores data stored in the bistable circuit 30. This makes it possible to restore data which is nonvolatilely stored in the ferromagnetic tunnel junction device 50 to the bistable circuit 30 even though a power source is shut down. Thus, when the power source is restored after the power source is shut down, the data stored before the power source is shut down can be read out.

Figure 4A:
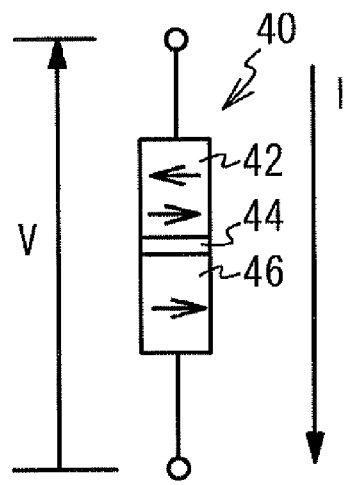
FIG. 4A through FIG. 4C are diagrams to describe a ferromagnetic tunnel junction device.

FIG. 4A is a diagram illustrating an example of a ferromagnetic tunnel junction device. A ferromagnetic tunnel junction device 40 includes a ferromagnetic electrode free layer 42, a ferromagnetic electrode pinned layer 46, and a tunnel insulation film 44 located between the ferromagnetic electrode free layer 42 and the ferromagnetic electrode pinned layer 46. The ferromagnetic electrode free layer 42 and the ferromagnetic electrode pinned layer 46 are composed of a ferromagnetic metal, a half-metallic ferromagnet, or a ferromagnetic semiconductor. A magnetization direction of the ferromagnetic electrode free layer 42 is changeable. On the other hand, the magnetization direction is pinned in the ferromagnetic electrode pinned layer 46. A state that magnetization directions of the ferromagnetic electrode free layer 42 and the ferromagnetic electrode pinned layer 46 are parallel is described as a parallel magnetization, and a state of anti-parallel is described as an anti-parallel magnetization.

Figure 4B:
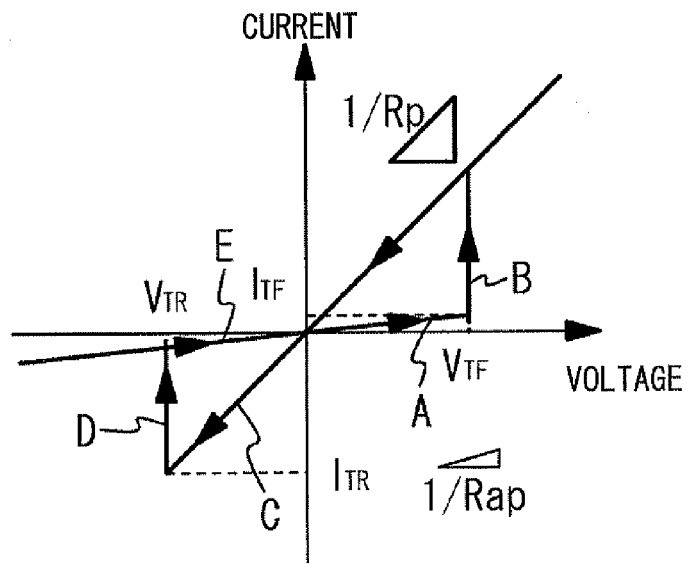
Figure 4C:
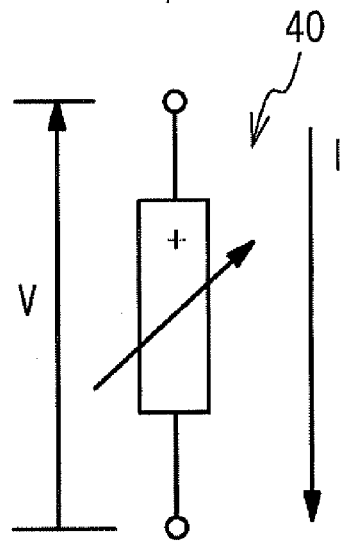

FIG. 4B is a diagram illustrating current-voltage characteristics of the ferromagnetic tunnel junction device 40. As illustrated in FIG. 4A, a voltage applied to the ferromagnetic electrode free layer 42 with reference to the ferromagnetic electrode pinned layer 46 is defined as V, and a current flowing from the ferromagnetic electrode free layer 42 to the ferromagnetic electrode pinned layer 46 is defined as I. Symbols of the ferromagnetic tunnel junction device 40 at this time are defined as illustrated in FIG. 4C. Referring to FIG. 4B, a resistance Rp of the ferromagnetic tunnel junction device 40 in a parallel magnetization state becomes smaller than a resistance Rap of the ferromagnetic tunnel junction device 40 in an anti-parallel magnetization state. Generally, Rp and Rap are functions of a voltage applied to the ferromagnetic tunnel junction, but hereinafter are treated as a resistance value of which is approximately constant. Even when Rp and Rap are not constant resistances, discussions described later are applicable in the same manner. In an anti-parallel magnetization state, when the voltage V applied to the ferromagnetic tunnel junction device 40 becomes large, the current I becomes large with at a slope of a inverse of a resistance Rap (A in FIG. 4B). When the current I exceeds a threshold current $I_{TF}$, the magnetization of the ferromagnetic electrode free layer 42 is inverted by majority-spin electrons of the ferromagnetic electrode pinned layer 46 injected from the ferromagnetic electrode pinned layer 46 to the ferromagnetic electrode free layer 42, and a parallel magnetization state is achieved (B in FIG. 4B). This makes a resistance of the ferromagnetic tunnel junction device 40 Rp. On the other hand, when a negative current I flows in a parallel magnetization state (C in FIG. 4B) and exceeds a threshold current $I_{TR}$ to a negative side, minority-spin electrons of the ferromagnetic electrode free layer 42 of electrons injected from the ferromagnetic electrode free layer 42 to the ferromagnetic electrode pinned layer 46 are reflected by the ferromagnetic electrode pinned layer 46. This makes the magnetization of the ferromagnetic electrode free layer 42 inverted, and an anti-parallel magnetization state is achieved (D in FIG. 4B).

As described above, a method of inverting the magnetization direction of the ferromagnetic electrode free layer the magnetization direction of which is changed by the injection of spin-polarized electrons is called as a current-induced magnetization reversal method. The current-induced magnetization reversal method has possibility to reduce power consumption needed for changing a magnetization direction compared to a method to change a magnetization direction by generating magnetic field. In addition, compared to the method to change the magnetization direction by generating magnetic field, the current-induced magnetization reversal method is insusceptible to a disturb which causes accidental writing and accidental erasure to a cell other than selected cell, and is suitable for high density integration because a problem of stray magnetic field does not exist.

Second Embodiment

Figure 5:
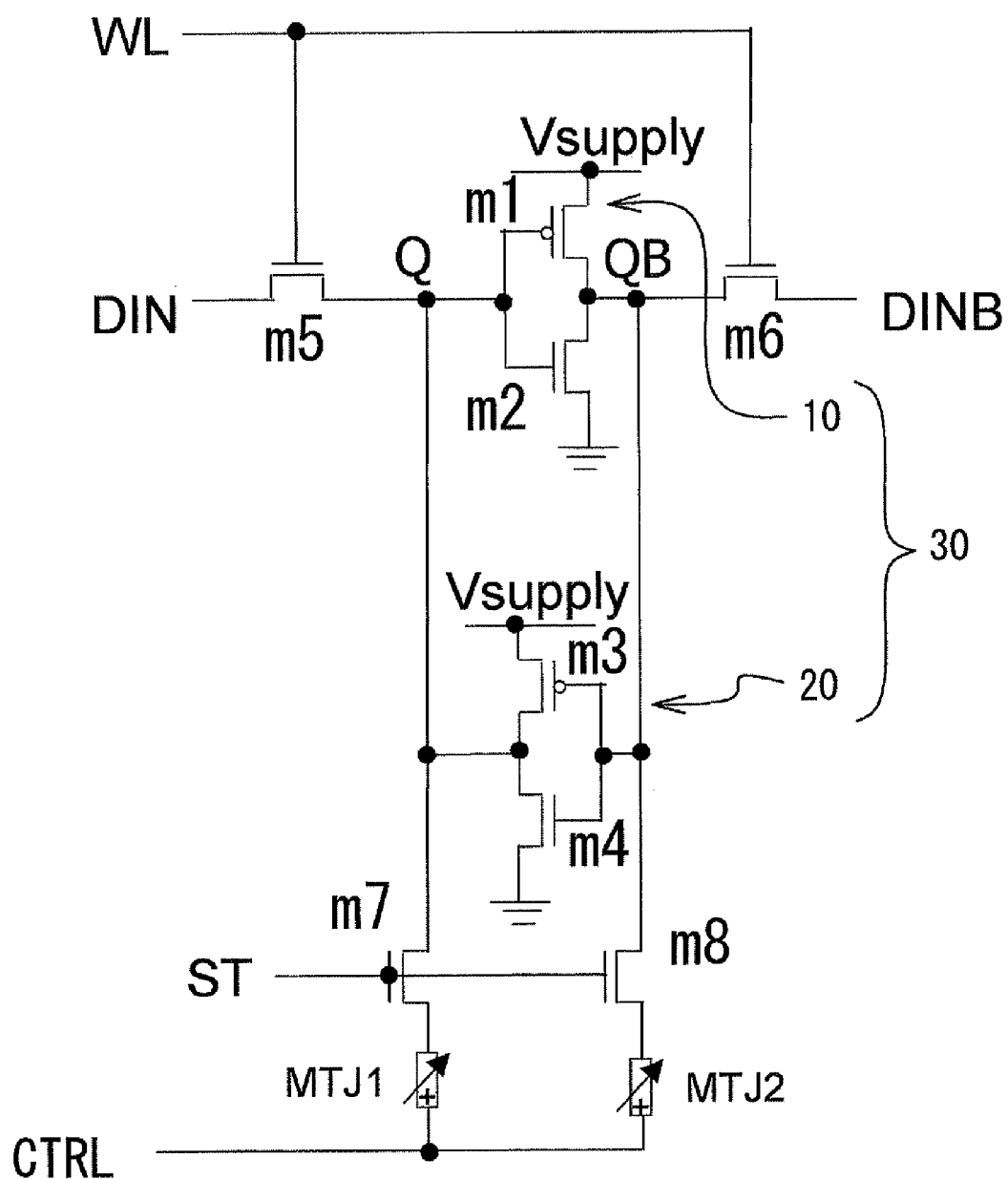
FIG. 5 is a circuit diagram of a memory circuit in accordance with a second embodiment.

FIG. 5 is a circuit diagram of a memory circuit in accordance with the second embodiment. Referring to FIG. 5, the memory circuit in accordance with the second embodiment includes n-type FETs m7 and m8, and ferromagnetic tunnel junction devices MTJ1 and MTJ2 in addition to the SRAM cell in FIG. 1. The FET m7 and the ferromagnetic tunnel junction device MTJ1 are coupled between the node Q and the control line CTRL, and the FET m8 and the ferromagnetic tunnel junction device MTJ2 is coupled between the node QB and the control line CTRL. Gates of FETs m7 and m8 are coupled to the switch line ST.

A description will now be given of a behavior of the memory circuit in accordance with the second embodiment. Writing data to and reading data from the bistable circuit 30 are performed in the same way as a conventional SRAM. That is to say that by setting the word line WL to a high level, and making FETs m5 and m6 conductive, data of the input/output lines DIN and DINB are written in the bistable circuit 30. In addition, by making input/output lines DIN and DINB an equipotential floating condition, setting the word line WL to a high level, and making FETs m5 and m6 conductive, data in the bistable circuit 30 can be read out to input/output lines DIN and DINB. By making FETs m5 and m6 non-conductive, data in the bistable circuit 30 is held. When writing, reading, and holding data to/from/in the bistable circuit 30, it is preferable that the switch line ST is at a low level, and FETs m7 and m8 are non-conductive. This can suppress the current between nodes Q and QB and the control line CTRL, and reduce power consumption.

Figure 6A:
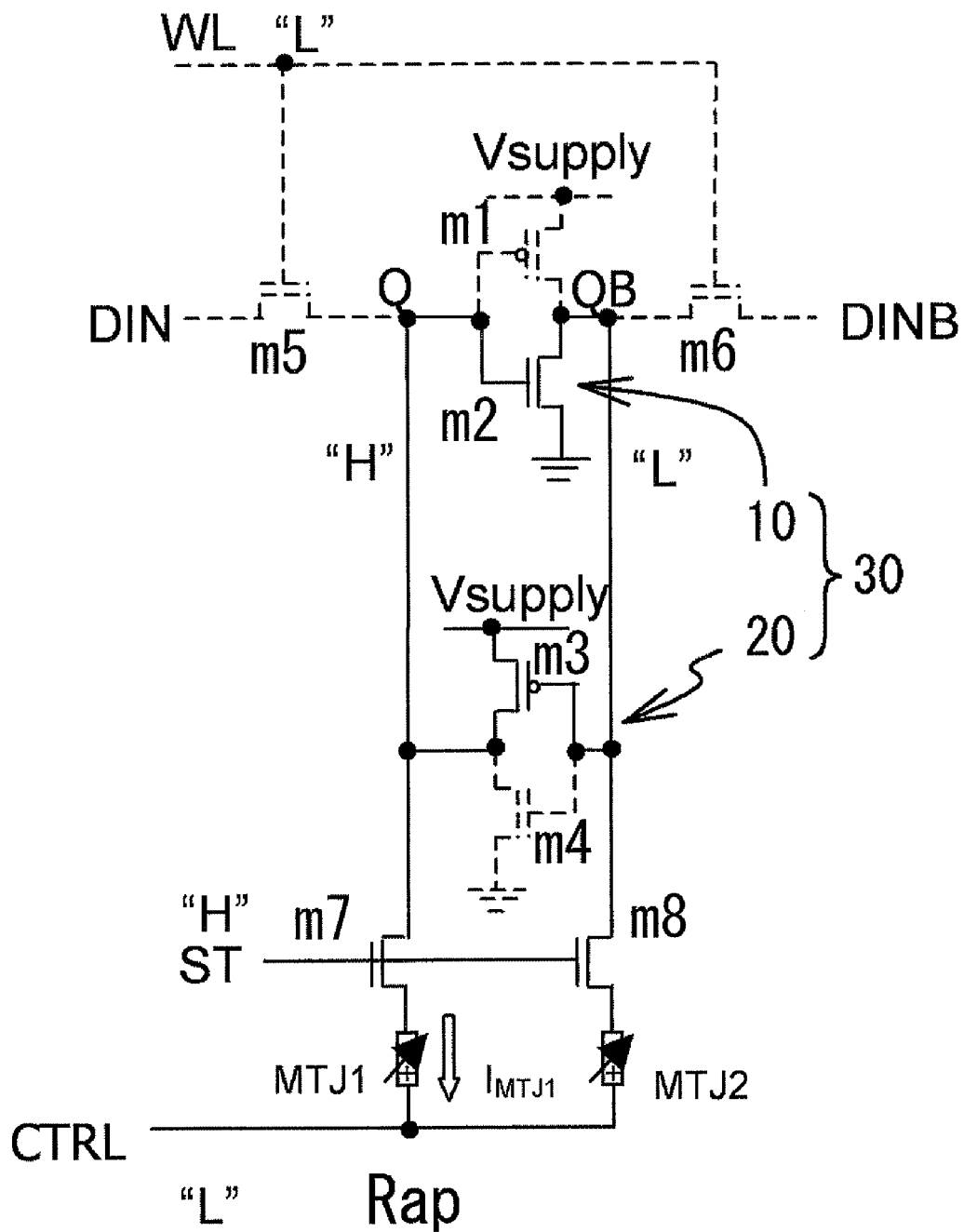
FIG. 6A and FIG. 6B are diagrams (No. 1) to describe a data store.
Figure 6B:
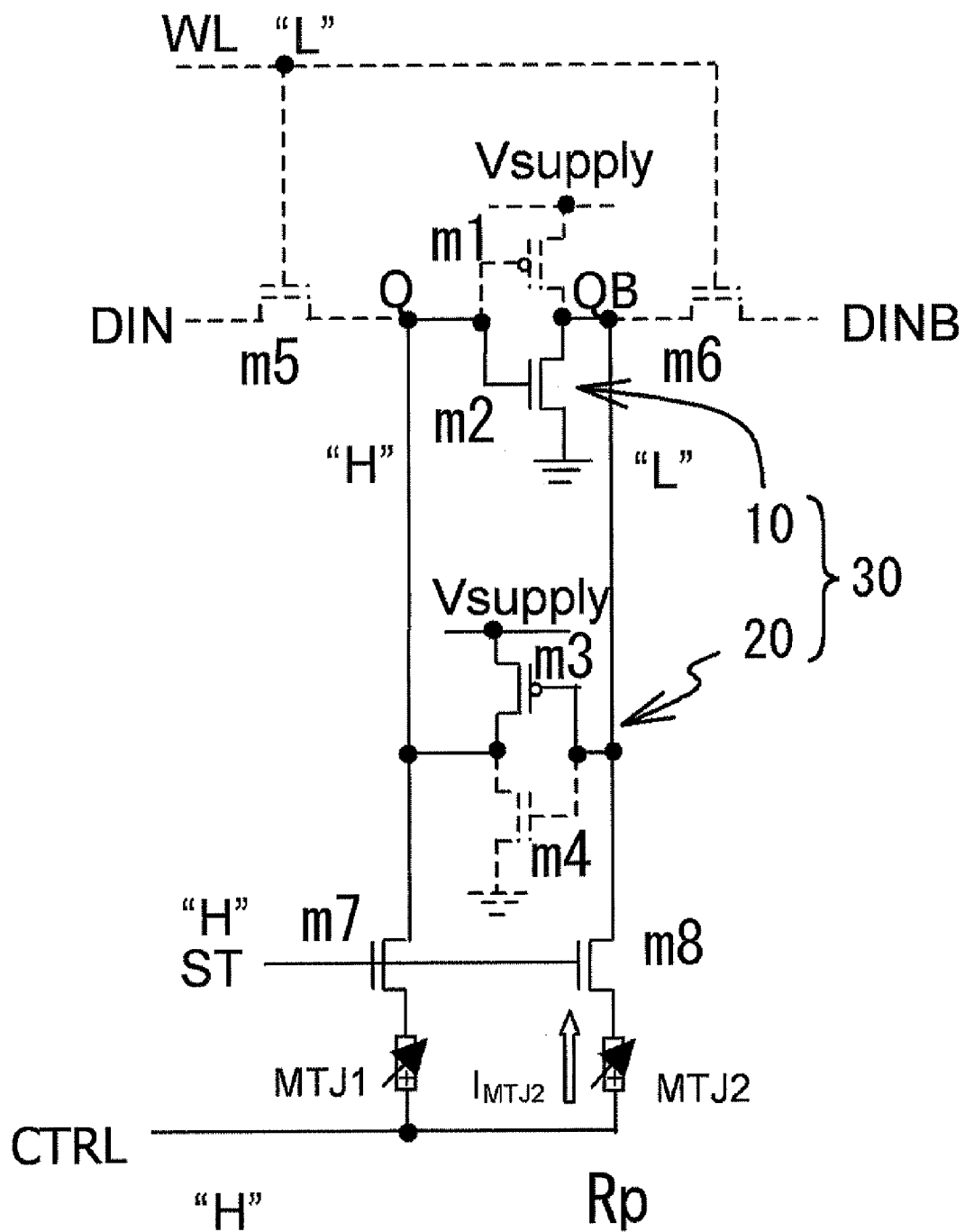

A description will now be given of a method to nonvolatilely store the data stored in the bistable circuit to ferromagnetic tunnel junction devices MTJ1 and MTJ2. A description will be given of the case that data where the node Q is at a high level "H" and the node QB is at a low level "L" is held first. Hereinafter, in circuit diagrams of FIGS. 6A and 6B, FIGS. 7A and 7B, FIGS. 9A through 9C, and FIGS. 11A through 11C, conductive FETs and the like are illustrated with a solid line, and non-conductive FETs and the like are illustrated with a dashed line. Referring to FIG. 6A and FIG. 6B, the word line WL is at a low level. This makes FETs m5 and m6 non-conductive, and data is held in the bistable circuit 30. Referring to FIG. 6A, the switch line ST is at a high level and the control line CTRL is at a low level. The current $I_{MTJ1}$ flows from the node Q to the control line CTRL via the FET m7. If the current $I_{MTJ1}$ is set to exceed the threshold current $I_{TR}$, a resistance of the ferromagnetic tunnel junction device MTJ1 results in a high resistance Rap. Since the node QB is at a low level, a current doesn't flow in the ferromagnetic tunnel junction device MTJ2. Referring to FIG. 6B, the switch line ST is at a high level and the control line CTRL is at a high level. A current $I_{MTJ2}$ flows from the control line CTRL to the node QB. If the current $I_{MTJ2}$ is set to exceed the threshold current $I_{TF}$, a resistance of the ferromagnetic tunnel junction device MTJ2 results in a low resistance Rp. Since the node Q is at a high level, a current doesn't flow in the ferromagnetic tunnel junction device MTJ1. When a sequence of operations described above is completed, a resistance of the ferromagnetic tunnel junction device MTJ1 results in a high resistance Rap, and a resistance of the ferromagnetic tunnel junction device MTJ2 results in a low resistance Rp. Any steps in FIG. 6A and FIG. 6B can be performed first.

Figure 7A:
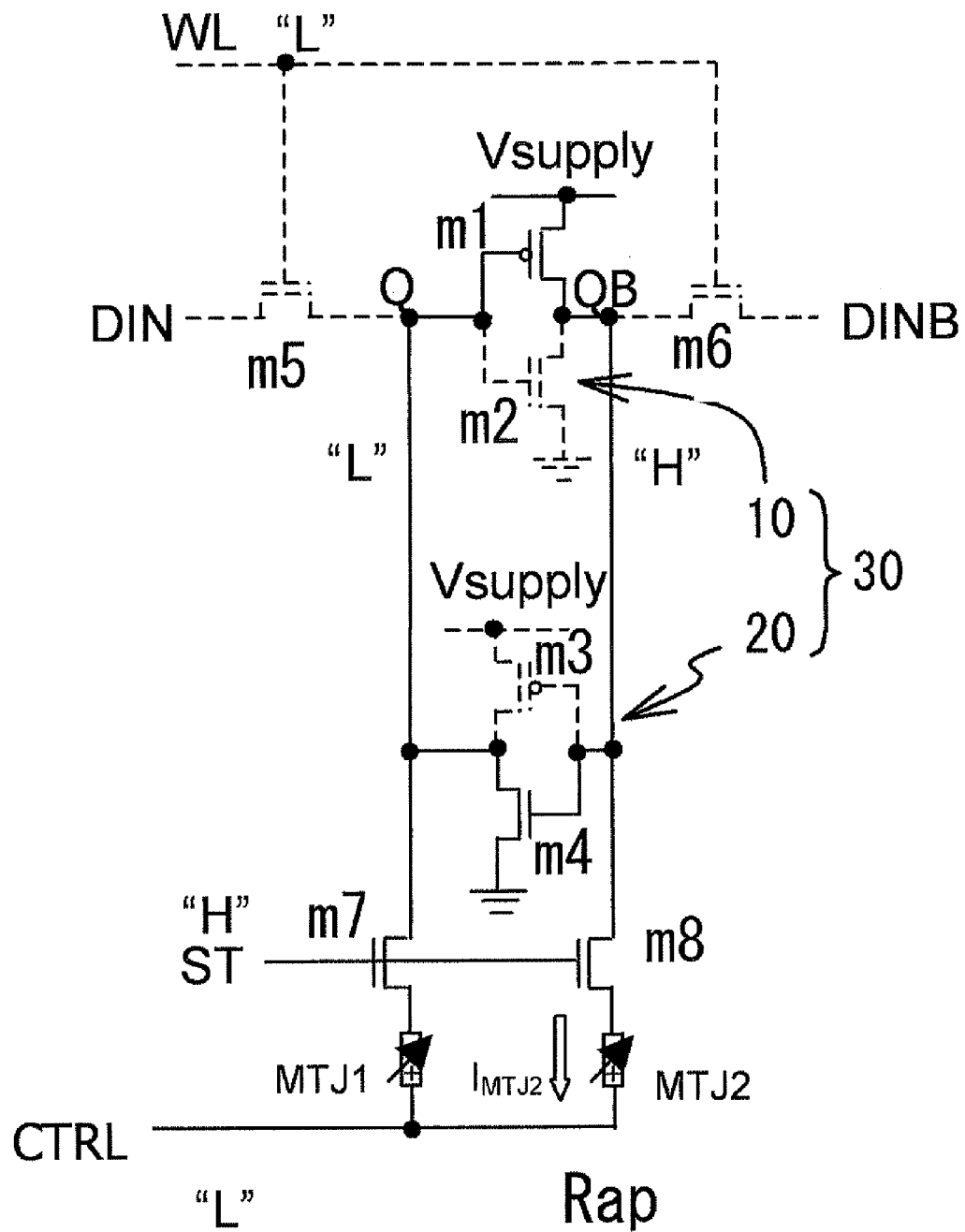
FIG. 7A and FIG. 7B are diagrams (No. 2) to describe a data store.
Figure 7B:
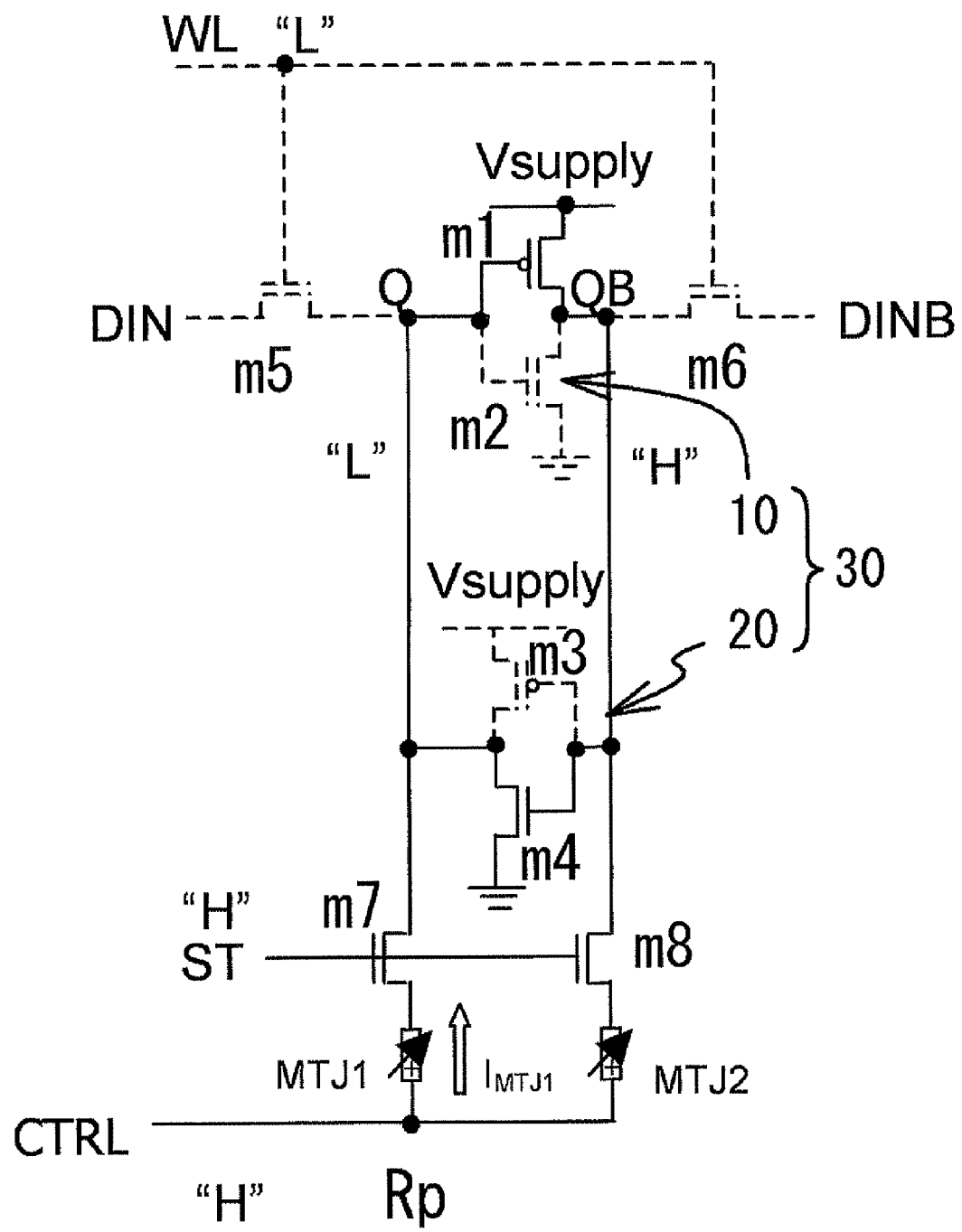

Referring to FIG. 7A and FIG. 7B, a description will be given of the case that data where the node Q is at a low level and the node QB is at a high level is held. Referring to FIG. 7A, when the switch line ST is at a high level and the control line CTRL is at a low level, the ferromagnetic tunnel junction device MTJ2 results in a high resistance Rap because a current $I_{MTJ2}$ flows from the node QB to the control line CTRL. Since the node Q is at a low level, a current does not flow in the ferromagnetic tunnel junction device MTJ1. Referring to FIG. 7B, when the switch line ST is at a high level and the control line CTRL is at a high level, the ferromagnetic tunnel junction device MTJ1 results in a low resistance Rp because a current $I_{MTJ1}$ flows from the control line CTRL to the node Q. Since the node QB is at a high level, a current does not flow in the ferromagnetic tunnel junction device MTJ2. When a sequence of operations is completed, the resistance of the ferromagnetic tunnel junction device MTJ1 results in a low resistance Rp, and the resistance of the ferromagnetic tunnel junction device MTJ2 results in a high resistance Rap. As described above, data in the bistable circuit 30 can be nonvolatilely stored in ferromagnetic tunnel junction devices MTJ1 and MTJ2.

Figure 8:
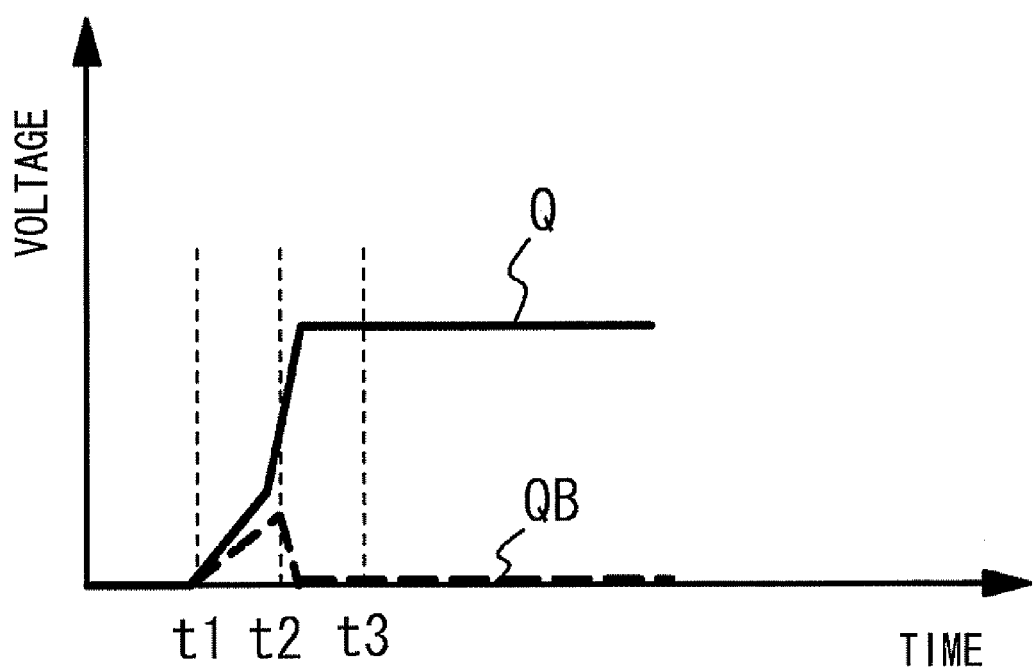
FIG. 8 is a diagram (No. 1) to describe a data restoration.
Figure 9A:
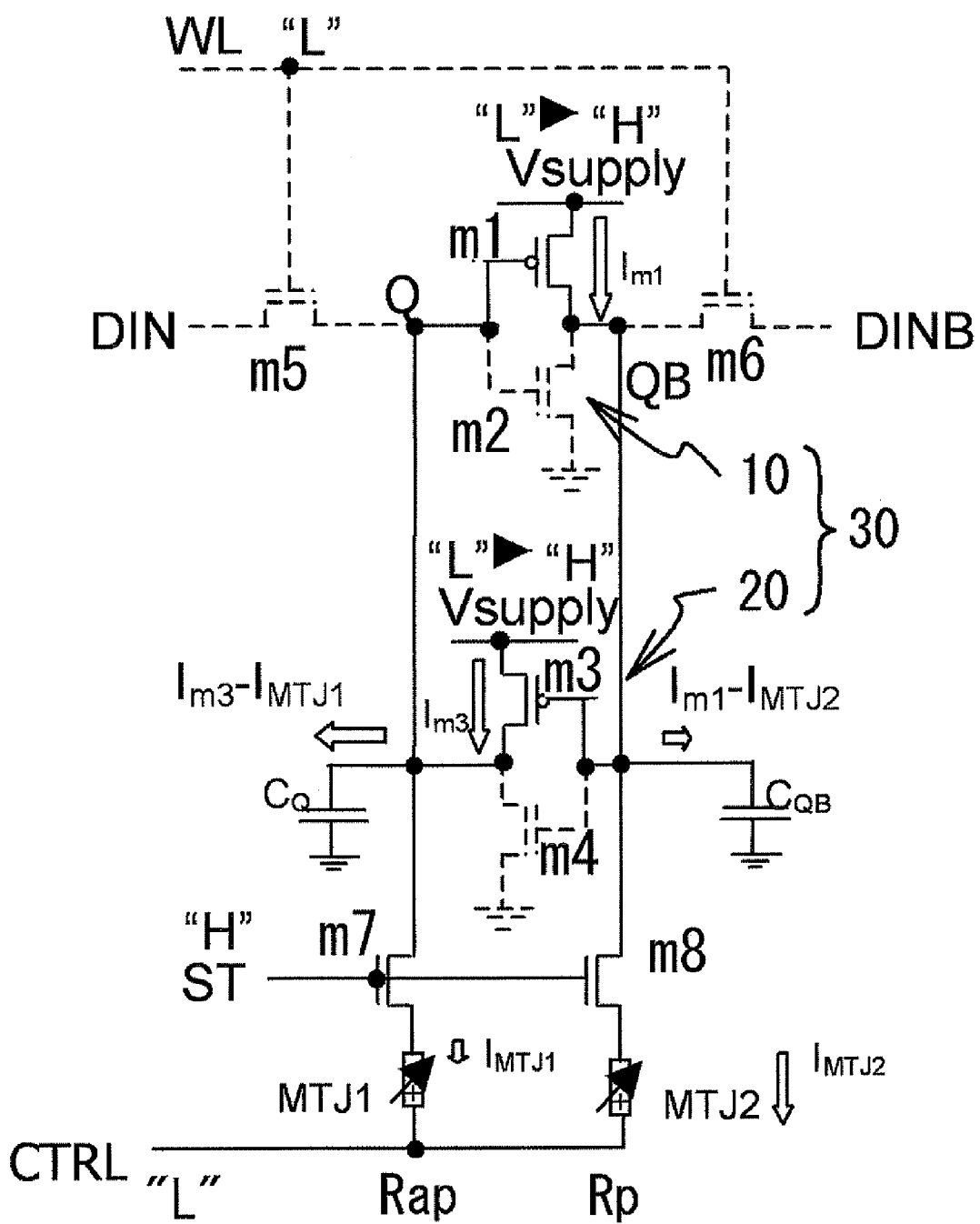
FIG. 9A through FIG. 9C are diagrams (No. 2) to describe a data restoration.
Figure 9B:
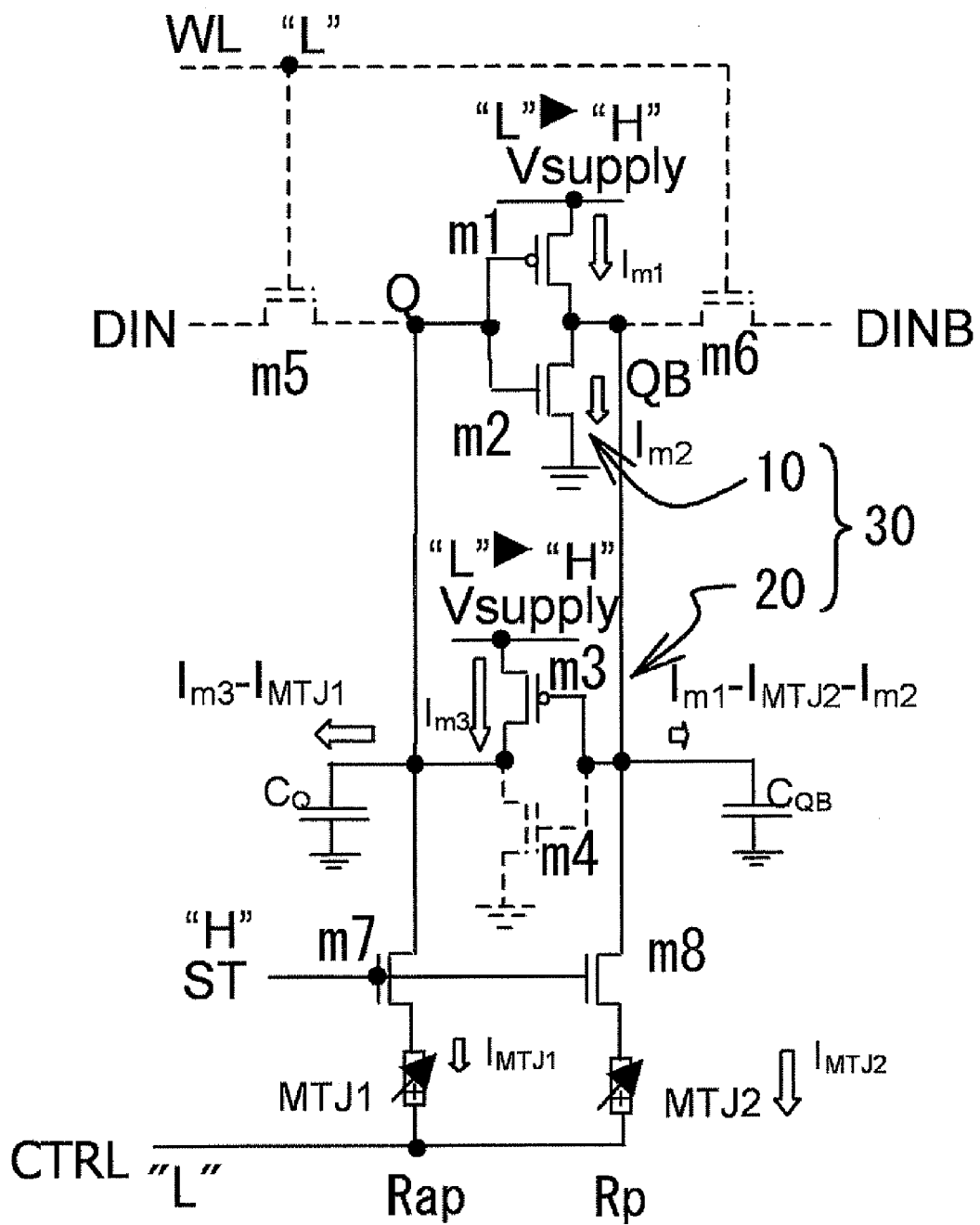
Figure 9C:
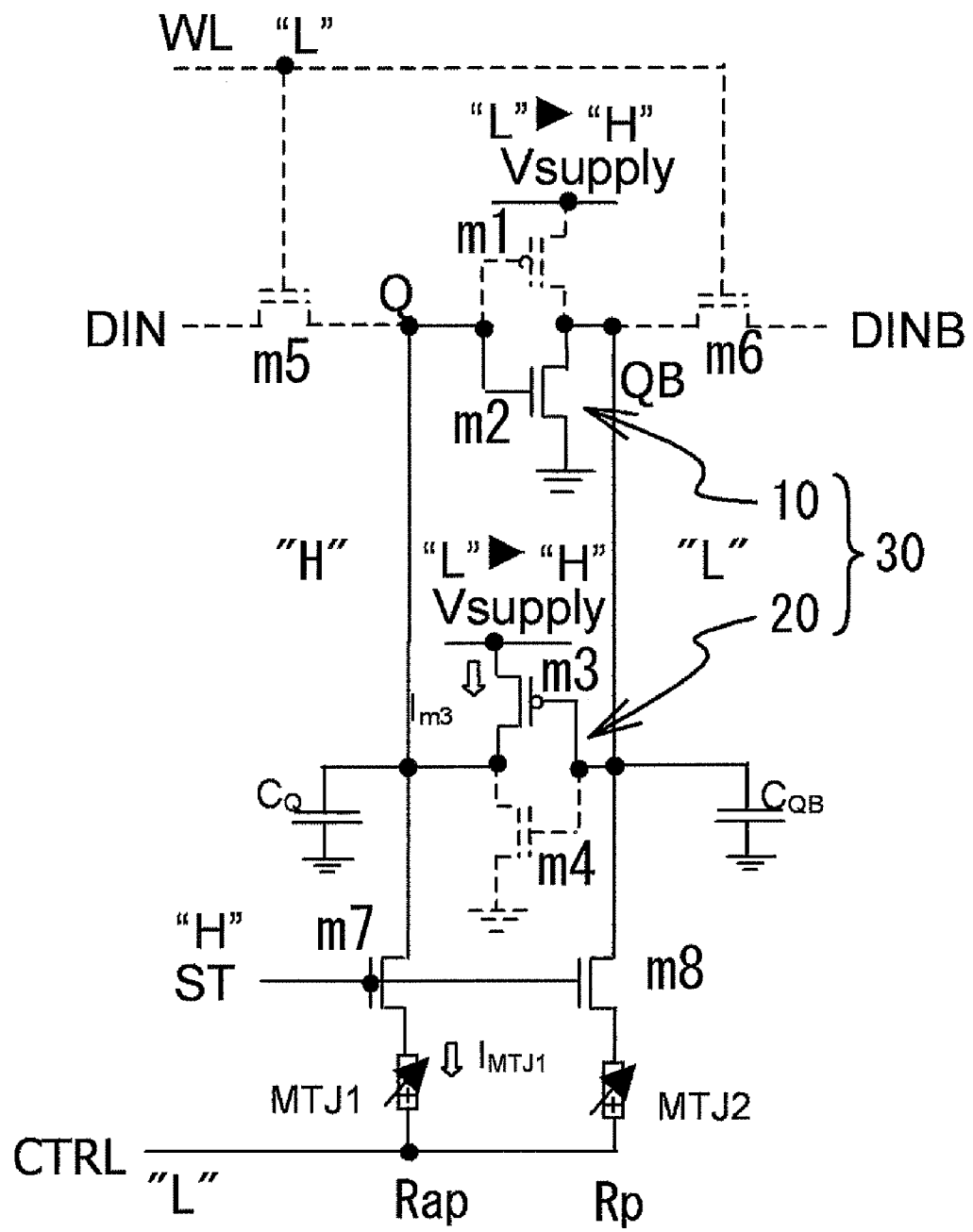

Even when a power source Vsupply is shut down and data in the bistable circuit 30 is lost, resistances of ferromagnetic tunnel junction devices MTJ1 and MTJ2 are held nonvolatilely. A description will now be given of a method of restoring data from ferromagnetic tunnel junction devices MTJ1 and MTJ2 to the bistable circuit 30 after that. FIG. 8 is a diagram illustrating voltages of nodes Q and QB in time for a data restoration to the bistable circuit 30. FIG. 9A through 9C are diagrams to explain conditions of the memory circuit at times t1 through t3 in FIG. 8 respectively. In FIG. 9A through FIG. 9C, capacitors $C_Q$ and $C_{QB}$ are coupled to nodes Q and QB respectively. Capacitors $C_Q$ and $C_{QB}$ are a wiring capacitor or a parasitic capacitor for example.

Referring to FIG. 9A, ferromagnetic tunnel junction devices MTJ1 and MTJ2 are a high resistance Rap and a low resistance Rp respectively. The switch line ST is at a high level at the time t1. A power source voltage is raised to a high level from a low level. Since nodes Q and QB are at a low level, currents $I_{m1}$ and $I_{m3}$ flow from a power source Vsupply to nodes Q and QB via FETs m1 and m3 in inverters 10, and 20 respectively. Since the ferromagnetic tunnel junction device MTJ1 is a high resistance Rap, a current $I_{MTJ1}$ flowing from the node Q to the control line CTRL which is at a low level is small. Since the ferromagnetic tunnel junction device MTJ2 is a low resistance Rp, a current $I_{MTJ2}$ flowing from the node QB to the control line CTRL which is at a low level is large.

Voltages $V_Q$ and $V_{QB}$ of nodes Q and QB are expressed by following formulas.

$$V_Q = \int (I_{m3} - I_{m4} - I_{MTJ1})/dt/C_Q \qquad \text{formula 1}$$

$$V_{QB} = \int (I_{m1} - I_{m2} - I_{MTJ2})/dt/C_{QB} \qquad \text{formula 2}$$

In addition, a relation of magnitude of each current is expressed as follows.

$$I_{m1} - I_{m3} \gg I_{m2} = I_{m4} \qquad \text{formula 3}$$

$$I_{MTJ1} < I_{MTJ2} \qquad \text{formula 4}$$

In addition, capacitances $C_Q$ and $C_{QB}$ of capacitors $C_Q$ and $C_{QB}$ are expressed as follows.

$$C_Q = C_{QB} \quad \text{formula 5}$$

Accordingly, a current charging a capacitor $C_Q$ from the node Q is $I_{m3} - I_{MTJ1}$, and a current charging a capacitor $C_{QB}$ from the node QB is $I_{m1} - I_{MTJ2}$.
Therefore, $$V_Q > V_{QB},$$

is obtained.

Accordingly, both voltages $V_Q$ and $V_{QB}$ increase between the time t1 and the time t2 in FIG. 8, but $V_Q$ is larger than $V_{QB}$.

Referring to FIG. 9B, when $V_Q$ becomes higher than a threshold voltage of the FET m2 composing the inverter 10 at the time t2 in FIG. 8, the FET m2 becomes conductive, and a current $I_{m2}$ flows in the FET m2. A current charging the capacitor $C_{QB}$ becomes $I_{m1} - M_{MTJ2} - I_{m2}$. If a current $I_{m2}$ becomes large, the capacitor $C_{QB}$ discharges, and a voltage of the node QB becomes zero.

Referring to FIG. 9C, when a steady state is achieved at the time t3 in FIG. 8, $I_{m3}$ becomes equal to $I_{MTJ1}$, the capacitor $C_Q$ comes to a charged condition, and the capacitor $C_{QB}$ comes to a discharged condition. This makes the node Q at a high level, and the node QB at a low level, and a data restoration to the bistable circuit 30 from ferromagnetic tunnel junction devices MTJ1 and MTJ2 is completed.

Figure 10:
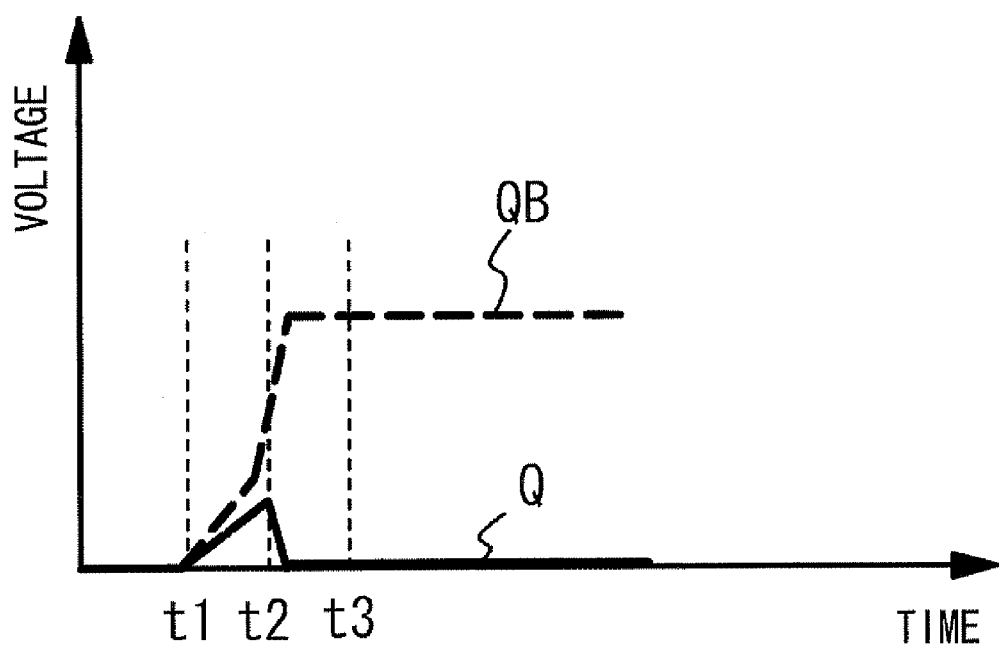
FIG. 10 is a diagram (NO. 3) to describe a data restoration.
Figure 11A:
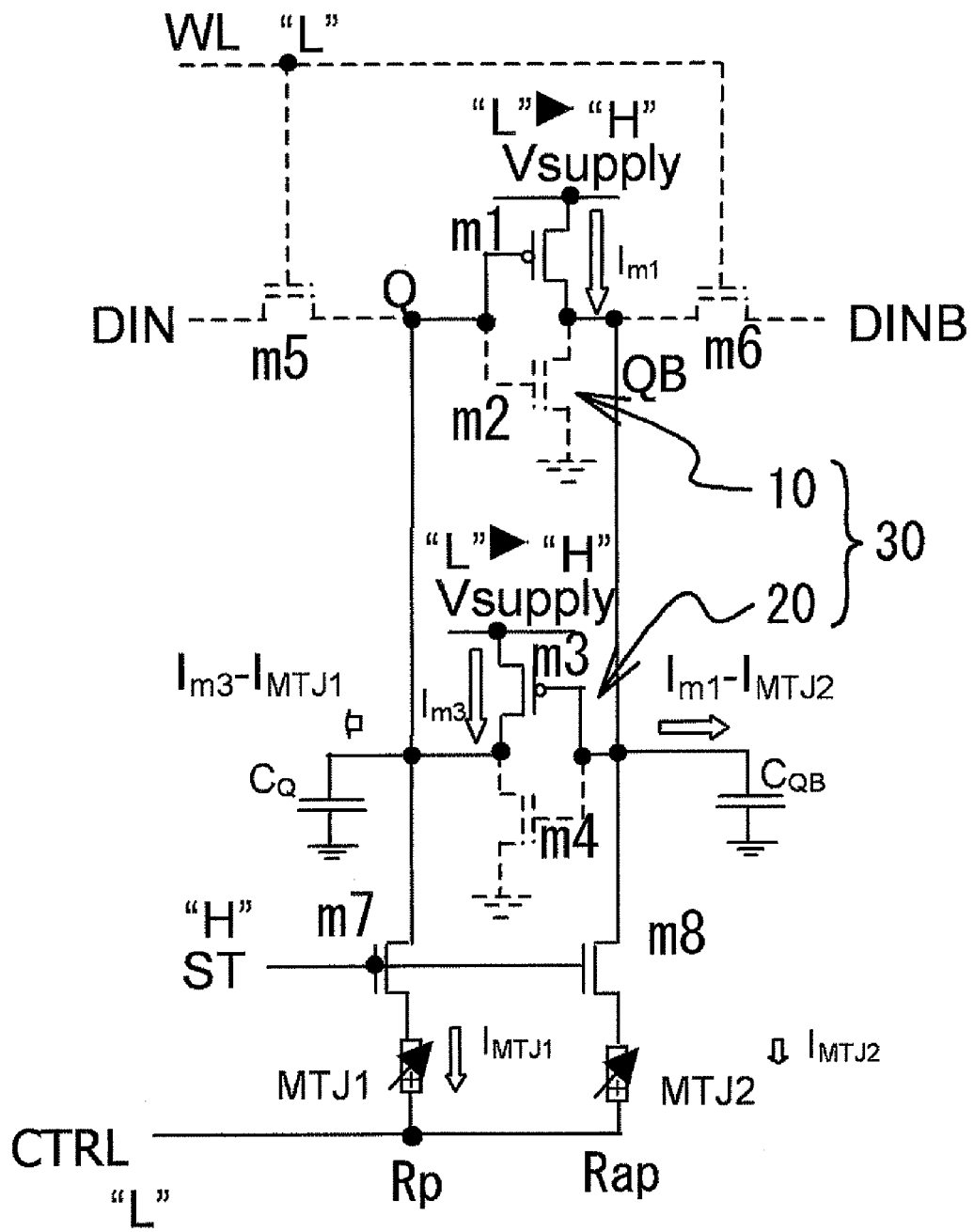
FIG. 11A through FIG. 11C are diagrams (No. 4) to describe a data restoration.
Figure 11B:
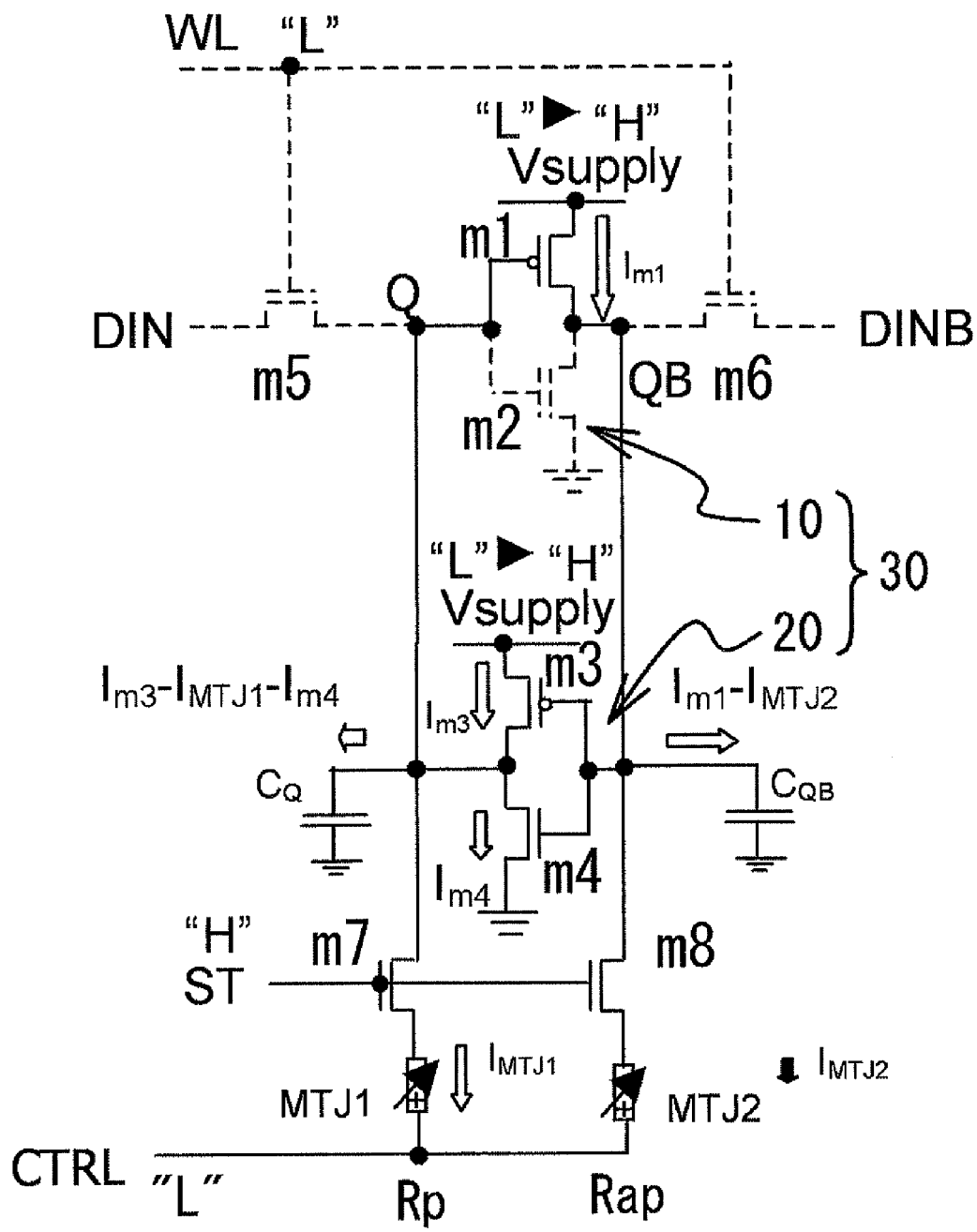
Figure 11C:
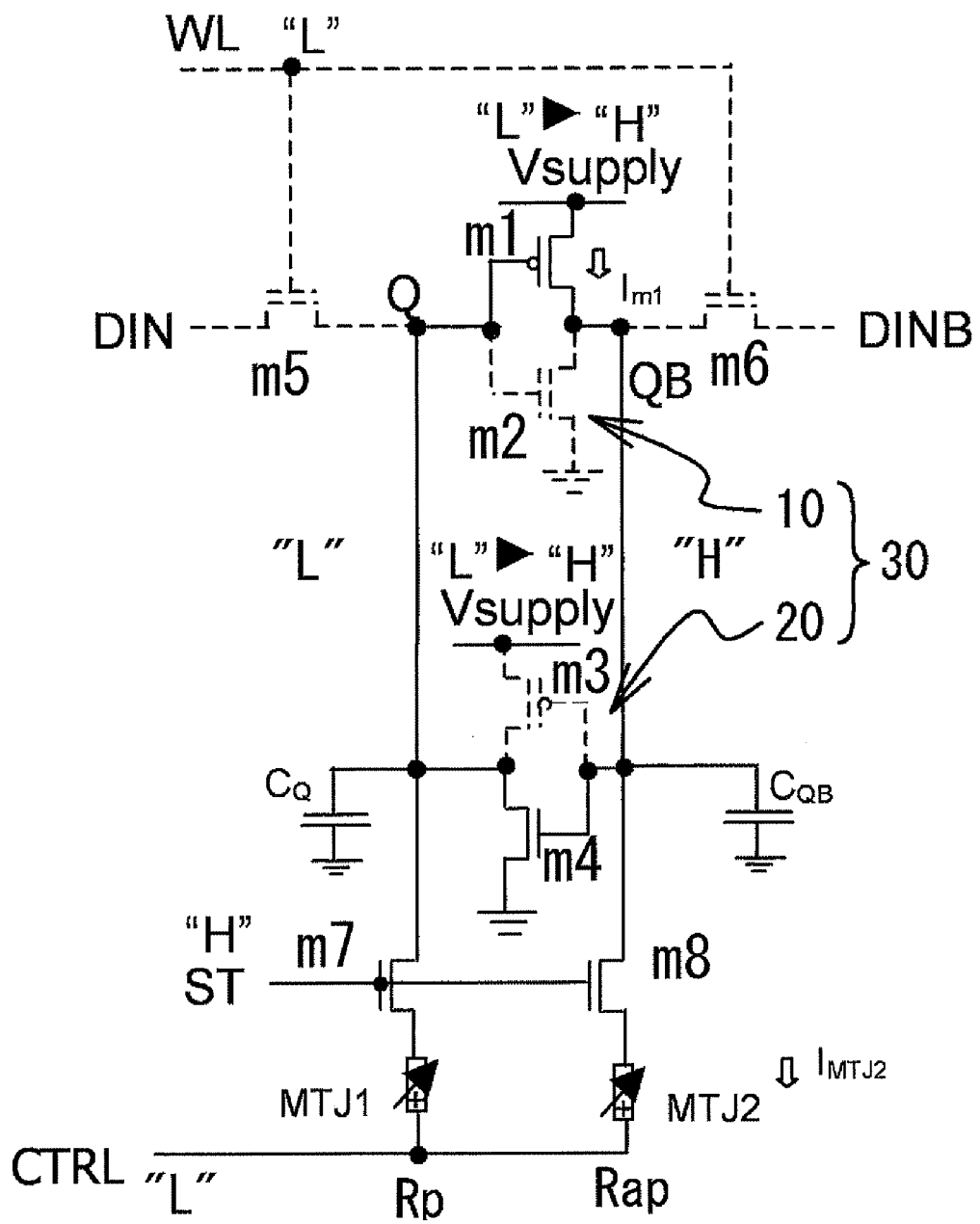

FIG. 10 is a diagram illustrating a data restoration to the bistable circuit 30 in the case that ferromagnetic tunnel junction devices MTJ1 and MTJ2 are a low resistance Rp and a high resistance Rap respectively, contrary to FIG. 8. FIG. 11A through FIG. 11C are diagrams to explain conditions of the memory circuit at times t1 through t3 in FIG. 10 respectively.

Referring to FIG. 11A, when raising a power source voltage to a high level from a low level, both voltages $V_Q$ and $V_{QB}$ increase, but $V_{QB}$ is larger than $V_Q$. Referring to FIG. 11B, when $V_{QB}$ becomes higher than a threshold voltage of the FET m4 composing the inverter 20, the FET m4 becomes conductive and a current Im4 flows. The voltage $V_Q$ of the node Q descends. Referring to FIG. 11C, when a steady state is achieved, the node Q becomes at a low level, and the node QB becomes at a high level. According to above operations, a data restoration to the bistable circuit 30 from ferromagnetic tunnel junction devices MTJ1 and MTJ2 is completed.

Figure 12:
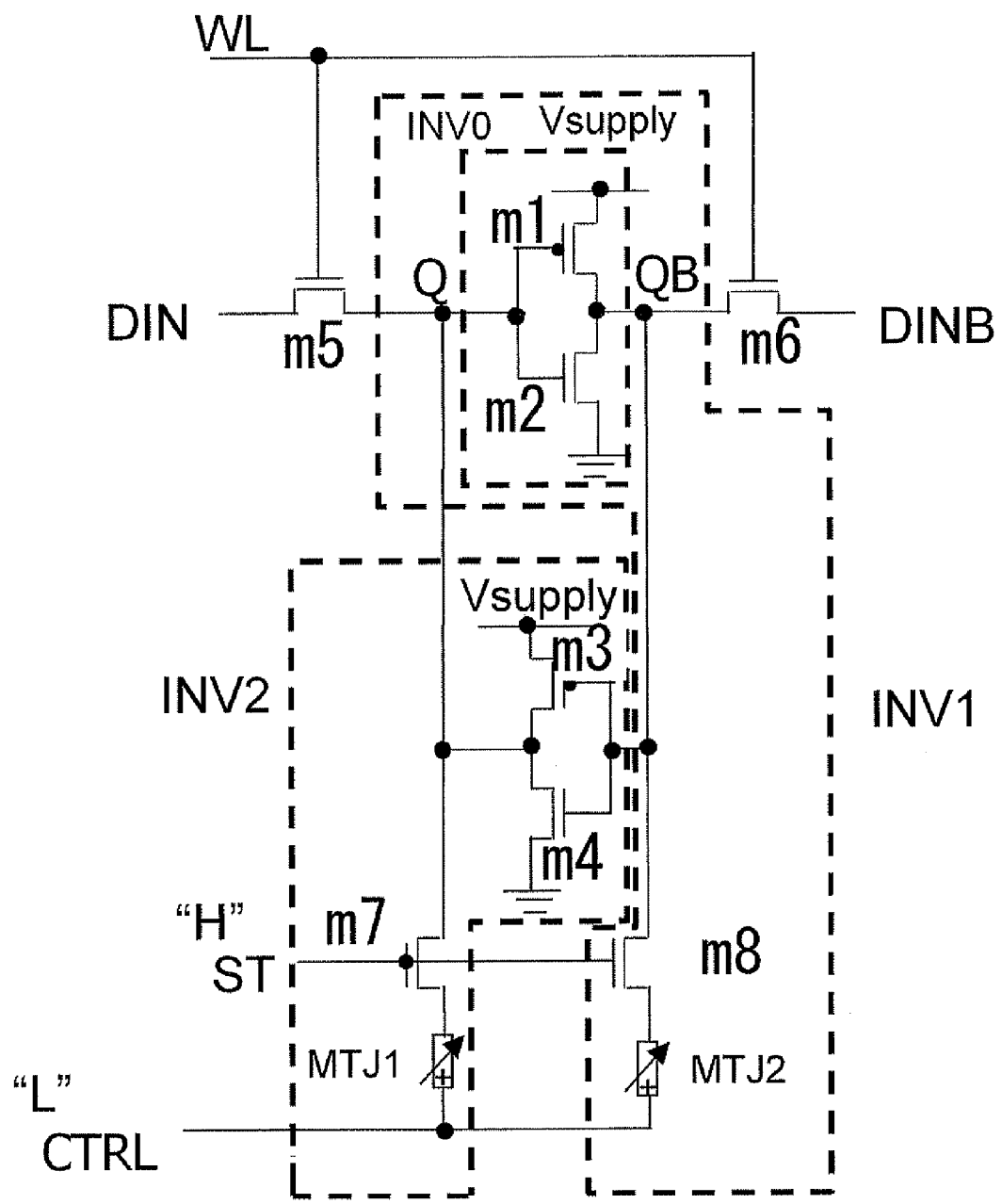
FIG. 12 is a diagram illustrating INV1 and INV2.

A description will now be given of a data restoration to the bistable circuit 30 from ferromagnetic tunnel junction devices MTJ1 and MTJ2 by focusing on the inverter. As illustrated in FIG. 12, a circuit provided with the inverter 10 and the ferromagnetic tunnel junction device MTJ2 will be described as an inverter INV1, a circuit provided with the inverter 20 and the ferromagnetic tunnel junction device MTJ1 will be described as an inverter INV2, and the inverter 10 or 20 without a ferromagnetic tunnel junction device will be described as an inverter INV0.

Figure 13A:
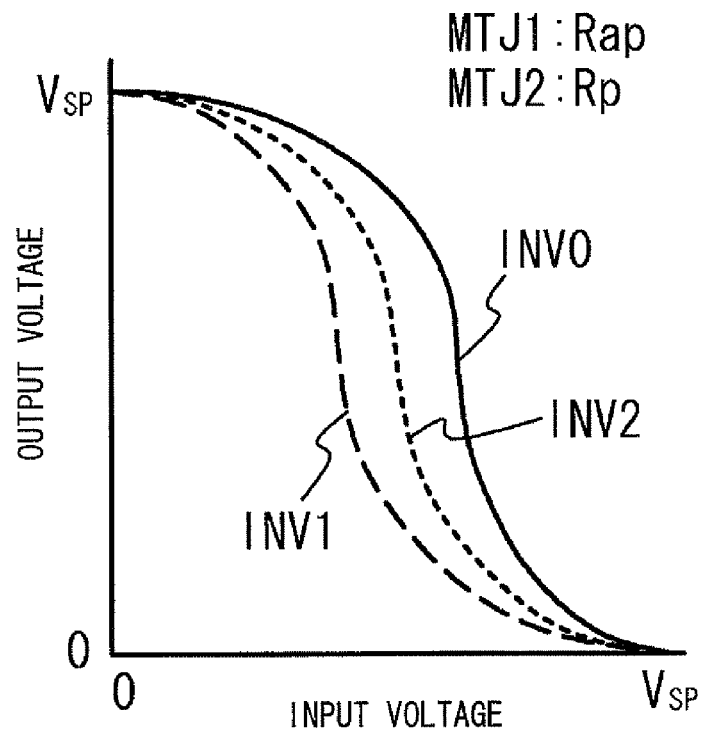
FIG. 13A and FIG. 13B are diagrams illustrating input/output characteristics of an inverter.
Figure 13B:
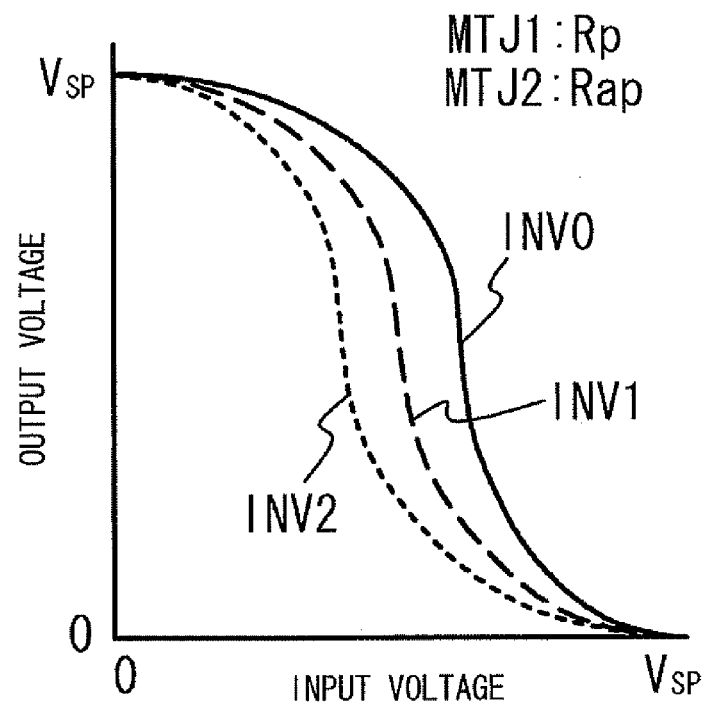

FIG. 13A is a conceptual diagram illustrating input/output characteristics of the inverter in the case that the ferromagnetic tunnel junction device MTJ1 is a high resistance Rap and the ferromagnetic tunnel junction device MTJ2 is a low resistance Rp. Compared to the inverter INV0 without the ferromagnetic tunnel junction device, logic thresholds of inverters INV1 and INV2 to which a ferromagnetic tunnel junction device is added become low. Compared to the inverter INV2 with the ferromagnetic tunnel junction device MTJ1 which is a high resistance Rap, the logic threshold of the inverter INV1 with the ferromagnetic tunnel junction device MTJ2 which is a low resistance Rp becomes further low. Referring to FIG. 13B, when the ferromagnetic tunnel junction device MTJ1 is a low resistance Rp and the ferromagnetic tunnel junction device MTJ2 is a high resistance Rap, the logic threshold of the inverter INV2 becomes low compared to the inverter INV1.

Figure 14A:
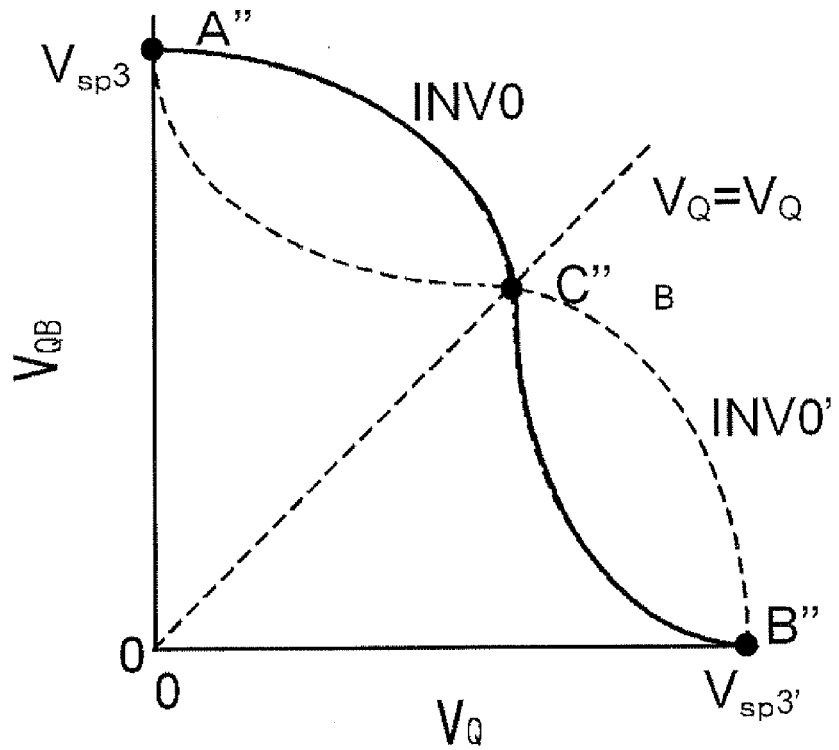
FIG. 14A through FIG. 14D are diagrams (No. 5) to describe a data restoration.

FIG. 14A is a conceptual diagram of a characteristic curve of the bistable circuit composed of the inverter INV0 or INV0' to which a ferromagnetic tunnel junction device is not coupled. Since characteristics of inverters INV0, and INV0' are equal, a switch point C" of the bistable circuit 30 is on the line $V_Q = V_{QB}$. A loop of a characteristic curve between the point A" when $V_{QB}$ is equal to a power source voltage Vsp3 and the switch point C" and a loop of a characteristic curve between a point B" when $V_Q$ is equal to a power source voltage Vsp3' and the point C" are symmetric.

Figure 14B:
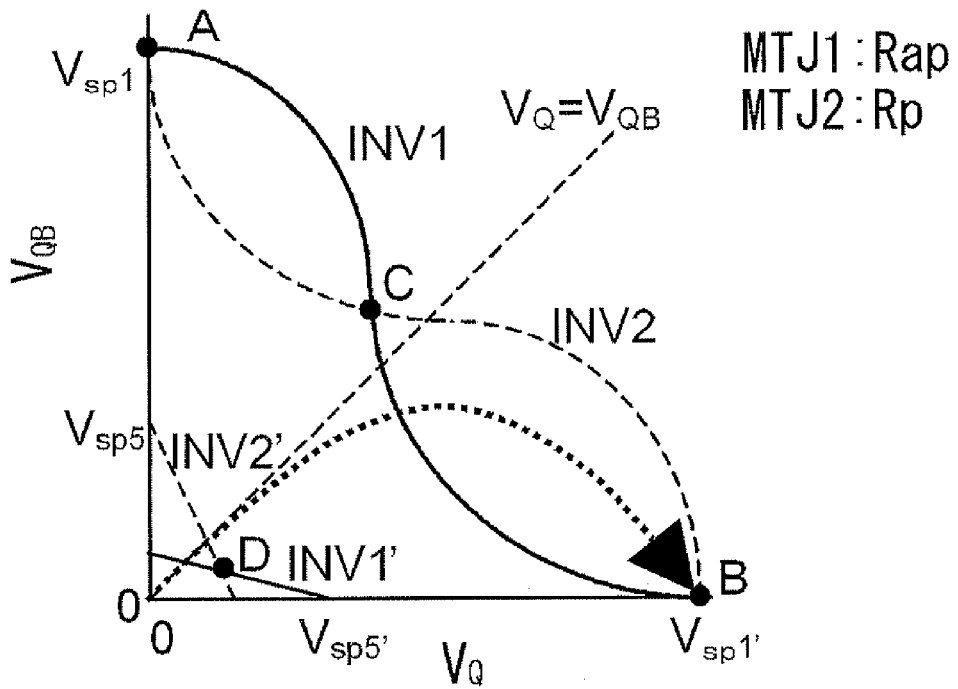

FIG. 14B is a conceptual diagram of a characteristic curve of the bistable circuit 30 in a case that the ferromagnetic tunnel junction device MTJ1 is a high resistance Rap, and the ferromagnetic tunnel junction device MTJ2 is a low resistance Rp. Since input/output characteristics of inverters INV1 and INV2 are asymmetric, the switch point C of the bistable circuit 30 lies above the line $V_Q = V_{QB}$. A loop of a characteristic curve between the point A when $V_{QB}$ is equal to a power source voltage $V_{sp1}$ and the switch point C becomes smaller than a loop of a characteristic curve between the point B when $V_Q$ is equal to a power source voltage $V_{sp1'}$ and the point C. A process to raise a power source voltage Vsupply from a ground voltage 0 V to a voltage $V_{sp1}$ or $V_{sp1'}$ is considered. At this time, a current $I_{MTJ2}$ flowing in the ferromagnetic tunnel junction device MTJ2 is set not to exceed a threshold current $I_{TR}$. When a power source voltage Vsupply is equal to a voltage $V_{sp5}$ or $V_{sp5'}$ which slightly exceeds an absolute value of a threshold voltage of a p-type MOSFET used in the inverter, characteristic curves of the inverter INV1 and the inverter INV2 become INV1' and INV2'. The threshold voltage of the inverter INV2 is lower than that of the inverter INV1. This means that when input voltages to inverters INV1, and INV2 (the voltage of the node Q in the case of the inverter INV2, and the voltage of the node Q in the case of the inverter INV2) are same, in the inverter INV2 more current flows from an output node (the node QB in the case of the inverter INV1, the node QB in the case of the inverter INV1) to a ground. Therefore, the output voltage of the inverter INV2 when the input voltage is 0 V is also lower than that of the inverter INV1. Thus, although a dynamic operating point of the bistable circuit depends on a speed of raising a power source voltage Vsupply and the like, it follows a locus illustrated with a dashed arrow and converges on the point B because the static steady point always lies below the line $V_Q = V_{QB}$.

Figure 14C:
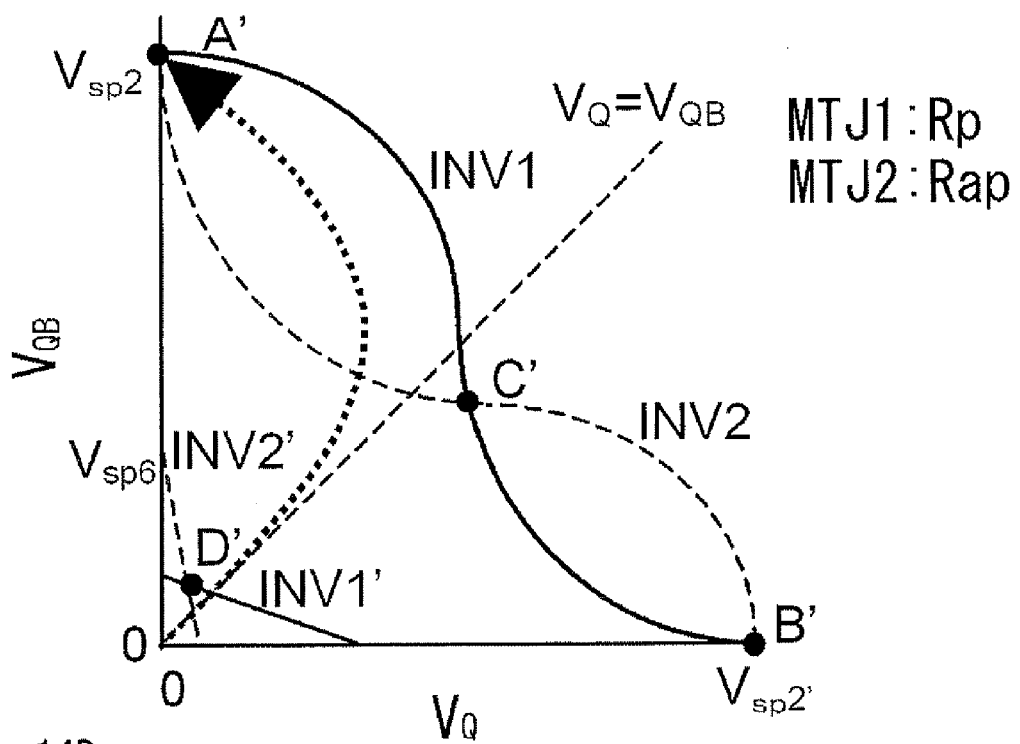

FIG. 14C is a conceptual diagram of a characteristic curve of the bistable circuit 30 in the case that the ferromagnetic tunnel junction device MTJ1 is a low resistance Rp and the ferromagnetic tunnel junction device MTJ2 is a high resistance Rap. The switch point C' of the bistable circuit 30 lies below the line $V_Q = V_{QB}$. A loop of a characteristic curve between the point A' when $V_{QB}$ is equal to a power source voltage $V_{sp2}$ and the switch point C' becomes bigger than a loop of a characteristic curve between the point B' when $V_Q$ is equal to a power source voltage $V_{sp2'}$ and the point C'. At this time, a power source voltage Vsupply is raised to $V_{sp2}$, and $V_{sp2'}$ from 0 V so that the current $I_{MTJ1}$ flowing in the ferromagnetic tunnel junction device MTJ1 does not exceed the threshold current $I_{TR}$. The dynamic operating point of the bistable circuit 30 follows a locus illustrated with a dashed arrow and converges on the point A' because the static steady point always lies above the line $V_Q = V_{QB}$.

In FIGS. 14B and 14C, even though the dynamic operating point becomes $V_Q = V_{QB}$ when raising a power source voltage, the direction on which the operating point converges does not change and the operating point converges on the point B or point A' because it lies within the characteristic loop which lies above or below the line $V_Q=V_{QB}$ until just before that.

Figure 14D:
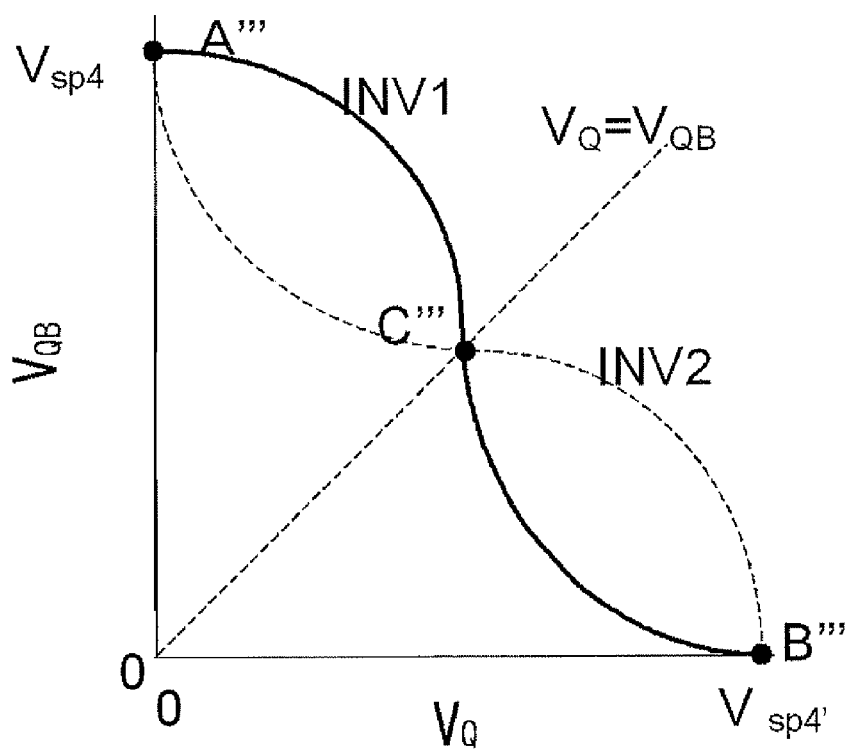

In FIG. 14B or 14C, once the current IMJ1 or $I_{MTJ2}$ of the ferromagnetic tunnel junction device MTJ1 or MTJ2 exceeds the threshold current $I_{TR}$, ferromagnetic tunnel junction devices MTJ1 and MTJ2 become a high resistance Rap. Therefore, as illustrated in FIG. 14D, logic thresholds of inverters INV1 and INV2 become same, and the switch point C''' becomes on the line $V_Q=V_{QB}$. Accordingly, when raising a power source voltage Vsupply to a voltage $V_{sp4}$ or $V_{sp4'}$ from 0 V, it cannot be determined whether the static steady point converges on the point A''' or on the point B'''. As described above, when restoring data, it is preferable to set currents $I_{MTJ1}$ and $I_{MTJ2}$ so as not to exceed the threshold current $J_{TR}$.

FIG. 15 is a timing diagram illustrating a control of the memory circuit in accordance with the second embodiment. A hatched area indicates that it is not exactly known whether it is at a high level or at a low level. Referring to FIG. 15, a power source voltage Vsupply is supplied, and the control line CTRL and the switch line ST are at a low level. Writing data to the bistable circuit 30 is performed by setting the word line WL to a high level and setting input/output lines DIN and DINB to a high level or to a low level. Storing data from the bistable circuit 30 to ferromagnetic tunnel junction devices MTJ1, and MTJ2 is performed by setting the switch line ST and the control line CTRL to a high level during the period T1 (corresponding to FIG. 6B and FIG. 7B), and setting the switch line ST to a high level and setting the control line CTRL to a low level during the period T2 (corresponding to FIG. 6A and FIG. 7A).

After that, by setting a power source voltage Vsupply to 0 V, the memory circuit becomes sleep condition. Since a current does not flow in the memory circuit at this time, power consumption can be reduced. Restoring data from ferromagnetic tunnel junction devices MTJ1 and MTJ2 to the bistable circuit 30 is performed by raising a power source voltage Vsupply from 0 V under the condition that the control line CTRL is at a low level and the switch line ST is at a high level during the period T3 (corresponding to FIG. 8 through FIG. 11C). Reading out data from the bistable circuit 30 is performed by setting the word line WL to a high level.

Figure 16:
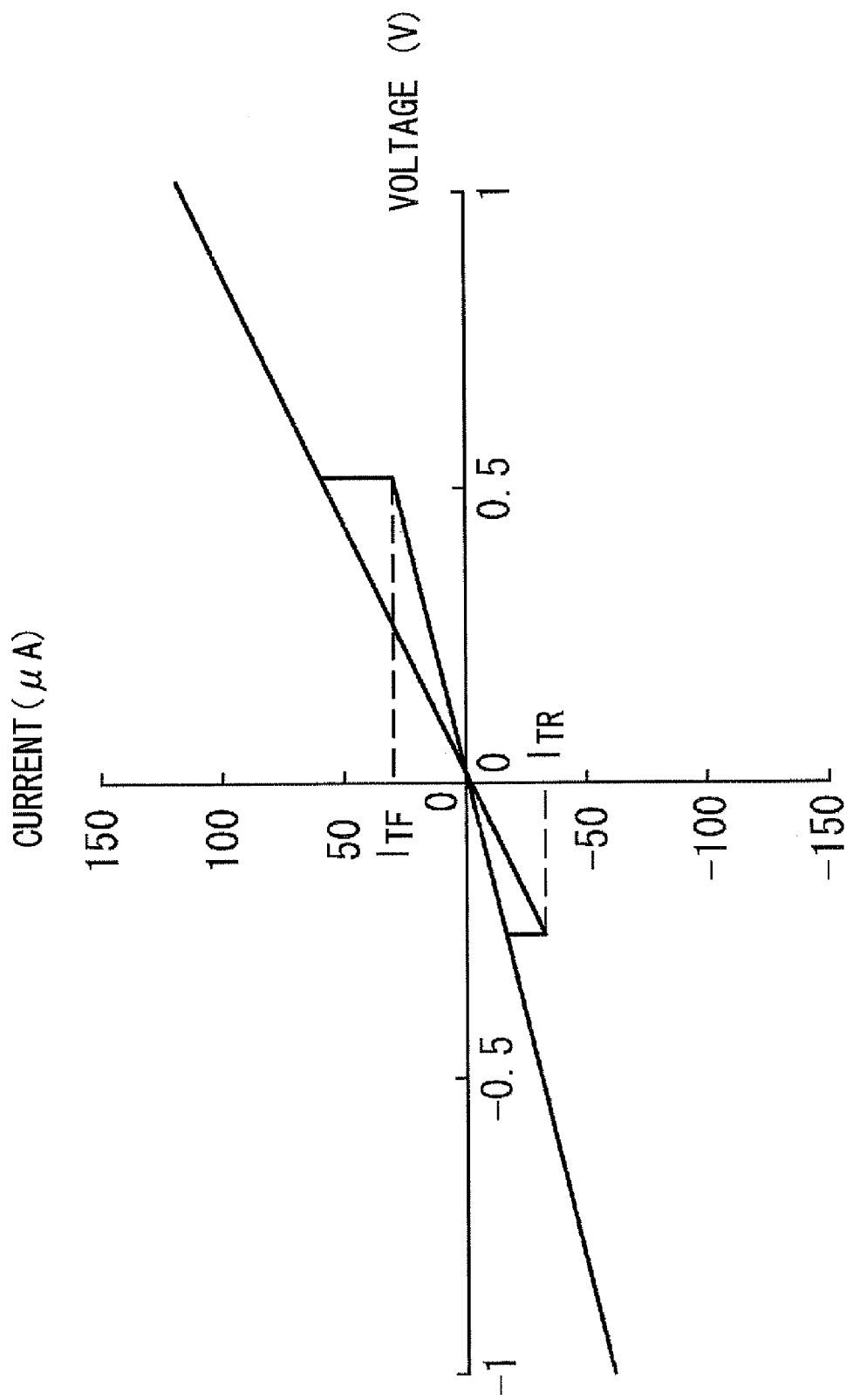
FIG. 16 is a diagram illustrating current-voltage characteristics of the ferromagnetic tunnel junction device used for a simulation.

A simulation of the memory circuit in accordance with the second embodiment is performed. FIG. 16 is a diagram of current-voltage characteristics of a ferromagnetic tunnel junction device used for the simulation. Threshold currents $I_{TF}$ and $I_{TR}$ are 30 μA and −30 μA respectively, and resistances Rap and Rp are 16.7 kΩ and 8.33 kΩ respectively. A channel length L of each FET is 0.07 μm, a channel width Wn of an n-type FET is 1.0 μm, and a channel width Wp of a p-type FET is 1.5 μm.

FIG. 17A through FIG. 17D are timing diagrams illustrating simulation results. FIG. 17A is a timing diagram of a storing operation when the node Q is at a high level, and FIG. 17B is a timing diagram of a restoring operation after FIG. 17A. FIG. 17C is a timing diagram of a storing operation when the node Q is at a low level, and FIG. 17D is a timing diagram of a restoring operation after FIG. 17C. Each diagram is illustrated by adding 1.5 V to the level of the node Q, 3 V to the level of the switch line ST, 4.5 V to the level of the control line CTRL, 6 V to a power source voltage Vsupply, and 7.5 V to the level of the word line WL. A method for storing and a method for restoring are same as described before.

In FIG. 17A, the condition that the node Q is at a high level and the node QB is at a low level is stored in the ferromagnetic tunnel junction device. In FIG. 17B, a high level is restored to the node Q, and a low level is restored to the node QB. In the same manner, in FIG. 17C, the condition that the node Q is at a low level and the node QB is at a high level is stored in the ferromagnetic tunnel junction device. In FIG. 17D, a low level is restored to the node Q, and a high level is restored to the node QB. As described above, in the memory circuit in accordance with the second embodiment, it can be confirmed that data stored in ferromagnetic tunnel junction devices MTJ1 and MTJ2 can be restored to the bistable circuit 30 after a power source is restored.

Third Embodiment

Figure 18:
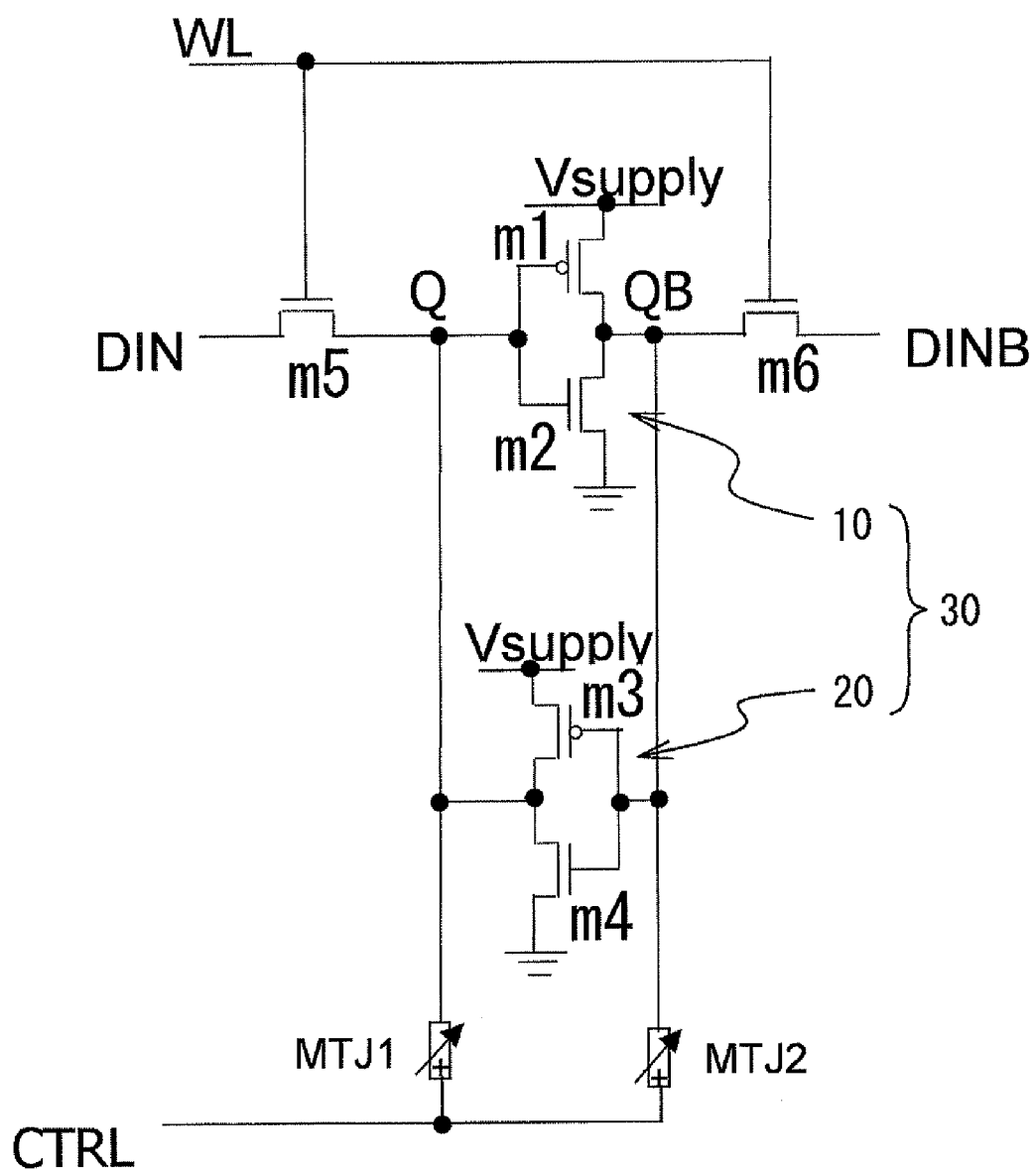
FIG. 18 is a circuit diagram of a memory circuit in accordance with a third embodiment.

FIG. 18 is a circuit diagram of a memory circuit in accordance with the third embodiment. Compared to diagrams of the second embodiment, the FET m7 and the FET m8 are not provided in the third embodiment. As described, it is not necessary to provide the FET m7 (a first switch) and the FET m8 (a second switch). However, to suppress the current flowing from the bistable circuit 30 to the control line CTRL, it is preferable to provide the FET m7 and the FET m8.

FIG. 19A through FIG. 19D are diagrams illustrating results of simulations, which are performed in the same manner as FIG. 17A through FIG. 17D of the second embodiment, to the memory circuit in accordance with the third embodiment. Each diagram is illustrated by adding 1.5 V to the level of the node Q, 3 V to the level of the control line CTRL, 4.5 V to a power source voltage Vsupply, and 6 V to the level of the word line WL.

Figure 19C:
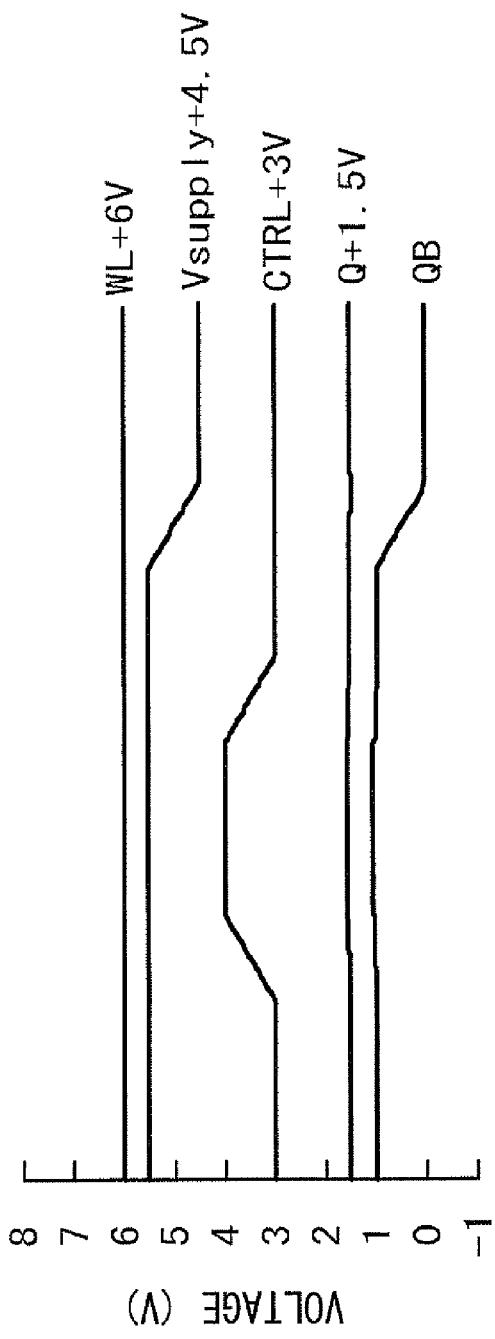
Figure 19D:
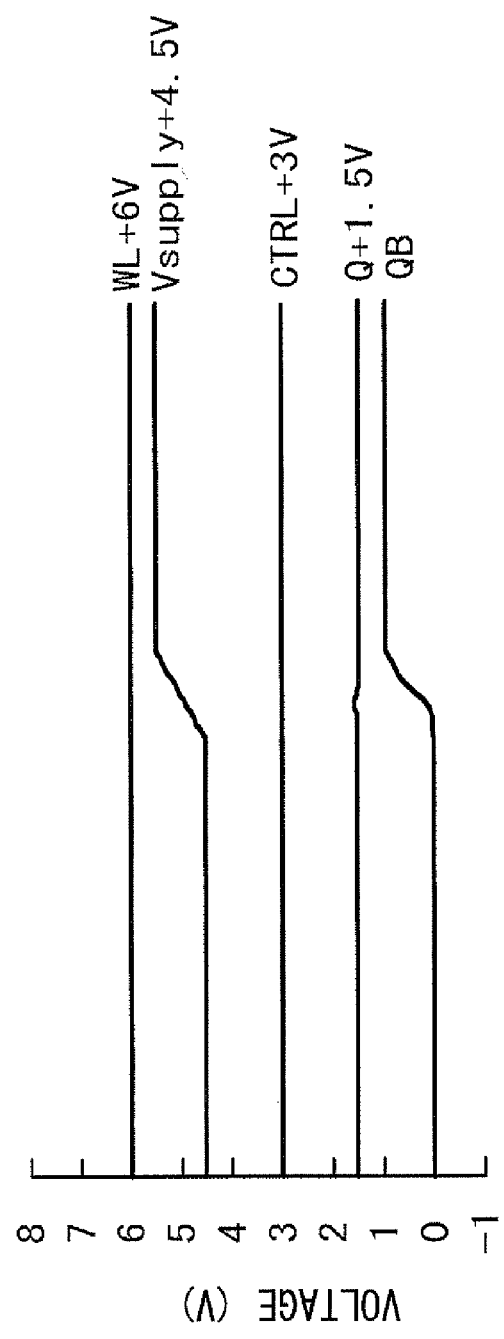

In FIG. 19A, the condition that the node Q is at a high level and the node QB is at a low level is stored in the ferromagnetic tunnel junction device. In FIG. 19B, a high level is restored to the node Q, and a low level is restored to the node QB. In the same manner, in FIG. 19C, the condition that the node Q is at a low level and the node QB is at a high level is stored in the ferromagnetic tunnel junction device. In FIG. 19D, a low level is restored to the node Q and a high level is restored to the node QB. As described above, in the memory circuit in accordance with the third embodiment, it can be confirmed that the data stored in ferromagnetic tunnel junction devices MTJ1 and MTJ2 can be restored to the bistable circuit 30 after a power source is restored.

Figure 20A:
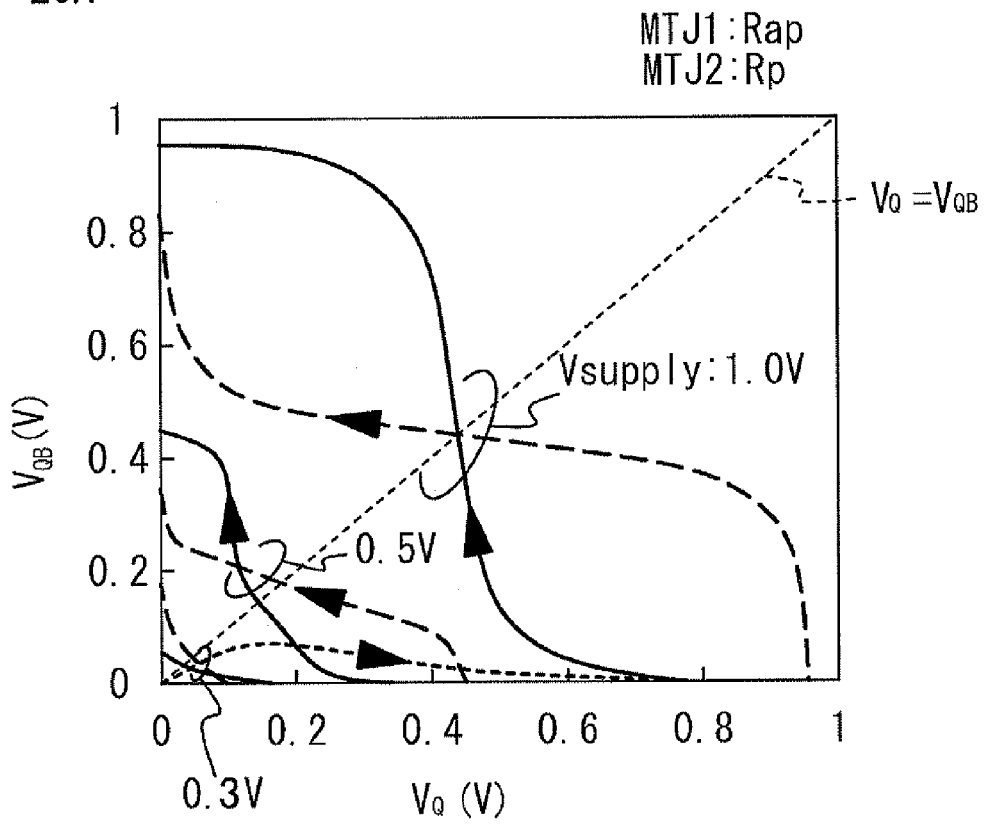
FIG. 20A and FIG. 20B are diagrams (No. 2) illustrating simulation results of the third embodiment.
Figure 20B:
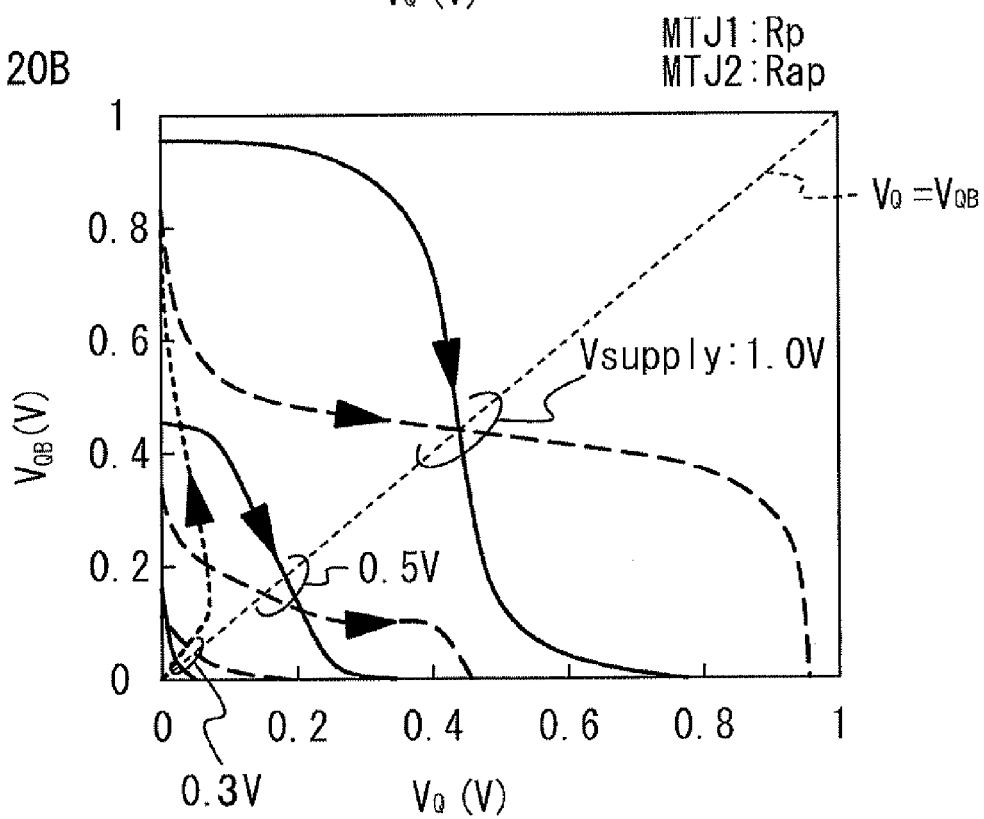

FIG. 20A illustrates a simulated characteristic curve of the bistable circuit 30 in the case that a resistance of the ferromagnetic tunnel junction device MTJ1 is a high resistance Rap and the ferromagnetic tunnel junction device MTJ2 is a low resistance Rp when a simulation begins. FIG. 20B illustrates a simulated characteristic curve of the bistable circuit 30 in the case that the ferromagnetic tunnel junction device MTJ1 is a low resistance Rp and the ferromagnetic tunnel junction device MTJ2 is a high resistance Rap when a simulation begins. Solid lines are curves corresponding to the inverter INV1, dashed lines are curves corresponding to the inverter INV2, and a simulation is performed with the lone inverter the input/output of which is decoupled. Arrows indicate a sweeping direction. Curves are illustrated when a power source voltage Vsupply is 1.0 V, 0.5 V and 0.3 V. Arrows with a dashed line indicate the locus of the dynamic operating point when raising a power source voltage from 0 V to 1.0 V after composing bistable circuit 30 by coupling the inputs/outputs of inverters INV1 and INV2 each other (when restoring is performed in FIG. 19B and FIG. 19D).

Referring to FIG. 20A and FIG. 20B, when a power source voltage Vsupply is 0.3 V or 0.5 V, a characteristic curve is asymmetric. Accordingly, if a power source voltage Vsupply becomes high, the dynamic operating point of the node Q converges on a low level, and that of the node QB converges on a high level. In FIG. 20B, the dynamic operating point of the node Q converges on a high level, and that of the node QB converges on a low level. When a power source voltage Vsupply is fixed to 1.0 V, if the input voltage of the inverter INV2 in FIG. 20A is swept from 0 V to 1 V and the input voltage of the inverter INV1 in FIG. 20B is swept from 1 V to 0 V respectively, a characteristic curve becomes symmetric because the current $I_{MTJ1}$ or $I_{MTJ2}$ flowing in the ferromagnetic tunnel junction device MTJ1 or MTJ2 exceeds the threshold current $I_{TR}$. As described, it is preferable to set a power source voltage Vsupply and resistance values Rp and Rap of ferromagnetic tunnel junction devices MTJ1 and MTJ2 so that the current $I_{MTJ1}$ or $I_{MTJ2}$ does not exceed the threshold current $I_{TR}$ during a restoring operation.

Fourth Embodiment

As described in the second and third embodiments, it is because logic thresholds of inverters INV1 and INV2 in FIG. 12 trade places according to stored data (see FIG. 13A and FIG. 13B) that the data stored in the ferromagnetic tunnel junction device can be restored to the bistable circuit 30. Therefore, if logic thresholds of the inverter 10 composing the bistable circuit 30 and the inverter INV2 composed by adding the ferromagnetic tunnel junction device MTJ1 to the inverter 20 are adapted to be different according to stored data, data can be restored even though a single ferromagnetic tunnel junction device is provided, Hereinafter, a description will be given of a composition where a single ferromagnetic tunnel junction device is provided.

Figure 21A:
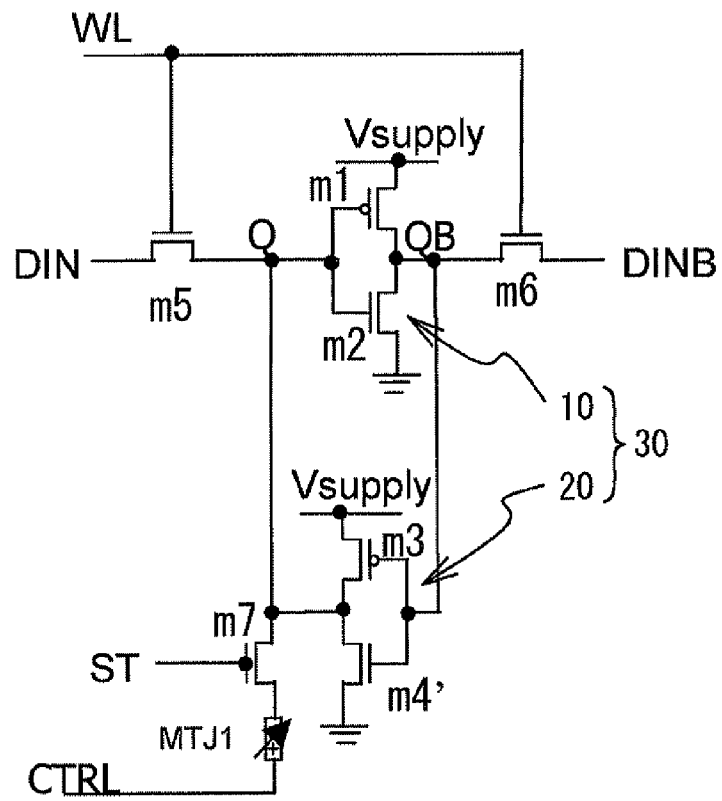
FIG. 21A and FIG. 21B is circuit diagrams of a memory circuit in accordance with a fourth embodiment.
Figure 21B:
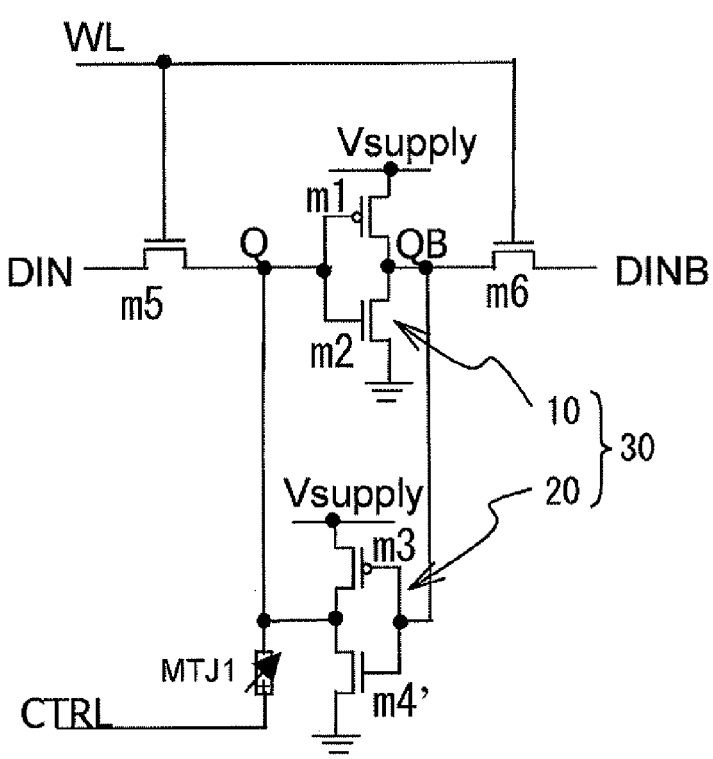

FIG. 21A and FIG. 21B are circuit diagrams of a memory circuit in accordance with the fourth embodiment. In the fourth embodiment, compared to the second and third embodiments, the channel width of the FET m4' of the inverter 20 is narrower than the channel width of the FET m3 of the inverter 10. In addition, the ferromagnetic tunnel junction device MTJ2 and the FET m8 are not provided. Accordingly, logic thresholds trade places in the input/output characteristics of the inverter 10 and the input/output characteristics of the inverter INV2 between the case that a resistance of the ferromagnetic tunnel junction device MTJ1 is a high resistance Rap and the case of a low resistance Rp. In the same manner as the second and third embodiments, the data stored in the ferromagnetic tunnel junction device MTJ1 can be restored to the bistable circuit 30. The FET m7 can be provided as illustrated in FIG. 21A, or does not have to be provided as illustrated FIG. 21B.

Fifth Embodiment

Figure 22A:
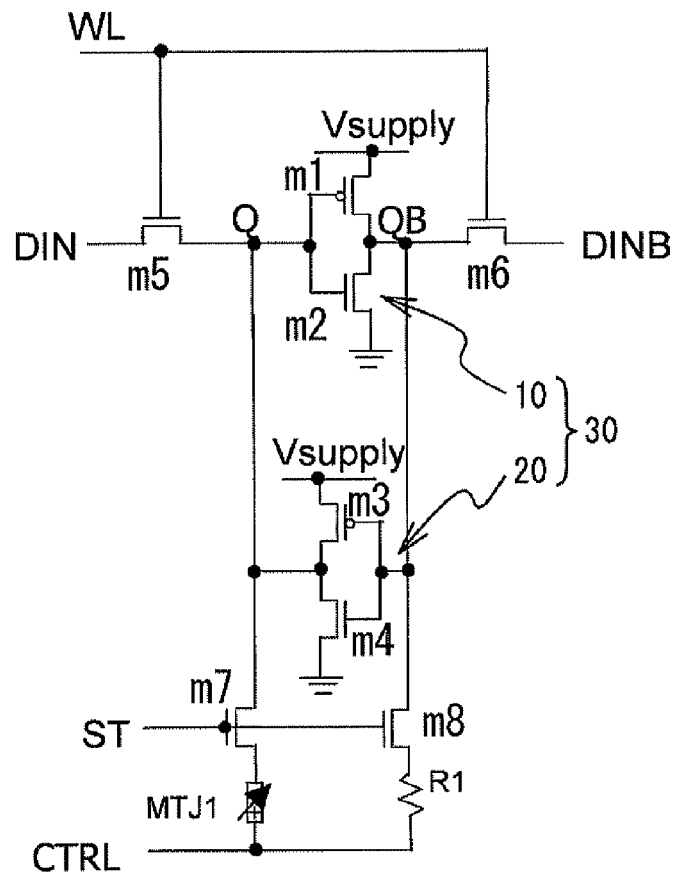
FIG. 22A and FIG. 22B are circuit diagrams of a memory circuit in accordance with a fifth embodiment.
Figure 22B:
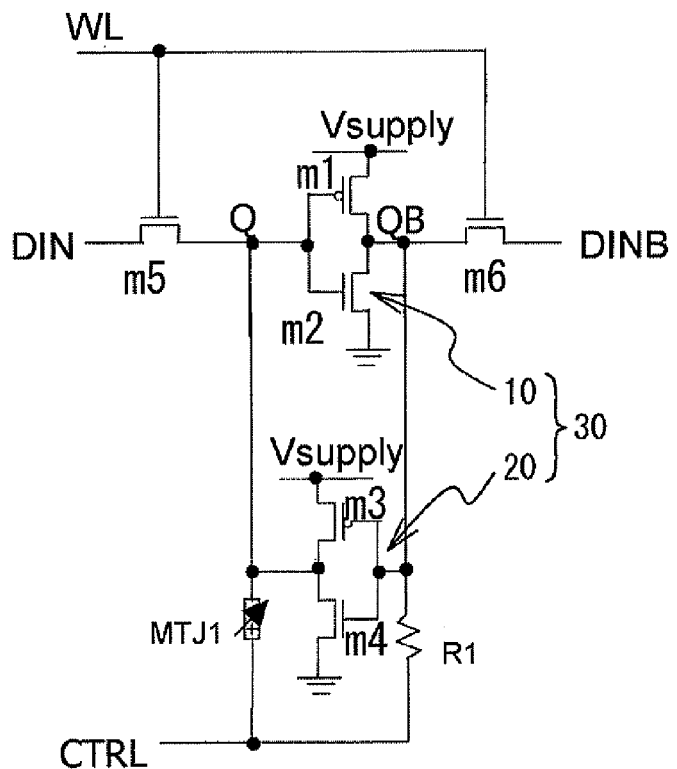

FIG. 22A and FIG. 22B are circuit diagrams of a memory circuit in accordance with the fifth embodiment. In the fifth embodiment, compared to the second and third embodiments, the ferromagnetic tunnel junction device MTJ2 is replaced with a resistance R1. The resistance R1 is set to be between a high resistance Rap and a low resistance Rp of the ferromagnetic tunnel junction device MTJ1. Accordingly, logic thresholds trade places in the input/output characteristics of the inverter INV1 to which the resistance R1 is added and the input/output characteristics of the inverter INV2 between the case that the resistance of the ferromagnetic tunnel junction device MTJ1 is a high resistance Rap and the case that is a low resistance Rp. Therefore, in the same manner as the second and third embodiments, the data stored in the ferromagnetic tunnel junction device MTJ1 can be restored to the bistable circuit 30. The FET m7 and the FET m8 can be provided as illustrated in FIG. 22A, and does not have to be provided as illustrated in FIG. 22B.

Sixth Embodiment

Figure 23A:
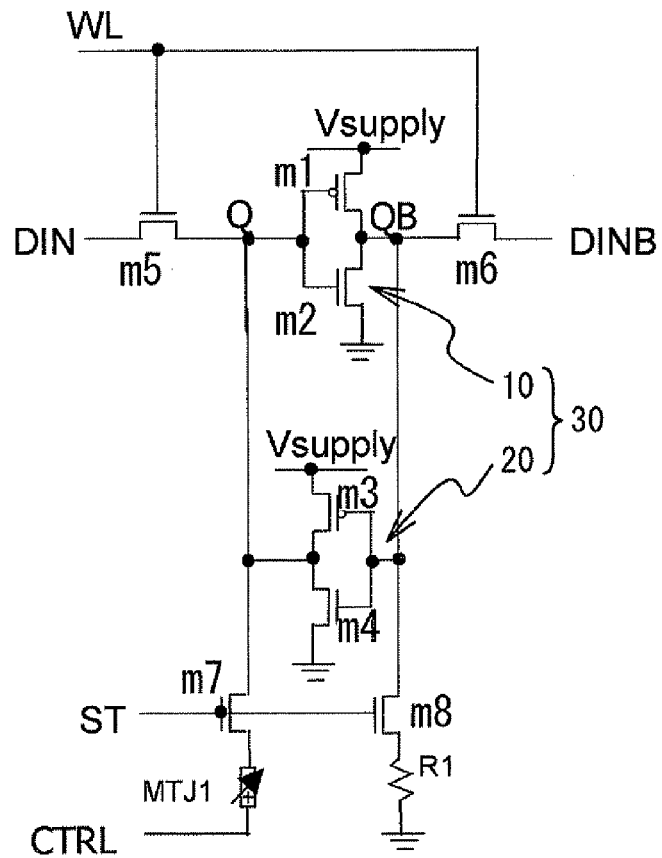
FIG. 23A and FIG. 23B are circuit diagrams of a memory circuit in accordance with a sixth embodiment.
Figure 23B:
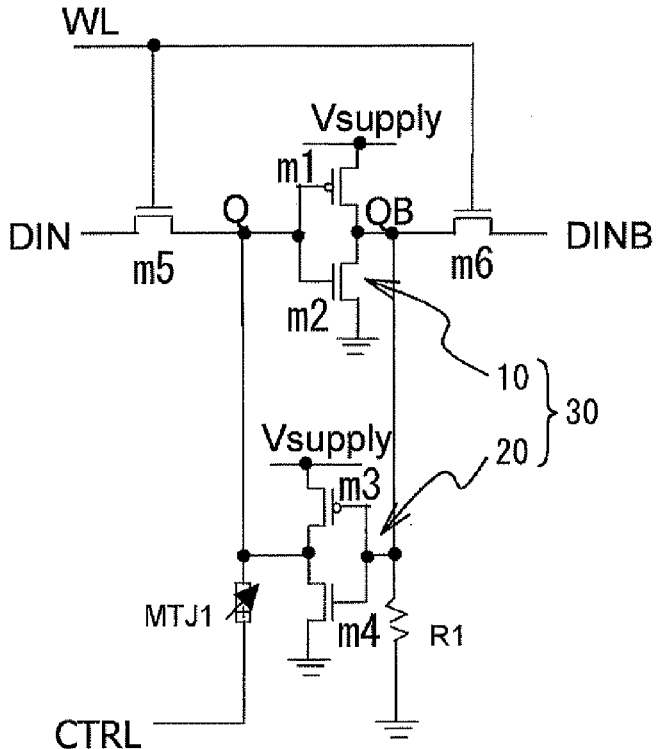

FIG. 23A and FIG. 23B are circuit diagrams of a memory circuit in accordance with the sixth embodiment. In the sixth embodiment, compared to the fifth embodiment, a resistance R1 contacts with a ground. Since data in the bistable circuit 30 is stored to the ferromagnetic tunnel junction device MTJ1, it is not necessary for the current to flow in the resistance R1 when the control line CTRL is high level. Therefore, a resistance R1 can contact with a ground. As same with the fifth embodiment, the resistance R1 is set to be between a high resistance Rap and a low resistance Rp. In addition, the FET m7 and the FET m8 can be provided as illustrated in FIG. 23A, and do not have to be provided as illustrated in FIG. 23B.

Seventh Embodiment

Figure 24:
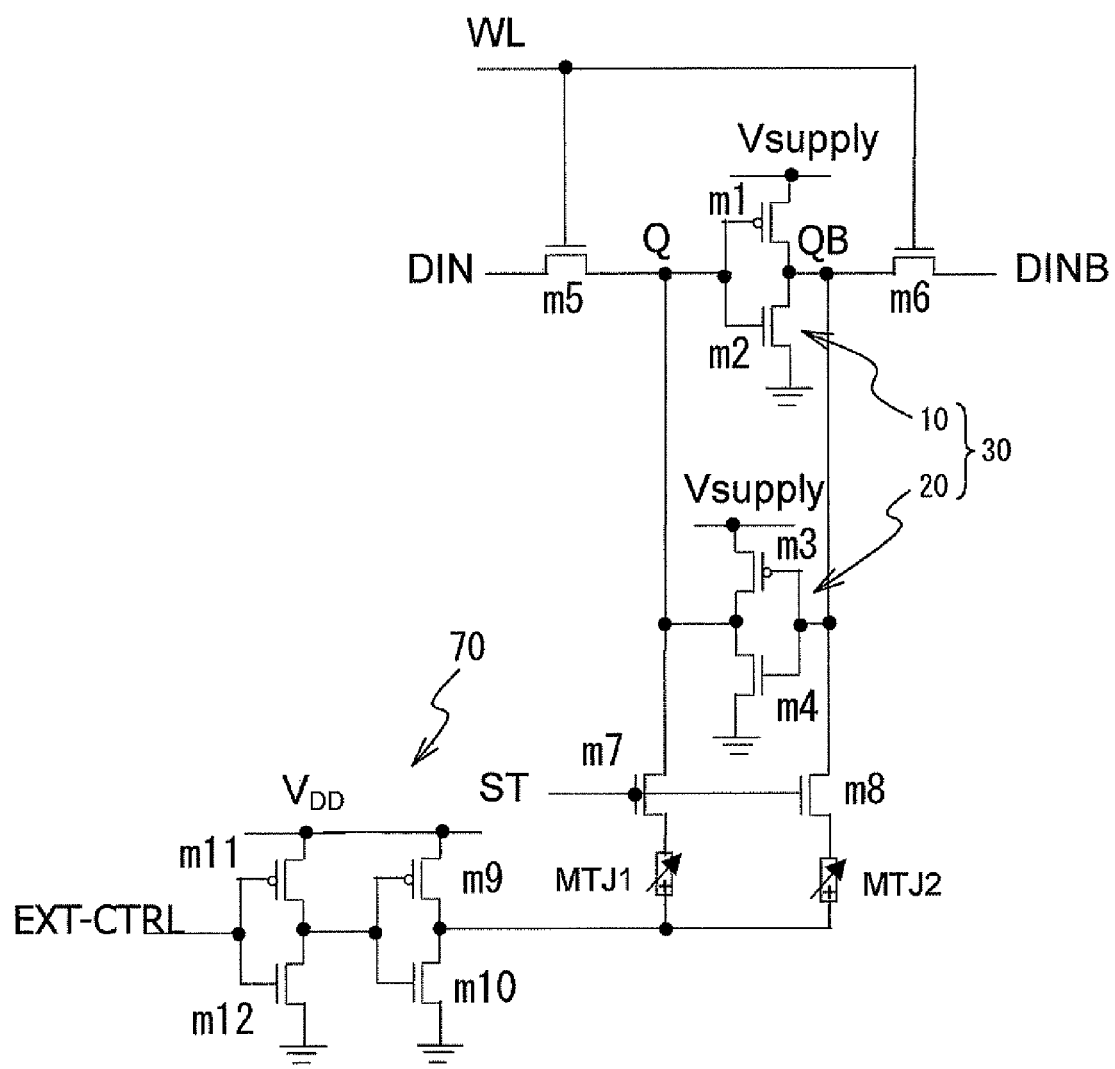
FIG. 24 is a circuit diagram of a memory circuit in accordance with a seventh embodiment.

FIG. 24 is a circuit diagram of a memory circuit in accordance with the seventh embodiment. In the seventh embodiment, an output of an amplifier circuit 70 including a two-stage inverter composed of FETs m9 through m12 is coupled to the control line CTRL in FIG. 5 of the second embodiment. An external control line EXT-CTRL is coupled to an input of the amplifier circuit 70, If many memory circuits are controlled with the control line CTRL at the same time, operations will get slow. According to the seventh embodiment, the store and restoration in the memory circuit can be performed at high speed because a signal of the external control line EXT-CTRL is amplified by the amplifier circuit 70.

Eighth Embodiment

Figure 25:
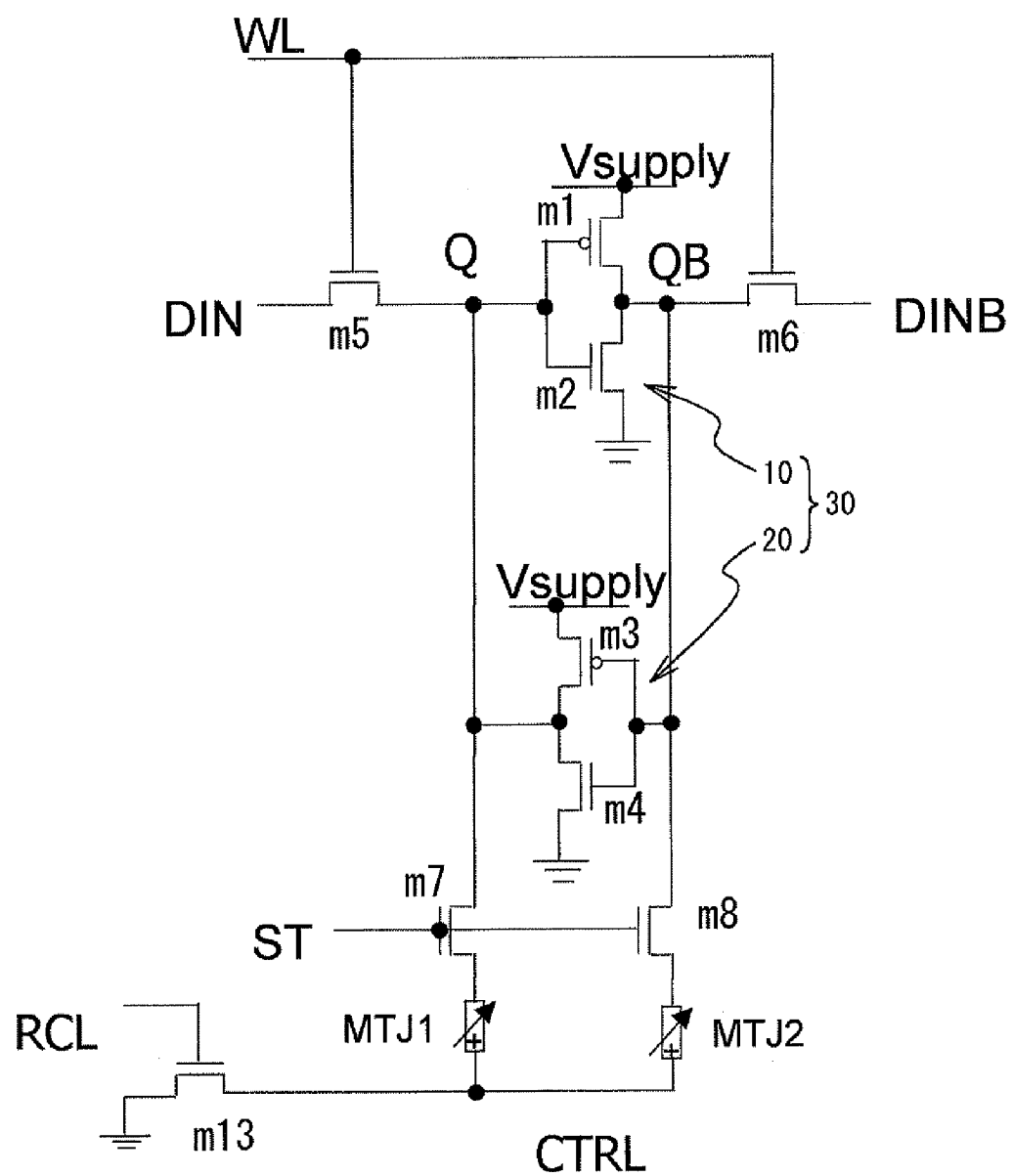
FIG. 25 is a circuit diagram of a memory circuit in accordance with an eighth embodiment.

FIG. 25 is a circuit diagram of a memory circuit in accordance with the eighth embodiment. In the eighth embodiment, an n-type MOSFET m13 is coupled between the control line CTRL and a ground, and the gate of the FET m13 is coupled to the second control line RCL. FIG. 26 is a timing diagram of the memory circuit in accordance with the eighth embodiment. When storing, the level of the second control line RCL is at a low level. The FET m13 becomes non-conductive. Therefore, because one of nodes Q and QB has a high level potential and the other has a low level potential, the current flows between the ferromagnetic tunnel junction device MTJ1 and the ferromagnetic tunnel junction device MTJ2, and data in the bistable circuit 30 is stored to ferromagnetic tunnel junction devices MTJ1 and MTJ2. At this time, the voltage of the control line CTRL becomes interlevel between a high level and a low level. When restoring, the second control line RCL is at a high level. As the control line CTRL becomes at a low level, a restoration can be performed in the same manner as the second embodiment. Accordingly, the store and restoration in the memory circuit are performed at high speed regardless of the driving performance of the control line CTRL.

FIG. 27A through FIG. 27D illustrate simulation results of the simulations, which are same as FIG. 17A through FIG. 17D of the second embodiment, to the memory circuit in accordance with the eighth embodiment. As for parameters used for the simulation, threshold currents $I_{TF}$ and $I_{TR}$ of the ferromagnetic tunnel junction device are 15 μA and −15 μA respectively, and other parameters are same as the second embodiment. Each diagram is illustrated by adding 1.5 V to the level of the node Q, 3 V to the level of the control line CTRL, 4.5 V to the second control line RCL, 6V to the switch line ST, 7.5 V to a power source voltage Vsupply, and 9 V to the word line WL.

In FIG. 27A, the condition that the node Q is at a high level and the node QB is at a low level is stored in the ferromagnetic tunnel junction device. In FIG. 27B, a high level is restored to the node Q, and a low level is restored to the node QB. In the same manner, in FIG. 27C, the condition that the node Q is at a low level and the node QB is at a high level is stored in the ferromagnetic tunnel junction device. In FIG. 27D, a low level is restored to the node Q and a high level is restored to the node QB. As described above, in the memory circuit in accordance with the eighth embodiment, it is confirmed that the data stored in ferromagnetic tunnel junction devices MTJ1 and MTJ2 can be restored to the bistable circuit 30 after a power source is restored.

Ninth Embodiment

Figure 28:
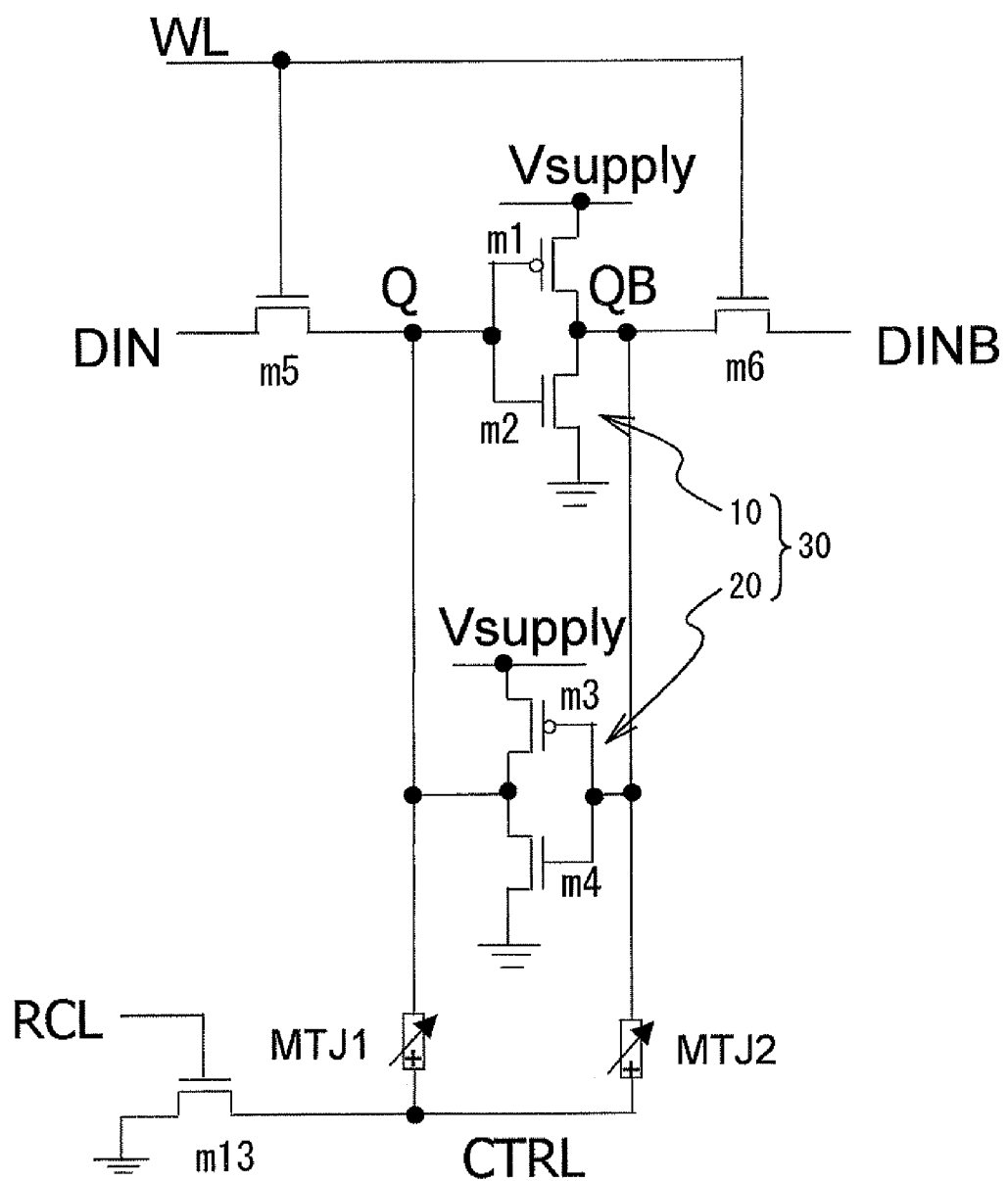
FIG. 28 is a circuit diagram of a memory circuit in accordance with a ninth embodiment.

FIG. 28 is a circuit diagram of a memory circuit in accordance with the ninth embodiment. In the ninth embodiment, compared to the eighth embodiment, FETs m7 and m8 are not provided. Other components are same as the eighth embodiment. FIG. 29A through FIG. 29D are diagrams illustrating simulation results of simulations, which are same as the FIG. 27A through FIG. 27D of the eighth embodiment, to the memory circuit in accordance with the ninth embodiment. As for parameters used for simulations, threshold currents $I_{TF}$ and $I_{TR}$ of the ferromagnetic tunnel junction device are 6 μA and −6 μA respectively, a high resistance value Rap and a low resistance value Rp are 50 kΩ and 25 kΩ respectively, and other parameters are same as the second embodiment.

In FIG. 29A, the condition that the node Q is at a high level and the node QB is at a low level is stored in the ferromagnetic tunnel junction device. In FIG. 29B, a high level is restored to the node Q and a low level is restored to the node QB. In the same manner, in FIG. 29C, the condition that the node Q is at a low level and the node QB is at a high level is stored in the ferromagnetic tunnel junction device. In FIG. 29D, a low level is restored to the node Q and a high level is restored to the node QB. As described above, it is confirmed that data stored in ferromagnetic tunnel junction devices MTJ1 and MTJ2 can be restored to the bistable circuit 30 also in the memory circuit to which FETs m7 and m8 are not provided in accordance with the ninth embodiment after a power source is restored.

Tenth Embodiment

Figure 30:
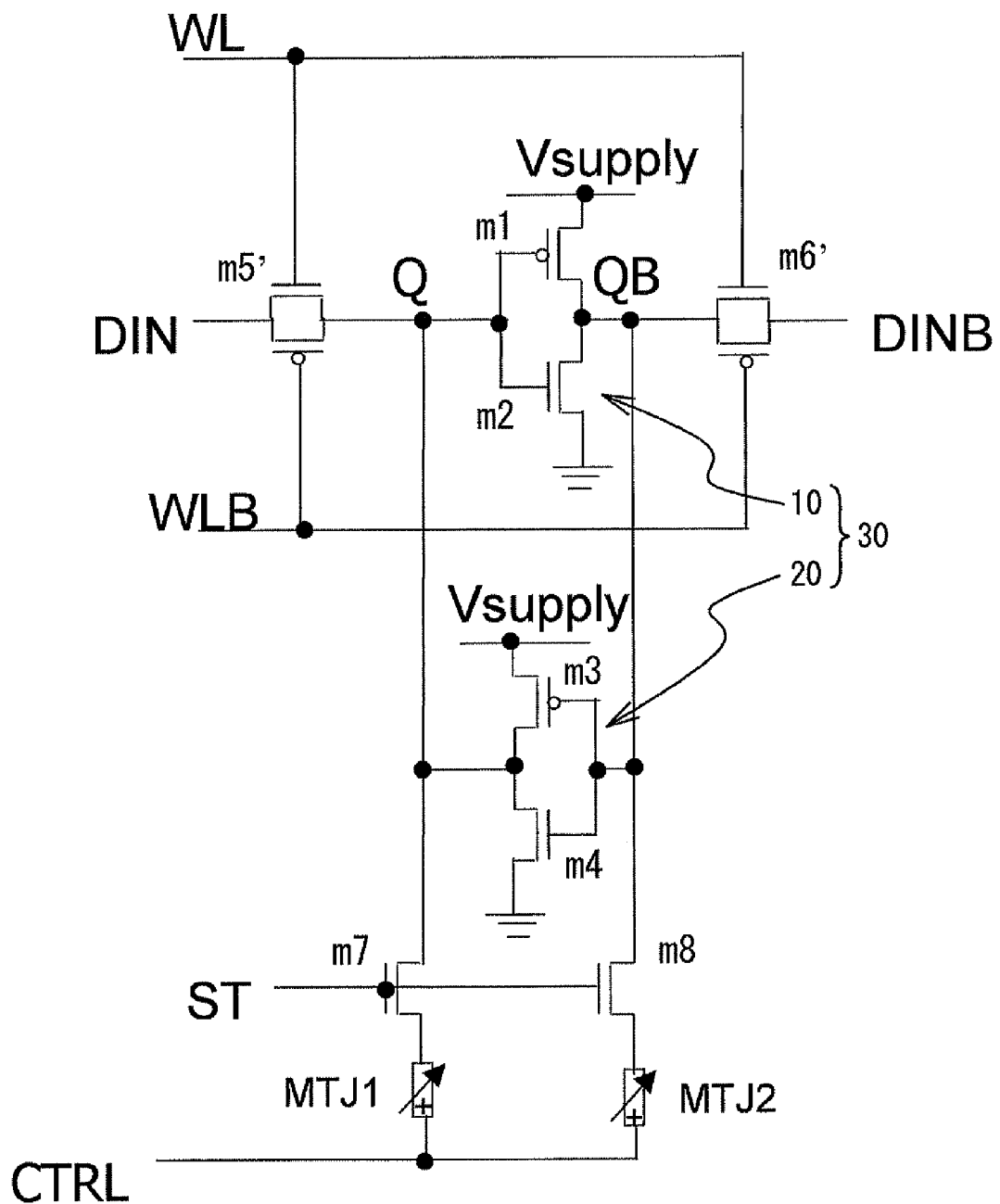
FIG. 30 is a circuit diagram of a memory circuit in accordance with a tenth embodiment.

FIG. 30 is a circuit diagram of a memory circuit in accordance with the tenth embodiment. In the tenth embodiment, compared to FIG. 5 of the second embodiment, complementary word lines WL and WLB are provided. A pass gate m5' is coupled between the node Q and the input/output line DIN, and a pass gate m6' is coupled between the node QB and the input/output line DINB. Pass gates m5' and m6' have a composition where sources of the n-type FET and the p-type FET are coupled each other, and drains of the n-type FET and the p-type FET are coupled each other.

Eleventh Embodiment

Figure 31:
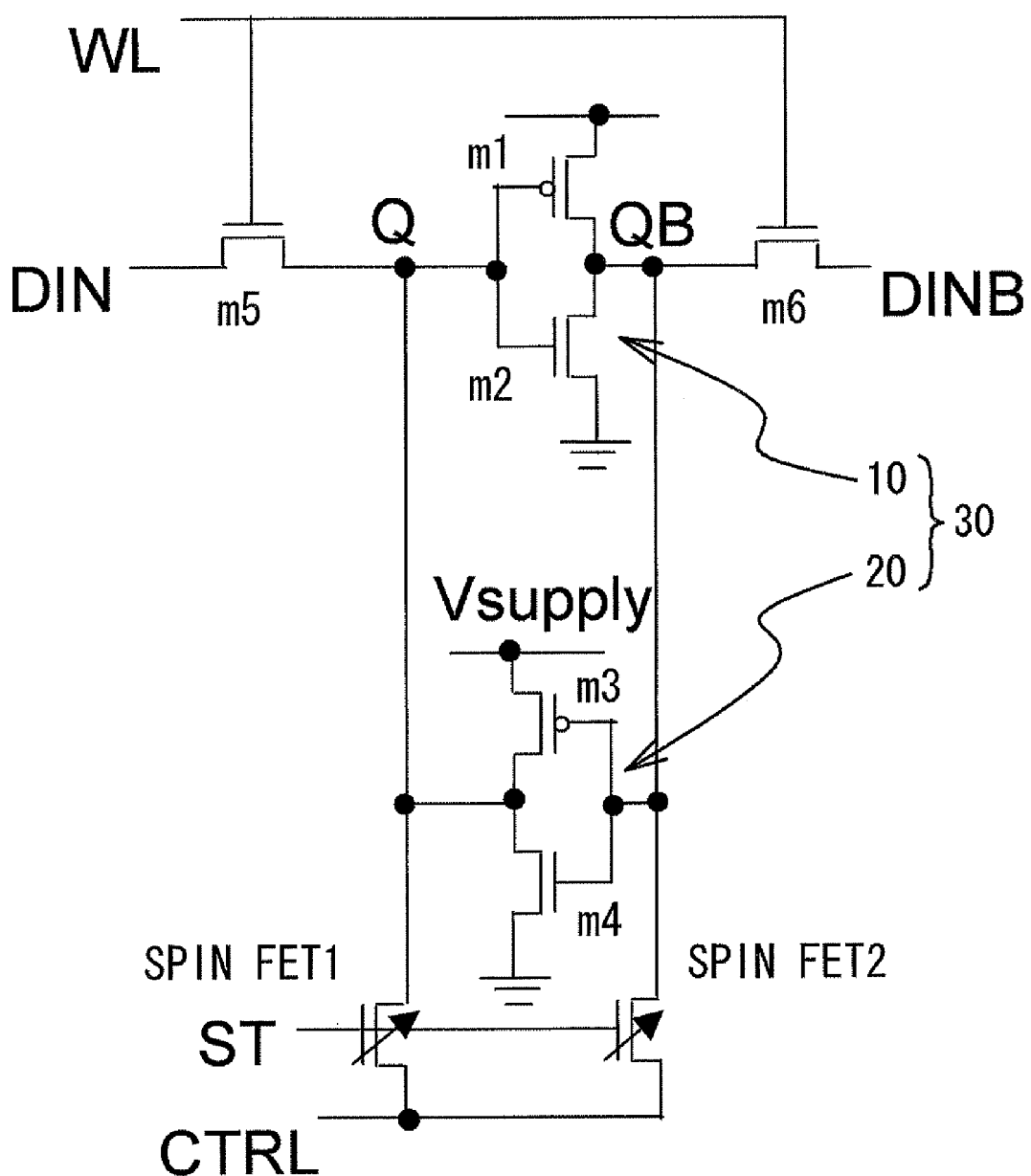
FIG. 31 is a circuit diagram of a memory circuit in accordance with an eleventh embodiment.

FIG. 31 is a circuit diagram of a memory circuit in accordance with the eleventh embodiment. In the eleventh embodiment, compared to FIG. 5 of the second embodiment, the ferromagnetic tunnel junction device MTJ1 and the FET m7 are replaced with a spin FET 1, and the ferromagnetic tunnel junction device MTJ2 and the FET m8 are replaced with a spin FET 2. As described, a spin FET can be used for the ferromagnetic tunnel junction device. A spin FET is a transistor a conductance of which can be nonvolatilely changed with the magnetization direction, and which has a switching function by a control terminal such as a gate. For example, a spin FET, which is disclosed in International Publication No. 2004-079827 or Journal of the Institute of Electronics, Information and Communication Engineers Vol. 88. No. 7. 2005 PP. 541-550, can be used.

Twelfth Embodiment

Figure 32:
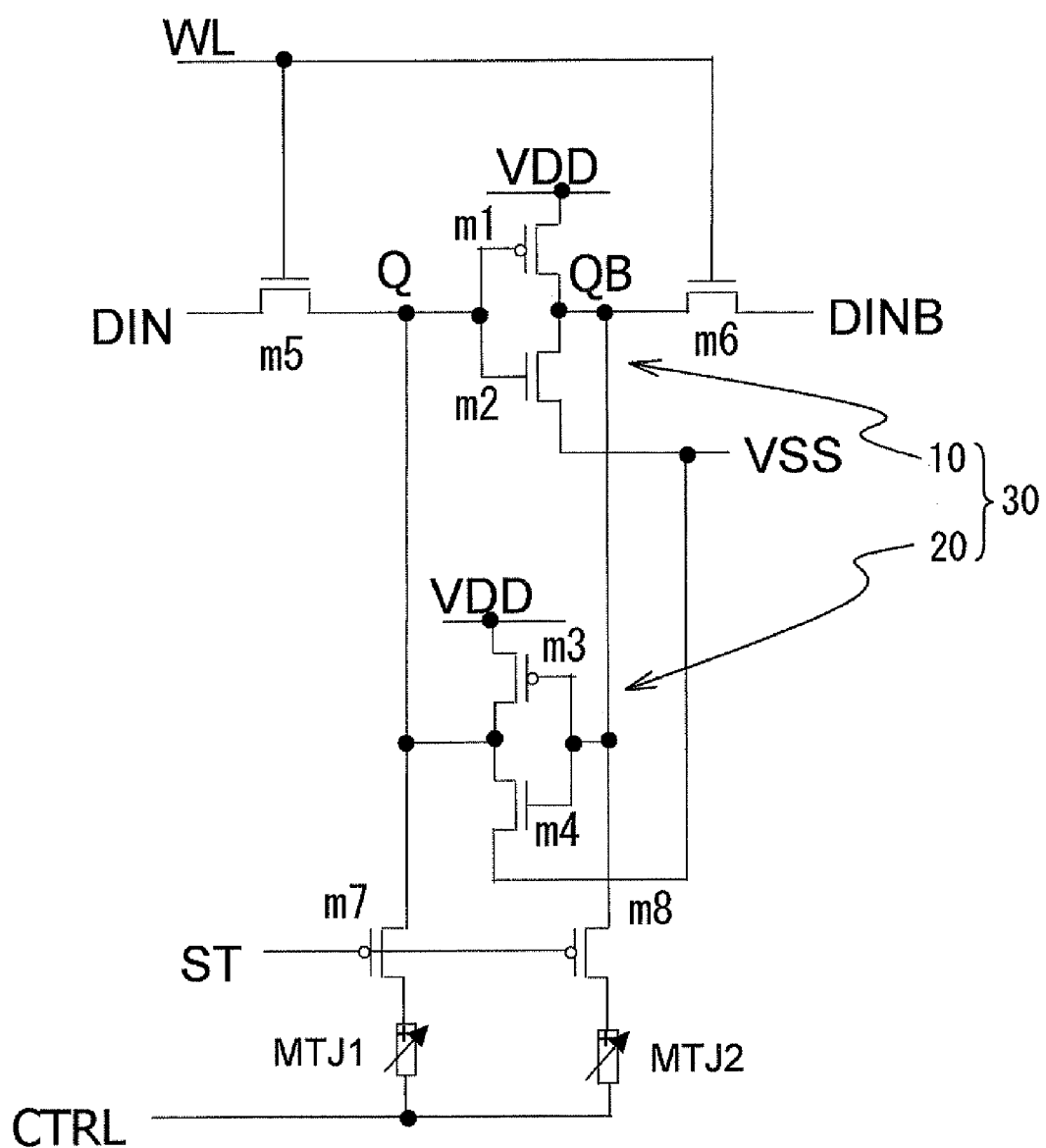
FIG. 32 is a circuit diagram of a memory circuit in accordance with a twelfth embodiment.

FIG. 32 is a circuit diagram of a memory circuit in accordance with the twelfth embodiment. Compared to the second embodiment, in the twelfth embodiment, inverters 10 and 20 are coupled between power source lines VDD and VSS. In addition, polarities of ferromagnetic tunnel junction devices MTJ1 and MTJ2 are inverted to those of the second embodiment. Accordingly, as the current flows from the node Q or QB to the control line CTRL, the ferromagnetic tunnel junction device MTJ1 or MTJ2 becomes a low resistance Rp, and as the current flows from the control line CTRL to the node Q or QB, the ferromagnetic tunnel junction device MTJ1 or MTJ2 becomes a high resistance Rap. In addition, FETs m7 and m8 are p-type MOSFETs. Other components are same as FIG. 5 of the second embodiment.

Figure 33:
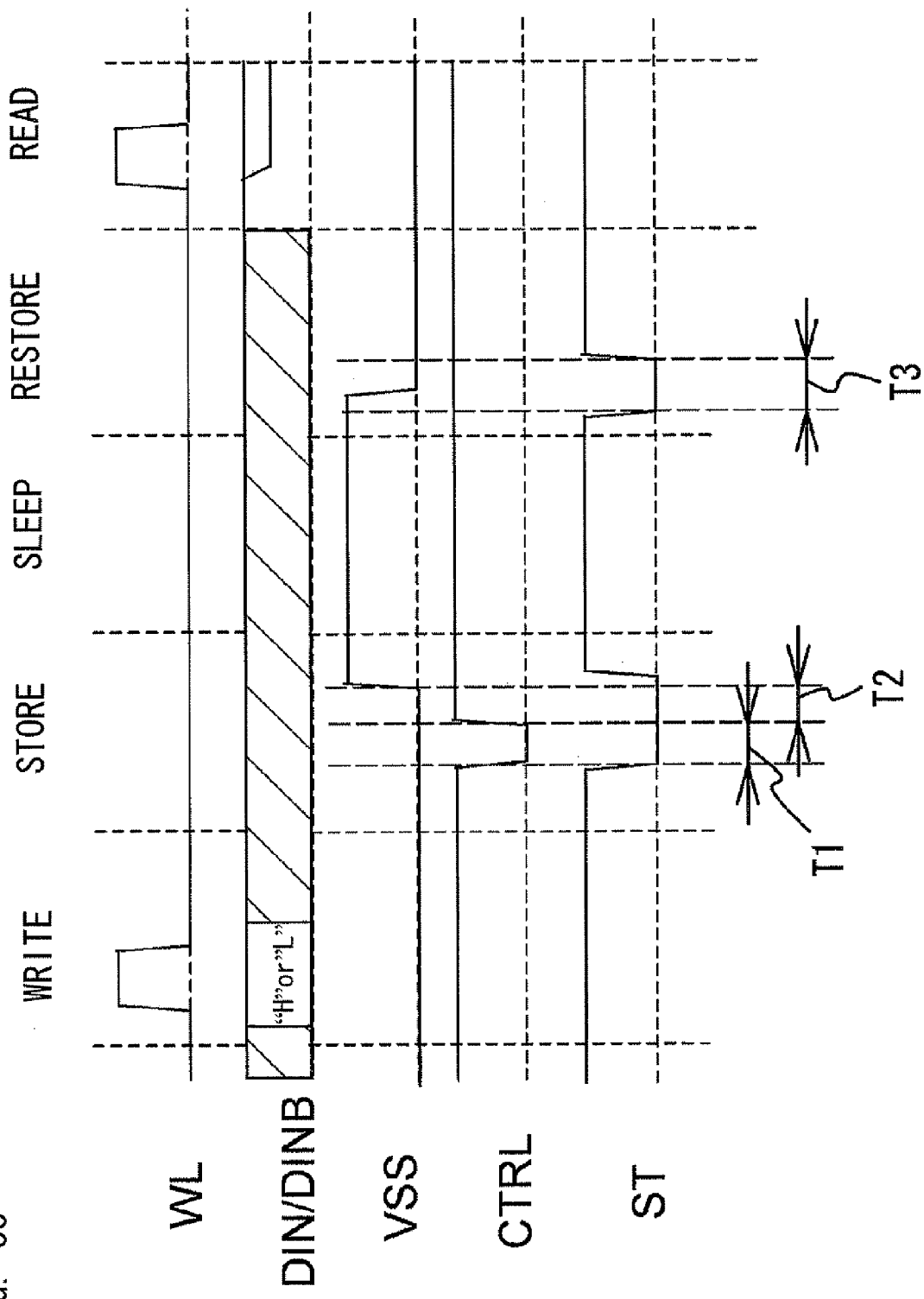
FIG. 33 is a timing diagram of the twelfth embodiment.

FIG. 33 is a timing diagram of the twelfth embodiment. In the twelfth embodiment, shutting down a power source is performed by setting VSS to a high level (VDD level). The level of the control line CTRL and the level of the switch line ST are at a high level in a write mode, sleep mode, and read mode. The switch line ST and the control line CTRL become at a low level during the period T1 of the store, and the switch line ST becomes at a low level and the control line CTRL becomes at a high level during the period T2. Accordingly, data in the bistable circuit 30 is restored to ferromagnetic tunnel junction devices MTJ1 and MTJ2. By setting the switch line to a low level during the period T3 of the restoration, data in ferromagnetic tunnel junction devices MTJ1 and MTJ2 is restored to the bistable circuit 30.

In the twelfth embodiment, the reason why polarities of ferromagnetic tunnel junction devices MTJ1 and MTJ2 are inverted to those of the second embodiment is as follows. For example, when setting the node Q to a high level, to charge the node Q from the control line CTRL against discharge currents of FETs m2 and m4, it is preferable that the ferromagnetic tunnel junction device MTJ1 is a low resistance Rp. Thus, if the polarity of the ferromagnetic tunnel junction device MTJ1 is same as the second embodiment, the ferromagnetic tunnel junction device MTJ1 becomes a high resistance Rap. In addition, the reason why FETs m7 and m8 are pMOSFETs is as follows. In an early stage of the restoration, sources and drains of FETs m7 and m8 are near to a high level. If FETs m7 and m8 are pMOSFETs, by setting the switch line ST to a low level, FETs m7 and m8 are made conductive reliably.

In the third through eleventh embodiments, it is also possible to couple inverters 10 and 20 between a power source line VDD and VSS and to set the polarity of the ferromagnetic tunnel junction device MTJ1 or MTJ2 same as the twelfth embodiment.

According to the second through twelfth embodiments, the ferromagnetic tunnel junction device MTJ1 or MTJ2 is coupled between the node Q or QB, and the control line CTRL. As the current flows between the node Q or QB, and the control line CTRL, the ferromagnetic tunnel junction device MTJ1 or MTJ2 becomes a high resistance, and as the current flows to counter direction, it becomes a low resistance. Accordingly, by passing the current between the control line CTRL and the node Q or QB according to the level of the node Q or QB, data in the bistable circuit 30 can be stored to the ferromagnetic tunnel junction device.

In addition, as illustrated in FIG. 15 and FIG. 33, when storing data to the the bistable circuit 30, the control line CTRL alternately applies a high level voltage and a low level voltage to the ferromagnetic tunnel junction device MTJ1 or MTJ2. Accordingly, data stored in the bistable circuit 30 can be stored to the ferromagnetic tunnel junction device MTJ1 or MTJ2.

When data is restored from the ferromagnetic tunnel junction device MTJ1 or MTJ2 to the bistable circuit 30, the control line CTRL applies a low level or a high level voltage to the ferromagnetic tunnel junction device MTJ1 or MTJ2 according to a method for shutting down a power source and its corresponding circuit. That is to say that in the first through eleventh embodiments, the control line CTRL applies a low level voltage to the ferromagnetic tunnel junction device MTJ1 or MTJ2, and in the twelfth embodiment it applies a high level voltage. Accordingly, data stored in the ferromagnetic tunnel junction device MTJ1 or MTJ2 can be restored to the bistable circuit 30.

As described in the second embodiment, FIG. 21A of the fourth embodiment, FIG. 22A of the fifth embodiment, FIG. 23A of the sixth embodiment, the seventh, eighth, tenth, and twelfth embodiments, the memory circuit may include a switch (corresponding to the FET m7 or m8) that is coupled between the node Q or QB and the ferromagnetic tunnel junction device MTJ1 or MTJ2. This switch becomes conductive during the store and restoration, and becomes non-conductive except during the store and restoration. Accordingly, power consumption of the memory circuit is reduced.

As described in the second embodiment, the third embodiment, the seventh through tenth embodiments, the twelfth embodiment, it is possible that the node Q is a first node Q, the node QB is a second node QB, the ferromagnetic tunnel junction device MTJ1 coupled between the first node Q and the control line CTRL is a first ferromagnetic tunnel junction device, and the ferromagnetic tunnel junction device MTJ2 coupled between the second node QB and the control line CTRL is the second ferromagnetic tunnel junction device. As described above, by using two ferromagnetic tunnel junction devices, compared to the case that the ferromagnetic tunnel junction device is coupled to one of nodes Q and QB, it is possible to make the difference between logic thresholds of the inverter INV1, which is composed of the inverter 10 and the second ferromagnetic tunnel junction device MTJ2, and the inverter INV2, which is composed of the inverter 20 and the first ferromagnetic tunnel junction device MTJ1, large. Therefore, there is an advantage in perspective of operation speed and noise margin, and operations can be more stable.

As described in the second, seventh, eighth, tenth and twelfth embodiments, the memory circuit includes a first switch (corresponding to the FET m7) which is coupled between the first node Q and the first ferromagnetic tunnel junction device MTJ1 and becomes conductive when storing and restoring data, and a second switch (corresponding to the FET m8) which is coupled between the second node QB and the second ferromagnetic tunnel junction device MTJ2 as switches. The first switch and the second switch become conductive when storing and restoring data, and become non-conductive except when storing and restoring data. As described above, by coupling the first switch and the second switch both between the first ferromagnetic tunnel junction device MTJ1 and the second ferromagnetic tunnel junction device MTJ2 and nodes Q and QB, power consumption can be reduced.

Accordingly, as the current flows between two ferromagnetic tunnel junction devices MTJ1 and MTJ2 when storing, the store can be performed at high speed even though the amplifier circuit 70 described in the seventh embodiment is not provided. When inverters 10 and 20 are coupled between power source lines VDD and VSS and the polarity of the ferromagnetic tunnel junction device MTJ1 or MTJ2 is same as the twelfth embodiment it is preferable that an electric power line to which the third switch is coupled is at a high level, and when a MOSFET is used for the third switch a p-type MOSFET is preferable.

As described in the second through twelfth embodiments, the memory circuit includes an input/output switch (corresponding to the FET m5 or m6, or the pass gate m5' or the pass gate m6') to input/output data to the node Q or QB. In addition, the input/output switch inputs/outputs data to the node Q or QB according to the level of the word line WL. Accordingly, the memory circuit can be used as a memory cell of an SRAM memory.

The input/output switch includes a first input/output switch to input/output data to the first node Q (corresponding to the FET m5 or the pass gate m5'), and a second input/output switch to input/output data to the second node QB (corresponding to the FET m6 or the pass gate m6'). As described above, it is preferable to couple the input/output switch to both the first node Q and the second node QB. As described above, the input/output switch for inputting/outputting data to the node Q or QB can be composed so as to include one or more switches for inputting/outputting data to the first node Q and one or more switches for inputting/outputting data to the second node QB. When the input/output switch is composed by coupling a number of switches, it is possible to speed up a circuit for external reading and writing.

Thirteenth Embodiment

Figure 2:
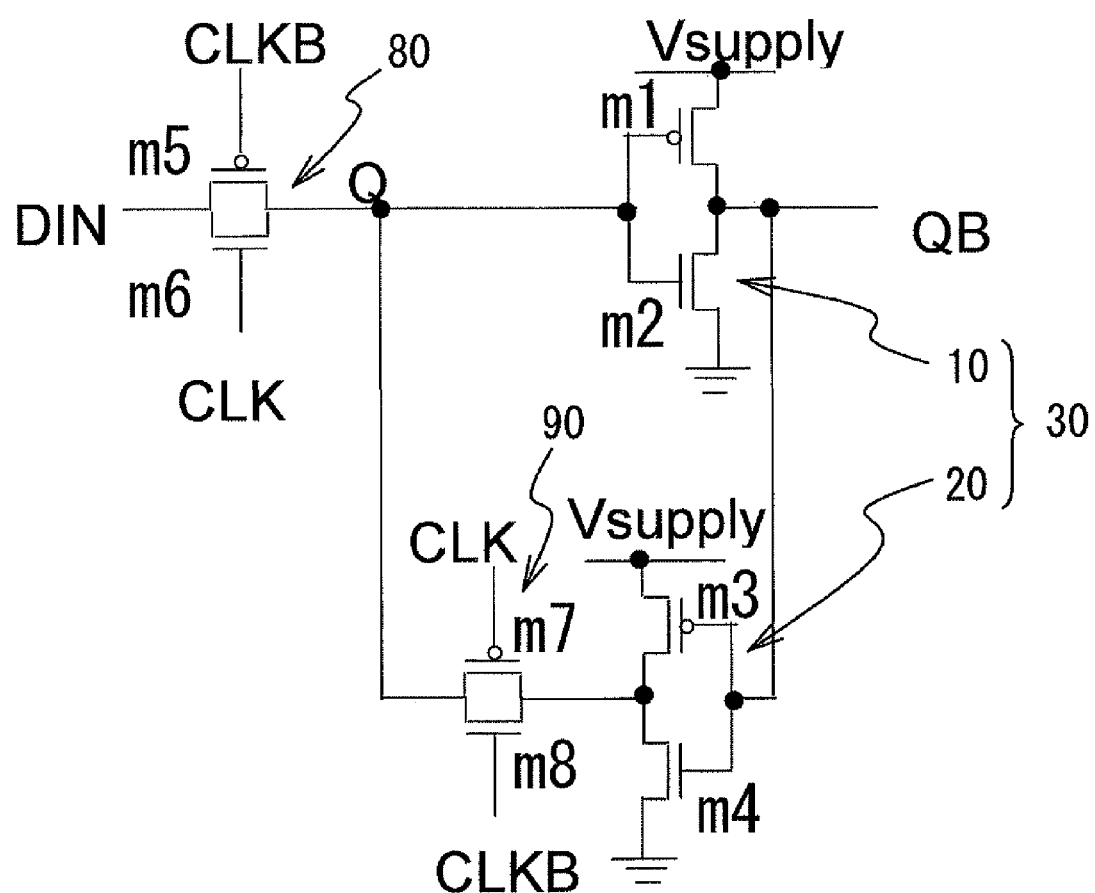
FIG. 2 is a circuit diagram of a latch circuit used for an integrated circuit.
Figure 34:
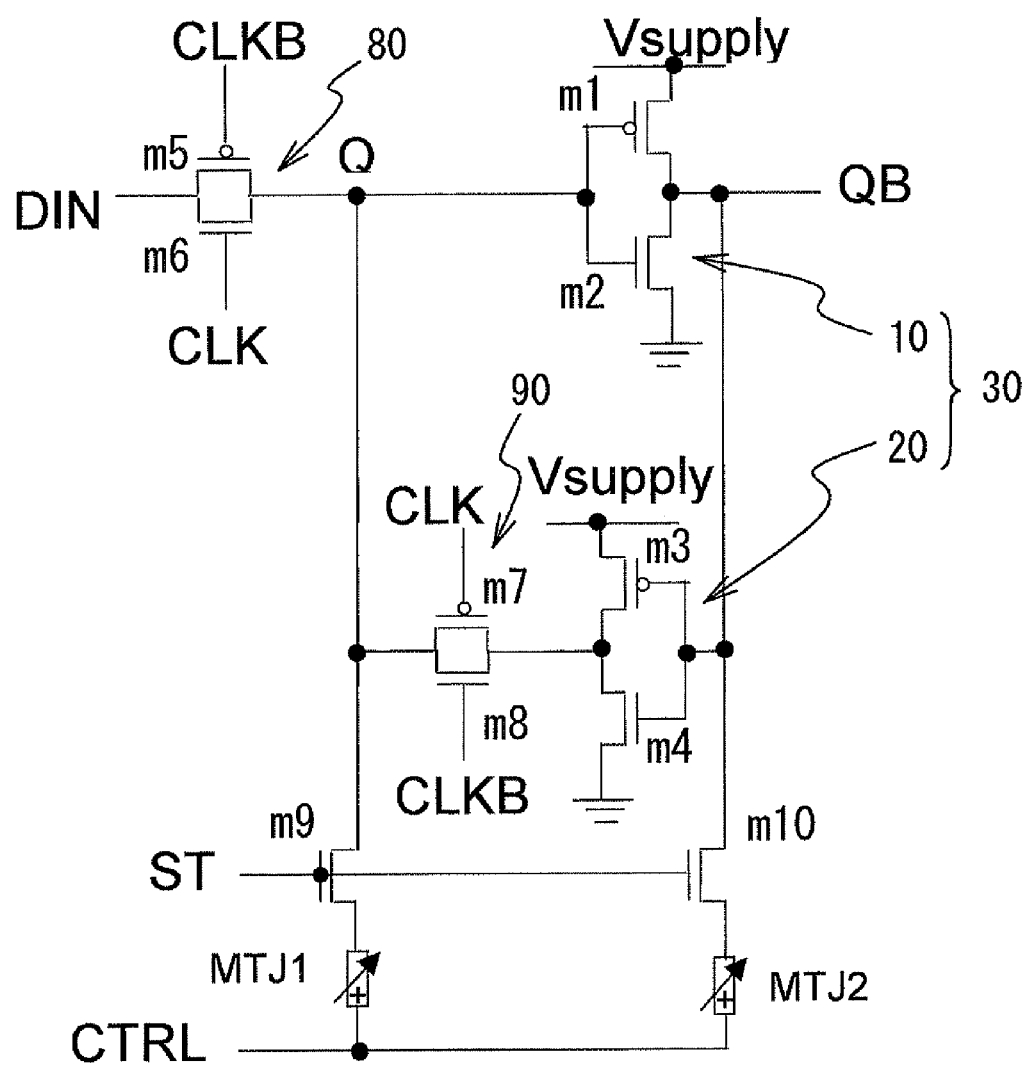
FIG. 34 is a circuit diagram of a latch circuit in accordance with a thirteenth embodiment.

FIG. 34 is a circuit diagram of a latch circuit in accordance with the thirteenth embodiment. Referring to FIG. 34, the latch circuit in accordance with the thirteenth embodiment includes n-type FETs m9 and m10, and ferromagnetic tunnel junction devices MTJ1 and MTJ2 in addition to the D latch circuit in FIG. 2. The FET m9 and the ferromagnetic tunnel junction device MTJ1 are coupled between the node Q and the control line CTRL, and FET m10 and the ferromagnetic tunnel junction device MTJ2 are coupled between the node QB and the control line CTRL. Gates of FETs m9 and m10 are coupled to the switch line ST.

A description will be given of the behavior of the latch circuit in accordance with the thirteenth embodiment. Writing data to and holding data in the bistable circuit 30 are performed in the same manner as a conventional D latch circuit. Data of the input line DIN is written to the bistable circuit 30 by setting the clock signal CLK to a high level and making the pass gate 80 conductive. The bistable circuit 30 holds data by setting the clock signal CLK to a low level and making the pass gate 90 conductive. Except the data storing operation from the bistable circuit 30 to ferromagnetic tunnel junction devices MTJ1 and MTJ2, and the data restoring operation from ferromagnetic tunnel junction devices MTJ1 and MTJ2 to the bistable circuit 30 (data writing, outputting, and holding), it is preferable that the switch line ST is at a low level and FETs m9 and m10 are non-conductive. Accordingly, the current between nodes Q and QB, and the control line CTRL is suppressed, and power consumption can be reduced.

Figure 35A:
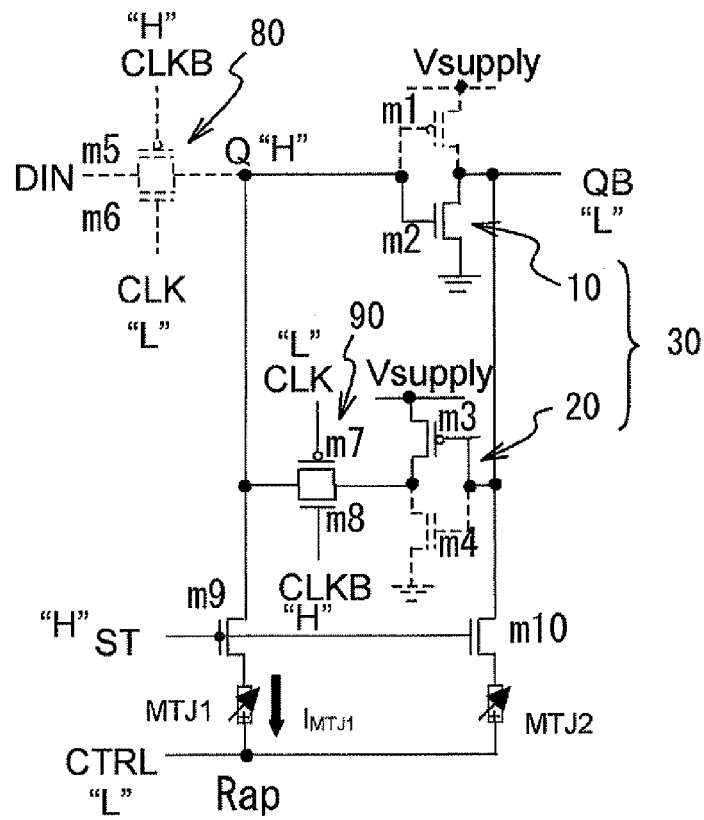
FIG. 35A and FIG. 35B are diagrams (No. 1) to describe a data store.
Figure 35B:
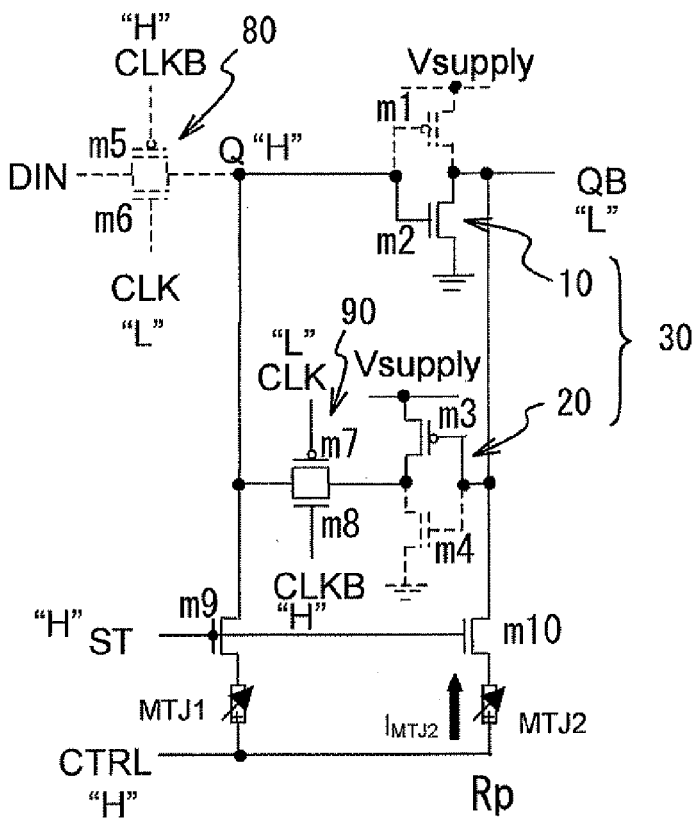

A description will be given of a method of storing data stored in the bistable circuit 30 to ferromagnetic tunnel junction devices MTJ1 and MTJ2 nonvolatilely. First a description will be given of the case that the data that the node Q is at a high level "H", the node QB is at a low level "L" is held. Hereinafter, in circuit diagrams of FIG. 35, FIG. 36, and FIG. 38, conductive FETs and the like are illustrated with a solid line, and non-conductive FETs and the like are illustrated with a dashed line. Referring to FIG. 35A and FIG. 35B, as the clock signal CLK becomes at a low level, data is held in the bistable circuit 30. Referring to FIG. 35A, the switch line ST is at a high level, and the control line CTRL is at a low level. The current $I_{MTJ1}$ flows to the control line CTRL from the node Q via the FET m9. When the current $I_{MTJ1}$ an is set to exceed the threshold current $I_{TR}$, a resistance of the ferromagnetic tunnel junction device MTJ1 results in a high resistance Rap. Since the node QB is at a low level, the current does not flow in the ferromagnetic tunnel junction device MTJ2. Referring to FIG. 35B, the switch line ST is at a high level, and the control line CTRL is at a high level. The current $I_{MTJ2}$ flows from the control line CTRL to the node QB. When the current $I_{MTJ2}$ is set to exceed the threshold current $I_{TF}$, a resistance of the ferromagnetic tunnel junction device MTJ2 results in a low resistance Rp. Since the node Q is at a high level, the current does not flow in the ferromagnetic tunnel junction device MTJ1. When a sequence of above operations is completed, a resistance of the ferromagnetic tunnel junction device MTJ1 results in a high resistance Rap, and a resistance of the ferromagnetic tunnel junction device MTJ2 results in a low resistance Rp. Any of steps in FIG. 35A and FIG. 35B can be performed first.

Figure 36A:
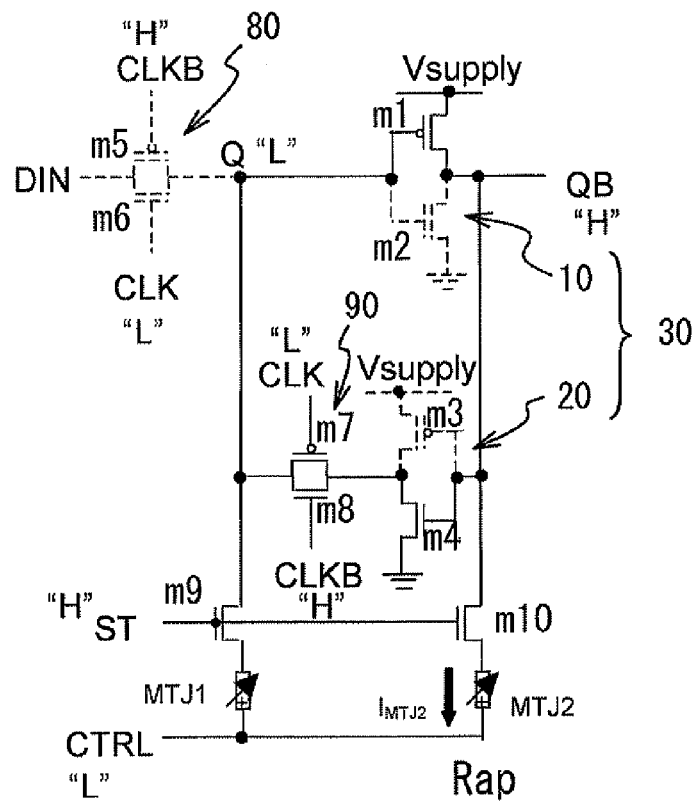
FIG. 36A and FIG. 36B are diagrams (No. 2) to describe a data store.
Figure 36B:
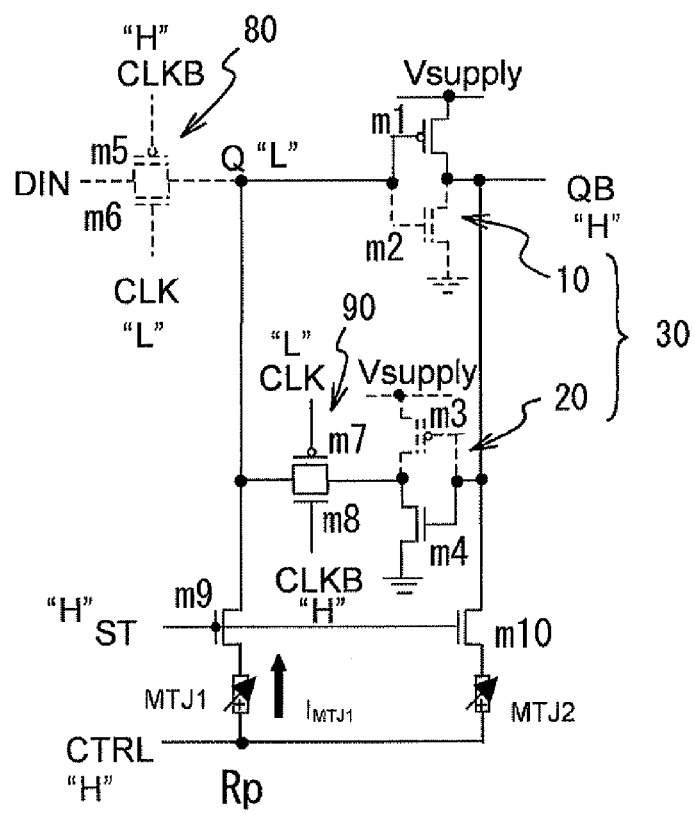

Referring to FIG. 36A and FIG. 36B, a description will be given of the case that the data where the node Q is at a low level and the node QB is at a high level is held. Referring to FIG. 36A, when the switch line ST is at a high level and the control line CTRL is at a low level, the ferromagnetic tunnel junction device MTJ2 results in a high resistance Rap because the current $I_{MTJ2}$ flows from the node QB to the control line CTRL. Since the node Q is at a low level, the current does not flow in the ferromagnetic tunnel junction device MTJ1. Referring to FIG. 36B, when the switch line ST is at a high level and the control line CTRL is at a high level, the ferromagnetic tunnel junction device MTJ1 results in a low resistance Rp because the current $I_{MTJ1}$ flows from the control line CTRL to the node Q. Since the node QB is at a high level, the current does not flow in the ferromagnetic tunnel junction device MTJ2. When a sequence of above operations is completed, a resistance of the ferromagnetic tunnel junction device MTJ1 results in a low resistance Rp, and a resistance of the ferromagnetic tunnel junction device MTJ2 results in a high resistance Rap. As described above, data in the bistable circuit 30 can be stored to ferromagnetic tunnel junction devices MTJ1 and MTJ2 nonvolatilely.

Figure 37:
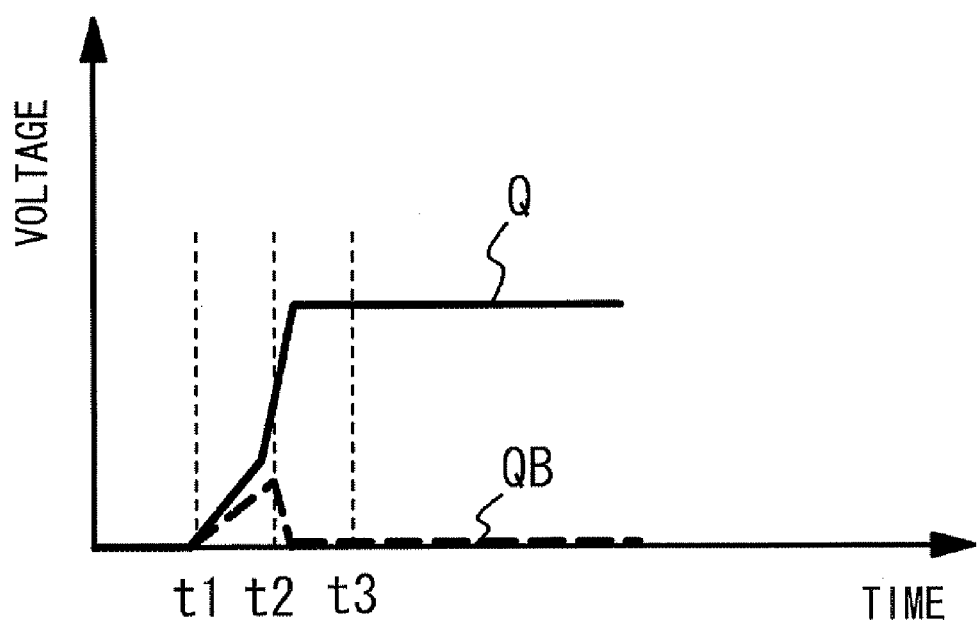
FIG. 37 is a diagram (No. 1) to describe a data restoration.
Figure 38A:
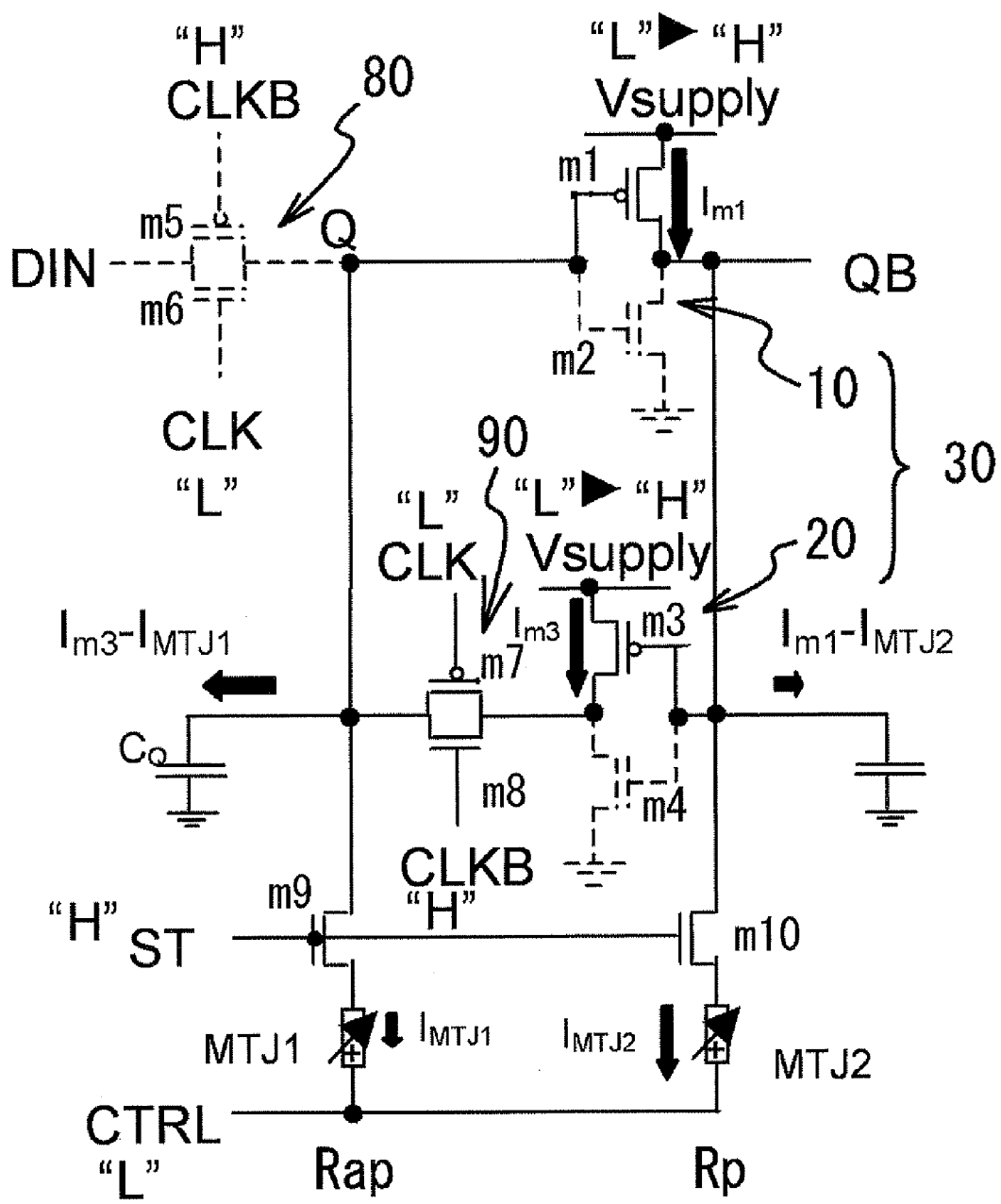
FIG. 38A through FIG. 38C are diagrams (No. 2) to describe a data restoration.
Figure 38B:
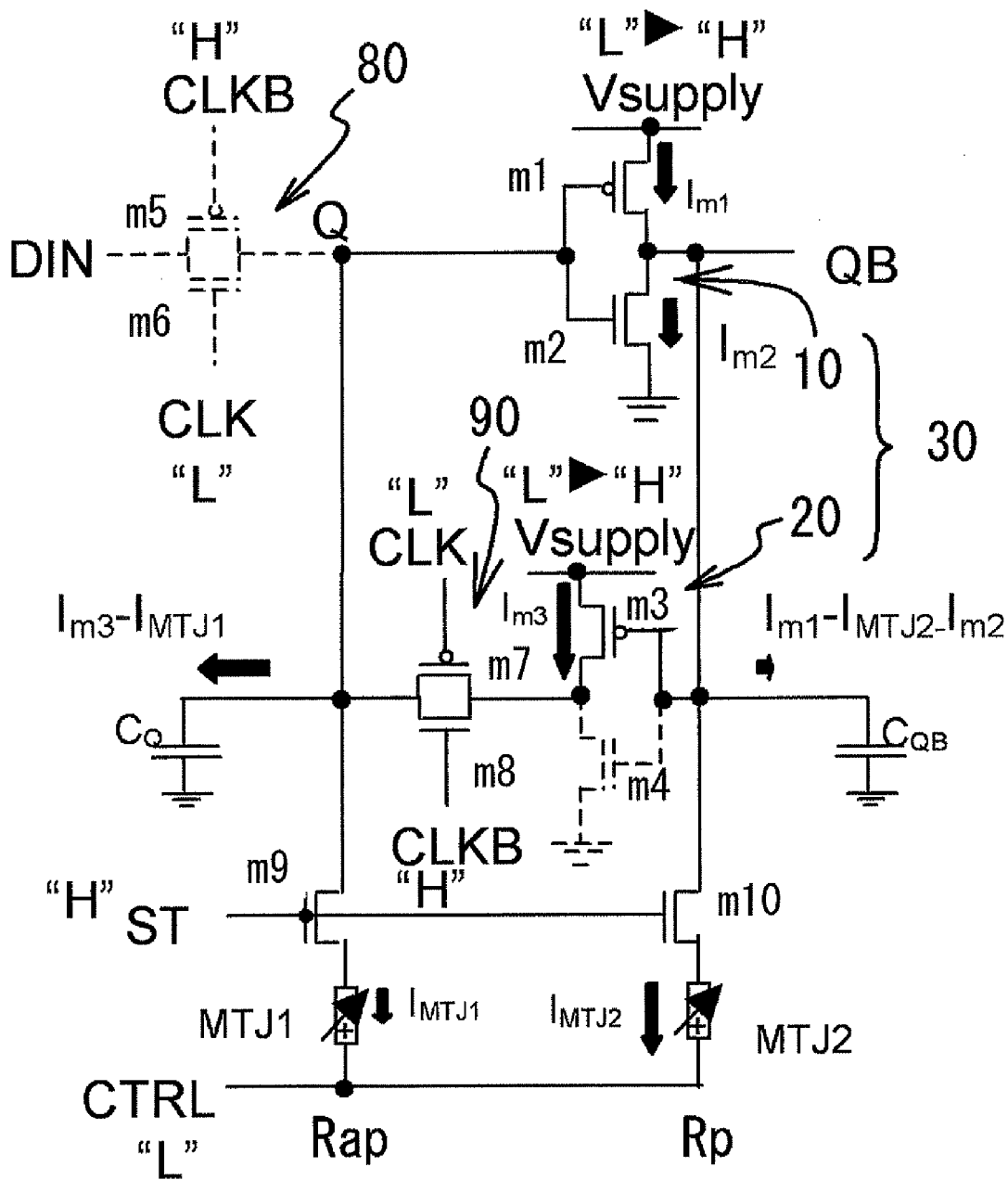
Figure 38C:
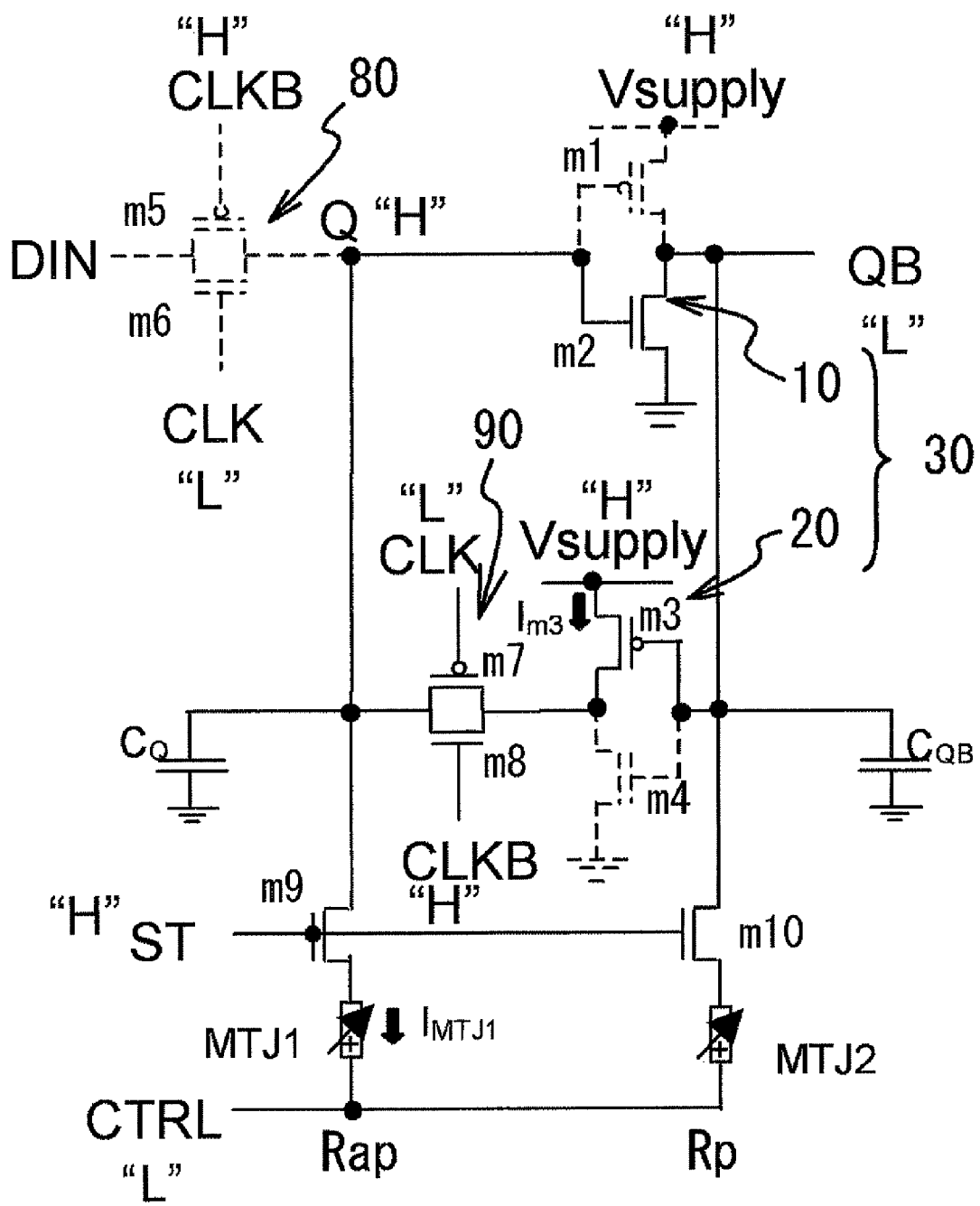

Even when a power source Vsupply is shut down and data in the bistable circuit 30 is lost, resistances of ferromagnetic tunnel junction devices MTJ1 and MTJ2 can be held nonvolatilely. A description will be given of a method of restoring data from ferromagnetic tunnel junction devices MTJ1 and MTJ2 to the bistable circuit 30 after that. FIG. 37 is a diagram illustrating voltages of nodes Q and QB in time for a data restoration to the bistable circuit 30. FIG. 38A through FIG. 38C are diagrams explaining conditions of the latch circuit at times t1 through t3 in FIG. 37 respectively. In FIG. 38A through FIG. 38C, capacitors $C_Q$ and $C_{QB}$ are coupled to nodes Q and QB respectively. Capacitors $C_Q$ and $C_{QB}$ are a wiring capacitor and parasitic capacitor of a transistor for example.

Referring to FIG. 38A, ferromagnetic tunnel junction devices MTJ1 and MTJ2 are a high resistance Rap and a low resistance Rp respectively. The clock signal CLK is at a low level, the pass gate 80 is non-conductive, and the pass gate 90 is conductive. At the time t1, the switch line ST is at a high level. A power source voltage is raised from a low level to a high level. Since nodes Q and QB are at a low level, the current $I_{m1}$ and $I_{m3}$ flow from a power source Vsupply to nodes Q and QB via FETs m1 and m3 in inverters 10 and 20 respectively. Since the ferromagnetic tunnel junction device MTJ1 is a high resistance Rap, the current $I_{MTJ1}$ flowing from the node Q to the control line CTRL which is at a low level is small. Since the ferromagnetic tunnel junction device MTJ2 is a low resistance Rp, the current $I_{MTJ2}$ flowing from the node QB to the control line CTRL that is at a low level is large.

Voltages $V_Q$ and $V_{QB}$ of nodes Q and QB are expressed by following formulas.

$$V_Q = \int (I_{m3} - I_{m4} - I_{MTJ1}) dt / C_Q \quad \text{formula 6}$$

$$V_{QB} = \int (I_{m1} - I_{m2} - I_{MTJ2}) dt / C_{QB} \quad \text{formula 7}$$

In addition, a relation of magnitude of each current is expressed as follows.

$$I_{m1} = I_{m3} \gg I_{m2} = I_{m4} \quad \text{formula 8}$$

$$I_{MTJ1} < I_{MTJ2} \quad \text{formula 9}$$

In addition, capacitances $C_Q$ and $C_{QB}$ of capacitors $C_Q$ and $C_{QB}$ are expressed as follows.

$$C_Q = C_{QB} \quad \text{formula 10}$$

As described above, the current charging the capacitor $C_Q$ from the node Q is $I_{m3} - I_{MTJ1}$, and the current charging the capacitor $C_{QB}$ from the node QB is $I_{m1} - I_{MTJ2}$.

Therefore, $$V_Q > V_{QB}$$

is obtained.

Accordingly, both voltages $V_Q$ and $V_{QB}$ increase between the time t1 and the time t2 in FIG. 37, but $V_Q$ is larger than $V_{QB}$.

Referring to FIG. 38B, at the time t2 in FIG. 37, when $V_Q$ becomes larger than the threshold voltage of the FET m2 composing the inverter 10, the FET m2 becomes conductive, and the current $I_{m2}$ flows in the FET m2. The current charging the capacitor $C_{QB}$ becomes $I_{m1} - I_{MTJ2} - I_{m2}$. When the current $I_{m2}$ becomes large, the capacitor $C_{QB}$ discharges, and the voltage of the node QB becomes zero.

Referring to FIG. 38C, when the steady state is achieved at the time t3 in FIG. 37, $I_{m3}$ becomes equal to $I_{MTJ1}$, the capacitor $C_Q$ comes to a charged condition, and the capacitor $C_{QB}$ comes to a discharged condition. According to this, the node Q becomes at a high level, the node QB becomes at a low level, and a data restoration from ferromagnetic tunnel junction devices MTJ1 and MTJ2 to the bistable circuit 30 is completed.

A data restoration to the bistable circuit 30 when ferromagnetic tunnel junction devices MTJ1 and MTJ2 are a low resistance Rp and a high resistance Rap respectively can be performed in the same manner except that node Q and QB in FIG. 37 through FIG. 38B switch places.

Figure 39:
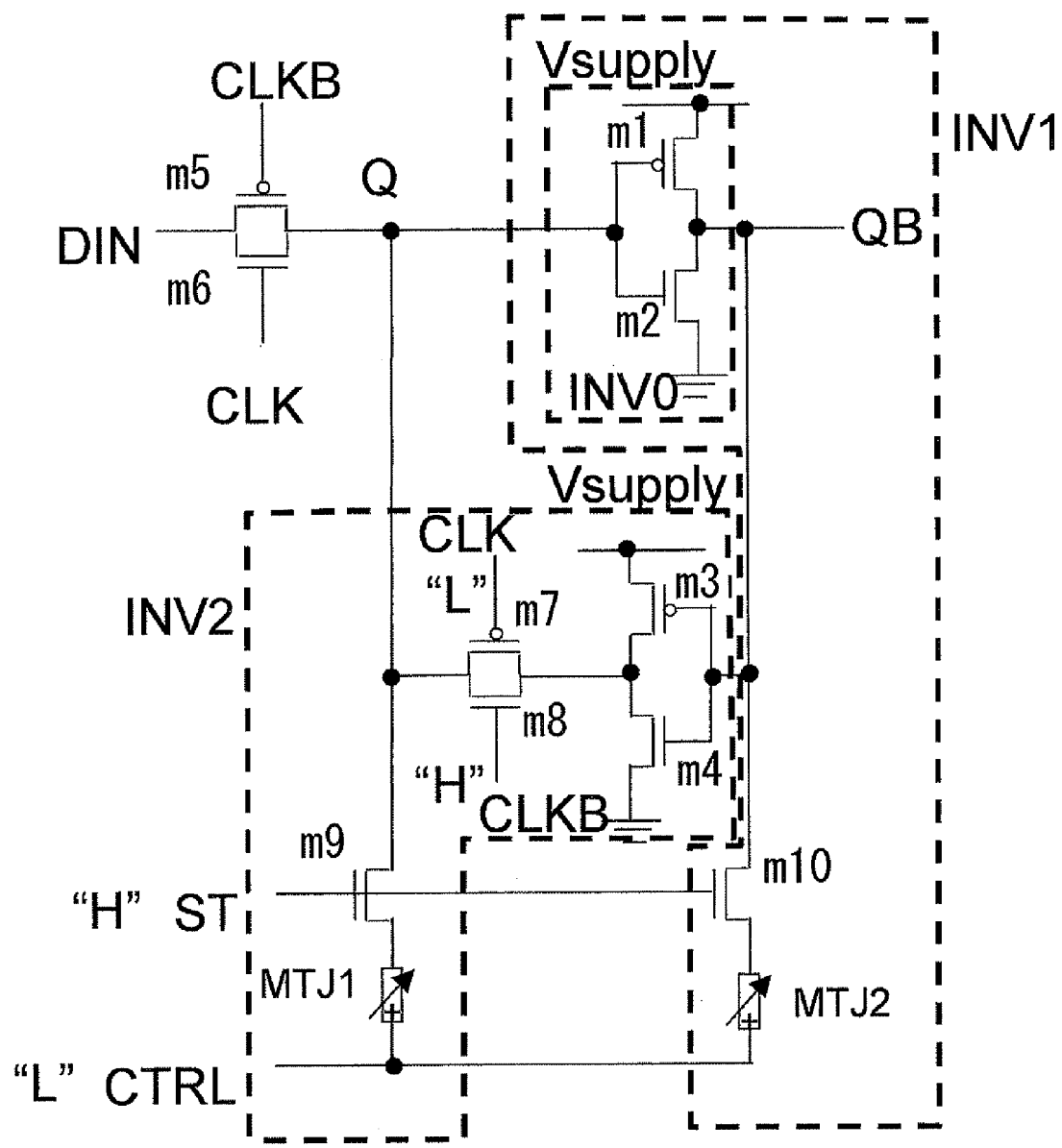
FIG. 39 is a diagram illustrating INV1 and INV2.

Then, a description will be given of restoring data from ferromagnetic tunnel junction devices MTJ1 and MTJ2 to the bistable circuit 30, focusing on the inverter. As illustrated in FIG. 39, a circuit provided with the inverter 10 and the ferromagnetic tunnel junction device MTJ2 is described as the inverter INV1, a circuit provided with the inverter 20 and the ferromagnetic tunnel junction device MTJ1 is described as the inverter INV2, and the inverter 10 or 20 to which a ferromagnetic tunnel junction device is not added is described as the inverter INV0.

Figure 40A:
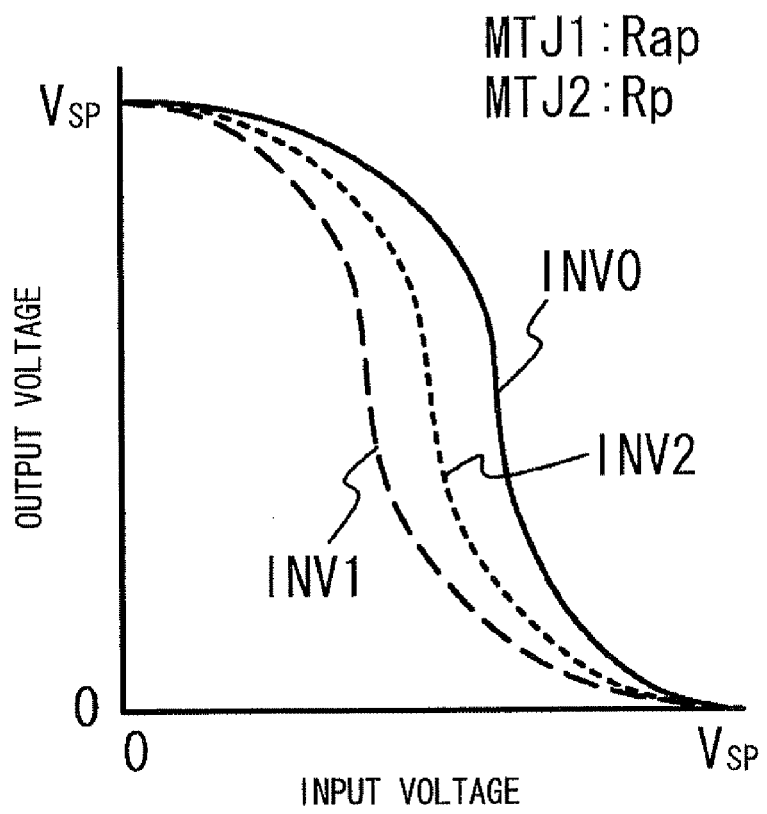
FIG. 40A and FIG. 40B are diagrams illustrating input/output characteristics of an inverter.
Figure 40B:
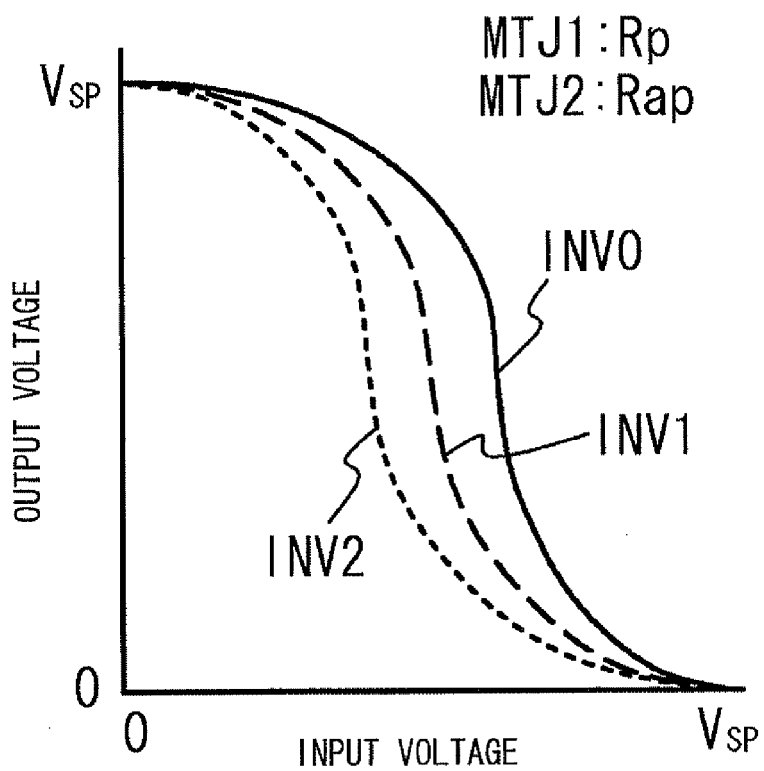

FIG. 40A is a conceptual diagram illustrating input/output characteristics of the inverter when the ferromagnetic tunnel junction device MTJ1 is a high resistance Rap, and the ferromagnetic tunnel junction device MTJ2 is a low resistance Rp. Inverters INV1 and INV2 to which the ferromagnetic tunnel junction device is added have low logic thresholds compared to the inverter INV0 to which the ferromagnetic tunnel junction device is not added. The logic threshold of the inverter INV1 the ferromagnetic tunnel junction device MTJ2 of which is a low resistance Rp is further low compared to the inverter INV2 the ferromagnetic tunnel junction device MTJ1 of which is a high resistance Rap. Referring to FIG. 40B, when the ferromagnetic tunnel junction device MTJ1 is a low resistance Rp, and the ferromagnetic tunnel junction device MTJ2 is a high resistance Rap, the logic threshold of the inverter INV2 becomes low compared to the inverter INV1.

Figure 41A:
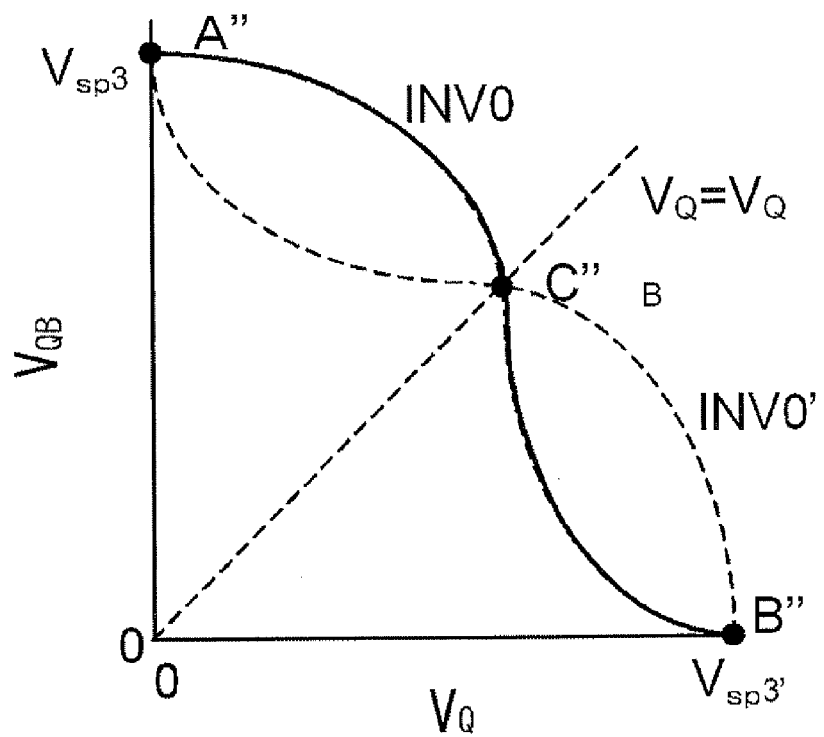
FIG. 41A through FIG. 41D are diagrams (No. 3) to describe a data restoration.

FIG. 41A is a conceptual diagram of a characteristic curve of the bistable circuit composed of the inverter INV0 or INV0' to which the ferromagnetic tunnel junction device is not coupled. Since characteristics of inverters INV0 and INV0' are same, the switch point C" of the bistable circuit 30 is on the line $V_Q=V_{QB}$. A loop of the characteristic curve between the point A" when $V_{QB}$ is equal to a power source voltage Vsp3 and the switch point C" and a loop of the characteristic curve between the point B" when $V_Q$ is equal to a power source voltage Vsp3' and the point C" are symmetric.

Figure 41B:
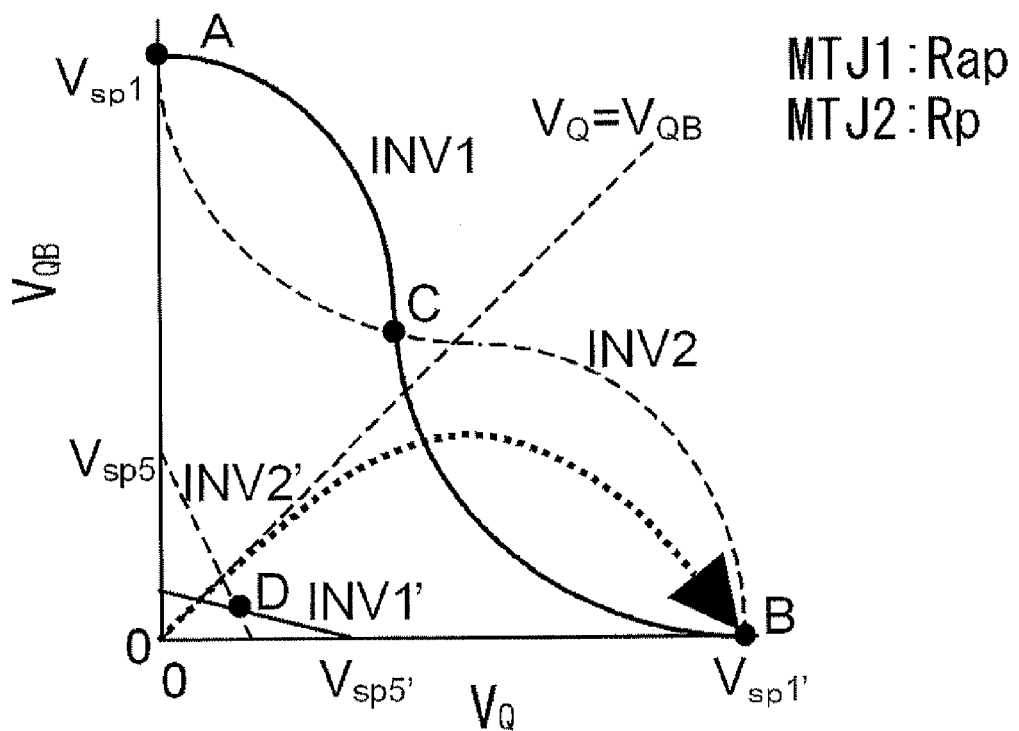

FIG. 41B is a conceptual diagram of a characteristic curve of the bistable circuit 30 when the ferromagnetic tunnel junction device MTJ1 is a high resistance Rap, and the ferromagnetic tunnel junction device MTJ2 is a low resistance Rp. Since input/output characteristics of inverters INV1 and INV2 are asymmetric, the switch point C of the bistable circuit 30 lies above the line $V_Q=V_{QB}$. A loop of the characteristic curve between the point A when $V_{QB}$ is equal to a power source voltage $V_{sp1}$ and the switch point C becomes smaller than a loop of the characteristic curve between the point B when $V_Q$ is equal to a power source voltage $V_{sp1'}$ the point C. A process raising a power source voltage Vsupply from a ground voltage 0 V to the voltage $V_{sp1}$ or $V_{sp1'}$ is considered. At this time, the current $I_{MTJ2}$ which flows in the ferromagnetic tunnel junction device MTJ2 is set so as not to exceed the threshold current $I_{TR}$. When a power source voltage Vsupply is a voltage $V_{sp5}$ or $V_{sp5'}$ which slightly exceeds an absolute value of the threshold voltage of a p-type MOS-FET used for the inverter, characteristic curves of the inverter INV1 and the inverter INV2 become INV1' and INV2'. The threshold voltage of the inverter INV2 is lower than that of the inverter INV1. That is to say that when input voltages to inverters INV1 and INV2 (the voltage of the node Q in the case of the inverter INV1, and the voltage of the node QB in the case of the inverter INV2) are same, more current flows from an output node (the node QB in the case of inverter INV1, and the node Q in the case of the inverter INV2) to the ground in the inverter INV2. Therefore, the output voltage of the inverter INV2 when the input voltage is 0 V becomes lower than that of the inverter INV1. Thus, although the dynamic operating point of the bistable circuit depends on a speed of raising a power source voltage Vsupply and the like, it follows a locus illustrated with the dashed arrow, and converges on the point B because the static steady point always lies below the line $V_Q=V_{QB}$.

Figure 41C:
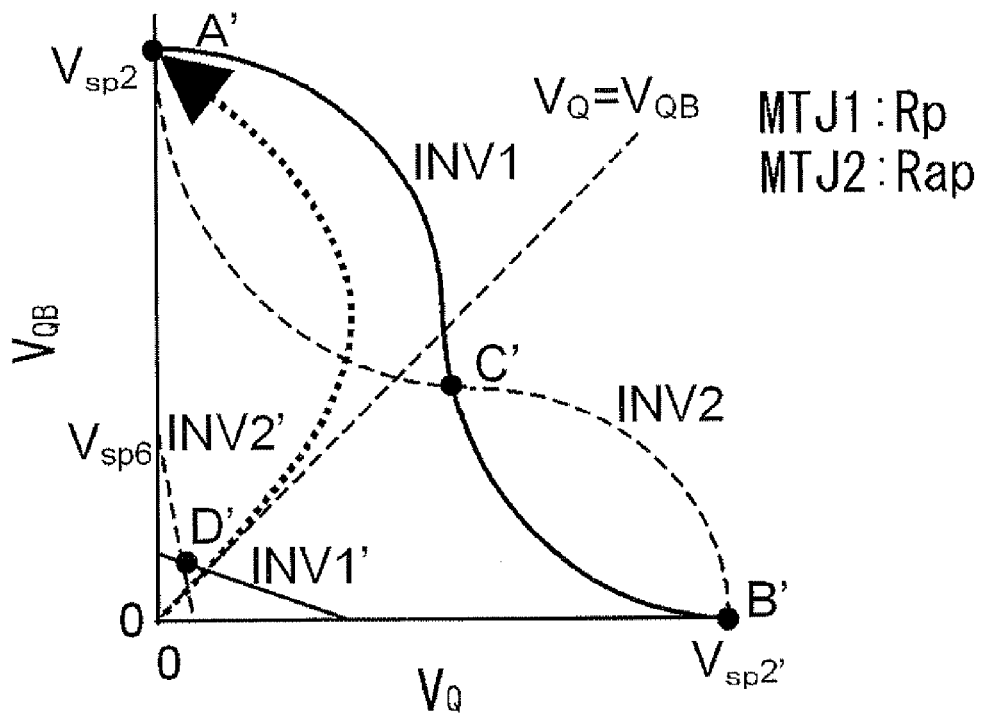

FIG. 41C is a conceptual diagram of a characteristic curve of the bistable circuit 30 when the ferromagnetic tunnel junction device MTJ1 is a low resistance Rp, and the ferromagnetic tunnel junction device MTJ2 is a high resistance Rap. The switch point C' of the bistable circuit 30 lies below the line $V_Q=V_{QB}$. A loop of the characteristic curve between the point A' when $V_{QB}$ is equal to a power source voltage $V_{sp2}$ and the switch point C' becomes bigger than a loop of the characteristic curve between the point B' when $V_Q$ is equal to a power source voltage $V_{sp2'}$ and the point C'. At this time, a power source voltage Vsupply is raised from 0 V to $V_{sp2}$ or $V_{sp2'}$ so that the current $I_{MTJ1}$ flowing in the ferromagnetic tunnel junction device MTJ1 does not exceed the threshold current $I_{TR}$. Since the static steady point always lies above the line $V_Q=V_{QB}$, the dynamic operating point of the bistable circuit 30 follows the locus illustrated with a dashed arrow and converges on the point A'.

In FIG. 41B and FIG. 41C, even though the dynamic operating point becomes $V_Q=Q_{QB}$ when a power source voltage is raised up, the direction of the steady point on which the dynamic operating point converges does not change, and the dynamic operating point converges on the point B or point A' because the dynamic operating point is within the characteristic loop which lies above or below the line $V_Q=V_{QB}$ just before that.

Figure 41D:
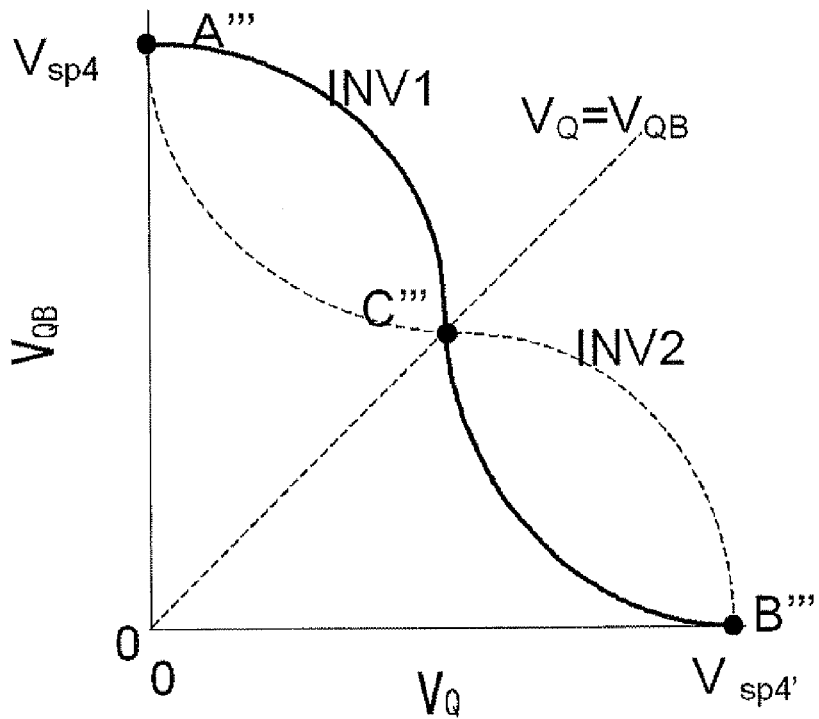

In FIGS. 41B and 41C, once the current $I_{MTJ1}$ or $I_{MTJ2}$ of the ferromagnetic tunnel junction device MTJ1 or MTJ2 exceeds the threshold current $I_{TR}$, ferromagnetic tunnel junction devices MTJ1 and MTJ2 become a high resistance Rap. Therefore, as illustrated in FIG. 41D, logic thresholds of inverters INV1 and INV2 become same, and the switch point C'" will be on the line $V_Q=V_{QB}$. Thus, when a power source voltage Vsupply is raised from 0 V to the voltage $V_{sp4}$ or $V_{sp4'}$, it cannot be determined whether the static steady point converges on the point A'" or on the point B'". As described above, it is preferable that the currents $I_{MTJ1}$ and $I_{MTJ2}$ do not exceed the threshold current In when restoring data, FIG. 42 is a timing diagram illustrating a control of the latch circuit in accordance with the thirteenth embodiment. A hatched area indicates that it is not exactly known whether it is at a high level or at a low level, Referring to FIG. 42, a power source voltage Vsupply is supplied, and the control line CTRL and the switch line ST are at a low level. Writing data to the bistable circuit 30 is performed by setting the clock signal CLK to a high level, and setting the input line DIN to a high level or a low level. Storing data from the bistable circuit 30 to ferromagnetic tunnel junction devices MTJ1 and MTJ2 is performed by setting the switch line ST and the control line CTRL to a high level during the period T1 (corresponding to FIG. 35B and FIG. 36B), and setting the switch line ST to a high level and the control line CTRL to a low level during the period T2 (corresponding to FIG. 35A and FIG. 36A).

After that, by setting a power source voltage Vsupply to 0 V, the latch circuit becomes sleep condition. Since the current does not flow in the latch circuit, power consumption can be reduced. Restoring data from ferromagnetic tunnel junction devices MTJ1 and MTJ2 to the bistable circuit 30 is performed by setting the control line CTRL to a low level during the period T3, and raising a power source voltage Vsupply from 0 V under the condition that the switch line ST is at a high level, the clock signal CLK is at a low level, and the inverted clock signal CLKB is at a high level (corresponding to FIG. 37 through FIG. 38C).

Figure 43:
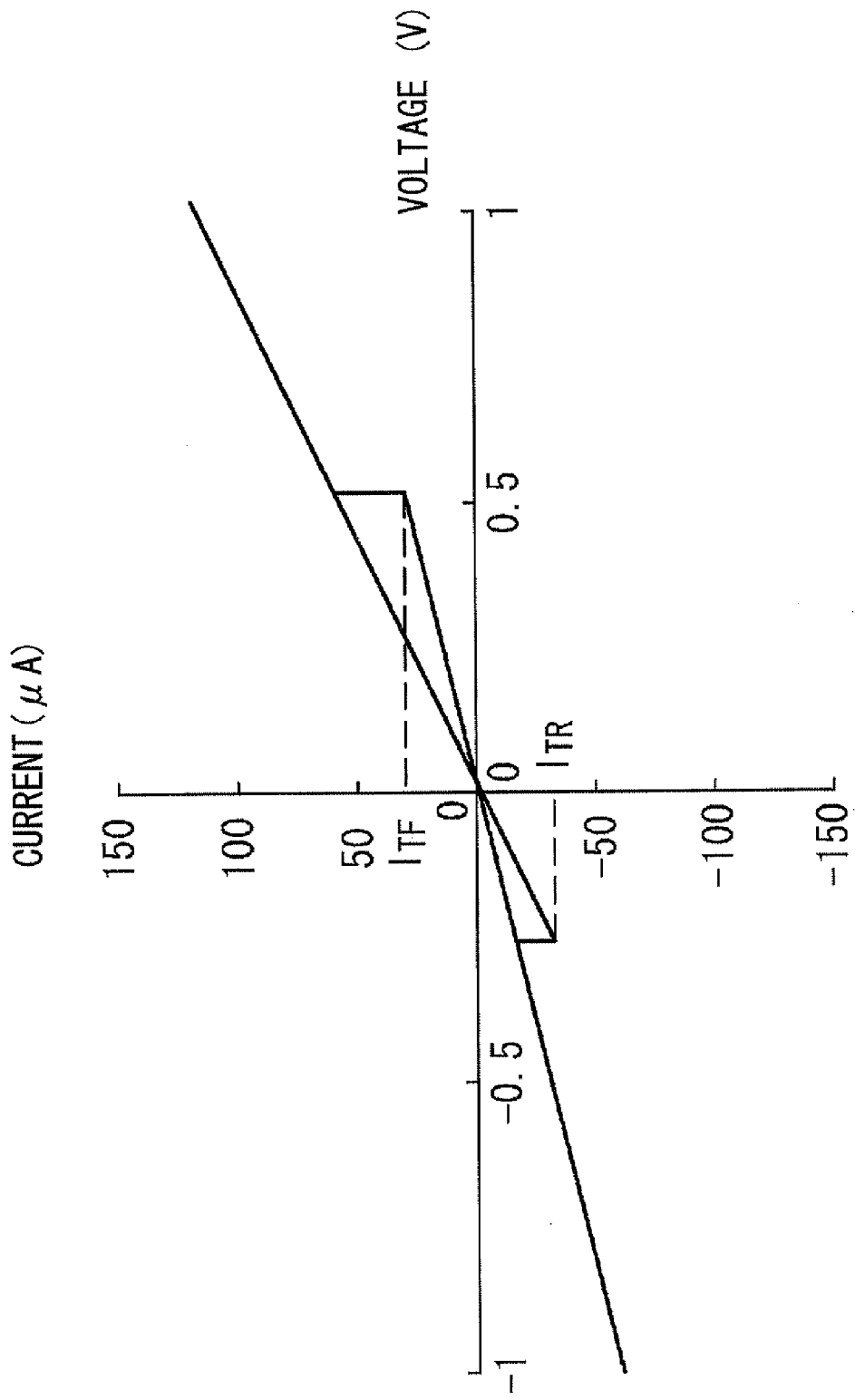
FIG. 43 is a diagram illustrating current-voltage characteristics of a ferromagnetic tunnel junction device used for a simulation.

A simulation of the latch circuit in accordance with the thirteenth embodiment is performed. FIG. 43 is a diagram illustrating current voltage characteristics of the ferromagnetic tunnel junction device used for the simulation. Threshold currents $I_{TF}$ and $I_{TR}$ are 30 μA and −30 μA respectively, and resistances Rap and Rp are 16.7 kΩ and 8.33 kΩ respectively. The channel length L of each FET is 0.07 μm, the channel width Wn of an n-type FET is 1.0 μm, and the channel width of a p-type FET is 1.5 μm.

Figure 44A:
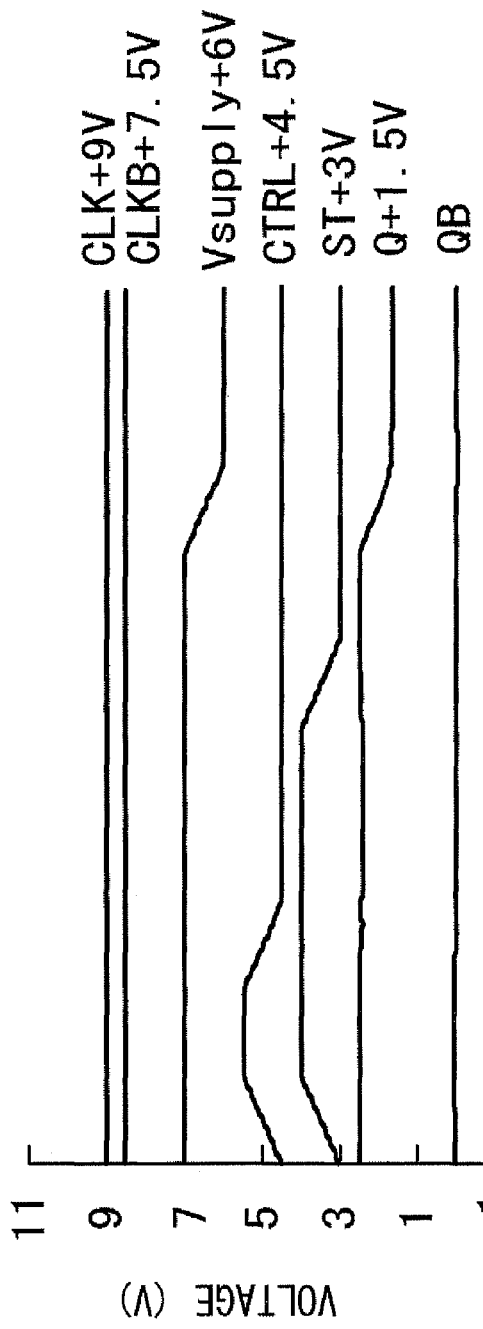
FIG. 44A through FIG. 44D are diagrams illustrating simulation results of the thirteenth embodiment.
Figure 44B:
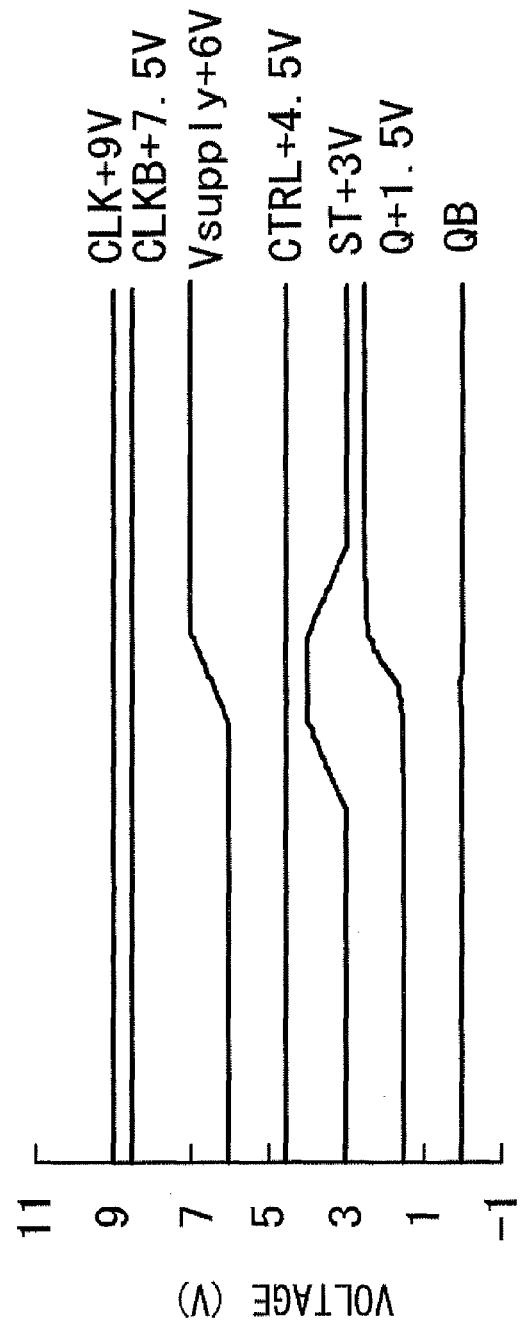
Figure 44C:
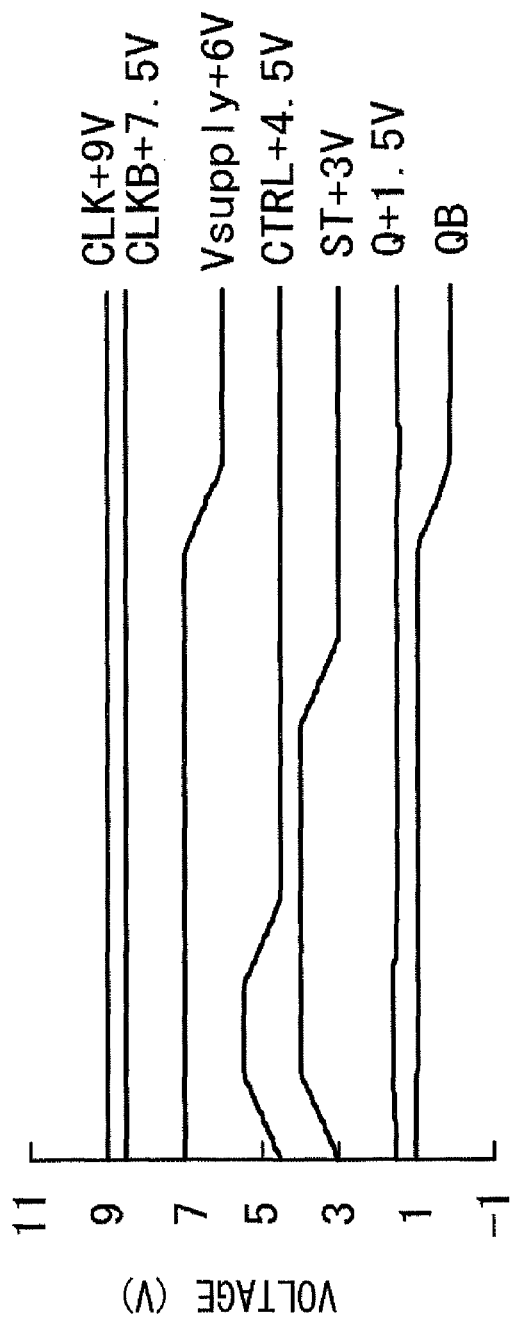
Figure 44D:
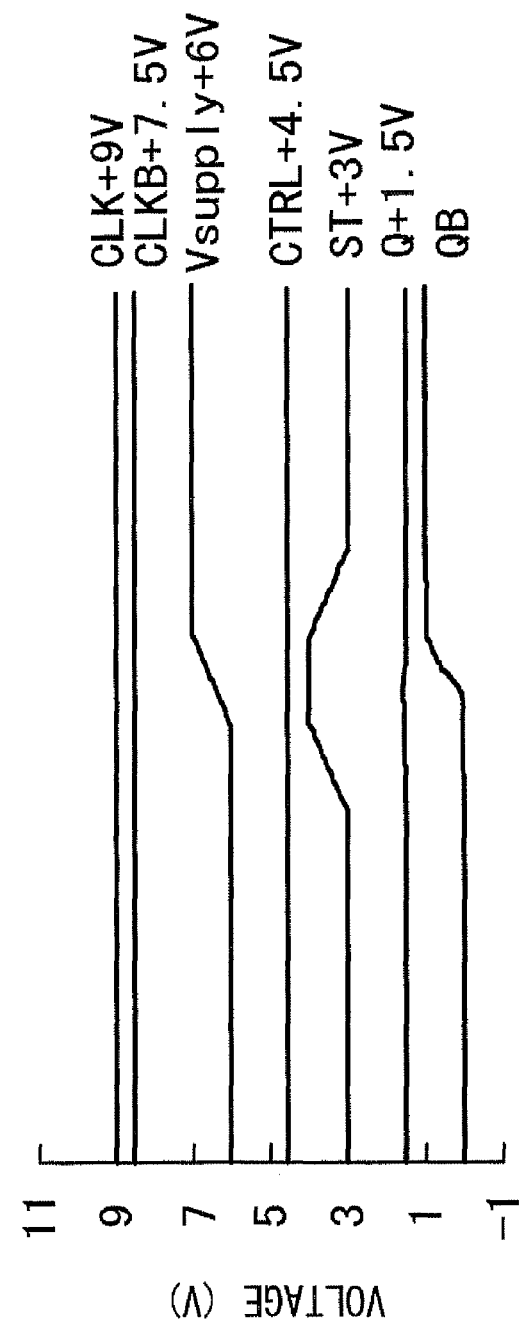

FIG. 44A and FIG. 44D are timing diagrams illustrating simulation results. FIG. 44A is a timing diagram of a storing operation when the node Q is at a high level, and FIG. 44B is a timing diagram of a restoring operation after FIG. 44A. FIG. 44C is a timing diagram of a storing operation when the node Q is at a low level, and FIG. 44D is a timing diagram of a restoring operation after FIG. 44C. Each diagram is illustrated by adding 1.5 V to the level of the node Q, 3V to the level of the switch line ST, 4.5 V to the level of the control line CTRL, 6V to a power source voltage Vsupply, 7.5V to the level of the inverted clock signal CLKB, 9.0V to the level of the clock signal CLK. A method for the store, and a method for the restoration are same as ones described before.

In FIG. 44A, the condition that the node Q is at a high level and the node QB is at a low level is stored in the ferromagnetic tunnel junction device. In FIG. 44B, a high level is restored to the node Q, and a low level is restored to the node QB. In the same manner, the condition that the node Q is at a low level and the node QB is at a high level is stored in the ferromagnetic tunnel junction device. In FIG. 44D, a low level is restored to the node Q, and a high level is restored to the node QB. As described above, in the latch circuit in accordance with the thirteenth embodiment, it is confirmed that the data stored in ferromagnetic tunnel junction device MTJ1 and MTJ2 can be restored to the bistable circuit 30 after a power source is restored.

Fourteenth Embodiment

Figure 45:
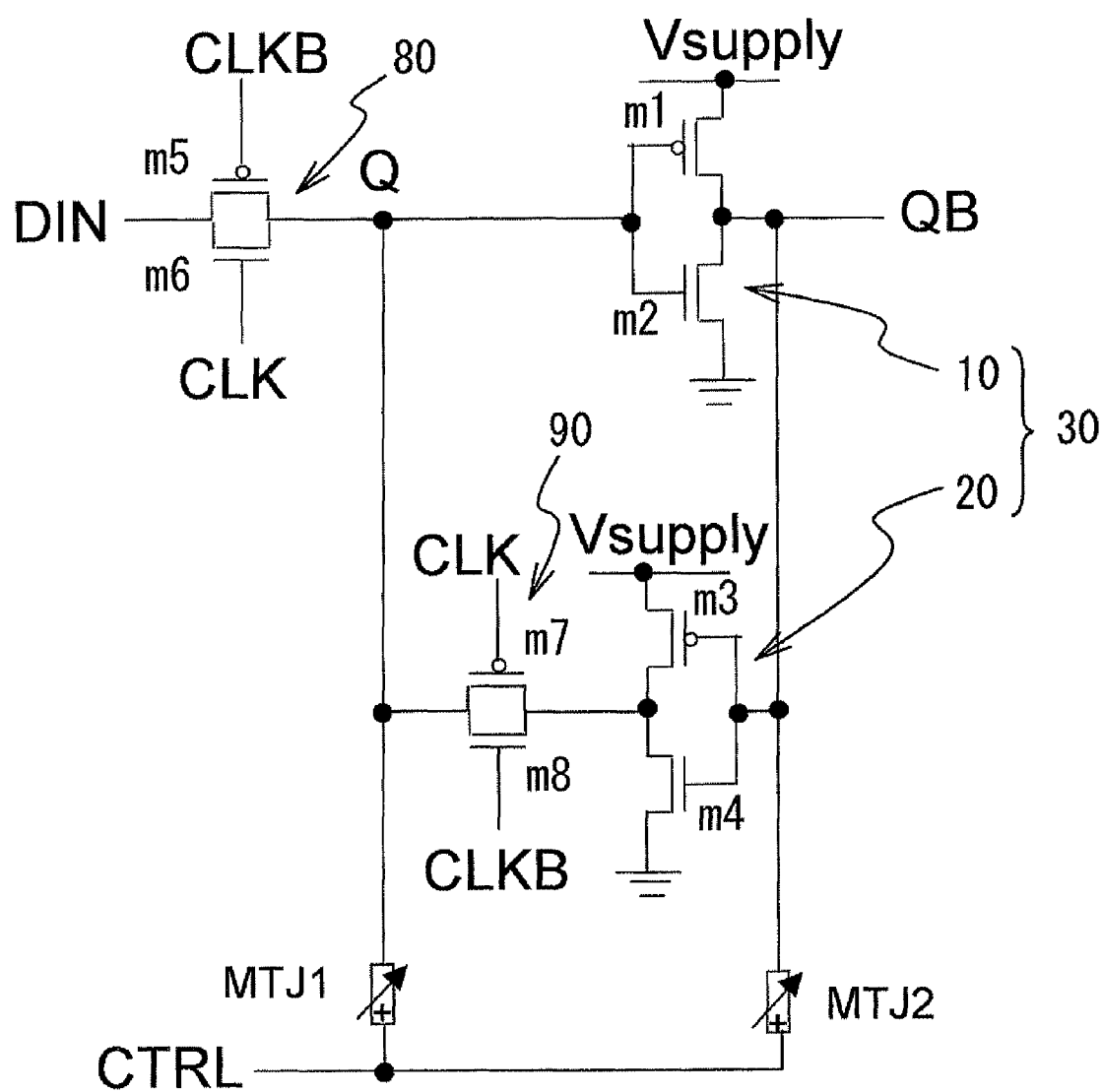
FIG. 45 is a circuit diagram of a latch circuit in accordance with a fourteenth embodiment.

FIG. 45 is a circuit diagram of a latch circuit in accordance with the fourteenth embodiment. Compared to FIG. 3 of the thirteenth embodiment, the FET m9 and the FET m10 are not provided. As described, the FET m9 (a first switch) and the FET m10 (a second switch) are not necessary. However, it is preferable to provide the FET m9 and the FET m10 to suppress the current flowing from the bistable circuit 30 to the control line CTRL.

FIG. 46A through FIG. 46D are diagrams illustrating results of simulations, which are same as FIG. 44A through 44D of the thirteenth embodiment, to the latch circuit in accordance with the fourteenth embodiment. Each diagram is illustrated by adding 1.5 V to the level of the node Q, 3 V to the level of the control line CTRL, 4.5 V to a power source voltage V supply, 6V to the level of the inverted clock signal CLKB, and 7.5V to the clock signal CLK.

Figure 46C:
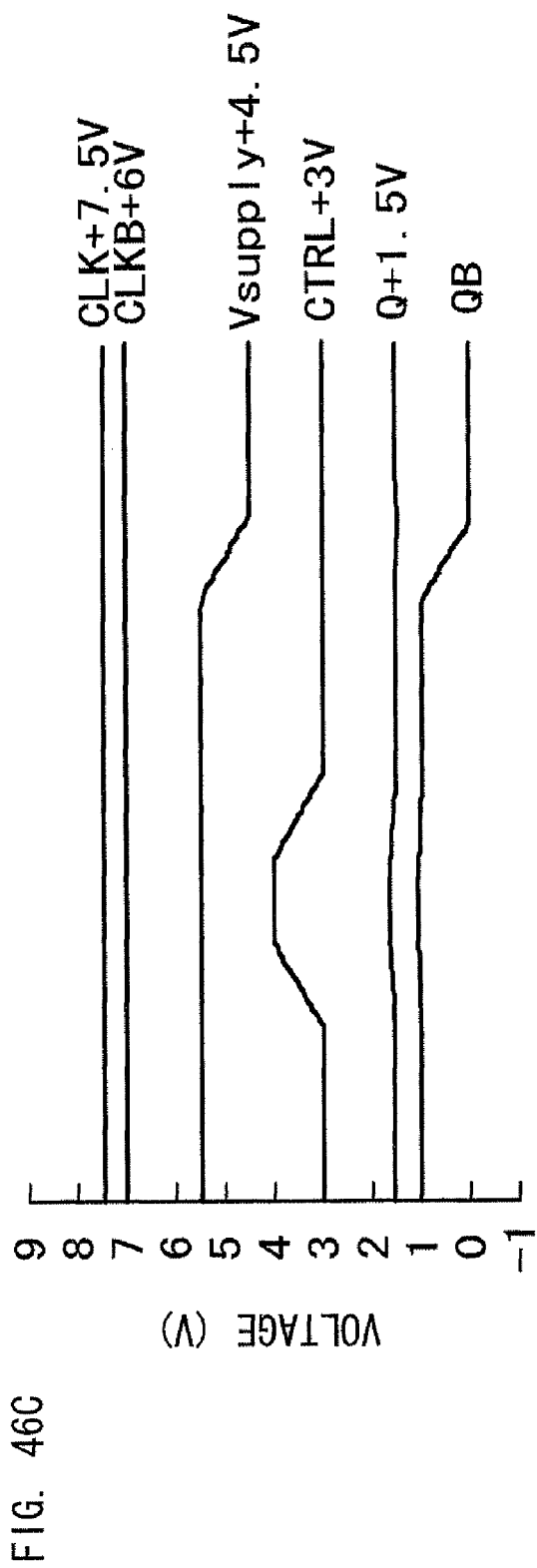
Figure 46D:
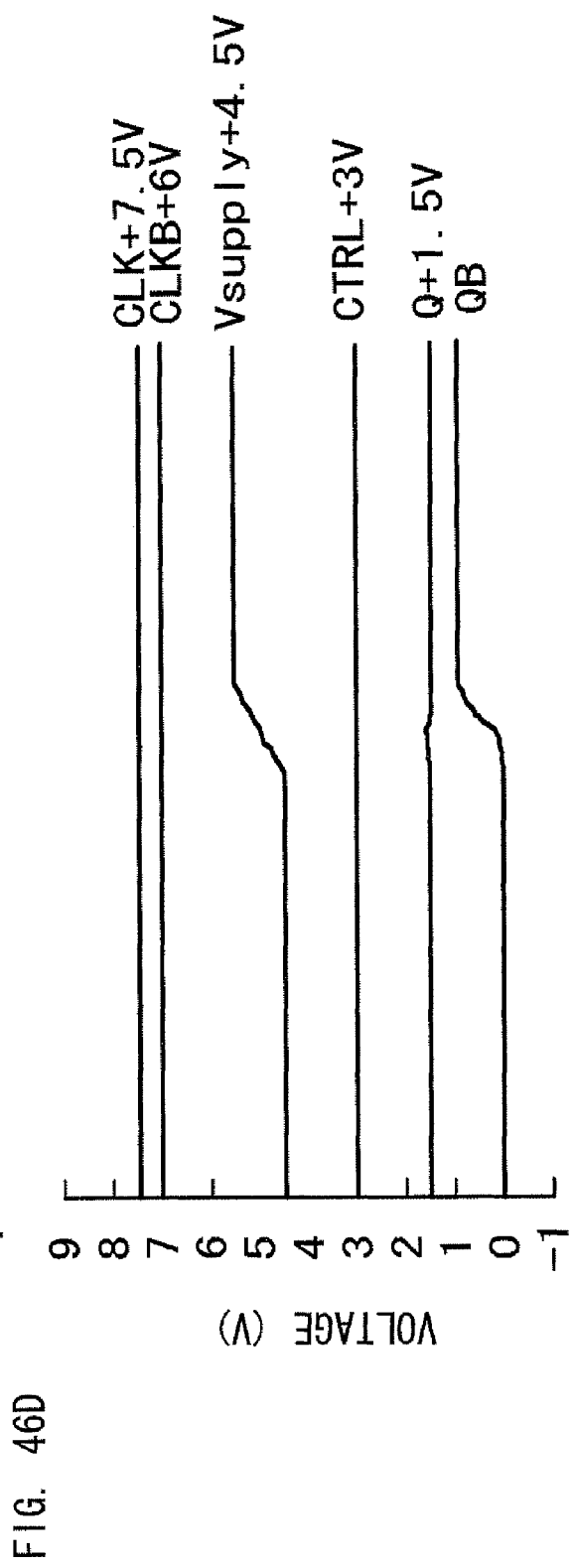

In FIG. 46A, the condition that the node Q is at a high level and the node QB is at a low level is stored in the ferromagnetic tunnel junction device. In FIG. 46B, a high level is restored to the node Q and a low level is restored to the node QB. In the same manner, the condition that the node Q is at a low level, and the node QB is at a high level is stored in the ferromagnetic tunnel junction device. In FIG. 46D, a low level is restored to the node Q, and a high level is restored to the node QB. As described above, in the latch circuit in accordance with the fourteenth embodiment, it is confirmed that data stored in ferromagnetic tunnel junction devices MTJ1 and MTJ2 can be restored to the bistable circuit 30 after a power source is restored.

Figure 47A:
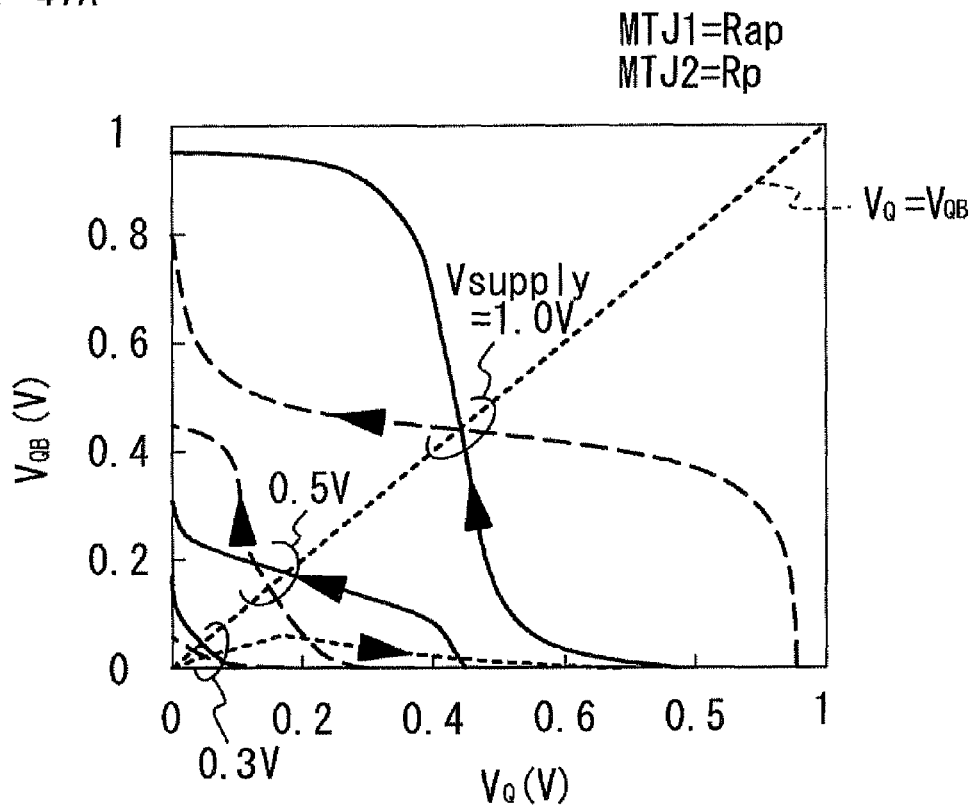
FIG. 47A and FIG. 47B are diagrams (No. 2) illustrating simulation results of the fourteenth embodiment.
Figure 47B:
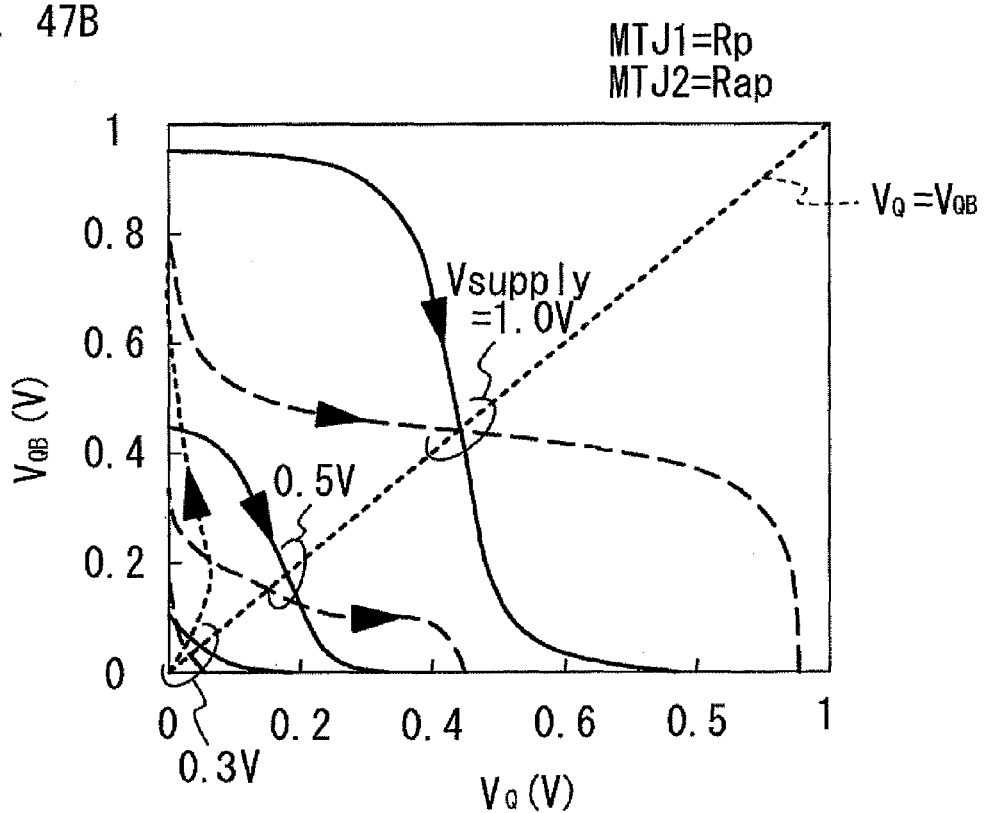

FIG. 47A illustrates a simulated characteristic curve of the bistable circuit 30 in the case that a resistance of the ferromagnetic tunnel junction device MTJ1 is a high resistance Rap and the ferromagnetic tunnel junction device MTJ2 is a low resistance Rp when a simulation begins. FIG. 47B illustrates a simulated characteristic curve of the bistable circuit 30 in the case that the ferromagnetic tunnel junction device MTJ1 is a high resistance Rp and the ferromagnetic tunnel junction device MTJ2 is a high resistance Rap when a simulation begins. Solid lines are curves corresponding to the inverter INV1, dashed lines are curves corresponding to the inverter INV2, and a simulation is performed with the lone inverter the input/output of which is decoupled. Arrows indicate a sweeping direction. Curves illustrated when a power source voltage Vsupply is 1.0 V, 0.5 V and 0.3 V. Arrows with dashed line indicate the locus of the dynamic operating point when raising a power source voltage from 0 V to 1.0 V after the bistable circuit 30 is composed by coupling inputs/outputs of the inverter INV1 and the inverter INV2 each other (when restoration is performed in FIG. 46B and FIG. 46D).

Referring to FIG. 47A and FIG. 47B, when a power source voltage Vsupply is 0.3 V or 0.5 V, characteristic curves are asymmetric. Accordingly, as a power source voltage Vsupply becomes high, the dynamic operating point converges on a low level in the node Q, and on a high level in the node QB in FIG. 47A. In FIG. 47A, the dynamic operating point converges on a high level in the node Q, and on a low level in the node QB. When a power source voltage Vsupply is fixed to 1.0V, if the input voltage of the inverter INV2 in FIG. 47A and the input voltage of the inverter INV1 in FIG. 47B are swept from 0 V to 1 V and from 1 V to 0 V respectively, as the current $I_{MTJ1}$ or $I_{MTJ2}$ flowing in the ferromagnetic tunnel junction device MTJ1 or MTJ2 exceeds the threshold current $I_{TR}$, a characteristic curve becomes symmetric. As described, it is preferable to set a power source voltage Vsupply, resistance values Rp and Rap of the ferromagnetic tunnel junction devices MTJ1 and MTJ2 so that currents $I_{MTJ1}$ and $I_{MTJ2}$ do not exceed the threshold current $I_{TR}$ during the restoring operation.

Fifteenth Embodiment

It is because logic thresholds of inverters INV1 and INV2 in FIG. 39 trade places according to stored data that data stored in the ferromagnetic tunnel junction device can be restored to data of the bistable circuit 30 as described in the thirteenth and fourteenth embodiments (see FIG. 40A and FIG. 40B). Thus, if the logic thresholds of the inverter 10 composing the bistable circuit 30, and the inverter INV2 composed by adding the ferromagnetic tunnel junction device MTJ1 to the inverter 20 are adapted to be different according to stored data, data can be restored even though a single ferromagnetic tunnel junction device is provided. Hereinafter, a description will be given of a composition where a single ferromagnetic tunnel junction device is provided.

Figure 48A:
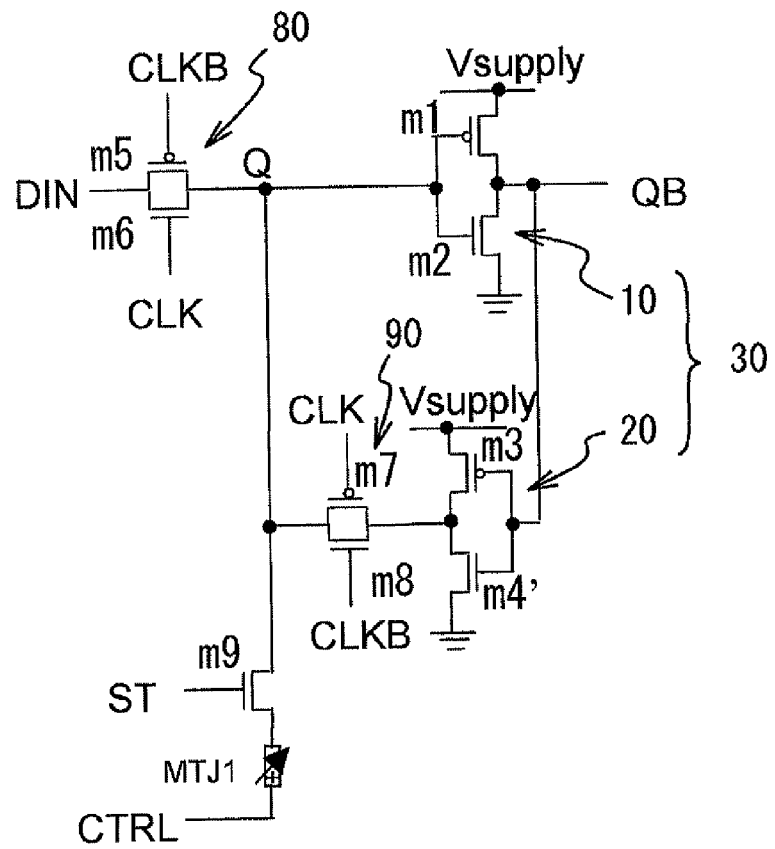
FIG. 48A and FIG. 48B are circuit diagrams of a latch circuit in accordance with a fifteenth embodiment.
Figure 48B:
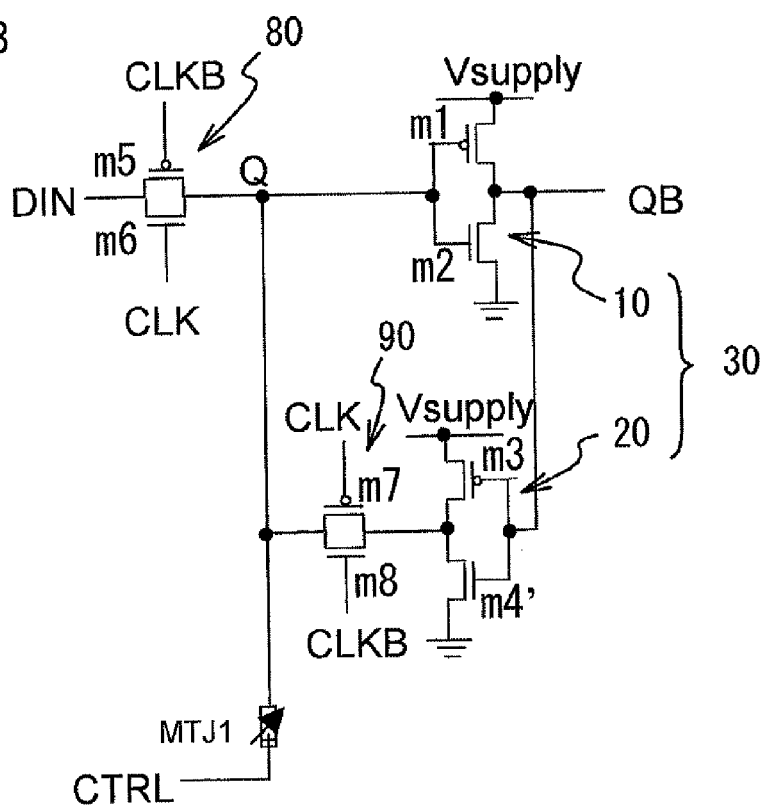

FIG. 48A and FIG. 48B are circuit diagrams of a latch circuit in accordance with the fifteenth embodiment. In the fifteenth embodiment, compared to the thirteenth and fourteenth embodiment, the channel width of the FET m4' of the inverter 20 is narrower than that of the FET m3 of the inverter 10. In addition, the ferromagnetic tunnel junction device MTJ2 and the FET m10 are not provided. Accordingly, logic thresholds trade places in the input/output characteristics of the inverter 10 and the input/output characteristics of the inverter INV2 between the case that a resistance of the ferromagnetic tunnel junction device MTJ1 is a high resistance Rap and the case that is a low resistance Rp. In the same manner as the thirteenth and fourteenth embodiments, data stored in the ferromagnetic tunnel junction device MTJ1 can be restored to the bistable circuit 30. The FET m9 can be provided as illustrated in FIG. 48A, or does not have to be provided as illustrated in FIG. 48B.

Sixteenth Embodiment

Figure 49A:
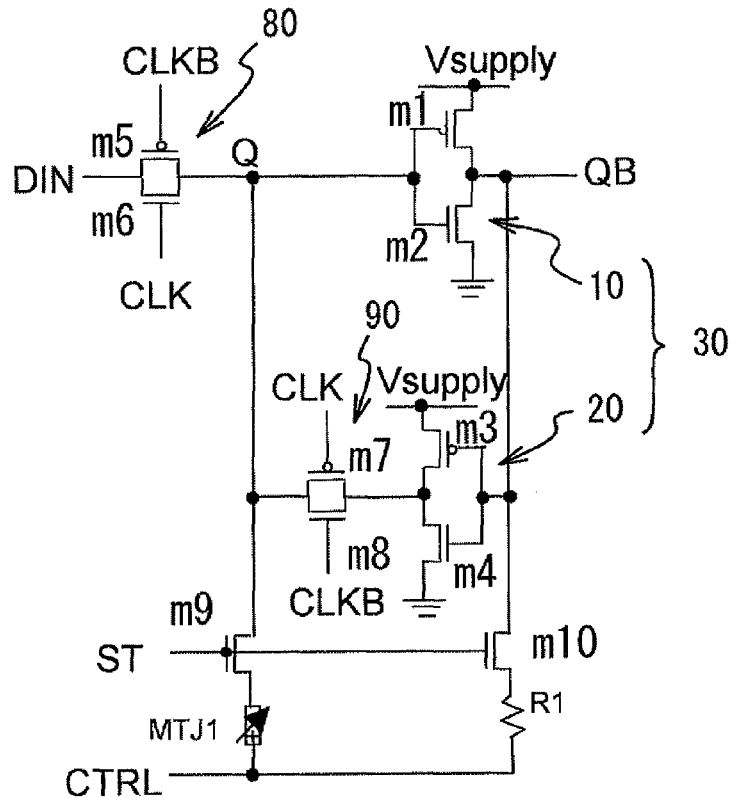
FIG. 49A and FIG. 49B are circuit diagrams in accordance with a sixteenth embodiment.
Figure 49B:
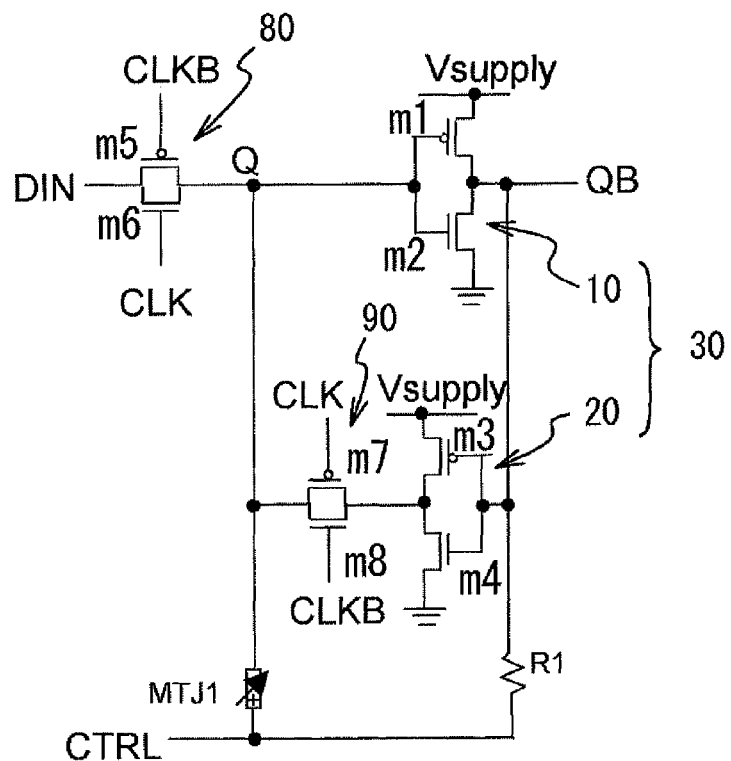

FIG. 49A and FIG. 49B are circuit diagrams of a latch circuit in accordance with the sixteenth embodiment. In the sixteenth embodiment, compared to the thirteenth and fourteenth embodiments, the ferromagnetic tunnel junction device MTJ2 is replaced with a resistance R1. A resistance R1 is set so as to be between a high resistance Rap and a low resistance Rp of the ferromagnetic tunnel junction device MTJ1. Accordingly, logic thresholds trade places in the input/output characteristics of the inverter INV1 composed by adding a resistance R11 to the inverter 10 and in the input/output characteristics of the inverter INV2 between the case that a resistance of the ferromagnetic tunnel junction device MTJ1 is a high resistance Rap and the case that is a low resistance Rp. Therefore, in the same manner as the thirteenth and fourteenth embodiments, data stored in the ferromagnetic tunnel junction device MTJ1 can be restored to the bistable circuit 30. The FET m9 and the FET m10 can be provided as illustrated in FIG. 49A, or do not have to be provided as illustrated in FIG. 49B.

Seventeenth Embodiment

Figure 50A:
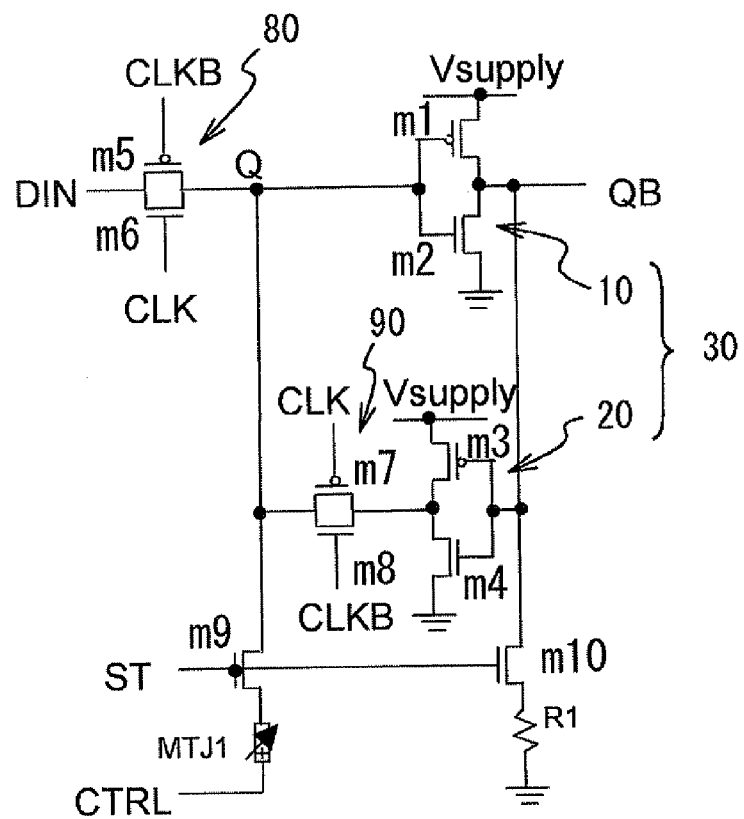
FIG. 50A and FIG. 50B are circuit diagrams of a latch circuit in accordance with a seventeenth embodiment.
Figure 50B:
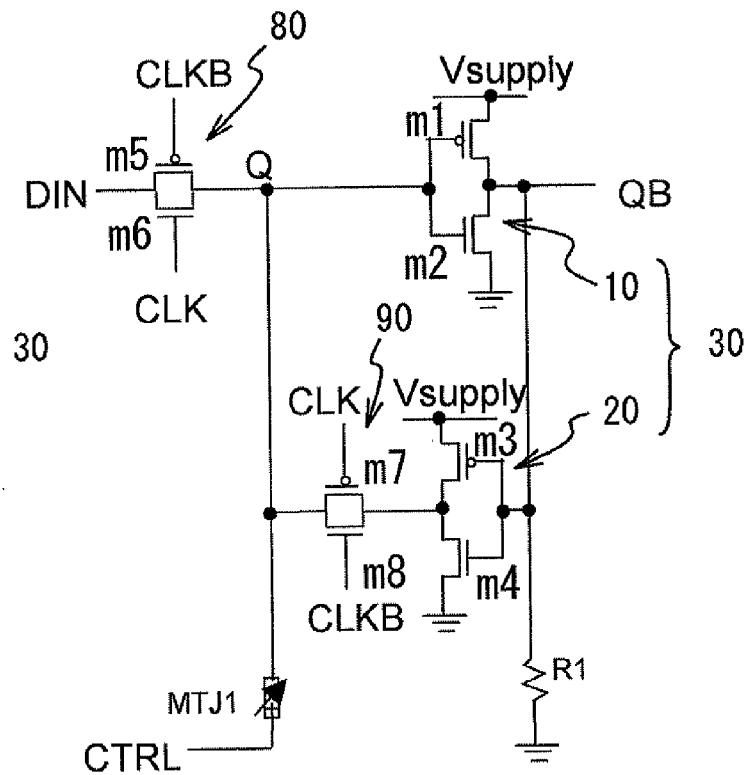

FIG. 50A and FIG. 50B are circuit diagrams of a latch circuit in accordance with the seventeenth embodiment. In the seventeenth embodiment, compared to the sixteenth embodiment, a resistance R1 is coupled to a ground. Since data in the bistable circuit 30 is stored to the ferromagnetic tunnel junction device MTJ1, the current does not have to flow in the resistance R1 when the control line CTRL is at a high level. Therefore, the resistance R1 can be coupled to a ground. In the same manner as the sixteenth embodiment, a resistance R1 is set to be between a high resistance Rap and a low resistance Rp of the ferromagnetic tunnel junction device MTJ1. In addition, the FET m9 and the FET m10 can be provided as illustrate in FIG. 50A, or do not have to be provided as illustrated in FIG. 50B.

Eighteenth Embodiment

Figure 51:
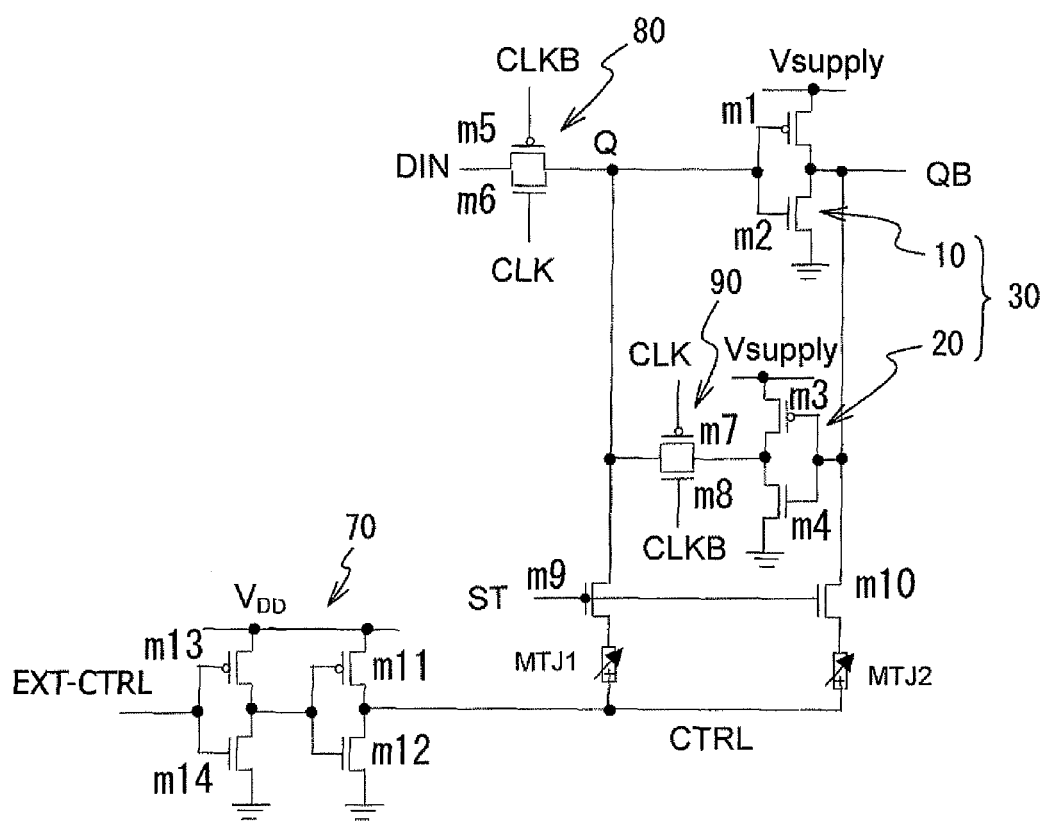
FIG. 51 is a circuit diagram of a latch circuit in accordance with an eighteenth embodiment.

FIG. 51 is a circuit diagram of a latch circuit in accordance with the eighteenth embodiment. In the eighteenth embodiment, an output of the amplifier circuit including a two-stage inverter composed of FETs m11 through m14 is coupled to the control line CTRL in FIG. 3 of the thirteenth embodiment. An external control line EXT-CTRL is coupled to an input of an amplifier circuit 70. If many latch circuits are controlled with the control line CTRL at the same time, operations will get slow. According to the eighteenth embodiment, as the amplifier circuit 70 amplifies a signal of the external control line EXT-CTRL, the store and restoration in the latch circuit can be performed at high speed.

Nineteenth Embodiment

Figure 52:
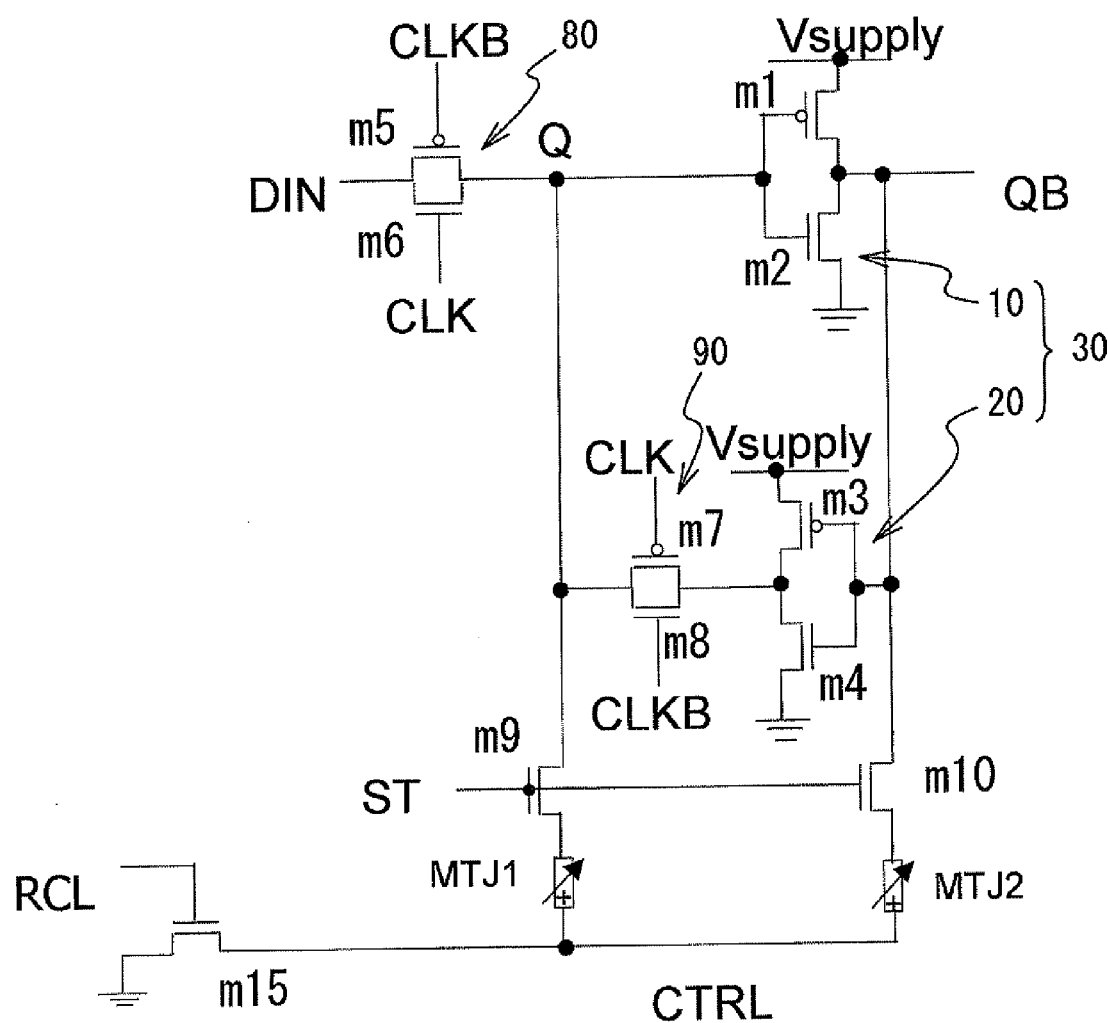
FIG. 52 is a circuit diagram of a latch circuit in accordance with a nineteenth embodiment.
Figure 53:
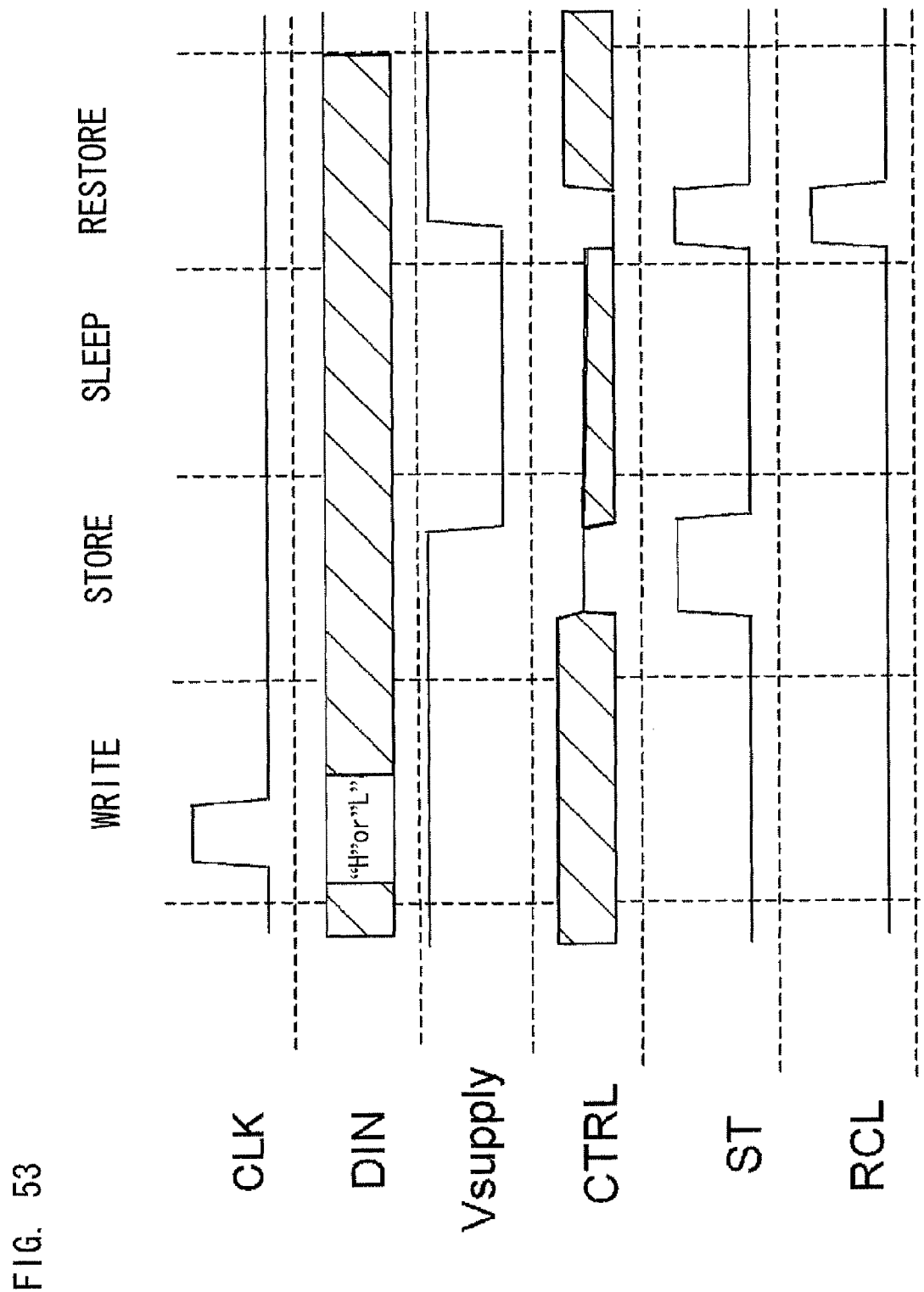
FIG. 53 is a timing diagram of the nineteenth embodiment.

FIG. 52 is a circuit diagram of a latch circuit in accordance with the nineteenth embodiment. In the nineteenth embodiment, an n-type MOSFET m15 is coupled between the control line CTRL and a ground, and the gate of the FET m15 is coupled to the second control line RCL. FIG. 53 is a timing diagram of the latch circuit in accordance with the nineteenth embodiment. When storing, the second control line RCL is at a low level. The FET m15 becomes non-conductive. As one of nodes Q and QB has a high level potential and the other has a low level potential, the current flows between the ferromagnetic tunnel junction device MTJ1 and the ferromagnetic tunnel junction device MTJ2, and data in the bistable circuit 30 is stored to ferromagnetic tunnel junction devices MTJ1 and MTJ2. The level of the control line CTRL becomes between a high level and a low level. When restoring, the second control line RCL is at a high level. The control line CTRL becomes at a low level, and a restoration can be performed in the same manner as the thirteenth embodiment. Accordingly, the store and restoration can be performed at high speed regardless of the driving ability of the control line CTRL.

FIG. 54A through FIG. 54D are diagrams illustrating results of simulations, which are same as FIG. 44A through FIG. 44D, to the latch circuit in accordance with the nineteenth embodiment. As for parameters used for simulations, a high resistance value Ra and a low resistance value Rp of the ferromagnetic tunnel junction device are 6.67 kΩ and 3.33 kΩ respectively, and other parameters are same as the thirteenth embodiment. Each diagram is illustrated by adding 1.5 V to the level of the node Q, 3.0 V to the second control line RCL, 4.5 V to the switch line ST, 6.0 V to a power source voltage Vsupply, 7.5 V to the level of the inverted clock signal CLKB, and 9.0 V to the level of the clock signal CLK.

In FIG. 54A, the condition that the node Q is at a high level and the node QB is at a low level is stored in the ferromagnetic tunnel junction device. In FIG. 54B, a high level is restored to the node Q, and a low level is restored to the node QB. In the same manner, in FIG. 54C, the condition that the node Q is at a low level and the node QB is at a high level is stored in the ferromagnetic tunnel junction device. In FIG. 54D, a low level is restored to the node Q and a high level is stored to the node QB. As described above, in the latch circuit in accordance with the nineteenth embodiment, data stored in ferromagnetic tunnel junction devices MTJ1 and MTJ2 can be restored to the bistable circuit 30 after a power source is restored.

Twentieth Embodiment

Figure 55:
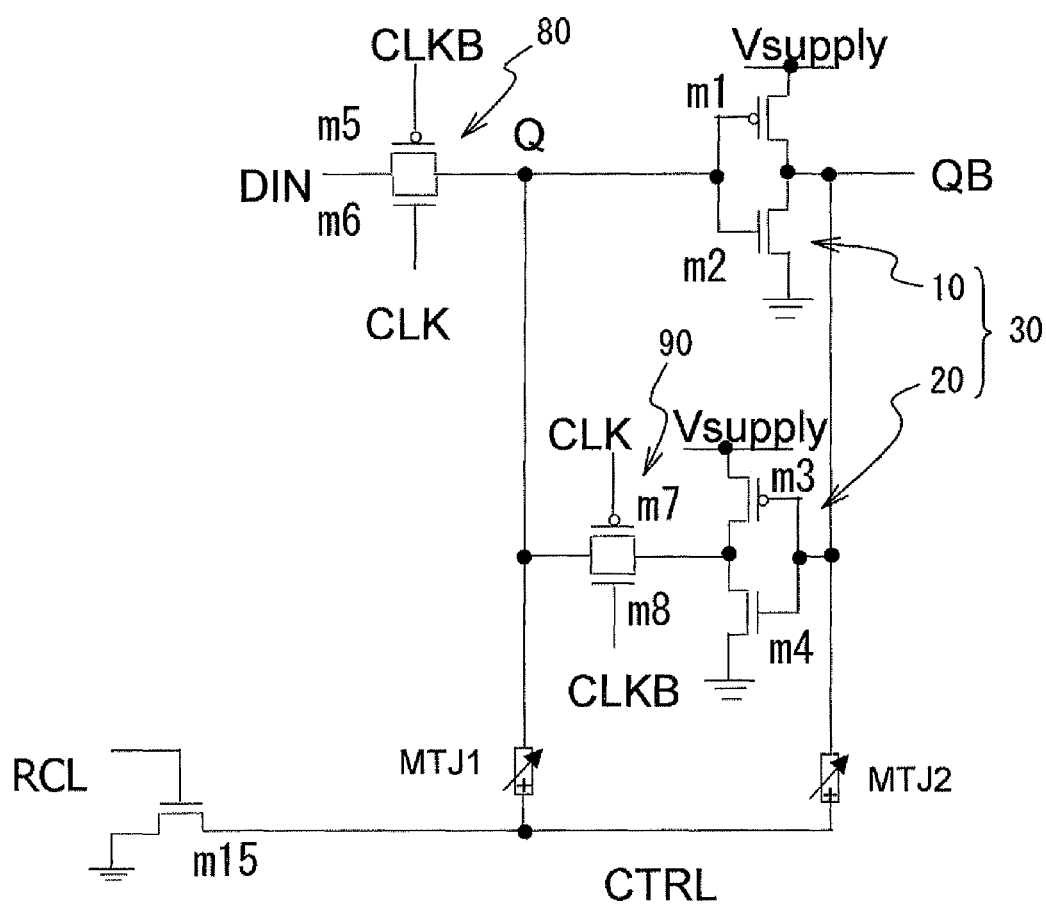
FIG. 55 is a circuit diagram of a latch circuit in accordance with a twentieth embodiment.

FIG. 55 is a circuit diagram of a latch circuit in accordance with the twentieth embodiment. In the twentieth embodiment, compared to the nineteenth embodiment FETs m0 and m10 are not provided. Other components are the same as the nineteenth embodiment. FIG. 56A through FIG. 56D are diagrams illustrating results of simulations, which are same as FIG. 56A through FIG. 54D of the nineteenth embodiment, to the latch circuit in accordance with the twentieth embodiment. As for parameters used for simulations, a high resistance value Rap and a low resistance value Rp of the ferromagnetic tunnel junction device are set to 10.67 kΩ and 5.33 kΩ respectively, and other parameters are same as the thirteenth embodiment.

In FIG. 56A, the condition that the node Q is at a high level and the node QB is at a low level is stored in the ferromagnetic tunnel junction device. In FIG. 56B, a high level is restored to the node Q, and a low level is restored to the node QB. In the same manner, in FIG. 56C, the condition that the node Q is at a low level and the node QB is at a high level is stored in the ferromagnetic tunnel junction device. In FIG. 56D, a low level is restored to the node Q, and a high level is restored to the node QB. As described above, in the latch circuit to which FETs m9 and m10 are not provided in accordance with the twentieth embodiment, it is confirmed that data stored in the ferromagnetic tunnel junction devices MTJ1 and MTJ2 can be restored to the bistable circuit 30 after a power source is restored.

Twenty-first Embodiment

Figure 57:
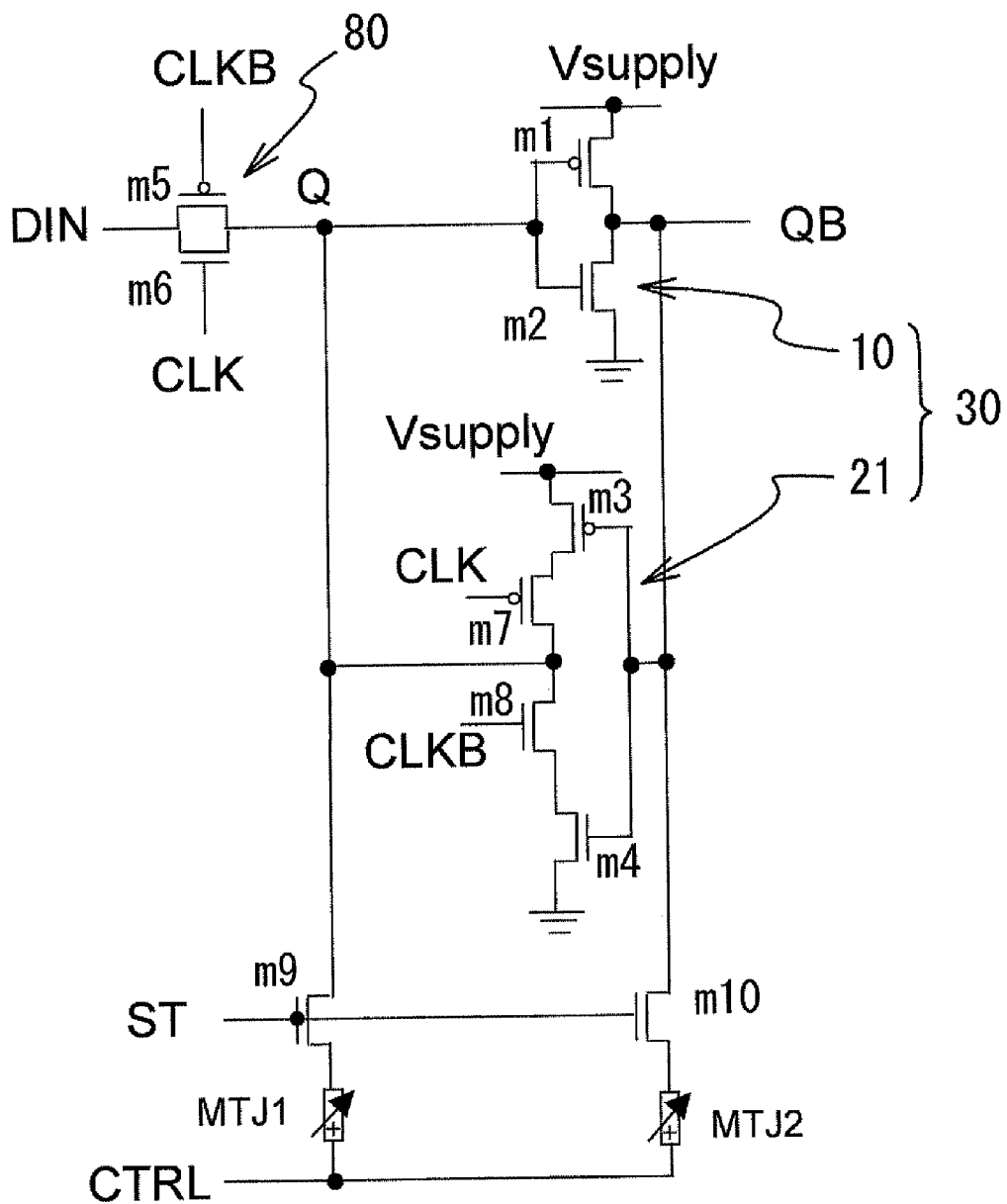
FIG. 57 is a circuit diagram of a latch circuit in accordance with a twenty-first embodiment.

FIG. 57 is a circuit diagram of a latch circuit in accordance with the twenty-first embodiment. In the twenty-first embodiment, compared to FIG. 34 of the thirteenth embodiment, a tristate inverter 21 includes p-type MOSFETs m3 and m7, and n-type MOSFETs m4 and m8. The p-type MOSFET m7 is coupled between a drain of the p-type MOSFET m3 and the node Q. The n-type MOSFET m8 is coupled between a drain of the n-type MOSFET m4 and the node Q. Gates of FETs m7 and m8 are coupled to the clock signal CLK and the inverted clock signal CLKB respectively. The twenty-first embodiment can have same functions as the thirteenth embodiment.

Twenty-second Embodiment

Figure 58:
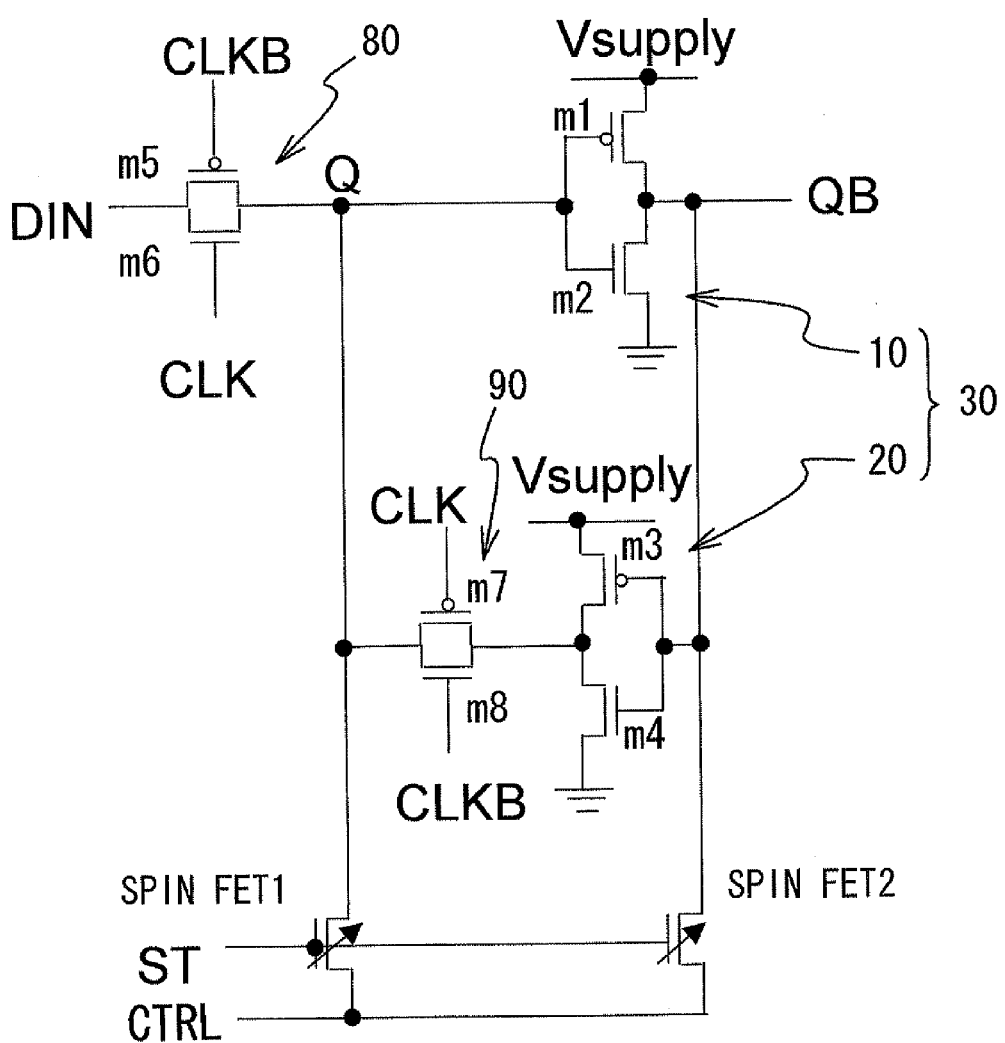
FIG. 58 is a circuit diagram of a latch circuit in accordance with a twenty-second first embodiment.

FIG. 58 is a circuit diagram of a latch circuit in accordance with the twenty-second embodiment. In the twenty-second embodiment, compared to FIG. 34 of the thirteenth embodiment, the ferromagnetic tunnel junction device MTJ1 and the FET m9 are replaced with the spin FET 1, and the ferromagnetic tunnel junction device MTJ2 and the FET m10 are replaced with the spin FET 2. Accordingly, a spin FET can be used for the ferromagnetic tunnel junction device. A spin FET is a transistor a conductance of which can be nonvolatilely changed with the magnetization direction, and which has a switching function by a control terminal such as a gate. For example, a spin FET, which is disclosed in International Publication No. 2004-079827 or Journal of the Institute of Electronics, Information and Communication Engineers Vol. 88. No. 7. 2005 PP. 541-550, can be used.

Twenty-third Embodiment

Figure 59:
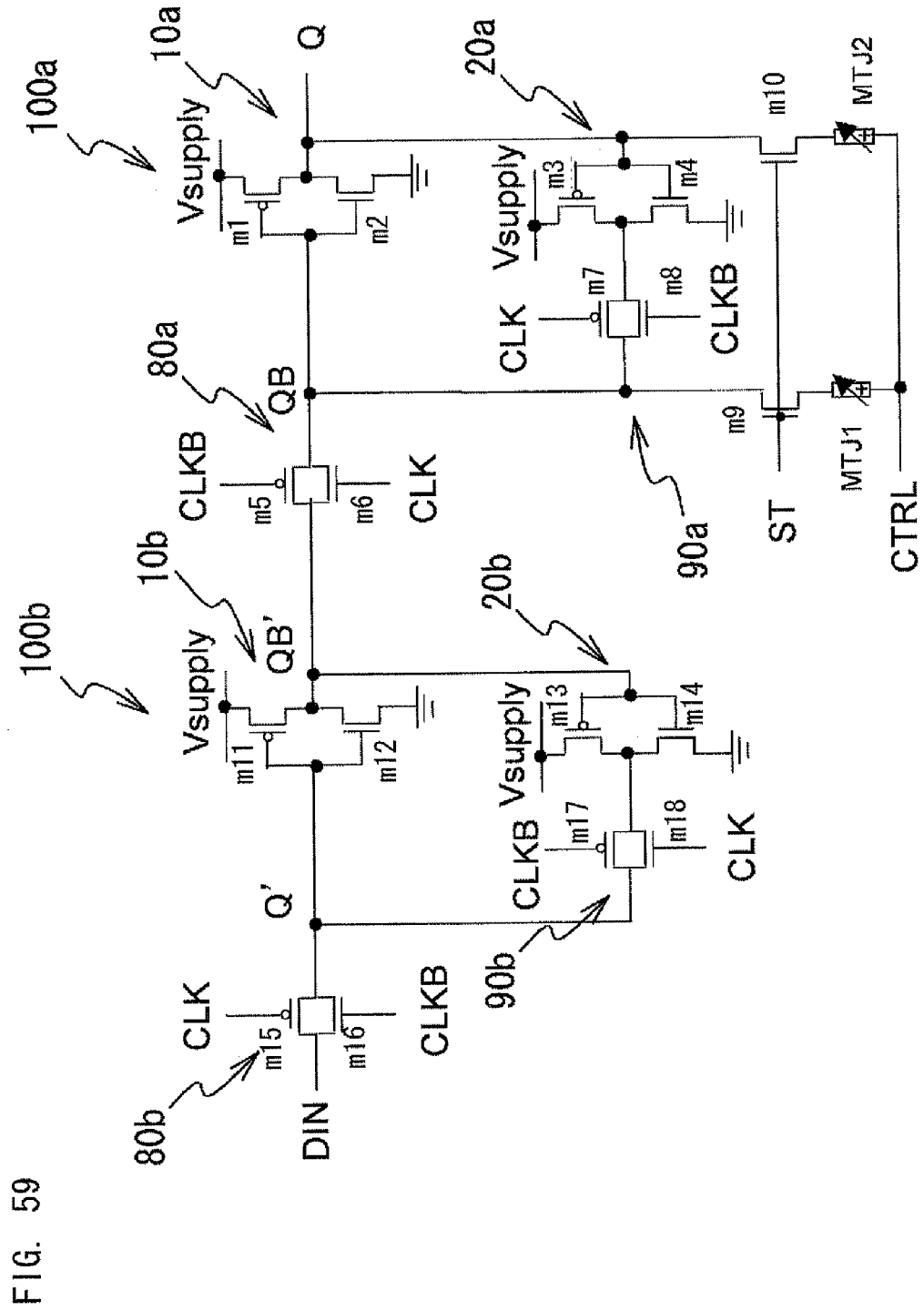
FIG. 59 is a circuit diagram of a flip-flop circuit in accordance with a twenty-third embodiment.

The twenty-third embodiment is an example of a master-slave-type flip-flop circuit in which two D latch circuits are coupled. FIG. 59 is a circuit diagram of a latch circuit in accordance with the twenty-third embodiment. A D latch circuit 100b is coupled to the D latch circuit 100a of the thirteenth embodiment. The node QB' of the D latch circuit 100b is input to the pass gate 80a of the D latch circuit 100a. The clock signal CLK and the inverted clock signal CLKB which are input to the pass gate are opposite in the D latch circuits 100a and 100b. As described, by providing ferromagnetic tunnel junction devices MTJ1 and MTJ2 to the D latch circuit 100a which is in the latter part of the master-slave-type flip-flop, data can be stored nonvolatilely. In addition, data can be restored. When storing and restoring data to ferromagnetic tunnel junction devices MTJ1 and MTJ2, the pass gate 80a of the D latch circuit 100a is non-conductive in the same manner as the thirteenth embodiment. Accordingly, operations of the D latch circuit 100b do not effect on a data store and restoration in the D latch circuit 100a.

Twenty-fourth Embodiment

Figure 60:
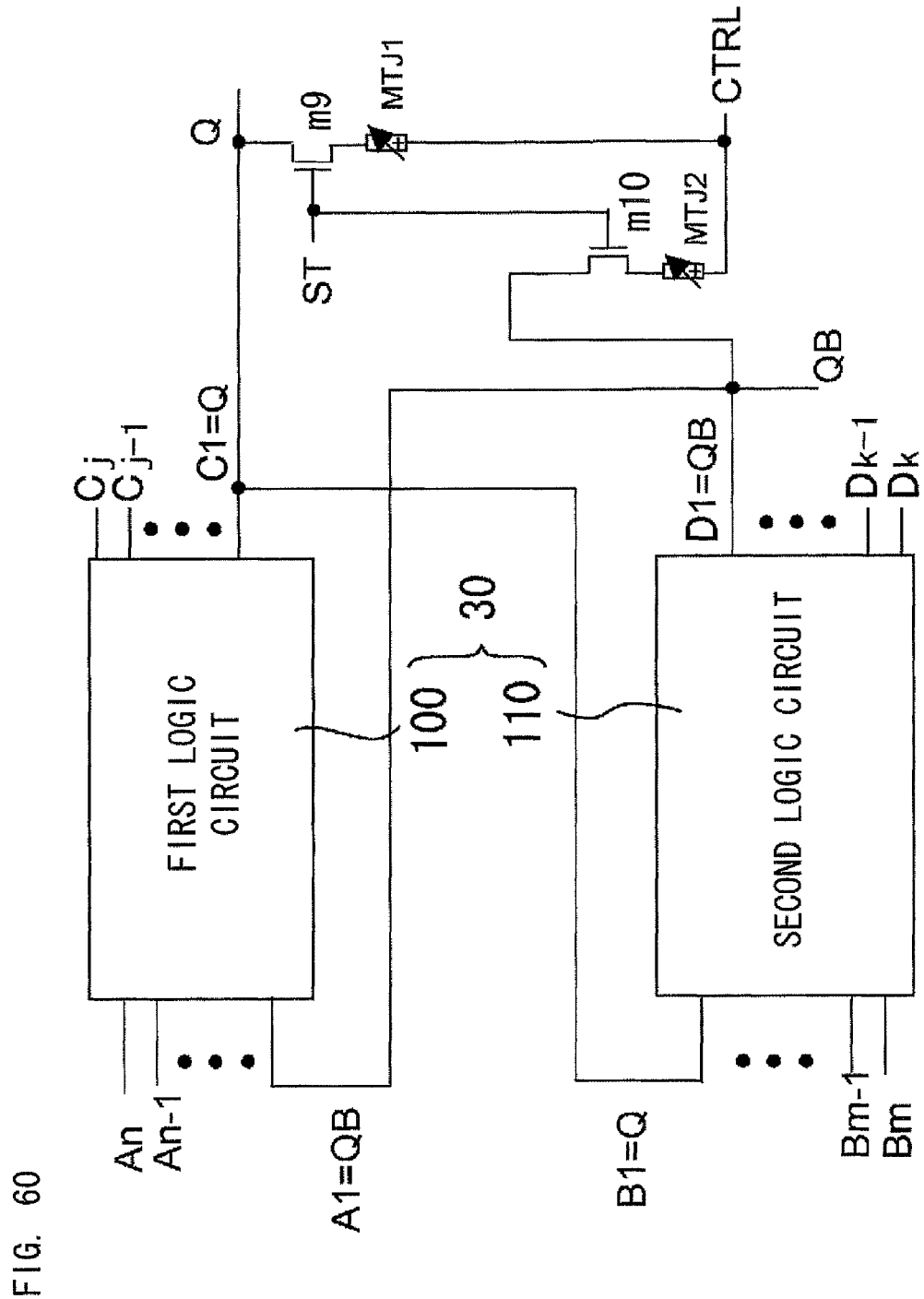
FIG. 60 is a circuit diagram of a latch circuit in accordance with a twenty-fourth embodiment.

The twenty-fourth embodiment is an embodiment composing a bistable circuit with a logic circuit. Referring to FIG. 60, the bistable circuit 30 includes a first logic circuit 100, and a second logic circuit 110. The first logic circuit 100 includes one or more inputs A1 through An and one or more outputs C1 through Cj. The second logic circuit 110 includes one or more inputs B1 through Bm and one or more outputs D1 through Dk. The output C1 of the first logic circuit 100 and the input B1 of the second logic circuit 110 are coupled to a first node Q. The output D1 of the second logic circuit 110 and the input A1 of the first logic circuit 100 are coupled to a second node QB. A first ferromagnetic tunnel junction device MTJ1 is coupled to the first node Q via the FET m9, and the second ferromagnetic tunnel junction device MTJ2 is coupled to the second node QB via the FET m10.

When storing data of the bistable circuit 30 to the ferromagnetic tunnel junction device MTJ1 or MTJ2, complementary data to be stored is output from the first logic circuit 100 and the second logic circuit 110 to the first node Q and the second node QB respectively. When restoring data from the ferromagnetic tunnel junction device MTJ1 or MTJ2 to the bistable circuit 30, the signal that has the first logic circuit 100 output a logic inversion of the second node QB to the first node Q is input to inputs A2 through An of the first logic circuit 100 (id est inputs except the input A1 which is coupled to the second node QB). The signal that has the second logic circuit 110 output a logic inversion of the first node Q1 to the second node QB is input to inputs B2 through Bm of the second logic circuit 110 (id est inputs except the inputs B1 which is coupled to the first node Q).

Figure 61A:
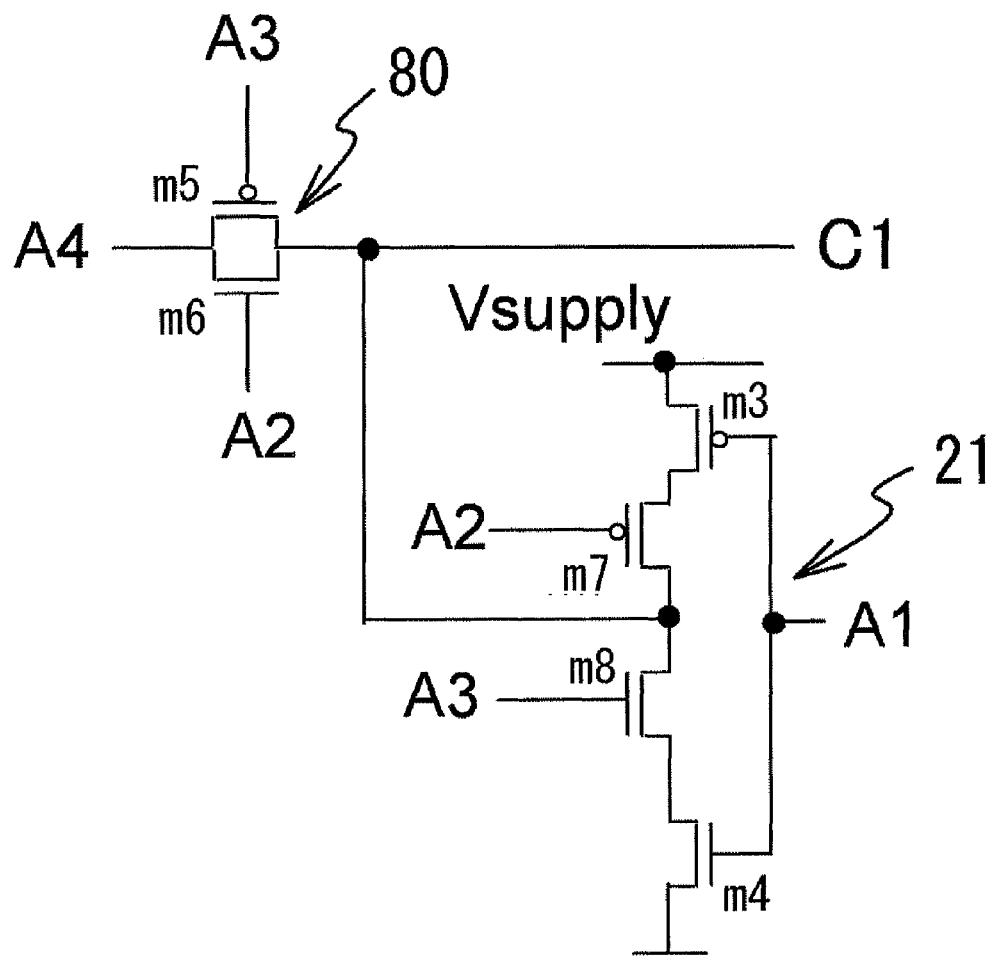
FIG. 61A and FIG. 61B are circuit diagrams illustrating examples of a first logic circuit and a second logic circuit.
Figure 61B:
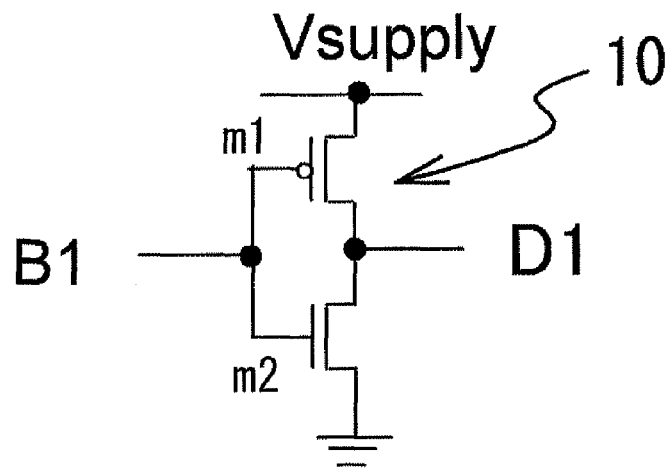

With the composition described above, the same advantage as the thirteenth embodiment can be achieved. For example, in the twenty-first embodiment, the first logic circuit 100 corresponds to the circuit of FIG. 61A, and the second logic circuit 110 corresponds to the circuit of FIG. 61B. When storing and restoring data, a signal is applied to inputs A2 through A4 in the first logic circuit 100 so that the logic inversion of the input A2 in FIG. 61A is output to the output C1. As illustrated in FIG. 61A, the logic inversion of the input B1 is output to the output D1 in the second logic circuit 110. As described above, the latch circuit in accordance with the twenty-first embodiment is included in the latch circuit in accordance with the twenty-fourth embodiment.

According to the twenty-fourth embodiment, the bistable circuit can be composed of the logic circuit. Accordingly, a nonvolatile latch circuit and a nonvolatile flip-flop circuit can be constructed by using a ferromagnetic tunnel junction device for a latch circuit and a flip-flop circuit that have set and reset functions beside the D latch circuit. Although descriptions were given with CMOSs as the first logic circuit 100 and the second logic circuit 110, a resistance load and a D-mode load can be used. The bistable circuit 30 of the thirteenth through twenty-third embodiments can be the bistable circuit using the first logic circuit 100 and the second logic circuit 110 as described in the twenty-fourth embodiment.

Twenty-fifth Embodiment

Figure 62:
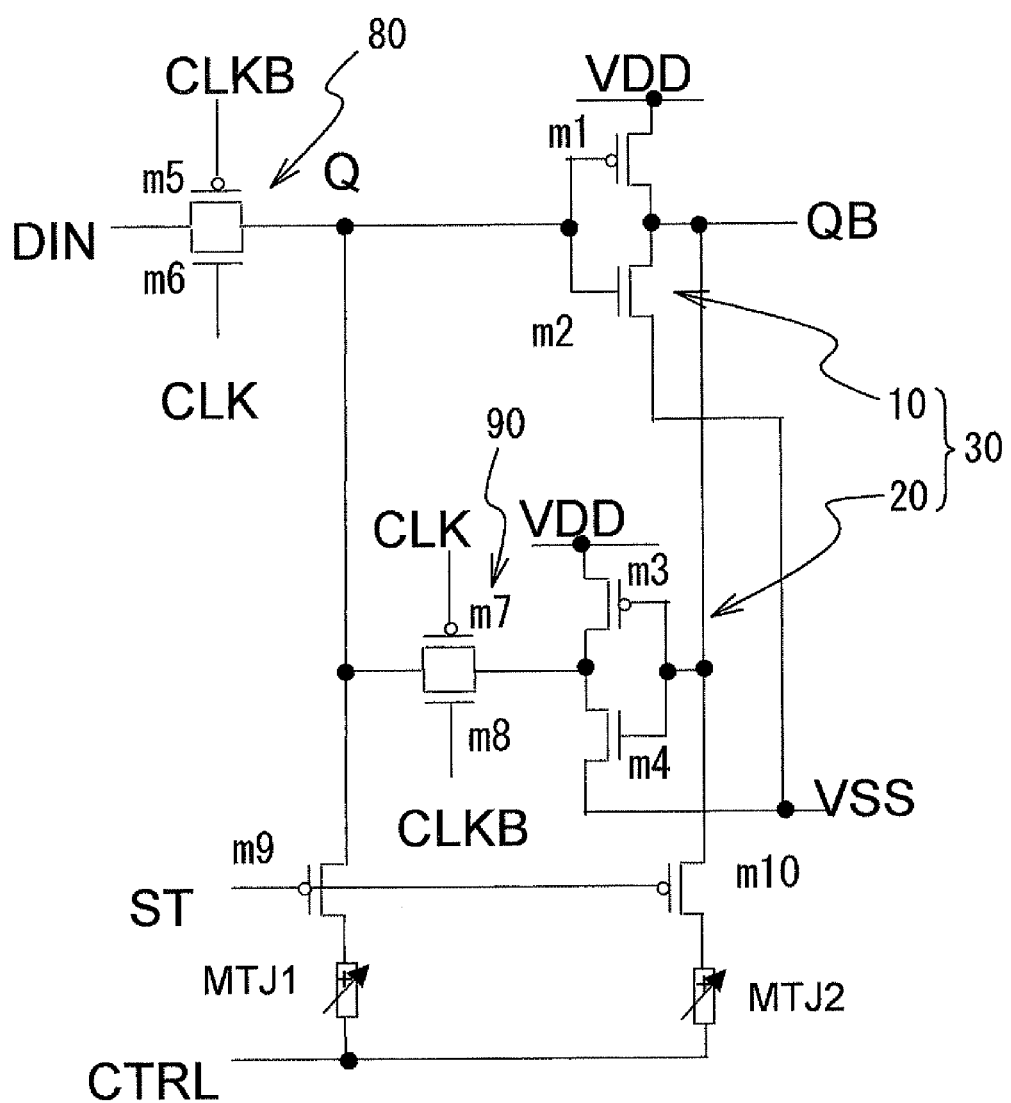
FIG. 62 is a circuit diagram of a latch circuit in accordance with a twenty-fifth embodiment.

FIG. 62 is a circuit diagram of a latch circuit in accordance with the twenty-fifth embodiment. In the twenty-fifth embodiment, compared to the thirteenth embodiment, inverters 10 and 20 are coupled between power source lines VDD and VSS. In addition, polarities of ferromagnetic tunnel junction devices MTJ1 and MTJ2 are inverted to those of the thirteenth embodiment. Accordingly, as the current flows from the node Q or QB to the control line CTRL, the ferromagnetic tunnel junction device MTJ1 or MTJ2 becomes a low resistance Rp, and as the current flows from the control line CTRL to the node Q or QB, the ferromagnetic tunnel junction device MTJ1 or MTJ2 becomes a high resistance Rap. Furthermore, FETs m9 and m10 are p-type MOSFETs. Other components are same as FIG. 34 of the thirteenth embodiment.

Figure 63:
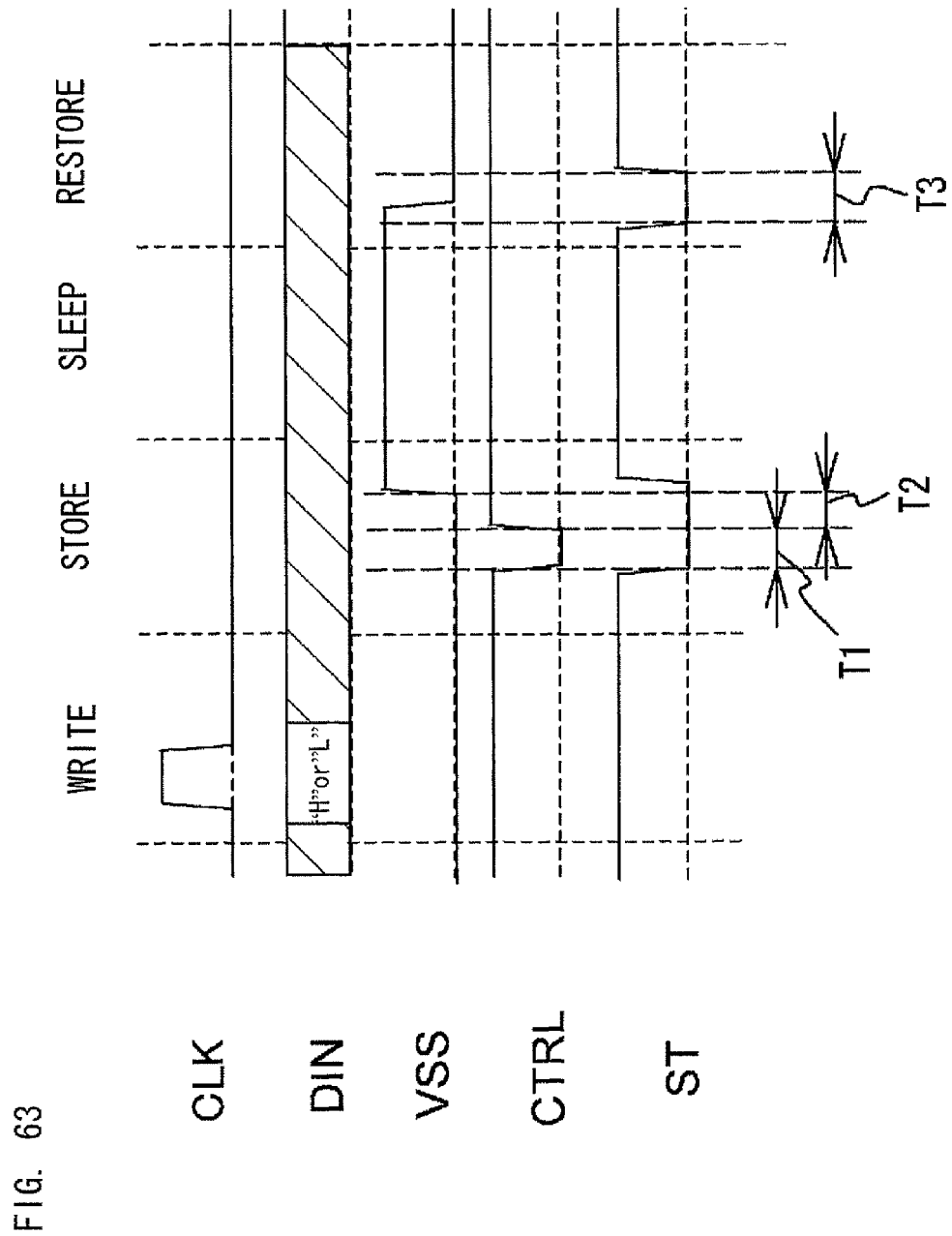
FIG. 63 is a timing diagram of the twenty-fifth embodiment.

FIG. 63 is a timing diagram of the twenty-fifth embodiment. In the twenty-fifth embodiment, shutting down a power source is performed by setting VSS to a high level (VDD level). The level of the control line CTRL and the level of the switch line ST are at a high level in a write mode and sleep mode. The switch line ST and the control line CTRL becomes at a low level during the period T1 of the store, and the switch line ST becomes at a low level and the control line CTRL becomes at a high level during the period T2. Accordingly, data of the bistable circuit 30 is stored to ferromagnetic tunnel junction devices MTJ1 and MTJ2. During the period T3 of the restoration, data of ferromagnetic tunnel junction devices MTJ1 and MTJ2 is restored to the bistable circuit 30 by setting the switch line ST to a low level.

In the twenty-fifth embodiment, the reason why polarities of ferromagnetic tunnel junction devices MTJ1 and MTJ2 are inverted to those of the thirteenth embodiment is as follows. For example, when setting the node Q to a high level, to charge the node Q from the control line CTRL against the discharge current of FETs m2 and m4, it is preferable that the ferromagnetic tunnel junction device MTJ1 is a low resistance Rp. It is because the ferromagnetic tunnel junction device MTJ1 becomes a high resistance Rap if the polarity of the ferromagnetic tunnel junction device MTJ1 is same as the fourteenth embodiment. In addition, the reason why FETs m9 and m10 are pMOSFETs is as follows. In an early stage of the restoration, both sources and drains of FETs m9 and m10 are near to a high level. At this time, if FETs m9 and m10 are p-type FETs, FETs m9 and m10 are made conductive reliably by setting the switch line ST to a low level.

Also in the fourteenth through twenty-fourth embodiments, it is possible that inverters 10 and 20 are coupled between power source lines VDD and VSS, and the polarity of the ferromagnetic tunnel junction device MTJ1 or MTJ2 is same as that of the twenty-fifth embodiment.

According to the thirteenth through twentieth, twenty-second, twenty-third, and twenty-fifth embodiments, the latch circuit includes the pass gate 80 (a first input switch) for writing data to the bistable circuit 30 from the input line DIN, and the pass gate 90 (a second input switch) that behaves in a complementary style to the pass gate 80 and holds data of the bistable circuit 30. In addition, the latch circuit includes the ferromagnetic tunnel junction device MTJ1 or MTJ2 that nonvolatilely stores data stored in the bistable circuit 30 according to the magnetization direction of the ferromagnetic electrode free layer, and the data nonvolatilely stored in the ferromagnetic tunnel junction device MTJ1 or MTJ2 can be restored to the bistable circuit 30. According to this, writing and outputting data to the bistable circuit 30 can be performed at high speed. Even though a power source is shut down, data nonvolatilely stored in the ferromagnetic tunnel junction device MTJ1 or MTJ2 can be restored to the bistable circuit 30. Therefore, it is possible to output the data before a power source is shut down even though the power source is restored after the power source is shut down.

The ferromagnetic tunnel junction device MTJ1 or MTJ2 is coupled between the node Q or QB and the control line CTRL. The ferromagnetic tunnel junction device MTJ1 or MTJ2 becomes a high resistance as the current flows between the node Q or QB and the control line CTRL, and becomes a low resistance as the current flows to the counter direction. Accordingly, by applying a current between the control line CTRL and the node Q or QB according to the level of the node Q or QB, the data of the bistable circuit 30 can be stored to the ferromagnetic tunnel junction device.

In addition, as illustrated in FIG. 42 and FIG. 63, when storing data to the bistable circuit 30, the control line CTRL applies a high level voltage to the ferromagnetic tunnel junction device MTJ1 or MTJ2, and further applies a low level voltage. Accordingly, data stored in the bistable circuit 30 can be stored in the ferromagnetic tunnel junction device MTJ1 or MTJ2.

When restoring data from the ferromagnetic tunnel junction device MTJ1 or MTJ2 to the bistable circuit 30, the control line CTRL applies a low level or high level voltage to the ferromagnetic tunnel junction device MTJ1 or MTJ2 according to a method for shutting down a power source and its corresponding circuit. That is to say that the control line CTRL applies a low level voltage to the ferromagnetic tunnel junction device MTJ1 or MTJ2 in the thirteenth through twenty-fourth embodiments, and applies a high level voltage in the twenty-fifth embodiment. According to this, data stored in the ferromagnetic tunnel junction device MTJ1 or MTJ2 can be restored to the bistable circuit 30.

As described in the thirteenth embodiment, FIG. 48A of the fifteenth embodiment, FIG. 49A of the sixteenth embodiment, FIG. 50A of the seventeenth embodiment, the eighteenth, nineteenth, twenty-first, and twenty-third through twenty-fifth embodiments, a latch circuit can include a switch (corresponding to the FET m9 or m10) which is coupled between the node Q or QB and the ferromagnetic tunnel junction device MTJ1 or MTJ2. This switch becomes conductive when storing and restoring, and becomes non-conductive except when storing and restoring. According to this, power consumption of the latch circuit can be reduced.

As described in the thirteenth, fourteenth, eighteenth through twenty-first, and twenty-third through twenty-fifth embodiments, the node Q can be the first node Q, the node QB can be the second node QB, the ferromagnetic tunnel junction device MTJ1 which is coupled between the first node Q and the control line CTRL can be the first ferromagnetic tunnel junction device, and the ferromagnetic tunnel junction device MTJ2 which is coupled between the second node QB and the control line CTRL can be the second ferromagnetic tunnel junction device, By using two ferromagnetic tunnel junction device as described, compared to the case that the ferromagnetic tunnel junction device is coupled to one of nodes Q and QB, it is possible to make the difference between logic thresholds of the inverter INV1, which is composed of the inverter 10 and the second ferromagnetic tunnel junction device MTJ2, and the inverter INV2, which is composed of the inverter 20 and the first ferromagnetic tunnel junction device MTJ1, large. Thus, there is an advantage in perspective of operation speed and noise margin, and operations can be more stable.

As described in the thirteenth, eighteenth, nineteenth, twenty-first, and twenty-third through twenty-fifth embodiments, the latch circuit includes a first switch (corresponding to the FET m9) that is coupled between the first node Q and the first ferromagnetic tunnel junction device MTJ1 and becomes conductive when storing and restoring data, and a second switch (corresponding to the FET m10) which is coupled between the second node QB and the second ferromagnetic tunnel junction device MTJ2 as switches. The first switch and the second switch become conductive when storing and restoring data, and become non-conductive except when storing and restoring data. As described, power consumption can be more reduced by coupling the first switch and the second switch both between the first ferromagnetic tunnel junction device MTJ1 and the second ferromagnetic tunnel junction device MTJ2 and nodes Q and QB.

As described in the nineteenth and twentieth embodiments, the latch circuit includes a third switch (corresponding to the FET m15) which is coupled between the control line CTRL and a ground which is a low level electric power line. As illustrated in FIG. 53, the third switch becomes non-conductive when storing data, and becomes conductive when restoring data. According to this, as the current flows between two ferromagnetic tunnel junction devices MTJ1 and MTJ2 when restoring, it is possible to perform the storing operation at high speed even though the amplifier circuit 70 described in the eighteenth embodiment is not provided. When inverters 10 and 20 are coupled between power source lines VDD and VSS and the polarity of the ferromagnetic tunnel junction device MTJ1 or MTJ2 is same as that of the twenty-fifth embodiment it is preferable that the electric power line to which the third switch is coupled is at a high level, and when a MOSFET is used for the third switch a p-type MOSFET is preferable.

As described in the twenty-third embodiment, it is possible to compose the flip-flop circuit with the latch circuit in accordance with the thirteenth through twenty-second, twenty-fourth and twenty-fifth embodiments.

Although descriptions have been given of the inverter using a CMOS as inverters 10 and 20, and the tristate inverter using CMOS as an example of the tristate inverter 21, the inverter using a resistance load and a D-mode load can be used. Although descriptions have been given with the pass gate as the first input switch and the second input switch, any devices that can switch conductive state and non-conductive state can be used. In addition, descriptions have been given with a FET as the first switch and the second switch, but any devices that can switch conductive state and non-conductive state can be used.

Although detail descriptions are given of preferred embodiments of the present invention, the present invention is not limited to the specifically described embodiments and variations, but other embodiments and variations may be made without departing from the scope of the present invention.

The invention claimed is:

1. A memory circuit comprising:
a bistable circuit that stores data; and
a ferromagnetic tunnel junction device that nonvolatilely stores the data stored in the bistable circuit according to a magnetization direction of a ferromagnetic electrode free layer,
the data nonvolatilely stored in the ferromagnetic tunnel junction device being able to be restored to the bistable circuit, a first inverter circuit and a second inverter circuit being coupled in a ring shape in the bistable circuit, the ferromagnetic tunnel junction device being coupled to a node to which the first inverter circuit and the second inverter circuit are coupled, and the ferromagnetic tunnel junction device being coupled between the node and a control line, and becoming a high resistance as a first current flows between the node and the control line, and becoming a low resistance as a second current flows to a counter direction of the first current,
wherein the control line applies a high level voltage to the ferromagnetic tunnel junction device and further applies a low level voltage lower than the high level voltage at a time differing from applying the high level voltage when nonvolatilely storing the data from the bistable circuit to the ferromagnetic tunnel junction device.

2. The memory circuit according to claim 1, wherein the ferromagnetic tunnel junction device changes the magnetization direction of the ferromagnetic electrode free layer by a current-induced magnetization reversal method.

3. The memory circuit according to claim 1, wherein the control line applies a low level or high level voltage to the ferromagnetic tunnel junction device when restoring the data from the ferromagnetic tunnel junction device to the bistable circuit.

4. The memory circuit according to claim 1, comprising a switch that is coupled between the node and the ferromagnetic tunnel junction device, and that becomes conductive when storing the data from the bistable circuit to the ferromagnetic tunnel junction device or when restoring the data from the ferromagnetic tunnel junction device to the bistable circuit.

5. The memory circuit according to claim 4, wherein the switch includes a MOSFET.

6. The memory circuit according to claim 1, wherein the node includes a first node and a second node that are complementary nodes to one another, and the ferromagnetic tunnel junction device includes a first ferromagnetic tunnel junction device which is coupled between the first node and the control line, and a second ferromagnetic tunnel junction device which is coupled between the second node and the control line.

7. The memory circuit according to claim 6, comprising:
a first switch that is provided between the first node and the first ferromagnetic tunnel junction device, and that becomes conductive when storing the data from the bistable circuit to the first ferromagnetic tunnel junction device or when restoring the data from the first tunneling junction device to the bistable circuit; and
a second switch that is provided between the second node and the second ferromagnetic tunnel junction device, and that becomes conductive when storing the data from the second ferromagnetic tunnel junction device to the bistable circuit or when restoring the data from the second ferromagnetic tunnel junction device to the bistable circuit.

8. The memory circuit according to claim 7, wherein the first switch and the second switch include a MOSFET respectively.

9. The memory circuit according to claim 1, comprising an input/output switch for inputting and outputting data to the node.

10. The memory circuit according to claim 9, wherein the input/output switch inputs and outputs data to the node according to a level of a word line.

11. The memory circuit according to claim 1, wherein the input/output switch includes a first input/output switch for inputting and outputting data to the first node, and a second input/output switch for inputting and outputting data to the second node.

12. The memory circuit according to claim 1, wherein the ferromagnetic tunnel junction device includes a ferromagnetic electrode free layer, a ferromagnetic electrode pinned layer, and a tunnel insulation film that is provided between the ferromagnetic electrode free layer and the ferromagnetic electrode pinned layer.

13. The memory circuit according to claim 1, wherein:
a first power source line applies a first voltage to the first inverter circuit and the second inverter circuit when the bistable circuit stores the data, a second power source line applies a second voltage lower than the first voltage to the first inverter circuit and the second inverter circuit when the bistable circuit stores the data, and the first power source line applies the second voltage to the first inverter circuit and the second inverter circuit when the bistable circuit shuts down; and
the ferromagnetic electrode free layer couples to the control line.

14. A memory circuit comprising:
a bistable circuit that stores data: and
a ferromagnetic tunnel junction device that nonvolatilely stores the data stored in the bistable circuit according to a magnetization direction of a ferromagnetic electrode free layer,
the data nonvolatilely stored in the ferromagnetic tunnel junction device being able to be restored to the bistable circuit, a first inverter circuit and a second inverter circuit being coupled in a ring shape in the bistable circuit, the ferromagnetic tunnel junction device being coupled to a node to which the first inverter circuit and the second inverter circuit are coupled, and the ferromagnetic tunnel junction device being coupled between the node and a control line, and becoming a high resistance as a first current flows between the node and the control line, and becoming a low resistance as a second current flows to a counter direction of the first current,
wherein the node includes a first node and a second node that are complementary nodes to one another, and the ferromagnetic tunnel junction device includes a first ferromagnetic tunnel junction device which is coupled between the first node and the control line, and a second ferromagnetic tunnel junction device which is coupled between the second node and the control line,
further comprising a third switch that is coupled between the control line and an electric power line which is at a low level or at a high level, the third switch becoming non-conductive when storing the data from the bistable circuit to the first ferromagnetic tunnel junction device and the second ferromagnetic tunnel junction device, and becoming conductive when restoring the data from the first ferromagnetic tunnel junction device and the second ferromagnetic tunnel junction device to the bistable circuit.

15. A latch circuit comprising:
a bistable circuit that includes a first logic circuit having one or more inputs and one or more outputs and a second logic circuit having one or more inputs and one or more outputs, and stores data;
a first node to which one of outputs of the first logic circuit and one of inputs of the second logic circuit are coupled;
a second node to which one of outputs of the second logic circuit and one of inputs of the first logic circuit are coupled; and
a ferromagnetic tunnel junction device that is coupled to at least one of the first node and the second node, and nonvolatilely stores data stored in the bistable circuit according to a magnetization direction of a ferromagnetic electrode free layer,
complementary data to be stored being output from the first logic circuit and the second logic circuit to the first node and the second node respectively when storing the data from the bistable circuit to the ferromagnetic tunnel junction device, a signal that has the first logic circuit output a logic inversion of the second node to the first node being output to inputs except an input which is coupled to the second node of the first logic circuit, and a signal that has the second logic circuit output a logic inversion of the first node to the second node being output to inputs except an input which is coupled to the first node of the second logic circuit when restoring the data from the ferromagnetic tunnel junction device to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance as a second current flows to a counter direction of the first current flowing between the at least one node and the control line,
wherein the control line applies a high level voltage to the ferromagnetic tunnel junction device and further applies a low level voltage lower than the high level voltage at a time differing from applying the high level voltage when nonvolatilely storing the data from the bistable circuit to the ferromagnetic tunnel junction device.

16. The latch circuit according to claim 15, wherein the ferromagnetic tunnel junction device changes the magnetization direction of the ferromagnetic electrode free layer by a current-induced magnetization reversal method.

17. The latch circuit according to claim 15, wherein the control line applies a low level or high level voltage to the ferromagnetic tunnel junction device when restoring the data from the ferromagnetic tunnel junction device to the bistable circuit.

18. The latch circuit according to claim 15, comprising a switch that is coupled between the at least one node and the ferromagnetic tunnel junction device, and becomes conductive when storing the data from the bistable circuit to the ferromagnetic tunnel junction device or when restoring the data from the ferromagnetic tunnel junction device to the bistable circuit.

19. The latch circuit according to claim 18, wherein the switch includes a MOSFET.

20. The latch circuit according; to claim 15, wherein the ferromagnetic tunnel junction device includes a first ferromagnetic tunnel junction device that is coupled between the first node and the control line, and a second ferromagnetic tunnel junction device that is coupled between the second node and the control line.

21. The latch circuit according to claim 20, comprising:
a first switch that is provided between the first node and the first ferromagnetic tunnel junction device, and becomes conductive when storing the data from the bistable circuit to the first ferromagnetic tunnel junction device or when restoring the data from the first ferromagnetic tunnel junction device to the bistable circuit; and
a second switch that is provided between the second node and the second ferromagnetic tunnel junction device, and becomes conductive when storing the data to the second ferromagnetic tunnel junction device or when restoring the data to the bistable circuit.

22. The latch circuit according to claim 20, wherein the first switch and the second switch include a MOSFET respectively.

23. The latch circuit according to claim 15, wherein the ferromagnetic tunnel junction device includes a ferromagnetic electrode free layer, a ferromagnetic electrode pinned layer, and a tunnel insulation film provided between the ferromagnetic electrode free layer and the ferromagnetic electrode pinned layer.

24. A latch circuit comprising:
a bistable circuit that stores data, and where a first inverter circuit and a second inverter circuit are coupled in a ring shape;
a first node and a second node to which the first inverter circuit and the second inverter circuit are coupled, and that are a complementary node to one another;
a first input switch for writing the data to the bistable circuit from an input line;

a second input switch that behaves in a complementary style to the first input switch, and holds data of the bistable circuit; and
a ferromagnetic tunnel junction device that nonvolatilely stores data stored in the bistable circuit according to a magnetization direction of a ferromagnetic electrode free layer,
data nonvolatilely stored in the ferromagnetic tunnel junction device being able to restored to the bistable circuit, the ferromagnetic tunnel junction device being coupled to at least one node of the first node and the second node, and the ferromagnetic tunnel junction device being coupled between the at least one node and, a control line, becoming a high resistance as a first current flows between the at least one node and the control line, and becoming a low resistance as a second current flows to a counter direction of the first current flowing between the at least one node and the control line,
wherein the control line applies a high level voltage to the ferromagnetic tunnel junction device and further applies a low level voltage lower than the high level voltage at a time differing from applying the high level voltage when nonvolatilely storing the data from the bistable circuit to the ferromagnetic tunnel junction device.

25. The latch circuit according to claim 24, wherein the second input switch is provided in the bistable circuit.

26. The latch circuit according to claim 24, wherein one of the first inverter circuit and the second inverter circuit is a tri-state inverter.

27. A latch circuit comprising:
a bistable circuit that includes a first logic circuit having one or more inputs and one or more outputs and a second logic circuit having one or more inputs and one or more outputs, and stores data;
a first node to which one of outputs of the first logic circuit and one of inputs of the second logic circuit are coupled;
a second node to which one of outputs of the second logic circuit and one of inputs of the first logic circuit are coupled; and
a ferromagnetic tunnel junction device that is coupled to at least one of the first node and the second node, and nonvolatilely stores data stored in the bistable circuit according to a magnetization direction of a ferromagnetic electrode free layer,
complementary data to be stored being output from the first logic circuit and the second logic circuit to the first node and the second node respectively when storing the data from the bistable circuit to the ferromagnetic tunnel junction device, a signal that has the first logic circuit output a logic inversion of the second node to the first node being output to inputs except an input which is coupled to the second node of the first logic circuit, and a signal that has the second logic circuit output a logic inversion of the first node to the second node being output to inputs except an input which is coupled to the first node of the second logic circuit when restoring the data from the ferromagnetic tunnel junction device to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance and a second current flows to a counter direction of the first current flowing between the at least one node and the control line,
wherein the ferromagnetic tunnel junction device includes a first ferromagnetic tunnel junction device that is coupled between the first node and the control line, and a second ferromagnetic tunnel junction device that is coupled between the second node and the control line,
further comprising a third switch that is coupled between the control line and an electric power line which is at a low level or at a high level, the third switch becoming non-conductive when storing the data from the bistable circuit to the first ferromagnetic tunnel junction device and the second ferromagnetic tunnel junction device, and becoming conductive when restoring the data from the first ferromagnetic tunnel junction device and the second ferromagnetic tunnel junction device to the bistable circuit.

28. A flip-flop circuit comprising a latch circuit which includes:
a bistable circuit that includes a first logic circuit having one or more inputs and one or more outputs and a second logic circuit having one or more inputs and one or more outputs, and stores data;
a first node to which one of outputs of the first logic circuit and one of inputs of the second logic circuit are coupled;
a second node to which one of outputs of the second logic circuit and one of inputs of the first logic circuit are coupled; and
a ferromagnetic tunnel junction device that is coupled to at least one of the first node and the second node, and nonvolatilely stores data stored in the bistable circuit according to a magnetization direction of a ferromagnetic electrode free layer,
complementary data to be stored being output from the first logic circuit and the second logic circuit to the first node and the second node respectively when storing the data from the bistable circuit to the ferromagnetic tunnel junction device, a signal that has the first logic circuit output a logic inversion of the second node to the first node being output to inputs except an input which is coupled to the second node of the first logic circuit, and a signal that has the second logic circuit output a logic inversion of the first node to the second node being output to inputs except an input which is coupled to the first node of the second logic circuit when restoring the data from the ferromagnetic tunnel junction device to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance as a second current flows to a counter direction of the first current flowing between the at least one node and the control line,
wherein the control line applies a high level voltage to the ferromagnetic tunnel junction device and further applies a low level voltage lower than the high level voltage at a time differing from applying the high level voltage when nonvolatilely storing the data from the bistable circuit to the ferromagnetic tunnel junction device.

29. A memory circuit comprising: a bistable circuit that stores data; and a ferromagnetic tunnel junction device that nonvolatilely stores the data stored in the bistable circuit according to a magnetization direction of a ferromagnetic electrode free layer,
the data nonvolatilely stored in the ferromagnetic tunnel junction device being able to be restored to the bistable circuit, a first inverter circuit and a second inverter circuit being coupled in a ring shape in the bistable circuit, the ferromagnetic tunnel junction device being coupled to a node to which the first inverter circuit and the second inverter circuit are coupled, and the ferromagnetic tunnel junction device being coupled between the node and a control line, and becoming a high resistance as a first current flows between the node and the control line, and becoming a low resistance as a second current flows to a counter direction of the first current, wherein the node includes a first node and a second node that are complementary nodes to one another, and the ferromagnetic tunnel junction device is connected only one of the first node and the second node.

30. A memory circuit comprising:

a bistable circuit that stores data; and a ferromagnetic tunnel junction device that nonvolatilely stores the data stored in the bistable circuit according to a magnetization direction of a ferromagnetic electrode free layer, the data nonvolatilely stored in the ferromagnetic tunnel junction device being able to be restored to the bistable circuit, a first inverter circuit and a second inverter circuit being coupled in a ring shape in the bistable circuit, the ferromagnetic tunnel junction device being coupled to a node to which the first inverter circuit and the second inverter circuit are coupled, and the ferromagnetic tunnel junction device being coupled between the node and a control line, and becoming a high resistance as a first current flows between the node and the control line, and becoming a low resistance as a second current flows to a counter direction of the first current, wherein a first power source line applies a first voltage to the first inverter circuit and the second inverter circuit when the bistable circuit stores the data, a second power source line applies a second voltage lower than the first voltage to the first inverter circuit and the second inverter circuit when the bistable circuit stores the data, and the second power source line applies the first voltage to the first inverter circuit and the second inverter circuit when the bistable circuit shuts down.

31. The memory circuit according to claim 30, comprising a p type MOSFET that is coupled between the node and the ferromagnetic tunnel junction device, and that becomes conductive when storing the data from the bistable circuit to the ferromagnetic tunnel junction device or when restoring the data from the ferromagnetic tunnel junction device to the bistable circuit.

32. The memory circuit according to claim 30, wherein the ferromagnetic electrode free layer couples to the node.

33. A memory circuit comprising:

a bistable circuit that stores data; and a spin FET that nonvolatilely stores the data stored in the bistable circuit, the data nonvolatilely stored in the spin FET being able to be restored to the bistable circuit, a first inverter circuit and a second inverter circuit being coupled in a ring shape in the bistable circuit, one of a source and a drain of the spin FET being coupled to a node to which the first inverter circuit and the second inverter circuit are coupled, the other of the source and the drain of the spin FET being coupled to a control line.

34. A latch circuit comprising:

a bistable circuit that stores data, and where a first inverter circuit and a second inverter circuit are coupled in a ring shape;

a first node and a second node to which the first inverter circuit and the second inverter circuit are coupled, and that are a complementary node to one another;

a first input switch for writing the data to the bistable circuit from an input line;

a second input switch that behaves in a complementary style to the first input switch, and holds data of the bistable circuit; and a ferromagnetic tunnel junction device that nonvolatilely stores data stored in the bistable circuit according to a magnetization direction of a ferromagnetic electrode free layer, data nonvolatilely stored in the ferromagnetic tunnel junction device being able to restored to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance as a second current flows to a counter direction of the first current flowing between the at least one node and the control line, wherein the ferromagnetic tunnel junction device includes a first ferromagnetic tunnel junction device that is coupled between the first node and the control line, and a second ferromagnetic tunnel junction device that is coupled between the second node and the control line, further comprising a third switch that is coupled between the control line and an electric power line which is at a low level or at a high level, the third switch becoming non-conductive when storing the data from the bistable circuit to the first ferromagnetic tunnel junction device and the second ferromagnetic tunnel junction device, and becoming conductive when restoring the data from the first ferromagnetic tunnel junction device and the second ferromagnetic tunnel junction device to the bistable circuit.

35. A latch circuit comprising:

a bistable circuit that includes a first logic circuit having one or more inputs and one or more outputs and a second logic circuit having one or more inputs and one or more outputs, and stores data;

a first node to which one of outputs of the first logic circuit and one of inputs of the second logic circuit are coupled;

a second node to which one of outputs of the second logic circuit and one of inputs of the first logic circuit are coupled; and a ferromagnetic tunnel junction device that is coupled to at least one of the first node and the second node, and nonvolatilely stores data stored in the bistable circuit according to a magnetization direction of a ferromagnetic electrode free layer, complementary data to be stored being output from the first logic circuit and the second logic circuit to the first node and the second node respectively when storing the data from the bistable circuit to the ferromagnetic tunnel junction device, a signal that has the first logic circuit output a logic inversion of the second node to the first node being output to inputs except an input which is coupled to the second node of the first logic circuit, and a signal that has the second logic circuit output a logic inversion of the first node to the second node being output to inputs except an input which is coupled to the first node of the second logic circuit when restoring the data from the ferromagnetic tunnel junction device to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance as a second current flows to a counter direction of the first current flowing between the at least one node and the control line, wherein the ferromagnetic tunnel junction device is connected only one of the first node and the second node.

36. A latch circuit comprising:

a bistable circuit that stores data, and where a first inverter circuit and a second inverter circuit are coupled in a ring shape;

a first node and a second node to which the first inverter circuit and the second inverter circuit are coupled, and that are a complementary node to one another;

a first input switch for writing the data to the bistable circuit from an input line;

a second input switch that behaves in a complementary style to the first input switch, and holds data of the bistable circuit; and a ferromagnetic tunnel junction device that nonvolatilely stores data stored in the bistable circuit according to a magnetization direction of a ferromagnetic electrode free layer, data nonvolatilely stored in the ferromagnetic tunnel junction device being able to restored to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance as a second current flows to a counter direction of the first current flowing between the at least one node and the control line, wherein the ferromagnetic tunnel junction device is connected only one of the first node and the second node.

37. A latch circuit comprising:

a bistable circuit that includes a first logic circuit having one or more inputs and one or more outputs and a second logic circuit having one or more inputs and one or more outputs, and stores data;

a first node to which one of outputs of the first logic circuit and one of inputs of the second logic circuit are coupled;

a second node to which one of outputs of the second logic circuit and one of inputs of the first logic circuit are coupled; and a ferromagnetic tunnel junction device that is coupled to at least one of the first node and the second node, and nonvolatilely stores data stored in the bistable circuit according to a magnetization direction of a ferromagnetic electrode free layer, complementary data to be stored being output from the first logic circuit and the second logic circuit to the first node and the second node respectively when storing the data from the bistable circuit to the ferromagnetic tunnel junction device, a signal that has the first logic circuit output a logic inversion at the second node to the first node being output to inputs except an input which is coupled to the second node of the first logic circuit, and a signal that has the second logic circuit output a logic inversion of the first node to the second node being output to inputs except an input which is coupled to the first node of the second logic circuit when restoring the data from the ferromagnetic tunnel junction device to the bistable circuit, the ferromagnetic tunnel junction device being coupled to at least one node of the first node and the second node, and the ferromagnetic tunnel junction device being coupled between the at least one node and a control line, becoming a high resistance as a first current flows between the at least one node and the control line, and becoming a low resistance as a second current flows to a counter direction of the first current flowing between the at least one node and the control line, wherein at least one of the first logic circuit and the second logic circuit has multiple inputs and or multiple outputs.

38. A latch circuit comprising:

a bistable circuit that includes a first logic circuit having one or more inputs and one or more outputs and a second logic circuit having one or more inputs and one or more outputs, and stores data;

a first node to which one of outputs of the first logic circuit and one of inputs of the second logic circuit are coupled;

a second node to which one of outputs of the second logic circuit and one of inputs of the first logic circuit are coupled; and a spin FET that is coupled to at least one of the first node and the second node, and nonvolatilely stores data stored in the bistable circuit, complementary data to be stored being output from the first logic circuit and the second logic circuit to the first node and the second node respectively when storing the data from the bistable circuit to the spin FET, a signal that has the first logic circuit output a logic inversion of the second node to the first node being output to inputs except an input which is coupled to the second node of the first logic circuit, a signal that has the second logic circuit output a logic inversion of the first node to the second node being output to inputs except an input which is coupled to the first node of the second logic circuit when restoring the data from the spin FET, one of a source and a drain of the spin FET being coupled to at least one node of the first node and the second node, the other of the source and the drain of the spin FET being coupled to a control line.

* * * * *